(12) United States Patent
Muranaka

(10) Patent No.: US 7,282,377 B2
(45) Date of Patent: Oct. 16, 2007

(54) METHOD FOR IDENTIFYING SEMICONDUCTOR INTEGRATED CIRCUIT DEVICE, METHOD FOR MANUFACTURING SEMICONDUCTOR INTEGRATED CIRCUIT DEVICE, SEMICONDUCTOR INTEGRATED CIRCUIT DEVICE AND SEMICONDUCTOR CHIP

(75) Inventor: Masaya Muranaka, Akishima (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 62 days.

(21) Appl. No.: 11/194,487

(22) Filed: Aug. 2, 2005

(65) Prior Publication Data

US 2005/0263605 A1    Dec. 1, 2005

Related U.S. Application Data

(62) Division of application No. 10/433,161, filed as application No. PCT/JP01/07727 on Sep. 6, 2001, now Pat. No. 6,941,536.

(30) Foreign Application Priority Data

Dec. 1, 2000    (WO) .................. PCT/JP00/08500

(51) Int. Cl.
    *H01L 21/00* (2006.01)
(52) U.S. Cl. ..................... 438/18; 257/678
(58) Field of Classification Search ............ 438/6, 438/210, 104, 107–114, 118, 121–123, 128–129, 438/135, 142, 145, 149, 151, 157, 176, 478, 438/184, 193, 195–198, 200, 218, 237, 165, 438/294, 308, 337, 353, 378, 401, 18
See application file for complete search history.

(56) References Cited

U.S. PATENT DOCUMENTS

| | | | | |
|---|---|---|---|---|
| 4,302,491 A | * | 11/1981 | Papageorgiou | 428/15 |
| 4,344,064 A | * | 8/1982 | Bitler et al. | 338/334 |
| 5,103,166 A | * | 4/1992 | Jeon et al. | 324/764 |
| 5,380,998 A | * | 1/1995 | Bossen et al. | 235/494 |
| 5,386,623 A | * | 2/1995 | Okamoto et al. | 29/832 |
| 5,617,364 A | | 4/1997 | Hatakeyama | 365/200 |
| 5,768,290 A | * | 6/1998 | Akamatsu | 714/732 |
| 5,804,980 A | * | 9/1998 | Nikawa | 324/752 |
| 5,843,797 A | * | 12/1998 | Iuchi | 438/275 |
| 5,983,331 A | | 11/1999 | Akamatsu et al. | 711/170 |
| 6,063,695 A | * | 5/2000 | Lin et al. | 438/462 |
| 6,161,052 A | | 12/2000 | Charlton et al. | 700/97 |
| 6,161,213 A | | 12/2000 | Lofstrom | 716/4 |
| 6,278,193 B1 | * | 8/2001 | Coico et al. | 257/797 |

(Continued)

FOREIGN PATENT DOCUMENTS

JP    56-50526    5/1981

(Continued)

*Primary Examiner*—Scott B. Geyer
*Assistant Examiner*—Andre' Stevenson
(74) *Attorney, Agent, or Firm*—Miles & Stockbridge P.C.

(57) ABSTRACT

In the manufacturing process of a semiconductor integrated circuit device, a plurality of identification elements having the same arrangement are formed and the relation of magnitude in a physical amount corresponding to variations in the process of the plurality of identification elements is employed as identification information unique to the semiconductor integrated circuit device.

21 Claims, 74 Drawing Sheets

U.S. PATENT DOCUMENTS

| | | | |
|---|---|---|---|
| 6,289,292 B1 | 9/2001 | Charlton et al. | 702/108 |
| 6,415,339 B1 | 7/2002 | Farmwald et al. | 710/23 |
| 7,119,662 B1* | 10/2006 | Horiguchi et al. | 340/5.7 |
| 2002/0017708 A1* | 2/2002 | Takagi et al. | 257/678 |
| 2003/0017652 A1* | 1/2003 | Sakaki et al. | 438/123 |

FOREIGN PATENT DOCUMENTS

| | | |
|---|---|---|
| JP | 64-37847 | 2/1989 |
| JP | 1-100943 | 4/1989 |
| JP | 1-269299 | 10/1989 |
| JP | 4-369750 | 12/1992 |
| JP | 5-67683 | 3/1993 |
| JP | 6-196435 | 7/1994 |
| JP | 6-291170 | 10/1994 |
| JP | 7-50233 | 2/1995 |
| JP | 7-335509 | 12/1995 |
| JP | 8-29493 | 2/1996 |
| JP | 8-213464 | 8/1996 |
| JP | 10-55939 | 2/1998 |
| JP | 11-214274 | 8/1999 |

* cited by examiner (A)
Y-X

|   | Y1 | Y2 | Y3 | Y4 |
|---|----|----|----|----|
| X1 | * | − | − | − |
| X2 | + | * | − | − |
| X3 | + | + | * | − |
| X4 | + | + | + | * |

VLT1 > VLT2 > VLT3 > VLT4

(B)
Y-X

|   | Y1 | Y2 | Y3 | Y4 |
|---|----|----|----|----|
| X1 | * | = | − | − |
| X2 | − | * | − | − |
| X3 | + | + | * | + |
| X4 | + | + | − | * |

VLT2 = VLT1 > VLT4 > VLT3

+ : Y > X
− : Y < X
* : no match
= : DRAW

ON SWITCHES
(A1,B1) (C1,D1) ▶ INV1    Pass
(A1,B1) (C2,D2) ▶ INV1    INV2
(A1,B1) (C3,D3) ▶ INV1    INV3
(A1,B1) (C4,D4) ▶ INV1    INV4
    ⋮          ▶   ⋮       ⋮
(A2,B2) (C1,D1) ▶ INV2    INV1
(A2,B2) (C2,D2) ▶ INV2    Pass
    ⋮          ▶   ⋮       ⋮
(A4,B4) (C3,D3) ▶ INV4    INV3
(A4,B4) (C4,D4) ▶ INV4    Pass Pass ●—●

FIG. 7
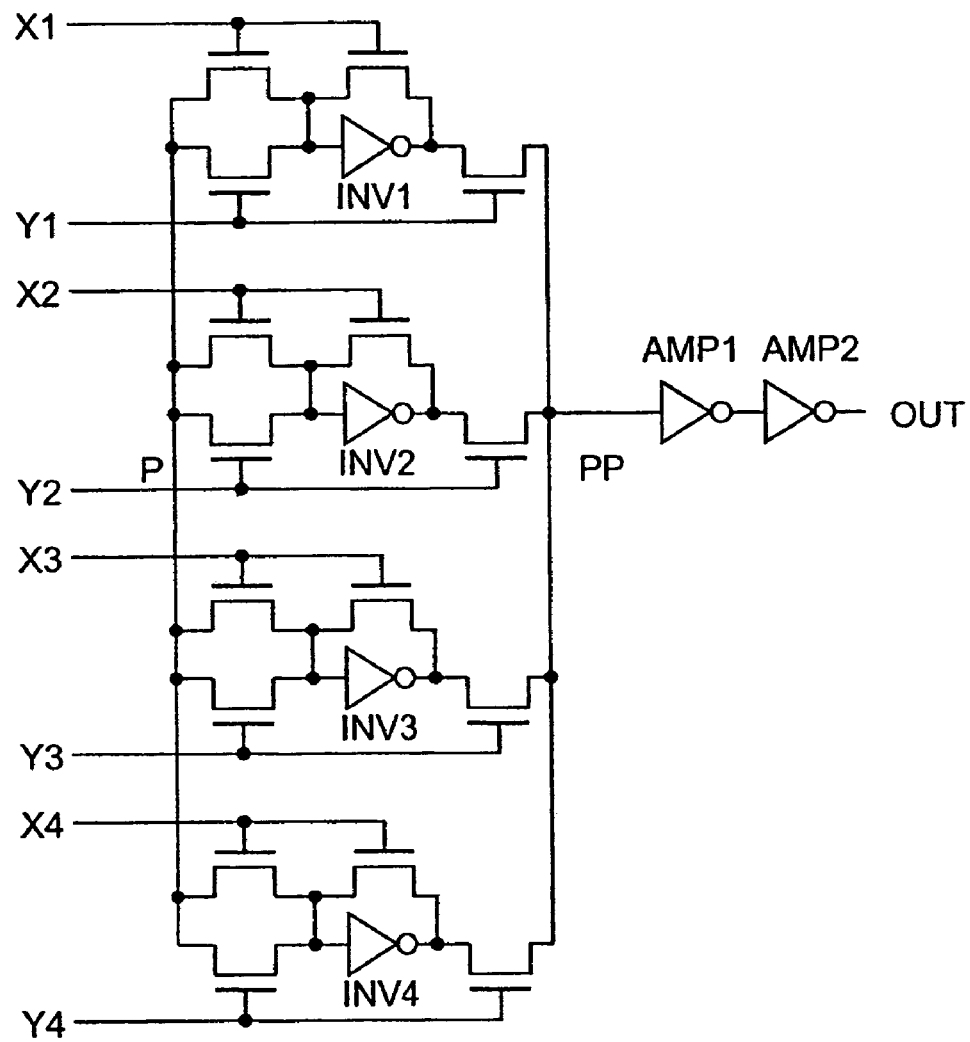
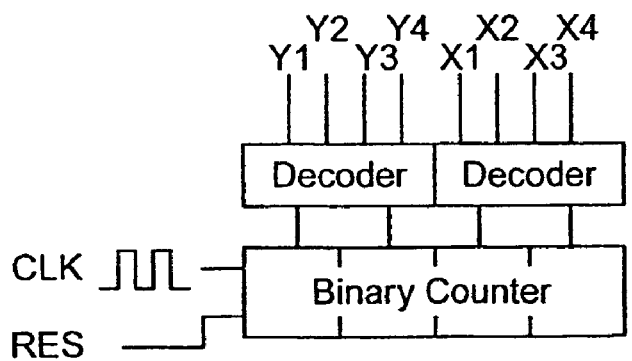

FIG. 17
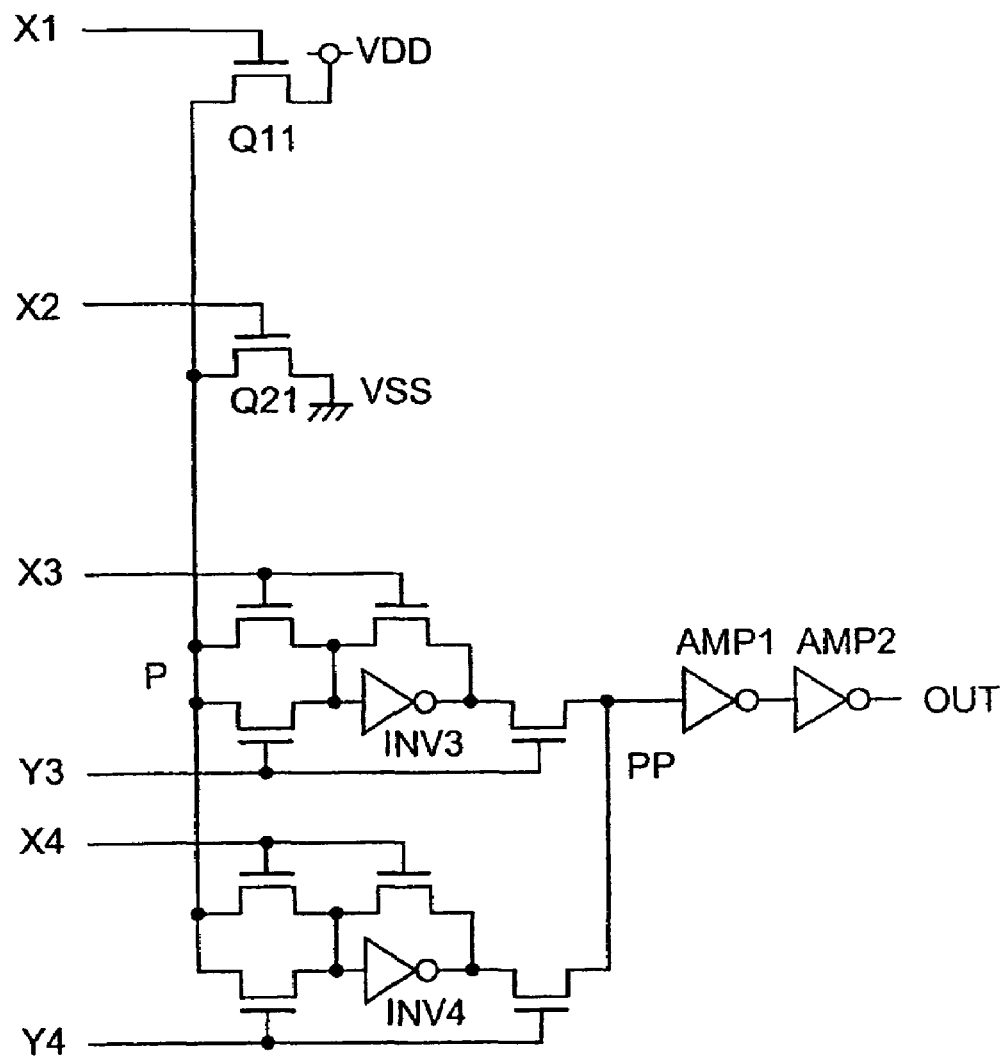
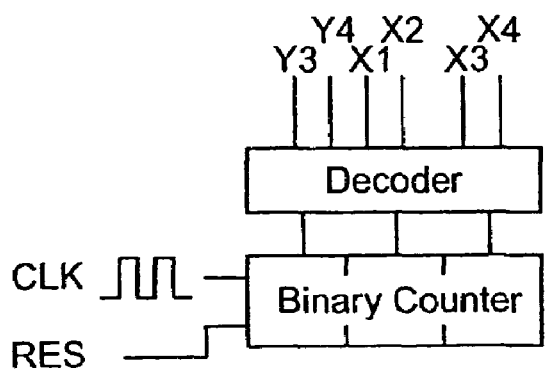

FIG. 18
(A)
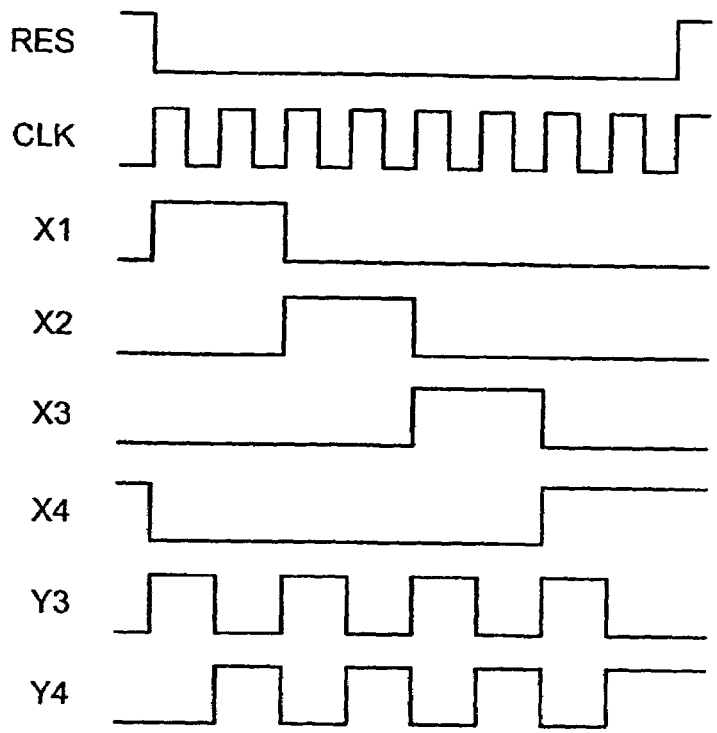
(B)
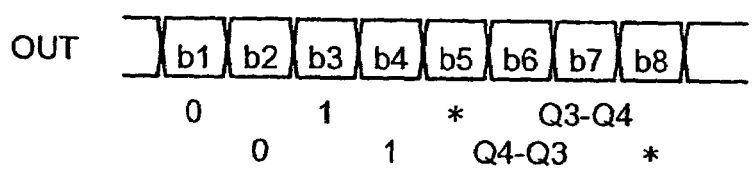
VLTQy−VLTQx > 0 : b="H"
VLTQy−VLTQx < 0 : b="L"

FIG. 19
(A)
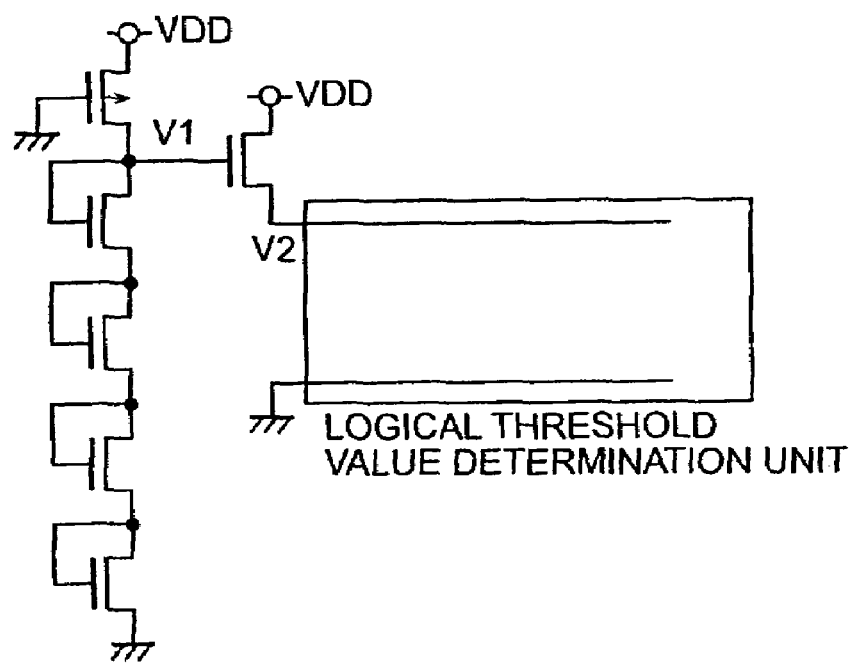
(B)
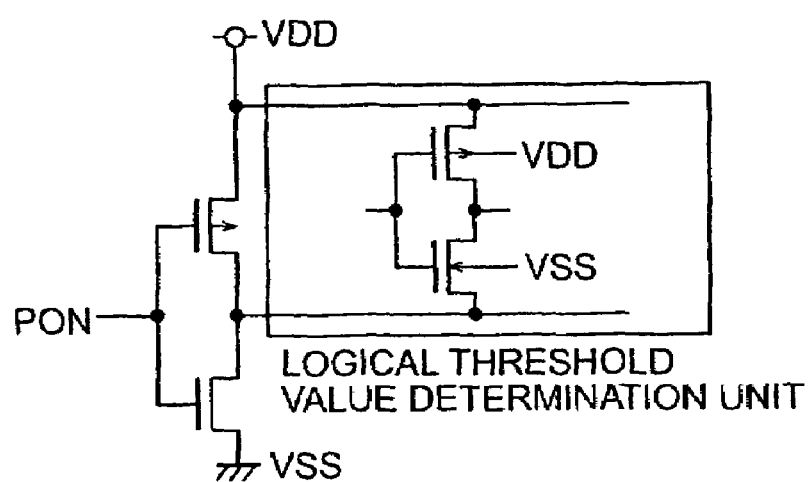

FIG. 30

| BIT | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | |
|---|---|---|---|---|---|---|---|---|---|---|---|---|---|---|---|---|---|---|---|---|---|---|---|---|---|
| MATCHED NUMBER | 0 | 0 | 0 | 0 | 0 | 0 | 1 | 0 | 1 | 1 | 0 | 0 | 0 | 1 | 0 | 0 | 0 | 0 | 1 | 0 | 1 | 1 | 1 | 1 | NUMBER OF UNMATCH BITS |
| MATCHING NUMBER 1 | 0 | 1 | 0 | 1 | 1 | 1 | 1 | 0 | 1 | 1 | 0 | 0 | 0 | 1 | 0 | 0 | 0 | 0 | 1 | 0 | 0 | 0 | 1 | 1 | 9 |
| MATCHING NUMBER 2 | 0 | 1 | 0 | 1 | 0 | 1 | 1 | 1 | 0 | 0 | 1 | 1 | 1 | 0 | 0 | 1 | 1 | 0 | 0 | 0 | 1 | 0 | 0 | 0 | 15 |
| MATCHING NUMBER 3 | 0 | 0 | 0 | 0 | 0 | 1 | 1 | 1 | 1 | 1 | 0 | 0 | 1 | 0 | 0 | 0 | 0 | 1 | 1 | 0 | 1 | 1 | 1 | 1 | 5 |
| MATCHING NUMBER 4 | 0 | 1 | 1 | 1 | 0 | 0 | 1 | 1 | 0 | 0 | 0 | 0 | 0 | 0 | 0 | 0 | 1 | 1 | 0 | 0 | 0 | 0 | 0 | 0 | 17 |
| MATCHING NUMBER 5 | 0 | 0 | 0 | 0 | 0 | 0 | 1 | 0 | 1 | 1 | 0 | 0 | 1 | 1 | 0 | 0 | 0 | 0 | 0 | 0 | 1 | 1 | 1 | 1 | 1 |

ELEMENT NUMBER

FIG. 31

| ELEMENT NUMBER | ORDER OF ELEMENTS | | | | | | | | | | | | | | | |
|---|---|---|---|---|---|---|---|---|---|---|---|---|---|---|---|---|
| IDENTIFIED NUMBER | 1 | 2 | 3 | 4 | 5 | 6 | 7 | 8 | 9 | 10 | 11 | 12 | 13 | 14 | 15 | 16 |
|  | 1 | 2 | 3 | 4 | 5 | 6 | 7 | 8 | 9 | 10 | 11 | 12 | 13 | 14 | 15 | 16 |
| IDENTIFICATION NUMBER 1 | 1 | 2 | 3 | 4 | 5 | 6 | 7 | 9 | 8 | 10 | 11 | 12 | 13 | 14 | 15 | 16 |
| IDENTIFICATION NUMBER 2 | 3 | 13 | 8 | 1 | 7 | 5 | 6 | 4 | 15 | 16 | 9 | 12 | 14 | 10 | 2 | 11 |
| IDENTIFICATION NUMBER 3 | 6 | 1 | 2 | 3 | 4 | 5 | 7 | 8 | 9 | 10 | 11 | 12 | 13 | 14 | 15 | 16 |

| | ABSOLUTE VALUE OF DISTANCE OF ORDER | | | | | | | | | | | | | | | | TOTAL | AVERAGE |
|---|---|---|---|---|---|---|---|---|---|---|---|---|---|---|---|---|---|---|
| IDENTIFICATION NUMBER 1 | 0 | 0 | 0 | 0 | 0 | 0 | 0 | 1 | 1 | 0 | 0 | 0 | 0 | 0 | 0 | 0 | 2 | 0.13 |
| IDENTIFICATION NUMBER 2 | 2 | 11 | 5 | 3 | 2 | 1 | 1 | 4 | 6 | 6 | 2 | 0 | 1 | 4 | 13 | 5 | 66 | 4.13 |
| IDENTIFICATION NUMBER 3 | 5 | 1 | 1 | 1 | 1 | 1 | 0 | 0 | 0 | 0 | 0 | 0 | 0 | 0 | 0 | 0 | 10 | 0.63 |

FIG. 64

| ELEMENT NUMBER | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| IDENTIFIED NUMBER | 1 | 8 | 5 | 10 | 15 | 12 | 9 | 11 | 2 | 10 | 7 | 6 | 4 | 3 | 14 | 13 |
| IDENTIFICATION NUMBER 1 | 1 | 2 | 3 | 4 | 5 | 6 | 7 | 8 | 9 | 10 | 11 | 12 | 13 | 14 | 15 | 16 |
| IDENTIFICATION NUMBER 2 | 16 | 13 | 8 | 1 | 7 | 5 | 6 | 4 | 15 | 3 | 9 | 12 | 14 | 10 | 2 | 11 |
| IDENTIFICATION NUMBER 3 | 9 | 8 | 5 | 16 | 3 | 12 | 11 | 15 | 2 | 13 | 1 | 7 | 6 | 4 | 10 | 14 |

ORDER OF ELEMENTS

ABSOLUTE VALUE OF DISTANCE OF RANK

| IDENTIFICATION NUMBER 1 | 15 | 6 | 2 | 6 | 10 | 6 | 2 | 3 | 7 | 9 | 4 | 6 | 9 | 11 | 1 | 3 |
| IDENTIFICATION NUMBER 2 | 0 | 5 | 3 | 9 | 8 | 7 | 3 | 13 | 2 | 2 | 2 | 6 | 10 | 7 | 12 | 2 |
| IDENTIFICATION NUMBER 3 | 7 | 0 | 0 | 6 | 12 | 0 | 2 | 4 | 0 | 12 | 6 | 1 | 2 | 1 | 4 | 1 |

|  | MAXI-MUM | | MINI-MUM |
|---|---|---|---|
|  | 1 | | 10 |
|  | 16 | > | 1 |
|  | 1 | < 10 | ⇒ NONELIGIBLE |
|  | 16 | > 3 | ⇒ ELIGIBLE |
|  | 9 | < 13 | ⇒ NONELIGIBLE |

| | TOTAL | AVERAGE |
|---|---|---|
| | 100 | 6.25 |
| | 96 | 6.00 |
| | 58 | 3.63 |

US 7,282,377 B2

METHOD FOR IDENTIFYING SEMICONDUCTOR INTEGRATED CIRCUIT DEVICE, METHOD FOR MANUFACTURING SEMICONDUCTOR INTEGRATED CIRCUIT DEVICE, SEMICONDUCTOR INTEGRATED CIRCUIT DEVICE AND SEMICONDUCTOR CHIP

CROSS-REFERENCE TO RELATED APPLICATION

This application is a division of application Ser. No. 10/433,161 filed Oct. 15, 2003, which is a 371 of PCT/JP01/07727 filed Sep. 6, 2001.

TECHNICAL FIELD

The present invention relates to a method for identifying a semiconductor integrated circuit device, a method for manufacturing a semiconductor integrated circuit device, a semiconductor integrated circuit device and a semiconductor chip, and mainly relates to the technology for assigning identification information unique to semiconductor integrated circuit devices or semiconductor chips to identify individual semiconductor integrated circuit devices or semiconductor chips.

BACKGROUND ART

A semiconductor integrated circuit device can be utilized in a variety of desired manners based on identification information unique thereto, if such identification information is assigned. If unique identification information can be set to semiconductor integrated circuit devices on a one-by-one basis, a novel manufacturing method and product management technique, demonstrated by the inventors, can be provided under the utilization of the unique identification information, as described later.

When a fault occurs at a stage such as an actual use stage of a semiconductor integrated circuit device, factors causing the fault is readily pursued if unique identification information can be retrieved from the semiconductor integrated circuit device. For example, a semiconductor maker can acquire information such as the manufacturing term, manufacturing line, manufacturing lot, testing history, design information and the like based on the unique identification information of the semiconductor integrated circuit device. This facilitates the pursuit of factors which cause the fault and countermeasures to be taken therefor.

The marking based on an ink printing method or a laser impressing method given to a package, which forms part of a semiconductor integrated circuit device, can be regarded as one type of identification information. While this type of marking mainly comprises a product model name of the semiconductor integrated circuit device, the product model name may be accompanied by a code representation of the manufacturing term such as year, week and the like. However, with this type of marking representation, it is difficult to set unique identification information to semiconductor integrated circuit devices on a one-by-one basis, which can be manufactured in large quantity or manufactured over a long term as industrial products, due to the shortage of the amount of information which can be represented thereby.

It can be assumed to set a programmable element such as a fuse element to a semiconductor chip which forms part of a semiconductor integrated circuit device and to give unique identification information inherent to the programmable element. However, if the original semiconductor integrated circuit device does not need a program element, this type of assumable technique would disadvantageously cause a complicated manufacturing process and an increased cost of the semiconductor integrated circuit device due to the requirement for an additional manufacturing step for the programmable element. The manufacturing process will be free from additional complication if the semiconductor integrated circuit device originally has a programmable element. Even in this case, an additional or modified manufacturing step is needed for writing unique recognition information into the programmable element.

In a know technique referred to as "silicon signature," a product model name or unique information is written into a semiconductor integrated circuit device in such a manner that they can be electrically read out. However, this type of technique requires an additional or modified manufacturing step for writing the information, as is the case with the foregoing.

The inventors were informed, through an investigation after the present invention had been made, that inventions described in JP-A-6-196435, JP-A-10-055939, JP-A-11-214274, JP-A-7-335509, and JP-A-7-050233 existed as related to the present invention, later described. Either of the inventions described in the official documents is recognized to require an extra manufacturing step for writing unique identification information into each chip. However, these official documents are not recognized to include any description related to a method for identifying a semiconductor integrated circuit device which does not particularly require an additional or a modified manufacturing step as the present invention, later described.

It is therefore an object of the present invention to provide a semiconductor integrated circuit device or a semiconductor chip which can be individually identified in a simple configuration, and a method for identifying a semiconductor integrated circuit device or a semiconductor chip. It is another object of the present invention to provide a semiconductor integrated circuit device which is capable of identifying individual semiconductor integrated circuit devices or semiconductor chips with a high reliability. It is a further object of the present invention to provide a rational method for manufacturing a semiconductor integrated circuit device. The above and other objects and novel features of the present invention will become apparent from the description of the specification and the accompanying drawings.

DISCLOSURE OF THE INVENTION

Representatives of the inventions disclosed in this application are briefly described in summary as follows. Specifically, in course of a manufacturing process of semiconductor integrated circuit devices, a plurality of identification elements having the same arrangement are formed and the relation of magnitude in a physical amount corresponding to variations in the process of the plurality of identification elements is employed as the basis for identification information unique to the semiconductor integrated circuit device.

BRIEF DESCRIPTION OF THE DRAWINGS

FIG. 7 is a circuit diagram illustrating a specific embodiment corresponding to the embodiment of FIG. 5;

FIG. 17 is a circuit diagram illustrating another embodiment of the identification number generator circuit according to the present invention;

FIG. 18 is a waveform chart for describing the operation of the circuit in the embodiment illustrated in FIG. 17;

FIG. 19 is a block diagram illustrating another embodiment of the identification number generator circuit according to the present invention;

FIG. 30 is an explanatory diagram showing an exemplary comparison method in the foregoing FIG. 29;

FIG. 31 is an explanatory diagram showing a comparison method when using the order of logical threshold values in a CMOS inverter circuit;

FIG. 64 is an explanatory diagram of the identification number according to the present invention;

BEST MODE FOR CARRYING OUT THE INVENTION

For discussing the present invention in greater detail, the invention will be described with reference to the accompanying drawings.

Figure 1:
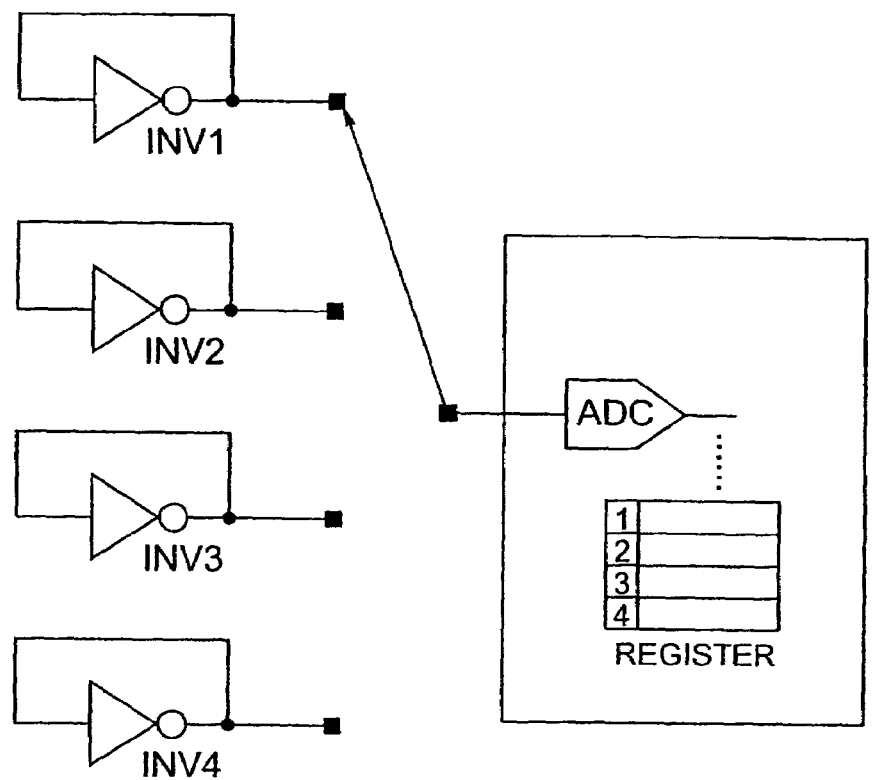
FIG. 1 is a basic circuit diagram illustrating one embodiment of an identification number generator circuit according to the present invention.

FIG. 1 illustrates a basic circuit diagram of one embodiment of an identification number generator circuit according to the present invention. CMOS inverter circuits INV1 to INV4 are configured to have the same characteristics as one another within an actually controllable range on the design and manufacturing of a semiconductor integrated circuit device. A specific configuration suitable for the present invention in order to provide a plurality of inverters with the same characteristics as one another will be better understood with reference to later FIG. 22 and description thereon. Therefore, a technique for providing the same characteristics as one another will be generally described below.

In a CMOS inverter circuit, it is understood that its characteristics are generally determined by the relative conductance of a P-channel MOSFET and an N-channel MOSFET which comprise the CMOS inverter circuit. In this respect, it can be understood that CMOS inverters having the same characteristics can be implemented by MOSFETs which have the same ratio W/L of a channel width W to a channel length L but have different sizes. However, the influence on the electric characteristics due to variations in semiconductor integrated circuit devices during the manufacturing is different for elements of different sizes.

In the embodiment, preferably, the plurality of CMOS inverters INV1 to INV4 are each implemented by elements, forming parts of the respective CMOS inverter, which have the same structure and the same size as one another. It goes without saying that these elements are manufactured in accordance with the characteristics of semiconductor integrated circuit devices which are manufactured in batches under the same process. In this way, the plurality of CMOS inverters INV1 to INV4 uniformly suffer from the influence due to manufacturing variations such as variations in machining dimensions during the manufacturing of semiconductor integrated circuit devices, variations in thicknesses of various layers, variations in impurity concentrations, and the like.

In the CMOS inverter circuit which has short-circuited input and output as illustrated in FIG. 1, an output voltage reaches a logical threshold value voltage. When all the CMOS inverter circuits have completely the same electric characteristics, the four inverter circuits INV1 to INV4 have an equal potential at a short-circuited node. However, this is an ideal condition, and in an actual semiconductor device, slight differences in the characteristics result in a difference in the potential at the input/output short-circuited nodes of the respective inverter circuits INV1 to INV4, i.e., the logical threshold value voltage.

It may be understood that the variations in the logical threshold value in the CMOS inverter circuits are dominated by variations in the MOS transistor characteristics. Also, the cause for the variations in the MOS transistor characteristics can be the gate width of the MOS transistor, the film thickness of a gate insulating film, a conduction determinant impurity concentration, its distribution, and the like. These variations can be classified into a macroscopic aspect and a microscopic aspect. The macroscopic aspect includes variations in the gate width among a plurality of wafers in the same lot.

The invention of this application mainly utilizes the variations in the microscopic aspect, and uses variations among elements which are disposed in relatively close proximity to one another. This is because such microscopic variations are observed as randomly generated in elements arranged in relatively close proximity to one another.

Specifically, variations in the logical threshold value in the inverter circuits INV1 to INV4 in FIG. 1 can also be thought to be random. The variations in the logical threshold value constitute the basis of a solution which involves "extracting variations in a characteristic feature possessed by a semiconductor element as unique identification information," which is a problem to be solved by this application. When CMOS inverter circuits are used, variations occurring in the logical threshold value can be regarded as the sum of variations possessed by an N-channel MOS transistor and variations possessed by a P-channel MOS transistor, wherein a wide variation range permits an identification number or identification information to be generated in an effective manner.

In the embodiment illustrated in FIG. 1, the order of magnitude is determined for the logical threshold values of the four inverter circuits INV1 to INV4. Specifically, voltages at the short-circuited input/output nodes in the respective CMOS inverter circuits INV1 to INV4 (corresponding to the logical threshold value) are selected by a switch and sequentially inputted to an analog/digital converter ADC. A quantized measurement (digital signal) is stored in a register for comparing the magnitude by a digital comparator or the like, not shown.

In other words, the digitized logical threshold values of the four CMOS inverter circuits INV1 to INV4, stored in the register, are compared by a comparator or the like with respect to the magnitude, and are arranged in a descending order or an ascending order. When a semiconductor integrated circuit device formed with the identification number generator circuit is mounted with a processor such as CPU, this may be used for the comparison of magnitude in software.

For example, digital values are stored corresponding to numbers 1 to 4 assigned to the CMOS inverter circuits INV1 to INV4, and the order is determined through the comparison of magnitude, for example, such as 1-3-2-4. Identification information is then generated based on the order of 1-3-2-4.

Figure 2:
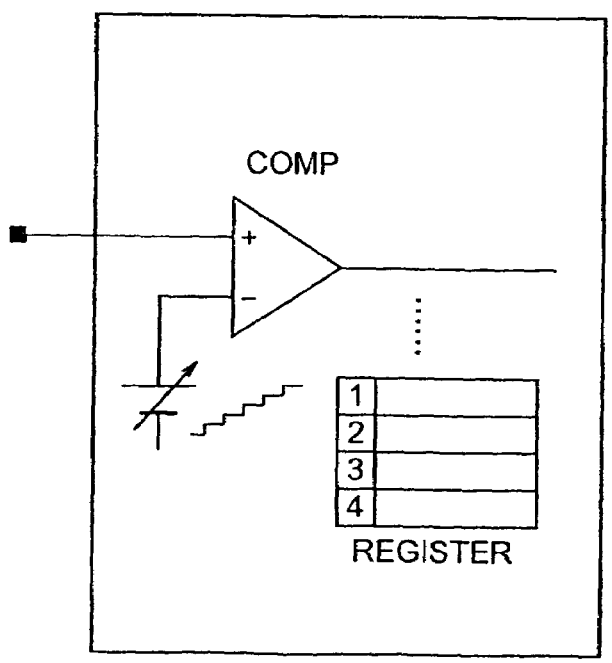
FIG. 2 is a basic circuit diagram illustrating another embodiment of the identification number generator circuit according to the present invention.

FIG. 2 illustrates a basic circuit diagram of another embodiment of the identification number generator circuit according to the present invention. In this embodiment, an analog comparator COMP is employed. In this embodiment, a voltage corresponding to the logical threshold value of each of the CMOS inverter circuits INV1 to INV4 is sequentially supplied by the switch for comparison with a reference potential of the comparator COMP. This reference voltage is changed in steps, and a detected level is stored in a register when a comparison result of the comparator changes from a low level to a high level, followed by comparing the magnitudes of the logical threshold values of the CMOS inverter circuits INV1 to INV4. Specifically, the logical threshold value is regarded as being smallest when the output signal of the comparator changes from the low level to the high level with the lowest reference voltage.

The identification number generator circuits illustrated in FIGS. 1 and 2 require circuits such as the high resolution analog/digital converter ACD, comparator COMP, step voltage generator, and the like, i.e., those circuits which do not appear in digital circuits or logical circuits.

Figures 3, 4:
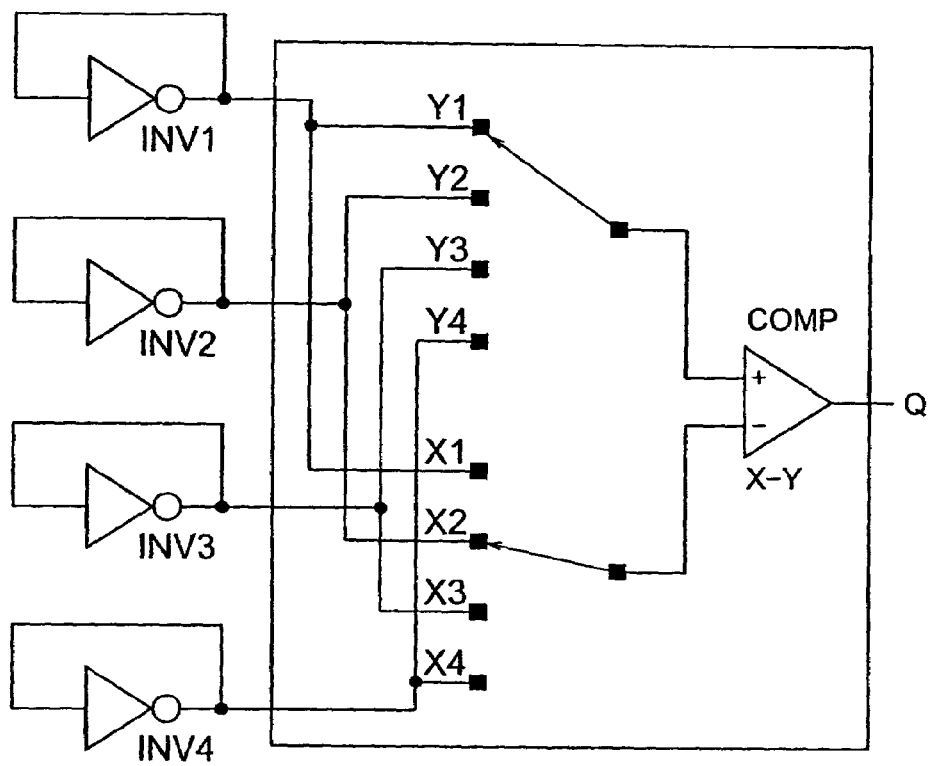
FIG. 3 is a basic circuit diagram illustrating another embodiment of the identification number generator circuit according to the present invention.
FIG. 4 is a diagram for describing the operation of the identification number generator circuit of FIG. 3.

FIG. 3 illustrates a basic circuit diagram of another embodiment of the identification number generator circuit according to the present invention. This embodiment takes into account to readily implement a form which may utilize a type of cell that substantially comprises a digital circuit or a logical circuit. In this embodiment, logical threshold values of the four CMOS inverter circuits INV1 to INV4 are combined two by two for comparison by the comparator COMP. The logical threshold values of these CMOS inverter circuits INV1 to INV4 are compared in round robin (league tournament).

FIG. 4 is a diagram for describing the operation of the identification number generator circuit in FIG. 3, showing an exemplary result of the round robin comparison. FIGS. 4(A) and (B) are, so to speak, match tables indicating to make on-state every one of switches Y1 to Y2 and switches X1 to X4, wherein a symbol "+" is written into the figure when a positive (high level) result is presented by subtracting the potential at a short-circuited node of a CMOS inverter circuit selected by a switch (×) connected to a non-inverting input terminal (−) of the comparator COMP from the potential at a short-circuited node of the CMOS inverter circuit (i.e., the logical threshold value voltage) selected by a switch (Y) connected to a non-inverting input terminal (+) of the comparator COMP, while a symbol "−" is written when a negative (low level) result is presented. "*" indicates a self match (no match) and therefore is invalid.

Referring to FIG. 4(A), Y1 has three "+", i.e., a clean score. Then, Y2 has two "+"; Y3 has one; and Y4 has zero (complete defeat). Specifically, since the logical threshold values (VLT) of the CMOS inverter circuits can be determined in magnitude with the number of "+," they are in the order of VLT1 (logical threshold value of INV1)-VLT2-VLT3-VLT4.

FIG. 4(B) shows another example. It is assumed herein that apparent differences exist among the logical threshold values of the respective CMOS inverter circuits. Specifically, actual games and the like involve draw matches and competitors having the same number of wins. A draw match is represented by (=). When there is such a draw match (=), Y1 and Y2 are at the same rank, while Y3 and Y4 are also at the same rank, failing to establish the order as mentioned above. Also, while the comparison (game) is made 16 times in this embodiment, the minimum number of games with n teams in round robin is n(n−1)/2 with suffice, so that six times may be actually sufficient.

The embodiment of FIG. 3 is composed of one comparator and two selector circuits in a relatively simple configuration as compared with the embodiments of FIGS. 1 and 2. However, since the identification number generator circuit employs the comparator COMP which is an analog circuit, it may encounter difficulties in the formation in a semiconductor integrated circuit device such as a gate array and logic ASIC.

Figure 5:
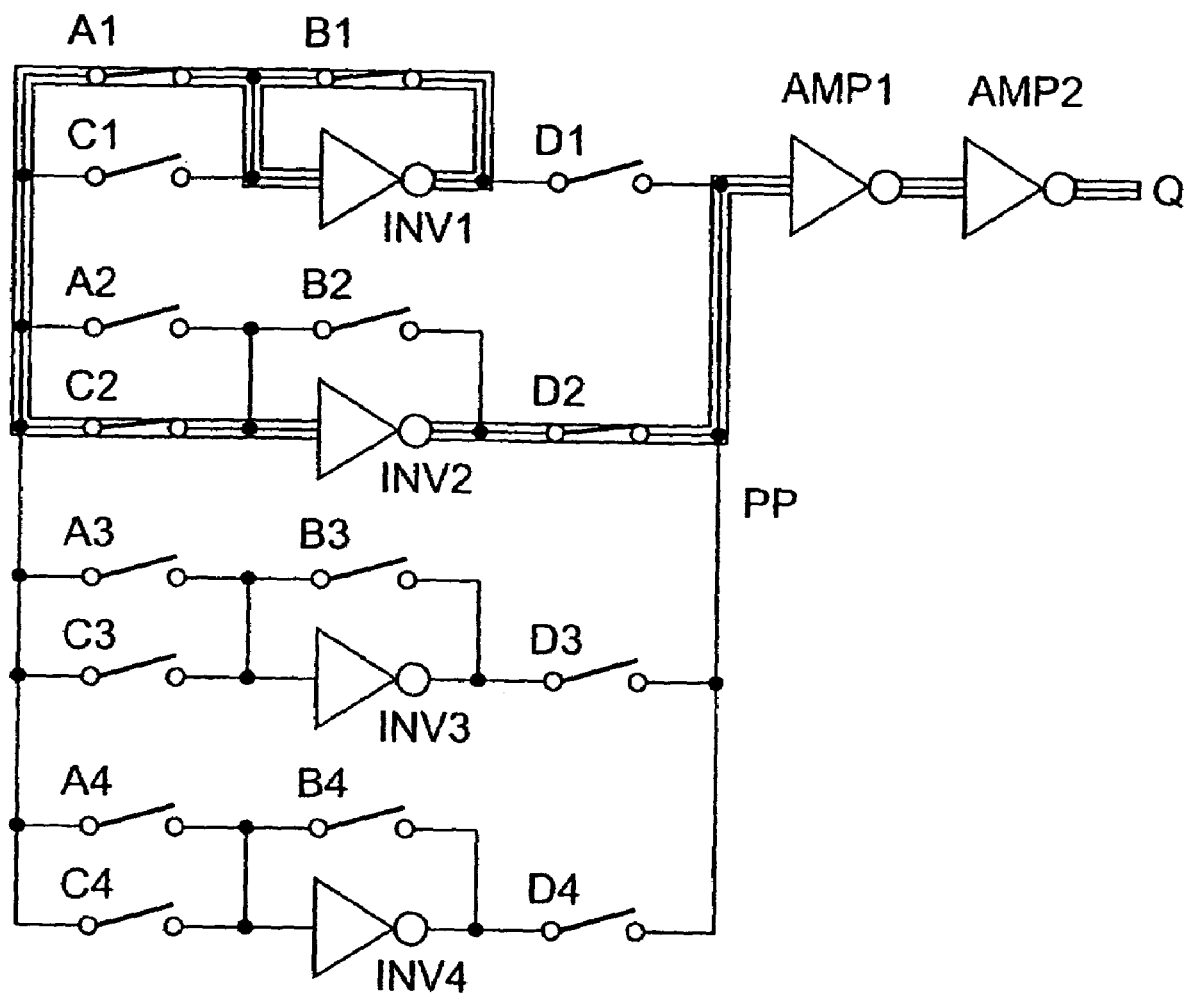
FIG. 5 is a basic circuit diagram illustrating another embodiment of the identification number generator circuit according to the present invention.

FIG. 5 illustrates a basic circuit diagram of another embodiment of the identification number generator circuit according to the present invention. This embodiment does not employ any analog circuit as in the embodiments of FIGS. 1 to 3, but represents a basic circuit composed only of a CMOS logic circuit and a MOSFET switch.

All the CMOS inverter circuits INV1 to INV4 in FIG. 5 have the same size. Each of the CMOS inverter circuits INV1 to INV3 is provided with four switches. Switches A (A1 to A4) and B (B1 to B4) are simultaneously opened and closed in association with each other. Likewise, switches C (C1 to C4) and D (D1 to D4) are also opened and closed in association with each other.

Figure 6:
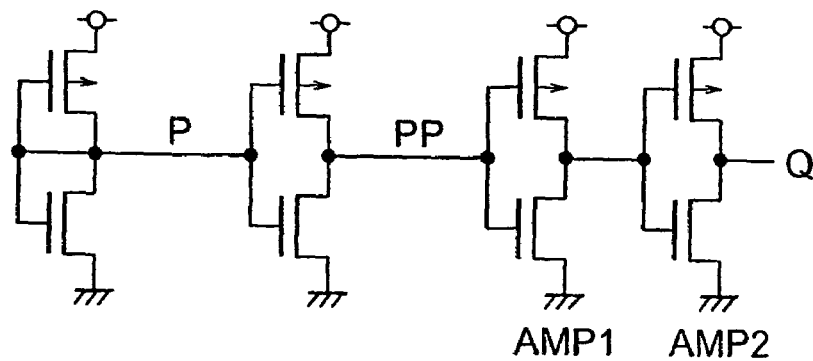
FIG. 6 is an equivalent circuit diagram for describing the circuit in the embodiment of FIG. 5.

FIG. 6 illustrates an equivalent circuit corresponding to open/close states of the switches for describing the circuit in the embodiment of FIG. 5. In FIG. 5, switches A1, B1, C2, D2 are closed (on-state). The switch B1 short-circuits the input/output of the CMOS inverter circuit INV1, and the voltage at the short-circuited node is supplied to a common node P through the switch A1. A potential at the common node P is applied to the input of the CMOS inverter circuit INV2 through the switch C2, and the output of the CMOS inverter circuit INV2 is supplied to a common node PP through the switch D2. Amplifier circuits AMP1 and AMP2 are configured of CMOS inverter circuits which are congruent in shape with INV1 to INV4.

In the equivalent circuit of FIG. 6, the input and output of the CMOS inverter circuit INV1 are short-circuited by the switch B1 which is turned on, and the potential at the common node P is equal to the logical threshold value of the CMOS inverter circuit INV1 by the action of the switch A1 which is turned on. The input to the CMOS inverter circuit INV2 is connected to the common node P through the switch C2 which is turned on. If the CMOS inverter circuits INV1 and INV2 have completely the same electrical characteristics, the potential at the common node PP connected to the output of the CMOS inverter circuit INV2 is equal to that at the common node P. Similarly, the amplifier circuits AMP1 and AMP2 also have the same potential at output nodes. In other words, the input/outputs of the four inverters are all equal to the logical threshold value voltage of the CMOS inverter circuit INV1. However, this is an ideal condition, and in an actual semiconductor device, slight differences in the characteristics result in different potentials at the respective nodes.

For example, when the logical threshold value VLT1 of the CMOS inverter circuit INV1 and the logical threshold value VLT2 of the CMOS inverter circuit INV2 are in a relationship represented by VLT1<VLT2, the potential at the common node PP is higher than the potential at the common node P. Conversely, when VLT1>VLT2, the potential at the common node PP is lower than the potential at the common node P.

The CMOS inverter circuit, which is a high gain inverting amplifier, has a gain which varies depending on the operation point. A maximum gain is provided when an input potential is near the logical threshold value of the CMOS inverter circuit. Generally, the CMOS inverter circuit has an inverting gain in a range of several tens to one hundred times near the logical threshold value thereof.

Therefore, the difference between the logical threshold values of the CMOS inverter circuits INV1 and INV2 in FIG. 6 is amplified by the CMOS inverter circuit INV2 at the later stage. Specifically, the logical threshold value voltage generated by the former CMOS inverter circuit is compared in magnitude with the logical threshold value voltage of the later CMOS inverter circuit itself, as a reference voltage, and amplified.

The amplification is also made by the amplifier circuits AMP2, AMP3, so that the difference between the logical threshold values of the CMOS inverter circuits INV1 and INV2 is amplified by a factor of several tens of thousands of times by the CMOS inverter INV2 and amplifier circuits AMP1, AMP2. Finally, a CMOS supply voltage amplitude signal can be generated at a node Q. Specifically, the result of a comparison of magnitude between the logical threshold values of the two CMOS inverter circuits INV1 and INV2 (a positive or negative sign) can be detected by the CMOS amplitude signal.

By changing a combination of opened and closed switches as in FIG. 6, all the CMOS inverter circuits INV1 to INV4 can be readily compared to provide the result as shown in FIG. 4(A). In this way, the circuit in this embodiment is suitable for a comparison of logical threshold values of CMOS inverter circuits.

Specifically, with a combination of CMOS inverter circuits and switches, a single CMOS inverter circuit can be used as a source of the logical threshold value voltage, or can be used as a determination circuit for determining a logical threshold value voltage generated by another CMOS inverter circuit, so that an extra comparator is not required, making it possible to significantly simplify the circuit configuration. Moreover, since the entirety, including the CMOS inverter circuits, is built by MOSFETs which perform switching operations, no particular difficulties will be experienced when mounted in a semiconductor integrated circuit device such as a gate array and a logic ASIC.

FIG. 7 illustrates a circuit diagram of a specific embodiment corresponding to the embodiment of FIG. 5. The CMOS inverter circuits INV1 to INV4 and amplifier circuits AMP1, AMP2 are CMOS inverter circuits in congruent shape. In this embodiment, N-channel MOSFETs are used as the aforementioned switches. Then, a binary counter and a decoder are provided for forming control signals Y1 to Y4 and X1 to X4 for these switches.

The CMOS inverter circuit INV1 is taken as an example in the following description. The control signal X1 is supplied to the gate of a switch MOSFET which short-circuits the input and output of the CMOS inverter circuit INV1, and a switch MOSFET which connects the common node P to the input. The control signal Y1 is supplied to the gate of a switch MOSFET which connects the input of the CMOS inverter circuit INV1 to the common node P and a switch MOSFET which connects the output to the common node PP. Likewise, in the respective CMOS inverter circuits INV2 to INV4, the control signals X2 to X4 and control signals Y2 to Y4 are connected to the gates of the corresponding switch MOSFETs, respectively.

The binary counter is a binary counter having a total of four bits, which is reset by a reset signal RES and counts the number of pulses in a clock signal CLK supplied thereto. The decoder forms the control signals Y1 to Y4 corresponds to the lower two bits of a count output, and forms the control signals X1 to X4 corresponding to the higher two bits of the count output.

Figures 8, 9:
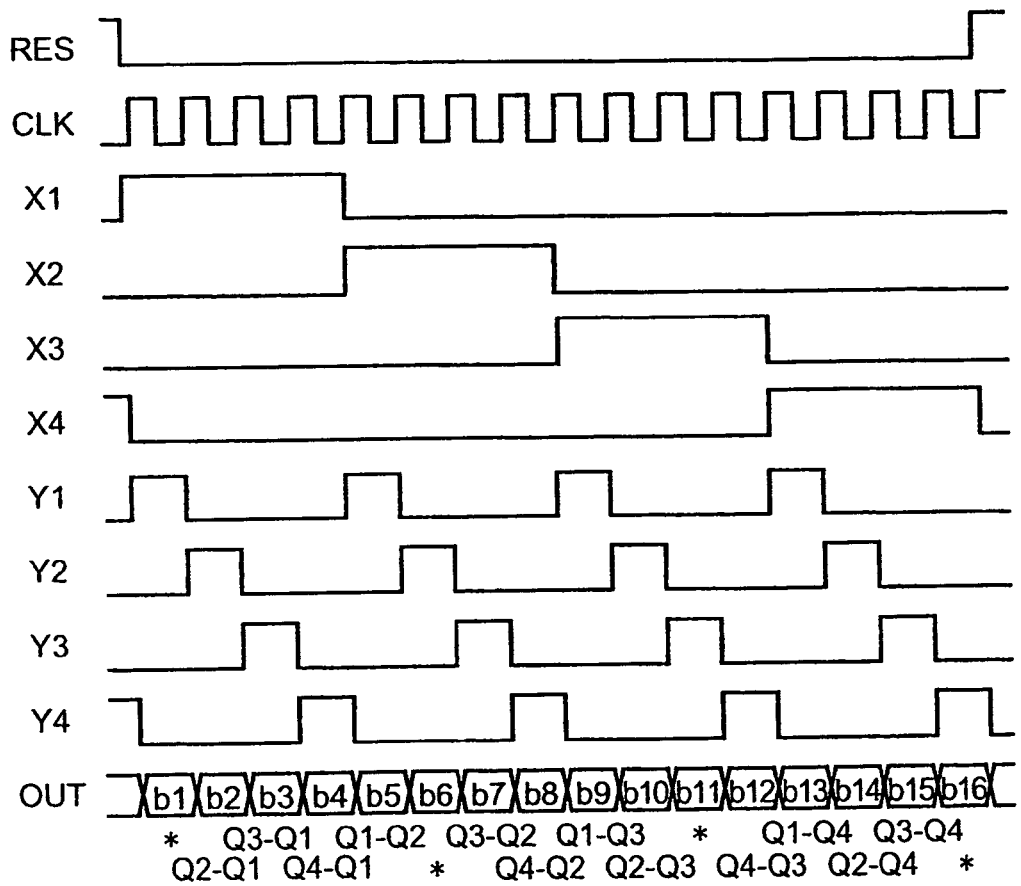
FIG. 8 is a timing chart for describing the operation of the circuit in the embodiment of FIG. 7.
FIG. 9 is a diagram for describing the operation of the circuit in the embodiment of FIG. 7.

FIG. 8 shows a timing chart for describing the operation of the circuit in the embodiment of FIG. 7. The reset signal RES is for initializing the binary counter. Here, the output of the binary counter is all "1" during a reset (RES="H") and immediately after the reset. Therefore, X4 and Y4 are active in the output of the decoder. The binary counter advances (+1) at the time the clock CLK first rises after the reset is released, so that the output changes to all "0." Therefore, the control signals X1 and Y1 are active in the output of the decoder.

Subsequently, the output of the binary counter repeatedly advances (+1) at the timing at which the clock signal CLK rises, causing the decoder to advance as shown in FIG. 8. Of course, it goes without saying that the output of the binary counter again returns to all "0" when the clock signal CLK rises 17 times. However, since necessary information can be retrieved up to 16 operations in this embodiment, the clock operations are not needed at the 17th time onward.

After the reset is released, the binary counter advances its counting operation each time the clock signal CLK rises, and information b1 to b16 delivered at an output node OUT each time is as shown in FIG. 9. As described above, the difference between the logical threshold values of the CMOS inverter circuits is amplified by the amplifier circuits AMP1, AMP2, and "H" (high level) is outputted at the output terminal when VLTQy−VLTQx>0, and "L" (low level) is outputted at the output terminal OUT when VLTQy−VLTQx<0.

Thus, the results of matches in round robin among the four CMOS inverter circuits INV1 to INV4 can be utilized as they are as the identification signals b1 to b16. Among the results b1 to b16 in the round robin of the four CMOS inverter circuits INV1 to INV4, those of self matches may be previously set to a particular level, high level or low level, as later described. Numbers 1 to 4 assigned to the four CMOS inverter circuits are replaced with 2-bit information pieces which can be arranged in the descending order, for example, as 1-2-3-4, so that resulting identification information can be compressed to one half, as 2×4=8 bits.

Figure 10:
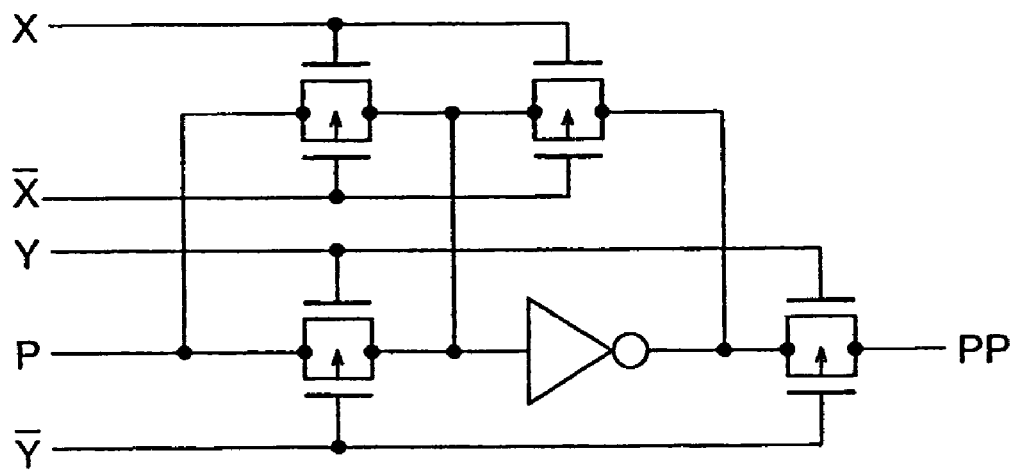
FIG. 10 is an exemplary modification illustrating one embodiment of a unit circuit which comprises a CMOS inverter circuit and switch MOSFETs which are the core of the identification number generator circuit according to the present invention.

FIG. 10 illustrates an exemplary modification of one embodiment of a unit circuit which comprises a CMOS inverter circuit and switch MOSFETs that are the core of the identification number generator circuit according to the present invention. In the circuit of FIG. 10, each of the four switch MOSFETs (A to D) in FIG. 5 is composed of a CMOS pair. Specifically, an N-channel MOSFET and a P-channel MOSFET are connected in parallel, and complimentary signals X and X/ are supplied to their gates, respectively.

When the CMOS switches are used in this manner, a voltage signal transmitted through the switch MOSFETs is not limited by the threshold value voltages, so that this is effective for a circuit which operates at a low voltage, wherein a voltage difference between a supply voltage or a ground potential of the circuit and the logical threshold value voltage, or a differential voltage between the supply voltage or the ground potential of the circuit and a voltage to be outputted to the common node PP is smaller than the threshold value voltage of the switch MOSFET.

Figure 11:
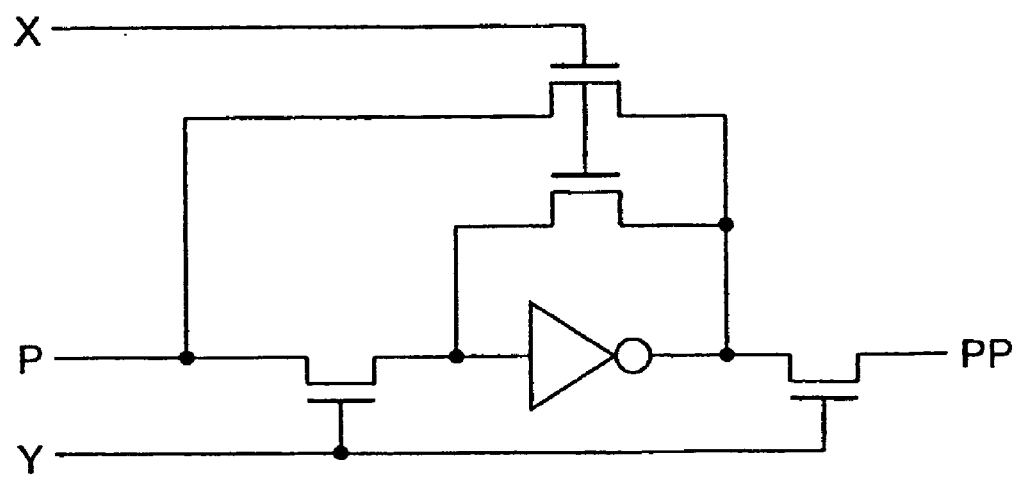
FIG. 11 is an exemplary modification illustrating another embodiment of the unit circuit which comprises a CMOS inverter circuit and switch MOSFETs which are the core of the identification number generator circuit according to the present invention.

FIG. 11 illustrates an exemplary modification of another embodiment of the unit circuit which comprises a CMOS inverter circuit and switch MOSFETs which are the core of the identification number generator circuit according to the present invention. The circuit in FIG. 11 changes the position of the N-channel switch MOSFET which supplies the common node P with the input/output short-circuit potential of the CMOS inverter circuit. In other words, the output side of the CMOS inverter circuit, which is short-circuited between the input and output, is connected to the common node P.

Figure 12:
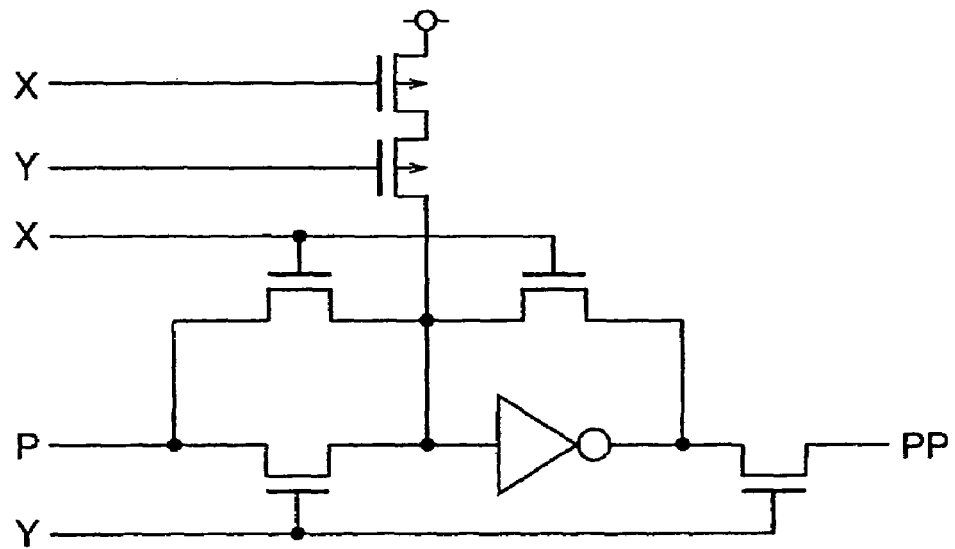
FIG. 12 is an exemplary modification illustrating another embodiment of the unit circuit which comprises a CMOS inverter circuit and switch MOSFETs which are the core of the identification number generator circuit according to the present invention.

FIG. 12 illustrates an exemplary modification of another embodiment of the unit circuit which comprises a CMOS inverter circuit and switch MOSFETs which are the core of the identification number generator circuit according to the present invention. The circuit of FIG. 12 comprises two P-channel MOSFETs which are connected in series between the input of the CMOS inverter circuit and a supply voltage terminal. These P-channel MOSFETs are supplied with selection signals X, Y at the gates, respectively. In this embodiment, when the CMOS inverter circuit is not selected, i.e., when neither the selection signal X nor Y is activated, the P-channel MOSFET is turned on to clamp the input of the CMOS inverter circuit at a high level such as a supply voltage to prevent a through current in the CMOS inverter circuit. Specifically, when the input of the CMOS inverter circuit is floating, a resulting intermediate potential can cause a large through current to flow between the N-channel MOSFET and P-channel MOSFET of the CMOS inverter circuit. Thus, the P-channel MOSFETs are provided to prevent the through current.

Figure 13:
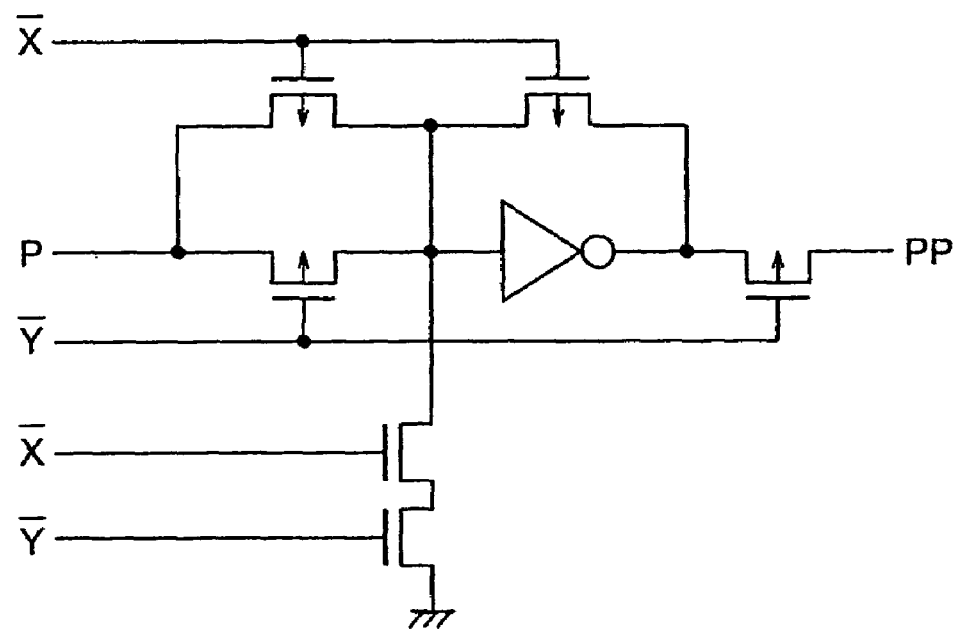
FIG. 13 is an exemplary modification illustrating another embodiment of the unit circuit which comprises a CMOS inverter circuit and switch MOSFETs which are the core of the identification number generator circuit according to the present invention.

FIG. 13 illustrates exemplary modification of another embodiment of the unit circuit which comprises a CMOS inverter circuit and switch MOSFETs which are the core of the identification number generator circuit according to the present invention. In the circuit of FIG. 13, the switch MOSFETs are changed from the N-channel MOSFETs as in the foregoing embodiment to P-channel MOSFETs, and the input of the CMOS inverter circuit is clamped to a low level by an N-channel MOSFET when it is placed in an inactive state. In this event, selection signals applied to the gates of the N-channel MOSFETs are inverted signals X/ and Y/.

Figure 14:
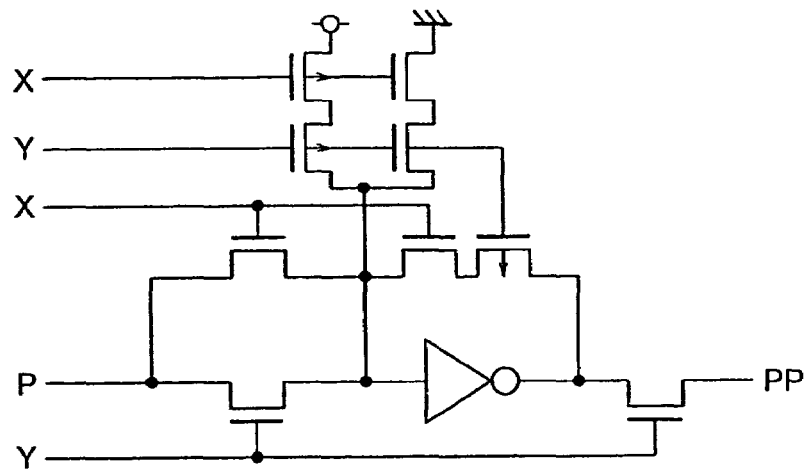
FIG. 14 is an exemplary modification illustrating another embodiment of the unit circuit which comprises a CMOS inverter circuit and switch MOSFETs which are the core of the identification number generator circuit according to the present invention.

FIG. 14 illustrates an exemplary modification illustrating another embodiment of the unit circuit which comprises a CMOS inverter circuit and switch MOSFETs which are the core of the identification number generator circuit according to the present invention. The circuit of FIG. 14 comprises two N-channel MOSFETs connected in series between the input of the CMOS inverter circuit and the ground potential of the circuit for preventing the common node PP from being indefinite at the aforementioned self match (no match), i.e., the output from being instable whether it becomes "H" or "L," and the input of the CMOS inverter circuit is clamped to a low level.

These N-channel MOSFETs are supplied with selection signals X and Y at the gates, respectively. In this way, the selection signals X, Y are at high level during a self match, and the input is supplied with the ground potential of the circuit. A short-circuit switch provided between the input and output of the CMOS inverter circuit is comprised of a series circuit of an N-channel MOSFET which receives the selection signal X and a P-channel MOSFET which receives the selection signal Y. In this way, the input and output are not short-circuited during a self match, and a high level can be outputted corresponding to the clamped low level supplied to the input. Also, the input is clamped to a high level such as a supply voltage, as is the case with the embodiment of FIG. 12, upon non-selection.

Figure 15:
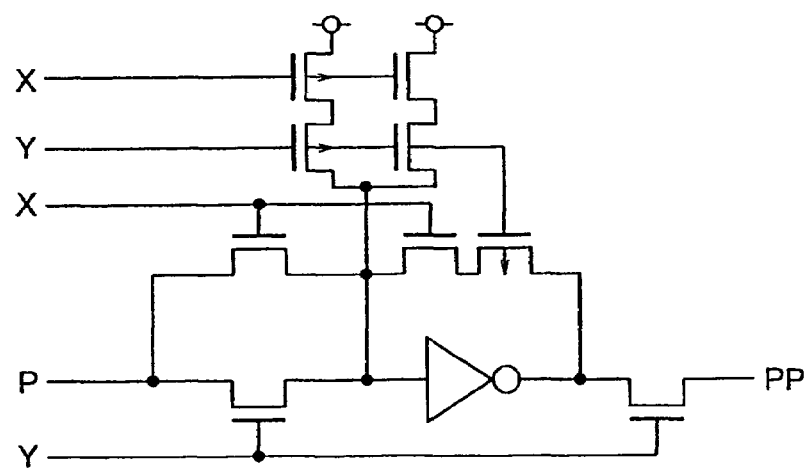
FIG. 15 is an exemplary modification illustrating another embodiment of the unit circuit which comprises a CMOS inverter circuit and switch MOSFETs which are the core of the identification number generator circuit according to the present invention.

FIG. 15 illustrates an exemplary modification illustrating another embodiment of the unit circuit which comprises a CMOS inverter circuit and switch MOSFETs which are the core of the identification number generator circuit according to the present invention. In the circuit of FIG. 15, the input of the CMOS inverter circuit is clamped to a high level for preventing the common node PP from being indefinite at the aforementioned self match (no match), i.e., the output from being instable whether it becomes "H" or "L," and the input of the CMOS inverter circuit is clamped to a low level. In a manner similar to the foregoing, for preventing short-circuit between the input and output during the self match, the short-circuit switch is comprised of a series circuit of an N-channel MOSFET and a P-channel MOSFET, as is the case with the embodiment of FIG. 14.

The object and effect of avoiding an indefinite level at the common node PP will be described later in detail. The respective exemplary modifications illustrated in FIGS. 10 to 15 may be implemented in combination. For example, the N-channel switch MOSFETs in FIG. 14 may be replaced with a CMOS pair.

In the embodiments of FIGS. 14 and 15, the self match (*) fields in FIG. 9 can be utilized to embed fixed information. Inherently, the self match field is indefinite, strictly speaking, this is the result of a comparison between the logical threshold values of each CMOS inverter circuit and amplifier circuit AMP, so that the identification ability will not be degraded even if information in this field is ignored or used for a different purpose. When the added N-channel MOSFETs in series connection are clamped to the ground potential or supply voltage as in FIGS. 14 and 15, the inputs of the CMOS inverter circuits INV1-INV4 can be biased to a low level or a high level side to arbitrarily set the output for the self match field.

In recent years, the semiconductor integrated circuit device technology is under progress for mounting bare chips on a substrate referred to as a build-up substrate, wherein either a product or a shipment date cannot be identified from the appearance, so that there is an increasingly high need for inserting a unique number for identifying the product or shipment date. Specifically, in System On Chip (SOC) as later described, individual product management becomes increasingly important, as to what is mounted on a base chip, which types of individual chips are combined, which chips should be combined, and the like. Therefore, the assignment of the unique number is advantageous.

Figure 16:
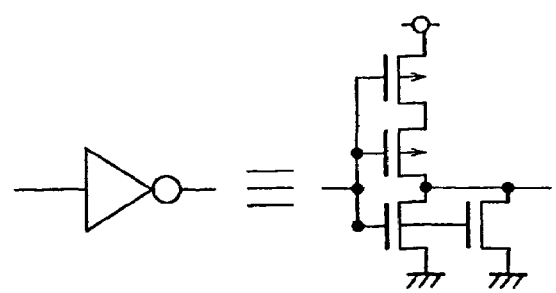
FIG. 16 is a circuit diagram illustrating one embodiment of a CMOS inverter circuit used in the identification number generator circuit according to the present invention.

FIG. 16 illustrates a circuit diagram illustrating one embodiment of a CMOS inverter circuit used in the identification number generator circuit according to the present invention. Generally, a CMOS inverter circuit comprises a P-channel MOSFET and an N-channel MOSFET arranged in series between a supply voltage and a ground potential of the circuit, their gates are connected in common for use as an input, and their drains are connected in common for use as an output. The CMOS inverter circuits INV1 to INV4 and amplifier circuits AMP1, AMP2 in the aforementioned embodiments can be each comprised of two MOSFETs as described above.

In contrast, in this embodiment, a CMOS inverter circuit is comprised of two P-channel MOSFETs and two N-channel MOSFETs. The two N-channel MOSFETs are connected in parallel between an output terminal and a ground potential point of the circuit, while the two P-channel MOSFETs are connected in series between the supply voltage and output terminal.

In this configuration, the N-channel MOSFETs have large conductance, whereas P-channel MOSFETs have small conductance. Specifically, a current flowing into the N-channel MOSFETs is set by the small conductance (large on-resistance) of the P-channel MOSFETs. Apparently, since a constant voltage can flow into the N-channel MOSFETs, the threshold value voltages of the two N-channel MOSFETs predominantly act on the logical threshold voltage of the CMOS inverter. In this way, the logical threshold value of the CMOS inverter circuit is less prone to the influence of fluctuations in the supply voltage.

With the P-channel MOSFETs operated as simple high resistance elements and the N-channel MOSFETS having the threshold value voltages predominantly acting on the logical threshold value, the resulting configuration is advantageously less prone to the influence of deteriorated element characteristics (NBTI), later described.

As will be later described, when an identification number generator circuit is comprised of a gate array, N-channel MOSFETs and P-channel MOSFETs have fixed element sizes, so that a plurality of MOSFETs may be combined as mentioned above to equivalently provide a different ratio of the element size of an N-channel MOSFET to the element size of a P-channel MOSFET to set a logical threshold value corresponding thereto.

FIG. 17 illustrates a circuit diagram of another embodiment of the identification number generator circuit according to the present invention. This embodiment illustrates a circuit for fixing a portion of an identification number to an arbitrary number in addition to the function so far described for generating a random identification number. In the embodiment illustrated in FIG. 7, 24 different identification numbers can be generated. The number of information bits are 16 bits including the self match result. Briefly describing the circuit in this embodiment, the output node (common node) P of the CMOS inverter circuit shown at the first stage in the aforementioned FIG. 6 is forcedly fixed to an arbitrary value. In this event, the first stage and second stage cannot be changed in the order.

In the circuit of this embodiment, from the circuit in the embodiment of FIG. 7, an output node corresponding to the CMOS inverter circuit INV1 is clamped to "H" (=VDD) by MOSFET Q11, and an output node corresponding to the CMOS inverter circuit INV2 is clamped to "L" (=VSS) by MOSFET Q21. Since the MOSFETs Q11 and Q12 for forming the thus clamped levels "H" and "L" are not inputs to the common node P, decode signals Y1 and Y2 are not needed. For this reason, the binary counter circuit is provided in a three-bit configuration, and the decoder circuit forms output signals as Y3, Y4.

FIG. 18 illustrates a waveform chart for describing the operation of the circuit in the embodiment illustrated in FIG. 17. There are four options at the first stage and two options at the second stage, so that a total of eight different outputs can be provided. In other words, the number of information bits are eight bits. In this embodiment, output signals b1 to b4 present "0," "0," "1," "1" at all times. The remaining b5 to 58 represent the result due to variations in logical threshold values of CMOS inverter circuits Q3 and Q4. This embodiment can generate only two different fixed numbers and two different random identification numbers at maximum.

In actual use, the fixed section and random section can be a combination of arbitrary sizes. A possible application may be such that the fixed section indicates a product code, and the random section indicates a sample number. A fixed identification number may be inserted into an information bit sequence in several other methods. For example, there are the method of replacing the self match field, the method of replacing one of repeated matches (comparison of changed first and second stages), as described in connection with FIGS. 14, 15. For actually implementing these circuits, a problem arises in that which part of a registration and matching system is burdened with the function, not only the circuit for generating identification numbers. However, in the overall system, the registration and matching functions are likely to be mainly implemented by computer software, so that advanced functions can be relatively readily implemented.

FIG. 19 illustrates a block diagram illustrating another embodiment of the identification number generator circuit according to the present invention. A logical threshold value determination unit, substantially represented by blocks in FIG. 19, is operated by a voltage V2, which is relatively low and stabilized, outputted from a power supply circuit shown in FIG. 19 and next described.

Specifically, a P-channel MOSFET applied with a ground potential of the circuit at its gate at all time operates as a loading means to supply an operating current to four N-channel MOSEETs serially connected in diode configuration which act as voltage regulator elements. In this way, a constant voltage V1 is formed corresponding to a constant voltage (threshold value voltage) between the gate and source of the N-channel MOSFETs in series connection, and is supplied as an operating current V2 for the logical threshold value determination unit through the gate and source of the N-channel MOSFET. The voltage supplied to such a logical threshold value voltage determination unit is made constant. As a result, the logical threshold values of the CMOS inverter circuits INV1 to INV4 and the like are less affected by fluctuations in the supply voltage VDD. In this way, a more stable operation can be expected for determining the logical threshold value.

In the invention of this application, it is not essential to provide a constant operating voltage to the logical threshold value determination unit as described above. Specifically, the invention of this application does not employ the absolute values of the logical threshold value voltages of a plurality of CMOS inverter circuits, but sets an identification number corresponding to a difference between the logical threshold value voltages of the individual CMOS circuits. Since the fluctuations in the supply voltage similarly affects the logical threshold value voltages of the respective CMOS inverter circuits, the relation of magnitude will not be significantly changed.

FIG. 19(B) illustrates a specific circuit for preventing aging changes of MOSFET. The threshold value voltage of a MOS transistor may undesirably fluctuate due to an electric field stress which depends on an electric field strength and temperature. Particularly, a phenomenon referred to as NBTI (Negative Bias Temperature Instability) remarkably appears in P-channel MOSFET. Often used as counter-measures to this is a method of applying a high voltage to the gate of the PMOS out of an intended time. In this embodiment, the ground potential VSS of the circuit of the logical threshold value determination unit is supplied from the N-channel MOSFET, and the N-channel MOSFET is turned on by a power supply control signal PON at high level in a logical threshold value determining operation to supply the ground potential VSS of the circuit. Then, except for the logical threshold value determining operation, the power supply control signal PON is brought to low level to turn off the N-channel MOSFET and to turn on the P-channel MOSFET to supply the supply voltage VDD to the ground potential side of the circuit as well. Then, the P-channel MOSFET is applied with a fixed gate voltage at the gate to supply the supply voltage VDD. In this way, the P-channel MOSFET is equi-potential, equal to the supply voltage VDD, at all of the gate, drain, source and substrate (channel), thereby minimizing fluctuations in the logical threshold value due to aging changes of the MOSFETs.

Figure 20:
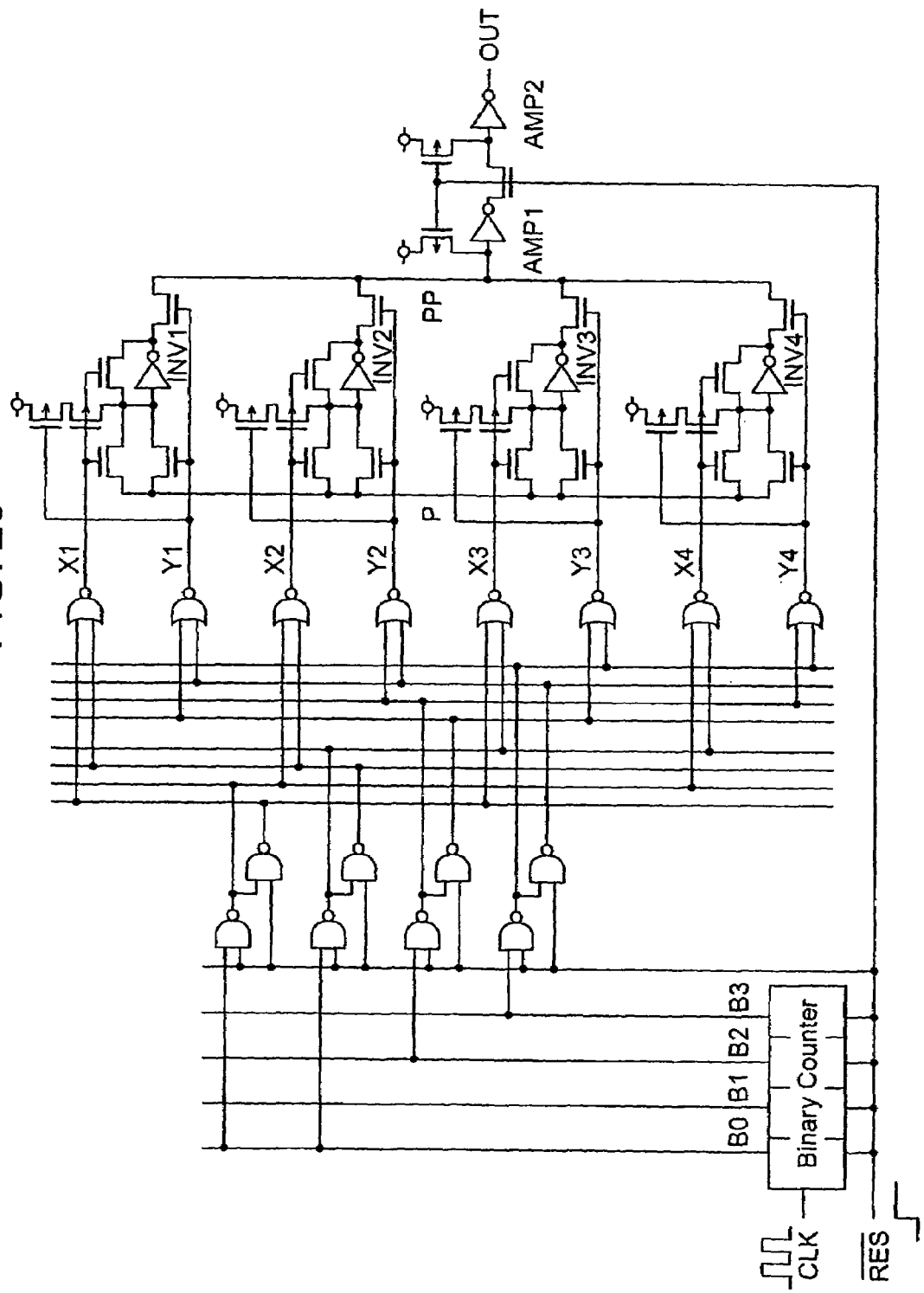
FIG. 20 is a block diagram illustrating another embodiment of the identification number generator circuit according to the present invention.

FIG. 20 illustrates a circuit diagram of another embodiment of the identification number generator circuit according to the present invention. In the circuit of this embodiment, a series circuit of P-channel MOSFET is provided at the input of each CMOS inverter circuit INV1 to INV4 to minimize fluctuations in the logical threshold value due to aging changes of the MOSFETs. At a reset, at which a signal RES/ is set to low level, the inputs of the CMOS inverter circuits INV1 to INV4 are clamped to the supply voltage.

Specifically, with the signal RES/ at low level (logical zero), output signals of AND gate circuits, which receive count outputs B0 to B3 of a binary counter circuit, are all set to high level (logical one). As a result, all of output signals Y1 to Y4 and X1 to X4 of NOR gate circuits, which form parts of a decoder circuit, transition to low level (logical zero), causing the P-channel MOSFETs in series connection arranged between the inputs of the respective CMOS inverter circuits INV1 to INV4 and the supply voltage VDD to turn on, thereby clamping them to the supply voltage. In this way, the supply voltage VDD is supplied to the gates of the P-channel MOSFETs which form parts of the respective CMOS inverter circuits INV1 to INV4.

Further, in this embodiment, the P-channel MOSFET, which is turned on by the signal RES/ at low level, clamps the inputs of the amplifier circuits AMP1 and AMP2 to the supply voltage VDD, to supply the voltage voltage to the gates of P-channel MOSFETs which form parts of the amplifier circuits.

Alternatively, the selection signals Y1 to Y4 may be all turned on to clamp the common input node P to the supply voltage. In any case, an action may be taken to control the gate voltages of the P-channel MOSFETs which form parts of the CMOS inverter circuits INV1 to INV4 and amplifier circuits AMP1, AMP2 in this manner, or to fully shut off the power supply to the identification number generator circuit. However, in the method of fully shutting off the power supply, it is necessary to take into consideration the electric separation of the element regions, in which the MOSFETs that form parts of the identification number generator circuit are formed, from other circuits. Specifically, this is because, even if the power supply is shut off, a constant voltage always applied to the substrate gate (channel) of MOSFET is not desirable from view point of the degradation in the element characteristics.

On the other hand, when attention is paid to such NBTI, a problem arises in a normal reliability guarantee. Specifically, the provision of a means for circumventing a stress as mentioned above disables screening of process defects which is performed in a so-called burn-in step. While there is no concern if the scale of the circuit is extremely smaller than the entire LSI, it should be advisable to bear in mind those applications which need the screening. In this event, a mode is provided for arbitrarily releasing a reset or a power-off in the burn-in step or the like.

Of course, it is well contemplated that the stress causes an identification number to fluctuate. However, a final identification number can be retrieved after the burn-in step for re-registration in a database, and even large fluctuations in the identification number exert small influence because lots treated in the burn-in step are limited in size in a range of several hundreds to several thousands.

Figure 21:
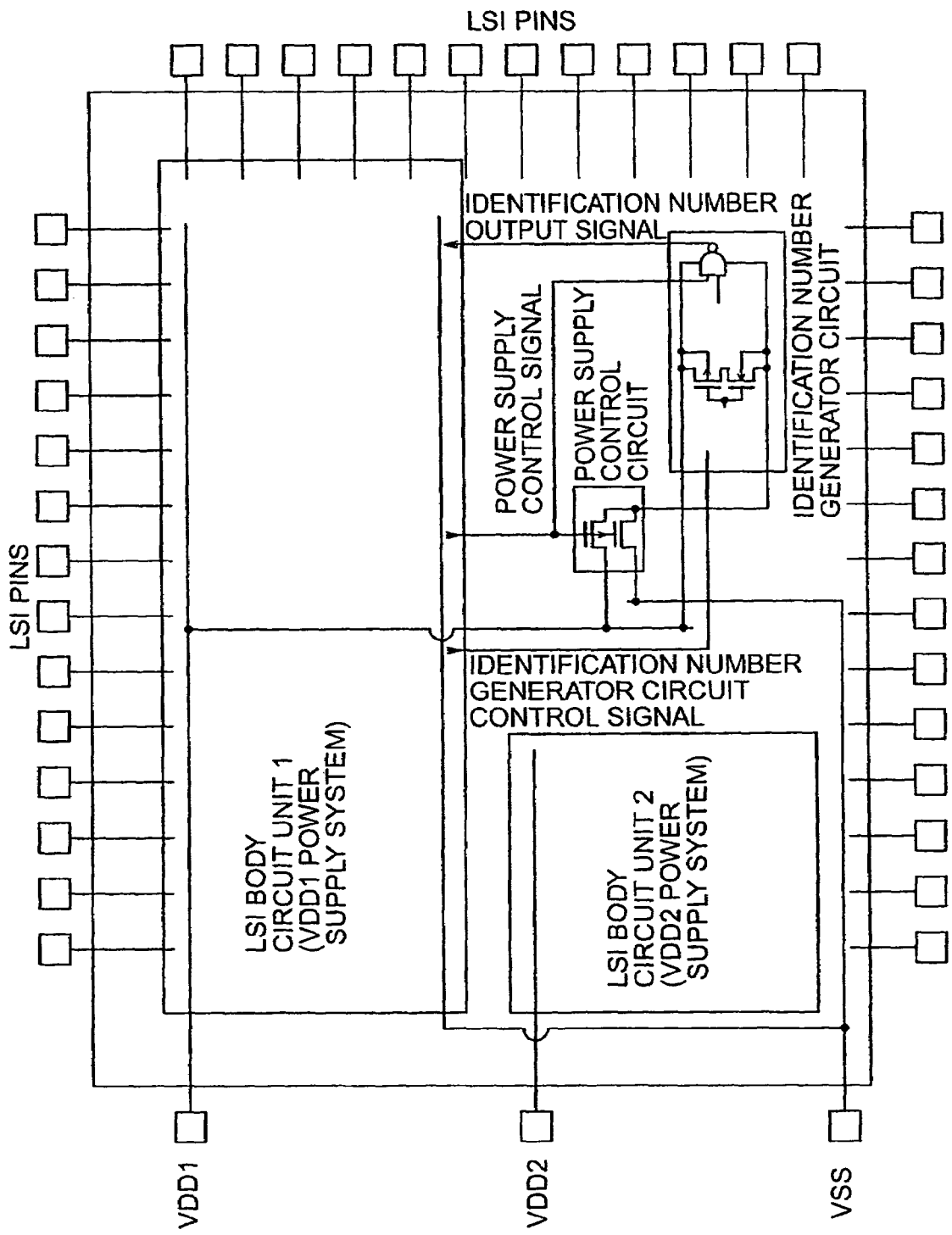
FIG. 21 is a general block diagram illustrating one embodiment of a semiconductor integrated circuit device according to the present invention.

FIG. 21 illustrates a general block diagram of one embodiment of a semiconductor integrated circuit device according to the present invention. This embodiment is directed to a power control for a system LSI which is mounted with the identification number generator circuit of this application. This system LSI employs two different types of power supplies VDD1 and VDD2 by way of example.

The identification number generator circuit receives the power supply from VDD1 in operation. Here, "in operation" refers to a time period for which an identification number is sent out in response to an identification number read request from the LSI circuit main unit 1. In other states, the power supply is shut off. A signal for controlling the power supply is a power supply control signal which is applied to a power supply control circuit. The power supply control circuit is composed of an N-channel MOSFET and a P-channel MOSFET which receive the power supply control signal at the gate. When the power supply control signal is at high level, the power supply of the identification number generator circuit is clamped to VSS, and an identification number output signal is clamped at low level. When the power supply control signal is at low level, the identification number generator circuit is supplied with VDD1. Circuits included in the illustrated identification number generator circuit are, for example, the logical threshold value determination circuit for CMOS inverter circuits, binary counter, and decoder, which are shown in FIG. 20, wherein the binary counter and decoder may be included in the LSI circuit main unit 1.

Figure 22:
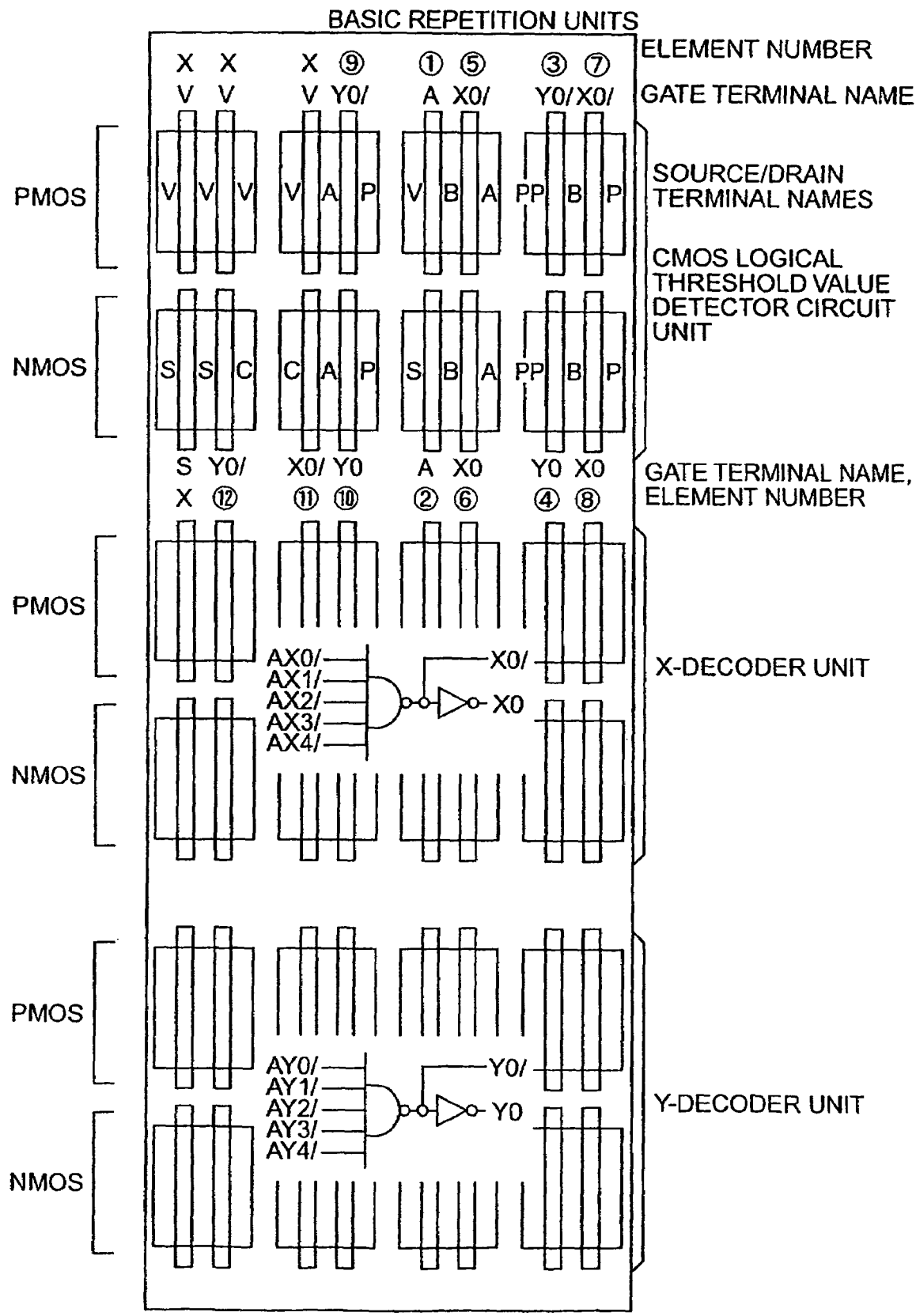
FIG. 22 is an element layout diagram illustrating one embodiment of the semiconductor integrated circuit device according to the present invention.

FIG. 22 illustrates an element layout diagram of elements in one embodiment which is suitable for the semiconductor integrated circuit device according to the present invention. Though the illustrated configuration is not particularly limited, the layout may be understood to be an example suitable for a so-called master-slice semiconductor integrated circuit device. For the ease of understanding, FIG. 22 only illustrates a plane pattern of active regions which comprise MOS transistors, and a wiring layer pattern such as metal wiring layers are omitted from the illustration. The essence of the technique will be well understood from the fact that even such a plane pattern predominantly affects the circuit characteristics which should be provided in the MOS transistors, but less affects the circuit characteristics which should be provided in wires such as metal wires.

The basic device structure itself of the semiconductor integrated circuit device is not directly related to the present invention, so that detailed description thereon is not made. However, this may be generally described as follows.

Specifically, a semiconductor device used herein is made of N-type single crystal silicon, and an N-type well region and a P-type well region are formed on the surface of the semiconductor substrate by a localized impurity introduction technique. An opening is formed for defining an active region in a so-called field insulating film which may be made of a silicon oxide film, disposed on the surface of the semiconductor substrate, and a gate insulating film is formed on the surface of the N-type well region and P-type well region, which are exposed through the opening, by a silicon thermal oxidization method or the like. A gate electrode layer, which may be made of a polycrystalline silicon layer, is selected on the gate insulating film and field insulating film. A P-type impurity is introduced using the gate electrode layer and field insulating film as substantial impurity introducing masks to form P-type semiconductor regions on the surface of the N-type well region for providing a source region and a drain region of a P-channel MOS transistor. Similarly, an N-type impurity is introduced using the gate electrode layer and field insulating film as substantial impurity introducing masks in a similar manner to form N-type semiconductor regions on the surface of the P-type well region for providing a source region and a drain region of an N-channel MOS transistor. This basic device structure is formed with desired wiring layers by known wiring layer forming technique and insulating layer forming technique.

In FIG. 22, a relatively small substantially square pattern defines an active region. One unit region is made up of the relatively small substantially square pattern and two elongated patterns in parallel with each other which are drawn to overlap the square pattern to mean gate electrode layers, respectively. For example, a unit region is made up of a relatively small square pattern positioned at an upper right end of the drawing and labeled with symbols PP, B, P, and two elongated patterns which are drawn to overlap the square pattern and labeled with symbols Y0/, X0/, respectively.

Thus, one active region is formed with two MOS transistors by two parallel gate-electrode layers, and semiconductor regions for the source and drain formed on the surface of the active region in self alignment to the two gate electrodes.

In FIG. 22, a plurality of unit regions for N-channel MOS transistors, and a plurality of unit regions for P-channel MOS transistors are arranged in columns as illustrated. In the column comprised of four unit regions for P-channel MOS transistors, located at the highest position (hereinafter referred to as the "first region column"), the respective unit regions are configured to have the same plane dimensions and the same extension direction as one another. Likewise, the respective unit regions in the column comprised of four unit regions for N-channel MOS transistors located immediately below the first column are configured to have the same plane dimensions and the same extension direction as one another. The first region column and second region column are provided to create an inverter and a switch MOS transistor connected thereto as in FIG. 20.

Similarly, a third region column and a fourth region column are provided to create an X-decoder unit, while a fifth region column and a sixth region column are provided to create a Y-decoder unit.

The entirety of the first region column to sixth region column in FIG. 22, each of which is comprised of four unit regions, is designated as a basic repetition unit. Specifically, a plurality of basic repetition units in FIG. 22 are arranged side by side in the lateral direction in FIG. 22 in accordance with a circuit scale to be achieved. According to this configuration, the first region columns in different basic repetition units also constitute a single column (also referred to as the "global region column") in the entire layout. Similarly, the second columns and onward constitute global region columns, respectively.

The layout in FIG. 22 and the repeated layout as mentioned above provide an example suitable for forming identification information of the present invention.

Instead of the layout in FIG. 22, if a plurality of unit regions which should make up the same region column are disposed across element regions or the like which make up other circuits and therefore are spaced by a relatively large distance from one another, the following difficulties may arise. Specifically, a plurality of unit regions significantly suffer from the influence exerted by macroscopic fluctuations in pattern dimensions as based on fluctuations in manufacturing conditions of the semiconductor integrated circuit device, or macroscopic fluctuations such as distorted patterns, resulting in a relatively large difference in pattern shape.

Since a mechanical stress applied to a semiconductor chip by mounting the semiconductor chip can differ from one site to another of the semiconductor chip, a plurality of unit regions can be applied with mechanical stresses which relatively largely differ from one unit region to another. A rise in operating temperature caused by a power supply current flowing through the circuit is not uniform in the plurality of unit regions. The thickness of the gate insulating film and a subtle change in the concentration of introduced impurities can be relatively increased due to the plurality of unit regions which are relatively distanced from one another.

In the layout of FIG. 22, a plurality of unit regions belonging to the same region column are disposed in relatively close proximity, and have the same size and the same direction as one another, so that they are less susceptible to the influence exerted by relative pattern dimensions, distorted patterns, mechanical stress, operating temperature, film thickness, and impurity concentrations, as mentioned above.

A so-called phase shift mask technique is understood to be an effective technique for miniaturizing circuit components, wires and the like, which make up a semiconductor integrated circuit device, to a so-called sub-micron level. In such a phase shift mask technique, a pattern can suffer from asymmetry or distortions such as a difference in shape in the left and right halves of a pattern to be formed, due to even a slight change in phase difference of light for exposing a photosensitive material layer which is later used as a mask. The layout as in FIG. 22 can sufficiently reduce deviated electric characteristics of a plurality of unit regions even if such a type of distorted pattern is present.

The influence exerted by the crystal orientation dependance of the carrier mobility in the semiconductor, together with the difference in configuration in the foregoing point of view, cannot be treated lightly for the present invention which utilizes the microscopic characteristics as mentioned above. In the layout of FIG. 22, the MOS transistors belonging to the first region column and the MOS transistors belonging to the second region column are free from the difference in the characteristics due to the crystal orientation dependency because all of a plurality of gate electrode layers forming part of the first region column are made in the same orientation and in the same pattern as one another, and all of a plurality of gate electrode layers forming part of the second region column are also made in the same orientation and in the same pattern as one another.

It will be understood from the foregoing that the layout of FIG. 22 is made in consideration of a significant reduction in the macroscopic variations or deviations in characteristics as mentioned above from the viewpoint of designing and manufacturing of the semiconductor integrated circuit device and in consideration of appropriate utilization of the microscopic variations as mentioned above.

When a need exists for more fully eliminating the deviations in electric characteristics of the MOS transistors created in the layout of FIG. 22, a dummy region can be set for solving an end effect of the overall array comprised of a plurality of the basic repetition units of FIG. 22. The dummy region is provided to make the ends of the overall array comparable to the interior of the overall array on the layout, and is comprised of at least a plurality of unit regions at the ends in the basic repetition units.

When this type of dummy region is not set, a machined shape of such ends can be affected depending on the configuration outside the ends in the overall array, and such ends and the remaining portions can be applied in different manners with a force which can affect the element characteristics, such as a stress produced between the semiconductor substrate and the insulating film on the surface thereof. They can be factors of causing the deviations in the electric characteristics. When the dummy region as mentioned above is set, the factors of causing the deviations in the electric characteristics are fully eliminated.

The dummy region can be provided as a region which is not utilized as a circuit or as a region for making other circuit which does not require attention to the deviations in the electric characteristics.

Figure 23:
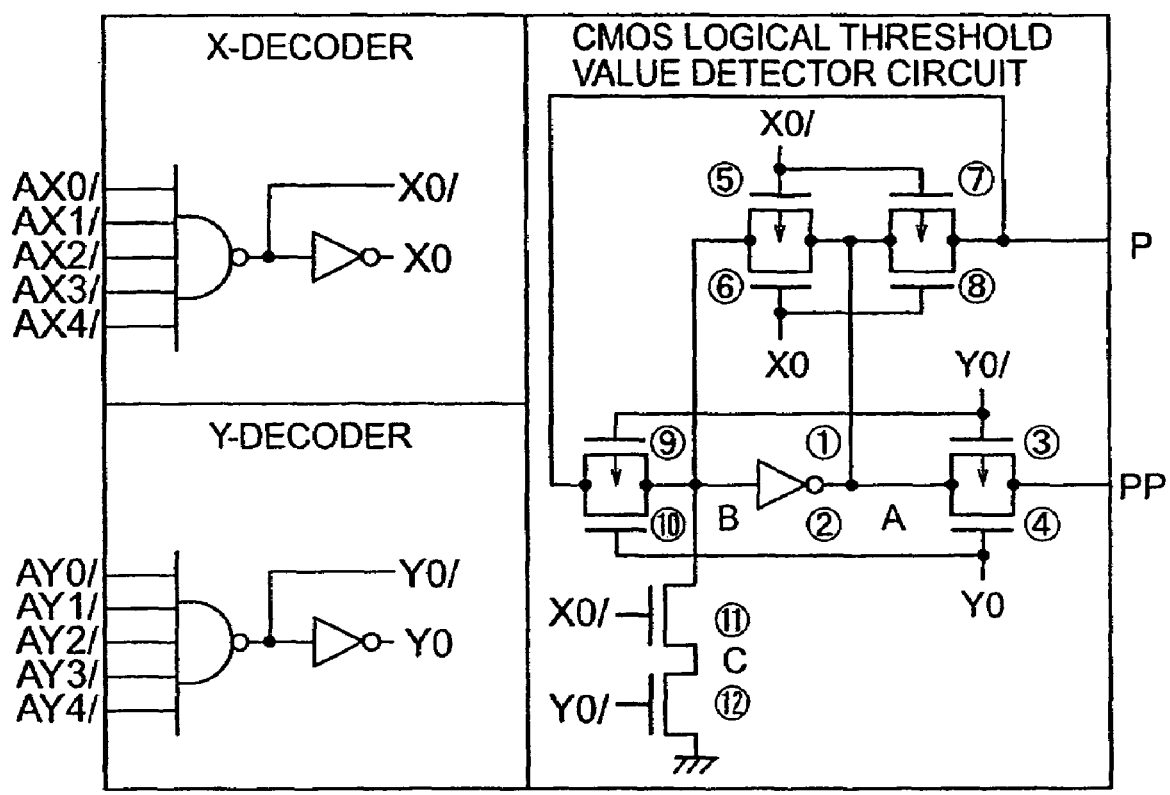
FIG. 23 is an equivalent circuit diagram corresponding to the foregoing FIG. 22.

FIG. 23 illustrates an equivalent circuit diagram corresponding to the foregoing FIG. 22. In FIGS. 22 and 23, the terminal names and element numbers are corresponding. However, details of the decoder unit are not illustrated because there are no particular restrictions except that it is disposed below (or above) the CMOS logical threshold value detector circuit. When the basic repetition units as in FIG. 22 are disposed in parallel, CMOS inverter circuits formed of elements can match the shape and surrounding environment with the same circuits adjacent thereto. In an layout scheme other than a gate array scheme, the basic repetition units may be laid out such that the CMOS inverter circuits are congruent. When the circuit is built using such gate arrays, the embodiment in FIG. 16 may be applied, in which case variations in the threshold value voltage of the N-channel MOSFET can be predominantly reflected to the logical threshold value, while reducing the influence of variations in the supply voltage.

Figure 24:
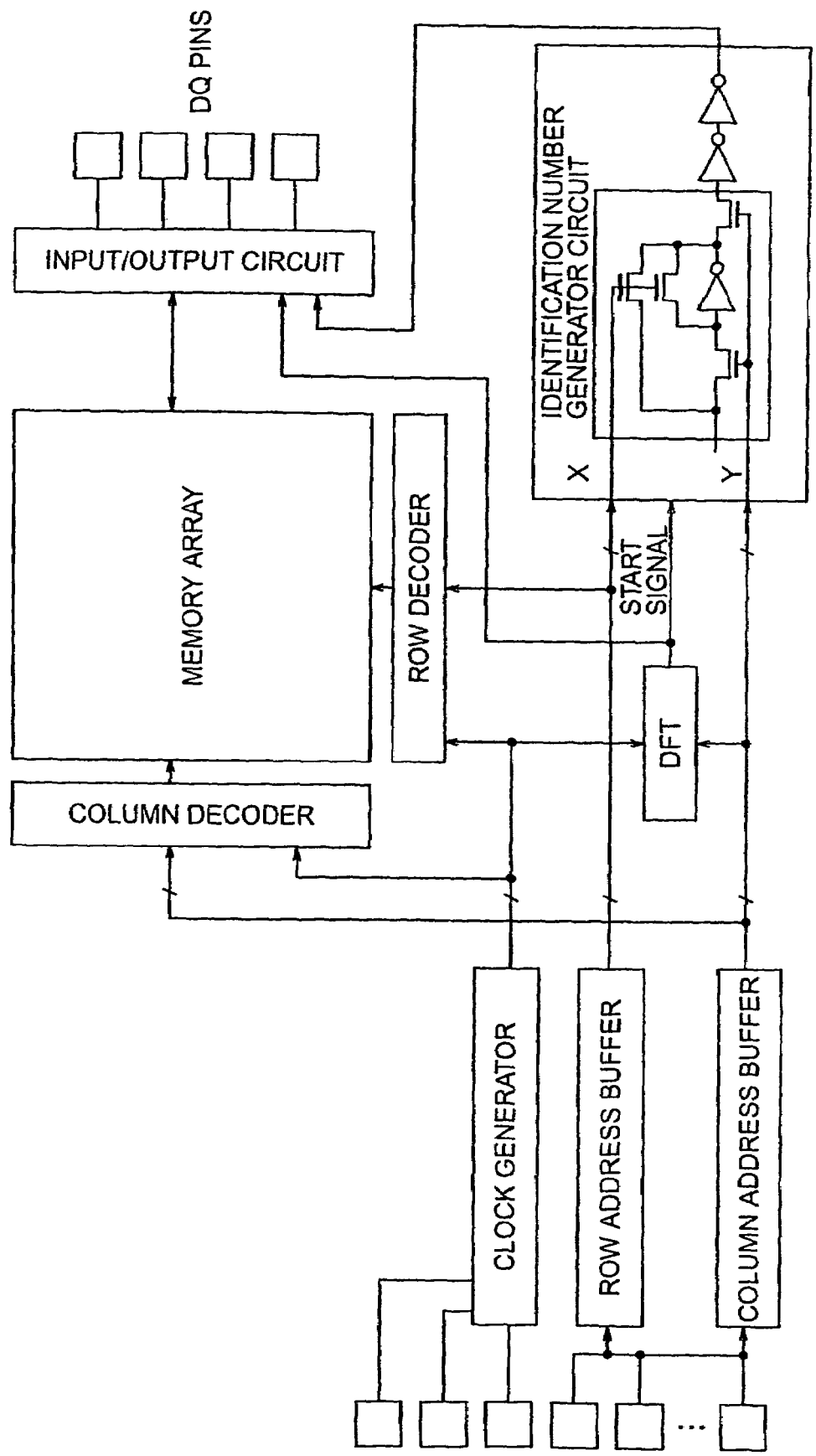
FIG. 24 is a block diagram illustrating one embodiment in which the present invention is applied to dynamic RAM.

FIG. 24 illustrates a block diagram of one embodiment when the present invention is applied to a dynamic RAM (random access memory, hereinafter simply referred to as the "DRAM"). In this embodiment, the binary counter and decoder are removed from the identification number generator circuit illustrated in FIG. 20 or the like. Instead of these counter and decoder, a row address signal and a column address signal of a DRAM, which is mounted with the same, are supplied with the signals X and Y, formed by the decoder, for direct use as a selection signal for the logical threshold value determination circuit of the CMOS inverter circuit. An identification number read mode is set for the DRAM, a start signal is generated by a circuit DFT, and address signals X and Y are supplied from the outside for the read, to output an identification number generated by the identification number generator circuit through an input/output circuit and a DQ pin, instead of a selection operation of the memory array. In this event, since the address signals X and Y can be input in an arbitrary order, fixed information in the self match fields alone can be specified for reading. Alternatively, the order in which the address signals X and Y are inputted may be entered as a code, such that a particular one can output a fixed signal corresponding to the self match or the identification number.

This configuration can be applied as well to semiconductor integrated circuit devices other than DRAM, such as other semiconductor memory devices such as another static RAM, flash EPROM and the like or a CPU (microprocessor) having address terminals, and the like.

Figure 25:
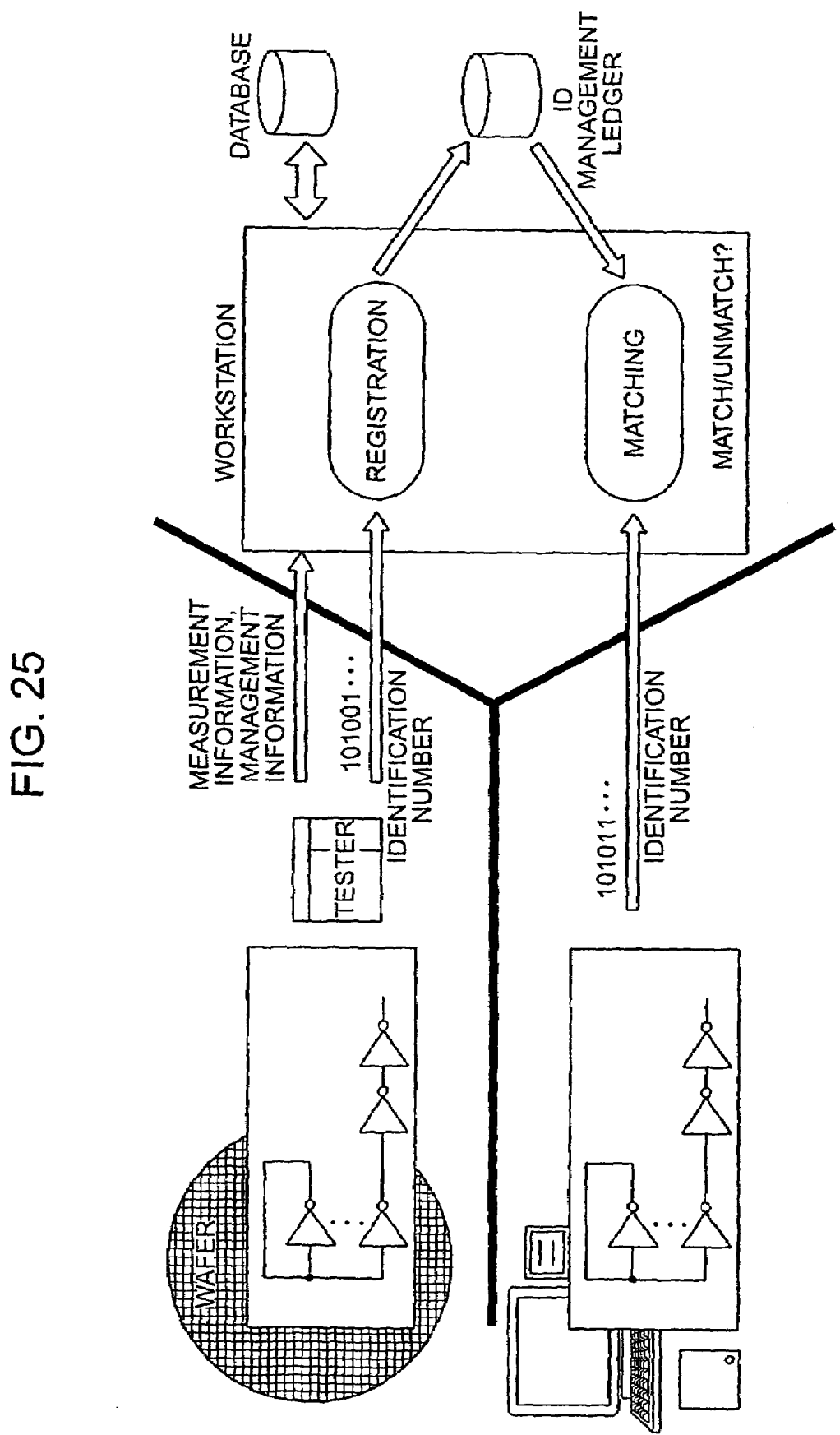
FIG. 25 is a general schematic diagram illustrating one embodiment of a semiconductor integrated circuit device which employs the identification number generator circuit according to the present invention.

FIG. 25 illustrates general schematic diagram of one embodiment of a semiconductor integrated circuit device which employs the identification number generator circuit according to the present invention. The essential purpose of assigning an identification number to a semiconductor integrated circuit device is to give a unique number to each LSI. While a numbering method may use a laser fuse, a flash (FLASH) memory or the like, a special process or program step and the like are required.

In this embodiment, an identification number generated by the identification number generator circuit of this application in a wafer state is read by a tester for registration in relation to a variety of data and the like in a workstation. After each LSI is finished into a product and mounted in an electronic device such as a personal computer PC and the like, the identification number is read from the LSI. The identification number read a this time is not ensured to completely match because even the same LSI differs in an operating environment and condition from the registration time. However, it can be estimated to be the same or not from the degree of discrepancy in identification number.

Description will be made on a determination algorithm for the identification system in this application. The identification number in this embodiment indicates the order of magnitude of the logical threshold values of a plurality of CMOS inverter circuits. A circuit having four CMOS inverter circuits as in the foregoing embodiment is counted as one unit. For example, there are 24 possible orders (the number of permutations) $_4P_4=4!=4\times3\times2\times1=24$ for the logical threshold values of the four CMOS inverter circuits. Assuming now that there are two units, if the logical threshold values completely randomly vary, the two units of CMOS inverter circuits has the same order with a probability of approximately 4.2% (=1−23/24).

Otherwise, when one unit is comprised of eight CMOS inverter circuits, there are 8!=40,320 possible orders. When there are 50 such units, one set or more of those having the same order exist with a probability of approximately 3% (=1−(40320×40319× . . . ×40271)/40320$^{50}$).

In a unit comprised of 16 CMOS inverter circuits, possible combinations amount to 16!=2.09E13. As such, the permutations of 16 is an extraordinary number, meaning that when the logical threshold values of the CMOS inverter circuits randomly vary, there hardly exist those which are in the same arrangement. Actually, when there are 1,000,000 units, it is estimated that one set or more of units in the same order exist with a probability of at least 5% or less (at a rough estimate because a strict calculation is difficult due to a large number of digits). In other words, there is one set per 20,000,000 units when roughly speaking. It is contemplated from such calculations that approximately 16 CMOS inverter circuits are required in one unit for completing a practical identification number. Therefore, the following description will be made on a unit comprised of 16 CMOS inverters, given as an example.

When 16 CMOS inverter circuits in one unit are implemented as in FIG. 7, round-robin comparison results amount to 256 including self-matches. In the following, one comparison result output is referred to as "one bit."

Figure 26:
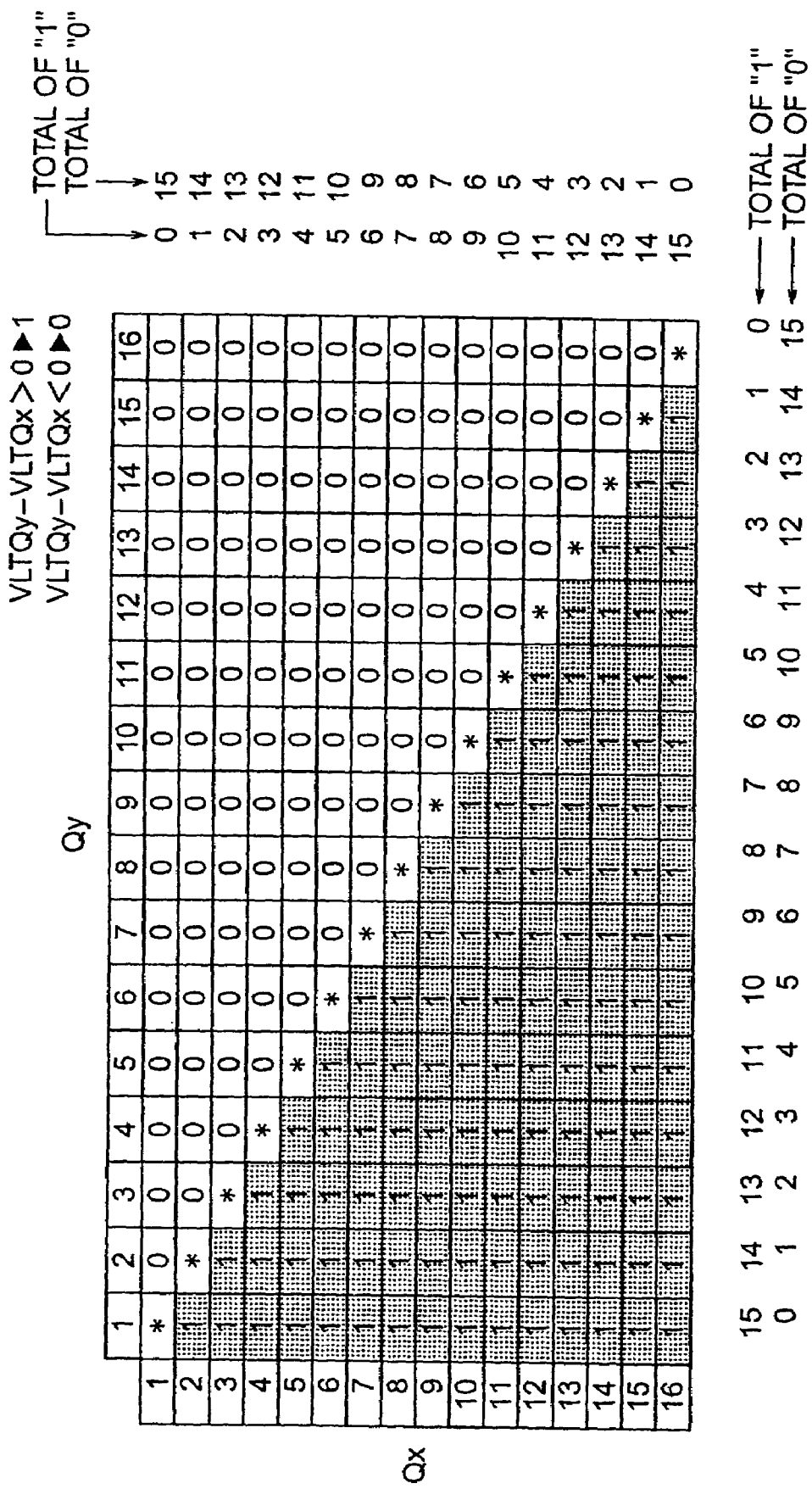
FIG. 26 is an explanatory diagram for explaining an algorithm for identifying an identification number according to the present invention.

FIG. 26 is the most simple example in which the logical threshold values of 16 CMOS inverter circuits are arranged in sequence as VLTQ1>VLTQ2> . . . >VLTQ16.

Figure 27:
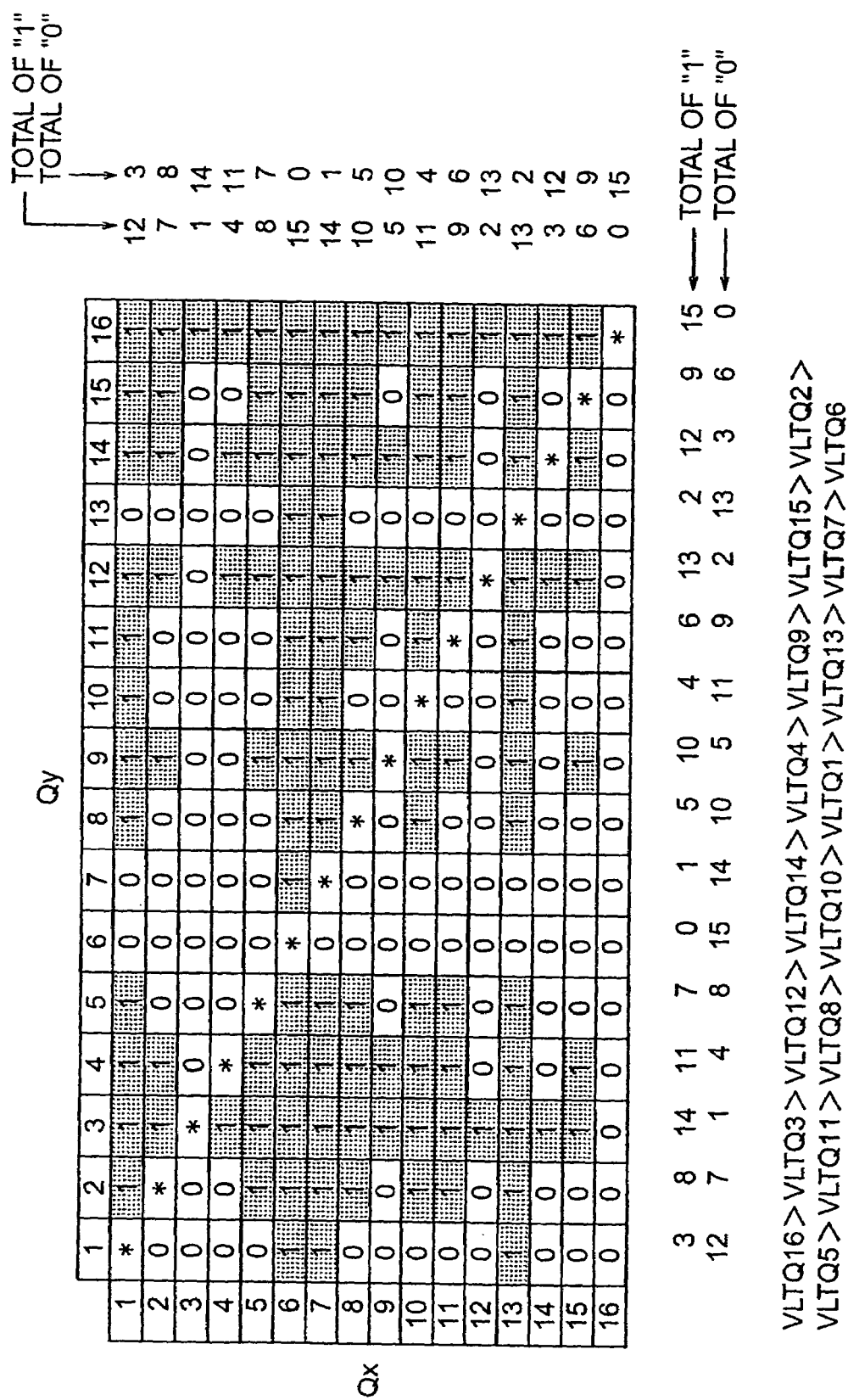
FIG. 27 is an explanatory diagram for explaining an algorithm for identifying an identification number according to the present invention.

FIG. 27 is an example in which the logical threshold values of CMOS inverter circuits are at random. "1" indicates that the second CMOS inverter circuit has a logical threshold value higher than that of the first one, "0" indicates that the second CMOS inverter circuit has a logical threshold value lower than that of the first one, and "*" indicates a self-match or indefinite. As can be seen in the two examples, bit patterns at OUT of the circuits corresponding to FIGS. 26 and 27 change to inherent patterns depending on how the logical threshold values of the CMOS inverter circuits are ordered. Thus, a direct use of the bit pattern at the output OUT as the identification number can be deemed to be the most simple manner. The number of bits of the identification number information in this method, i.e., data amount is 256 bits.

The bit pattern is nothing but a so-called match result table itself. On the other hand, the concept which underlies this application is the order of magnitude of logical threshold values of a plurality of CMOS inverter circuits. It is contemplated that the data amount of information to be handled can be reduced if information on the order of magnitude alone can be retrieved from the match result table.

FIGS. 26 and 27 show on the lower side and right side total numbers of "1" or "0" in the vertical direction and horizontal direction except for the self-match fields. For example, looking at totals of "1" on the lower sides of FIGS. 26 and 27, the order of the magnitude of number corresponds to the order of the magnitude of the logical threshold value. Compared to a league match of sports such as football or baseball, this is the same as a stronger team having a larger number of wins. Speaking with the CMOS inverter circuits, as a higher logical threshold value has a larger number of "1."

Since the number of wins or the total number of "1" is equivalent to the rank, the total number of "1" can be used to represent the order of magnitude of the logical threshold values of the CMOS inverter circuits. Of course, no change is basically caused even if the total number of "0" is used or a total number of "1" or "0" in the horizontal direction is used. With the use of this method, the data amount of information bit can be reduced Since each CMOS inverter circuit can have an order which can be represented by a number from 0 to 15, four bits of information amount are required in binary notation. Since there are 16 CMOS inverters, a total of 64 bits (=4×16) are required. As compared with the foregoing comparison result (match result) table, the data amount can be reduced by a factor of four from 256 bits to 64 bits.

While one unit is herein comprised of 16 CMOS inverter circuits, this effect is increased as the number of CMOS inverter circuits is larger. For example, with one unit comprised of 32 CMOS inverter circuits, the comparison result table requires 1024 bits, whereas when the order is used, the number of bits is reduced to 160 bits (5×32) by a factor of 6.5. Stated another way, although the comparison results are increased by a factor of four (=1024/256), this can be reduced to an increase by a factor of 2.5 (=160/64) with the order-based information. This is advantageous in that the identification system manages a less amount of data, and a processing time spent for matching can be reduced.

Figure 28:
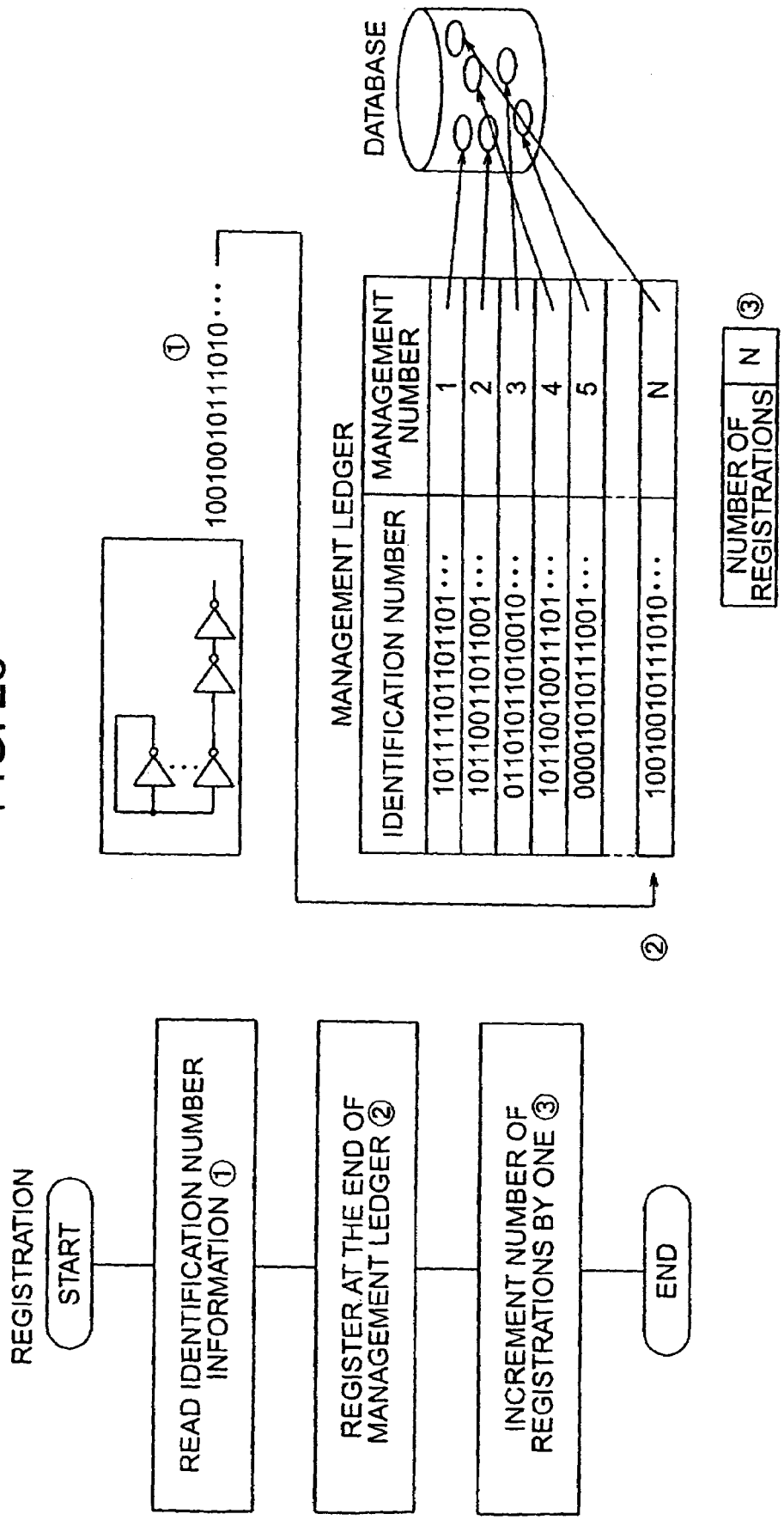
FIG. 28 is a schematic diagram illustrating one embodiment of a method of registering a matching algorithm in a system for identifying a semiconductor integrated circuit device according to the present invention.
Figure 29:
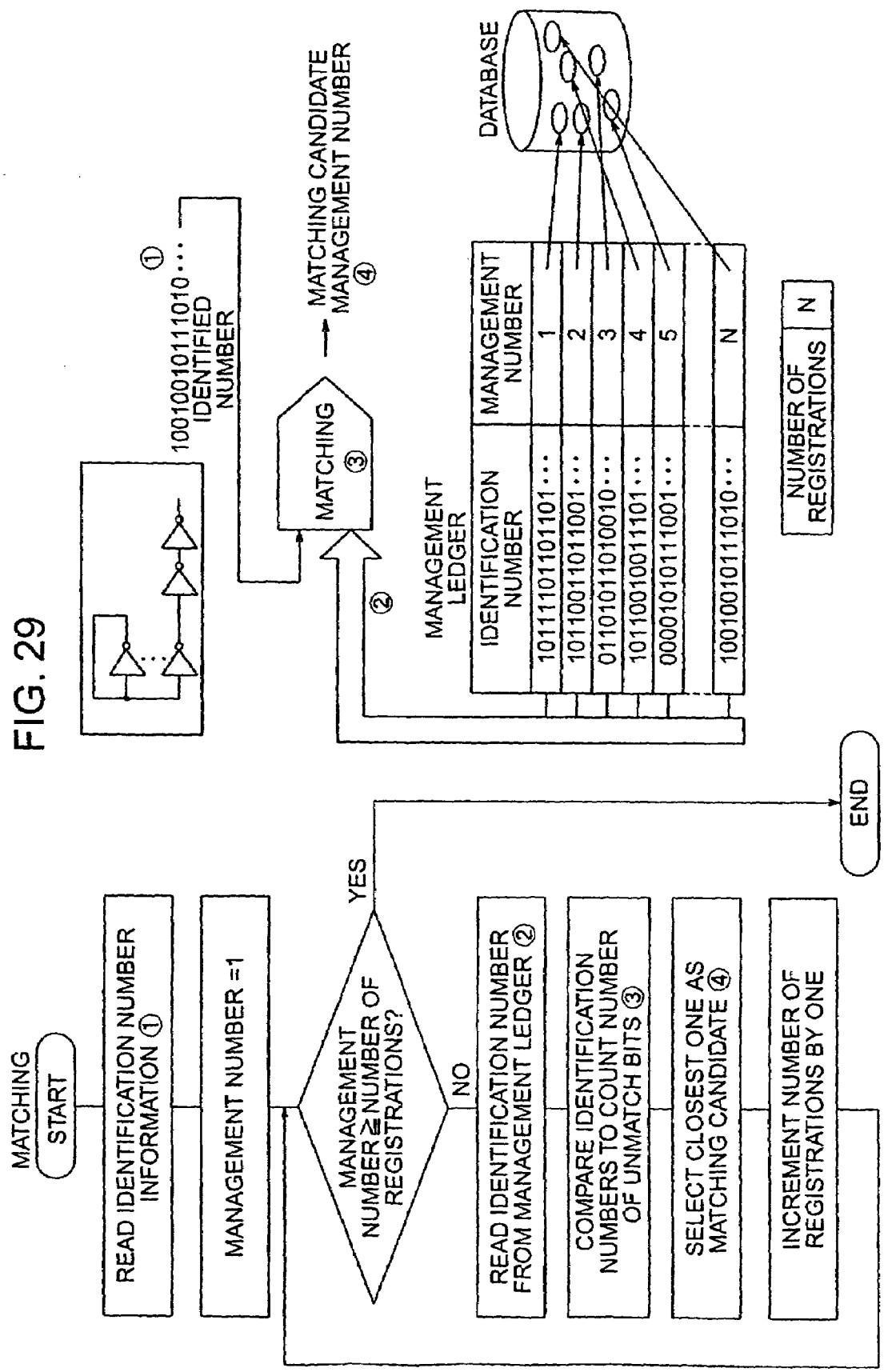
FIG. 29 is a schematic diagram illustrating one embodiment of the method of registering a matching algorithm in the system for identifying a semiconductor integrated circuit device according to the present invention.

FIGS. 28 and 29 each illustrate a schematic diagram of one embodiment of a matching algorithm in the identification system for the semiconductor integrated circuit device according to the present invention. While description is herein made on a method using comparison result information of the logical threshold values of CMOS inverter circuits, a method using the order of magnitude of logical threshold values is identical in general flow.

FIG. 28 illustrates a registration method.

(1) 256-bit comparison result information for the logical threshold values of the CMOS inverter circuits is read from the identification number generator circuit.

(2) The comparison result information is registered in an identification number management ledger and assigned a management number for relating to a database which stores information such as measurement data and the like.

(3) The number of registrations is incremented by one. While it is herein assumed that a newly registered identification number is not the same as those previously registered at all times, it is effective to add a procedure for confirming a duplication of registered one and generating some alarm upon new registration.

FIG. 29 illustrates a matching method. This system is characterized by allowing fluctuations in identification number due to a difference in environment and conditions between a registration instance and a matching instance.

(1) 256-bit comparison result information for the logical threshold values of the CMOS inverter circuits is read from the identification number generator circuit.

(2) Registered identification numbers are sequentially retrieved from the management ledger.

(3) The registered identification numbers are compared with an identified number. A comparison method will be later described.

(4) The one having the smallest difference between a registered identification number and the identified number is selected as a matching candidate. By repeating (2) to (4), the one finally having the smallest difference of all the registered identification numbers is selected as the most probable identical candidate.

FIG. 30 illustrates an explanatory diagram for an exemplary comparison method in FIG. 29. The identified number is shown by extracting 24 bits or a portion of the 256-bit comparison result output of the logical threshold values of the CMOS inverter circuits. Identification numbers 1 to 5 are registered identification numbers. Shaded portions in them are portions different from the bits of the identified number. A total number of unmatch bits is shown at the right end.

As described in connection with FIG. 8, since the "0" and "1" output patterns of the identification number generator circuit are unique to respective units, it can be determined whether or not an identification number is outputted from the same unit from the proportion of the number of matching bits which make up the pattern. While the identification number here is a mere example for description, the identification number 5 has the number of unmatch bits equal to one, and the remainders have the number of unmatch bits in a range of 5 to 17, making it apparent that the identification number 5 has a markedly high matching ratio. Therefore, the identification number 5 can be selected as the most probable candidate.

Figure 32:
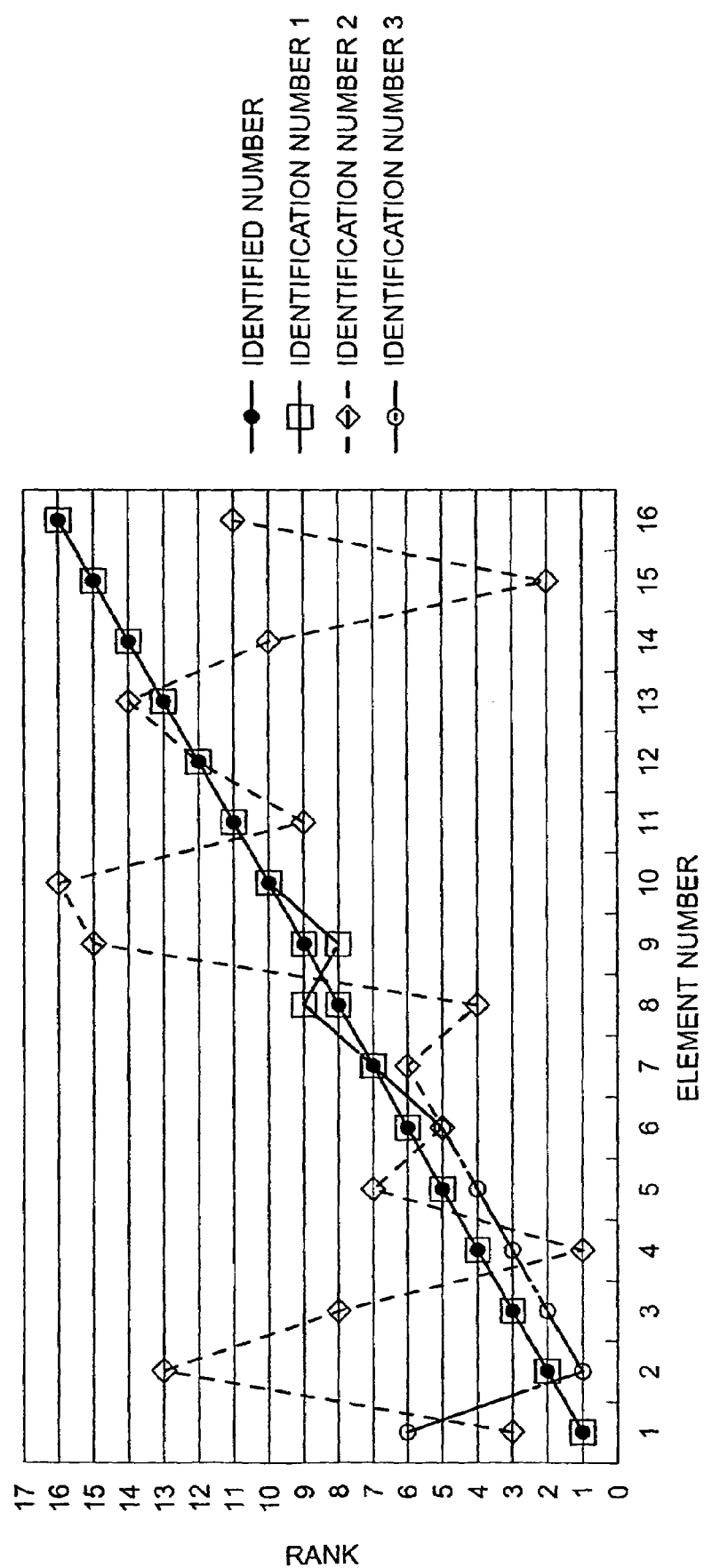
FIG. 32 is an explanatory diagram showing a comparison method when using the order of logical threshold values in the CMOS inverter circuit.

FIGS. 31 and 32 show explanatory diagrams of an exemplary identification number comparison method using the order of logical threshold values of CMOS inverter circuits. FIG. 31 is shown in a tabular form, while FIG. 32 is shown in a graphic representation. It is assumed herein, for simplifying the description, that the order of elements of identified numbers, i.e., the arrangement of the logical threshold values of the CMOS inverter circuits is the same order as element numbers. The identification number 1 is such that the element numbers 8 and 9 change place with each other, and the remainders are matching. In comparison with the identified numbers, a total of absolute values of distances of both orders is two. The identification number 2 has a random order, a total distance of order equal to 66, and its average equal to 4.13. Since an expected value of a total of the distances of this order is 85 in theory and 5.3 on average, the identification number 1 having the total of the distances of the order equal to 2 and an average equal to 0.125 can be said to be highly likely to be the same. In other words, for allowing fluctuations in identification numbers due to a difference in environment and conditions between the registration instance and matching instance, this system selects the one having the smallest total of discrepancies of identified numbers to registered identification numbers as a matching candidate.

In the identification number 3 in FIGS. 31 and 32, the order of the element number 1 deviates by five steps. The element numbers 2 to 6 deviate by one step, and the others deviate by zero step. A total and average of the distances of order are 10 and 0.625, respectively. As long as these values are concerned, they are sufficiently lower than expected values, so that it is highly likely to be a matching candidate. However, a deviation of the order by five steps in the element number 1 is deemed to be a rarely encountered phenomenon. If there were one which indicates an order distance equivalent to or slightly larger than the identification number 3, it is effective to add a maximum disparity of the order distance of each element to determination criteria in order to confirm more accurate identity. A specific example of the criteria is to add "the order distance of each element is two or less" to a reference which states "a total of order distances is 16 or less." Actual criteria differ depending on the characteristics of the identification number generator circuit and a system to which the present invention is applied.

FIGS. 31 and 32 illustrate when the number of elements for the identification number, i.e., the number of CMOS inverter circuits is 16. There can be some cases where the number of elements for the identification number is increased for such a reason as satisfying a higher capabilities of identification. For this purpose, a method of expanding the configuration as illustrated in FIG. 20, for example, is one of the most simple methods. An increase in the number of elements in the configuration of FIG. 20 can be achieved by setting CMOS inverters and switch MOSFETs corresponding to the number, setting the number of counter bits corresponding to the number, and setting the decoder. Another alternative method for increasing the number of elements may involve disposing a plurality of identification number generator circuits mainly comprised, for example, of 16 CMOS inverters in the same semiconductor integrated circuit device.

After delivered from the pre-process, semiconductor integrated circuit devices LSIs are subjected to a probe test in a wafer state, a screening test in a packaged state, and the like to detect faults. For memories, logic LSIs which mixedly include relatively large scaled memories, and the like, a so-called redundancy remedial technique has been introduced for substituting spare memory cells for defective memory cells which are detected in the probe test. With the miniaturization, higher speed and higher performance in the recent semiconductor processing technologies, a number of defective products are detected in a final screening step. Moreover, since semiconductor integrated circuit devices LSIs are more and more increased in scale, such defective devices detected after the manufacturing process are problematic because they causes a higher cost.

Thus, there is an increasing need for again recovering defects detected in products after assembly. For example, giving a memory as an example, chips damaged by the burn-in step and the like are collected, and deteriorated bits included in defective chips are again recovered with remaining spare memory cells.

Specifically considering the second recovery technique, the next two representative methods are contemplated for the recovery technique. A first method involves giving an independent number to each LSI to manage all recovery information in a probe test step for each memory chip. For the second recovery, the chip number is extracted from a memory chip, recovery information collected in the probe test step is retrieved from a management computer, and unused memory cells are identified based on them for the second recovery. A second scheme involves extracting the first recovery information from memory chips each time the second recovery is carried out. This employs a technique referred to as a so-called address roll call.

The following techniques are required for applying these second recovery techniques. In the first scheme, an independent number must be given to each memory chip. This can be implemented by programming an identification number upon a recovery performed after a probe test. In addition, in both the first and second schemes, it is necessary to contain an electrically programmable element upon second recovery. While the electrically programmable element may be provided at present by fusing polysilicon with a current, breaking an insulating film with a high electric field, using a FLASH memory, and the like, all of them can produce side effects such as an increased number of steps, the reliability of the programming element, an increased peripheral circuits, and the like.

Both the foregoing schemes involve mounting any programming element in an LSI body. The inventors of this application investigated a third scheme for dividing both parties into separate chips from another angle. This third scheme features that a dedicated process suitable for programming can be applied to a dedicated programming chip. Even this third scheme still has the following problems.

One problem is how LSI bodies are corresponded to the dedicated programming chips. Consider a method of solving this problem, taking a multi-chip module as an example. In the multi-chip module, both chips are finally assembled into a single semiconductor integrated circuit device on a module substrate. However, the combination must be strictly managed until each chip is assembled into the module. It is not easy to build an LSI manufacturing line which realizes this. It is therefore contemplated to assign an identification number to an LSI body, read the identification number of the LSI body which is mounted on the module substrate, and program information corresponding to the LSI body into a dedicated programming chip.

When a technique of cutting with a laser irradiating device, for example, is used as a programming method, such a laser irradiation cutting device can cut a fuse of a chip in a wafer state, but experiences difficulties in cutting a chip on a package or a module. This is because an alignment of fuse coordinates of a chip on a package or a module to a laser beam is technically difficult, and even if it is achieved, the alignment is required for each chip, resulting in an extremely low throughput. Essentially, a problem exists in how to read the identification information of the LSI body before irradiation of laser. For this reason, the dedicated programming chip is limited to an electrical programming scheme which can continuously execute a read-out of the identification number of the LSI body and a program on the same device.

Thus, a realistic form of the third method is "to mount an LSI body accompanied by an identification number and a dedicated program chip having an electrical programming element on a multi-chip module and program." However, the third scheme is also established on several constraints, and is not always the best option in the LSI production activities, for example, in view of the cost and reliability.

One of the constraints is the use of a multi-chip module as a premise. However, it is further unrealistic to employ a method of combining two chips directly on a substrate, for example, without using a multi-chip module.

A second constraint is the requirement of using processes which enable an electric program for a programming element used in the dedicated programming chip, for example, a polysilicon fuse, a FLASH memory, FRAM and the like. Each of these elements requires special processes, has a peripheral circuit in large scale, and is seemingly problematic in the reliability. As a relatively inexpensive scheme which suffers less from these problems, there is a programming scheme which uses a laser cut metal fuse, however, it cannot be said to be compatible with the third scheme, as mentioned above.

A third problem is the programming (marking) of an identification number into an LSI body. This programming also requires a laser fuse and an electrical program element. However, if a similar process is added to the LSI body even though the dedicated program chip is separately provided, the advantage of a reduced cost of the LSI body is mitigated. Thus, to solve these problems, the identification number generator circuit which uses variations in logical threshold values of CMOS inverter circuits is extremely useful.

Figure 33:
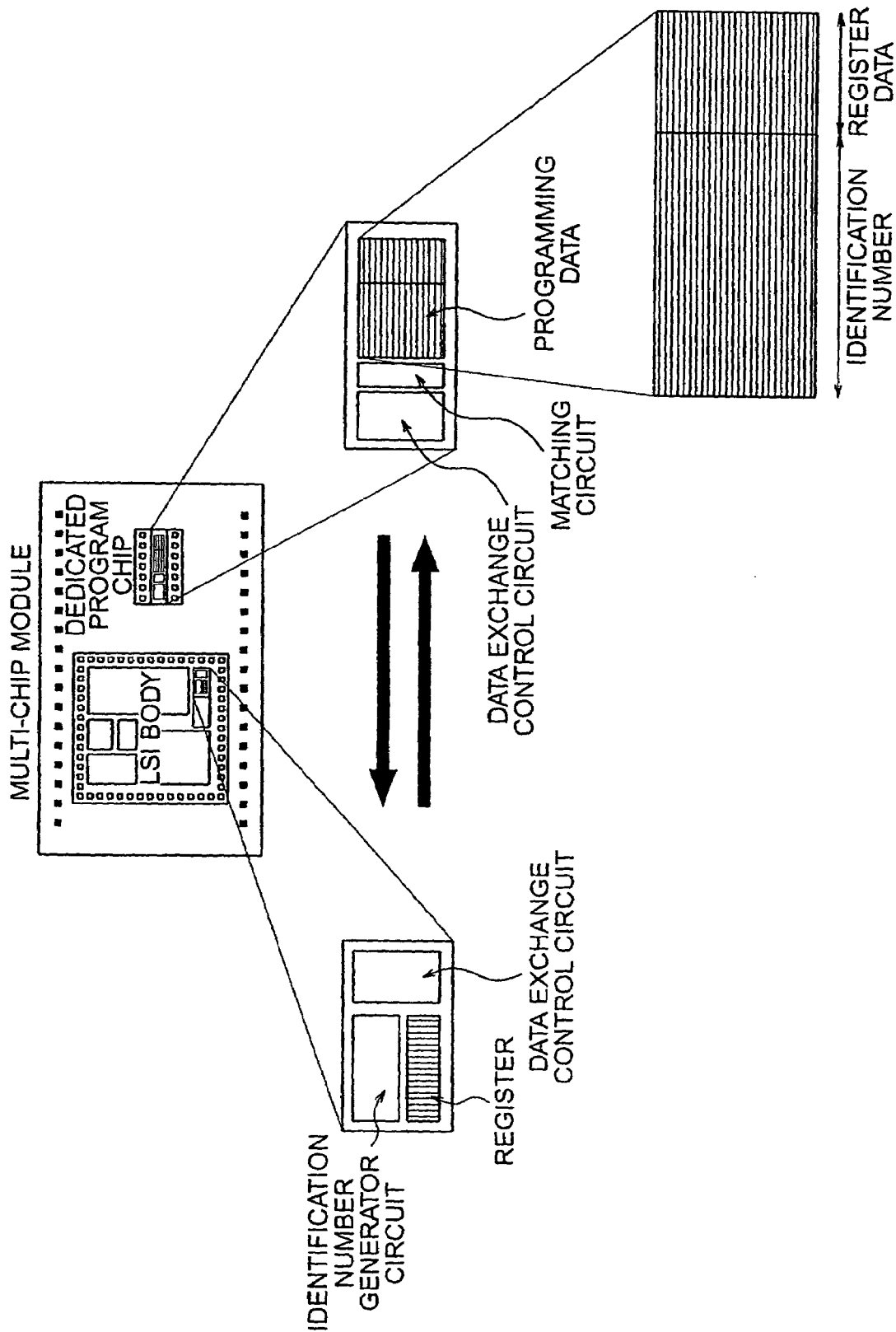
FIG. 33 is a schematic diagram illustrating one embodiment of a semiconductor integrated circuit device to which the present invention is applied.

FIG. 33 illustrates a schematic diagram of one embodiment of a semiconductor integrated circuit device to which the present invention is applied. First, a probe test is conducted for the LSI body. In this event, if faults are detected, for example, in a memory mounted in the LSI, recovery information is created for replacing the defective memory with a spare memory cell. For normal general-purpose memories and the like, a laser recovery is performed subsequently, whereas in the semiconductor integrated circuit device of this embodiment, the LSI body is diced as it is and assembled. Further, fault information subsequently detected in such steps as aging, screening and the like is added to the recovery information at the probe test. The final recovery information is written into the dedicated programming chip. The LSI body and dedicated program chip are used in combination as a multi-chip module.

Figure 34:
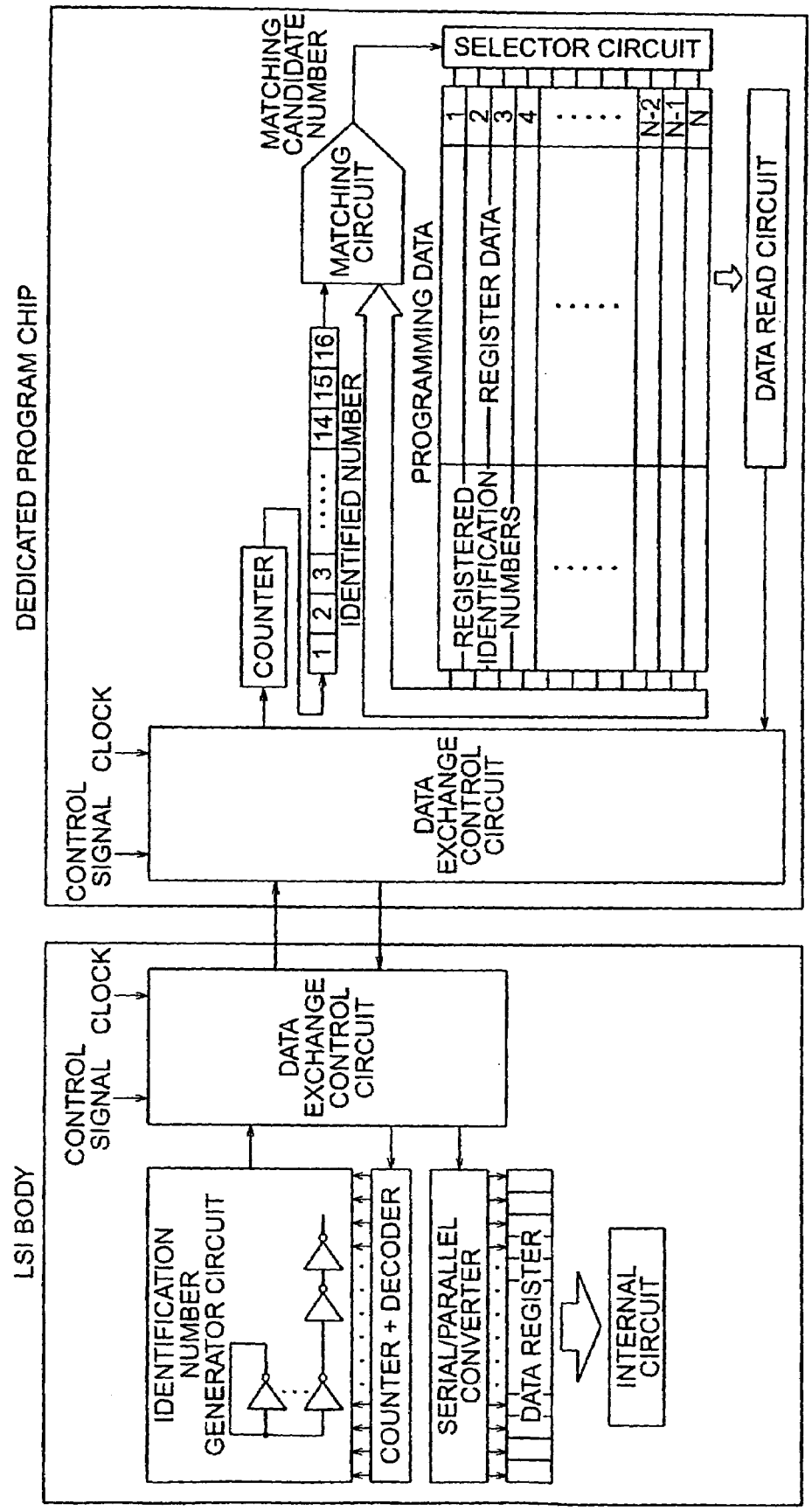
FIG. 34 is a block diagram illustrating one embodiment of a multi-chip module to which the present invention is applied.

FIG. 34 illustrates a block diagram of one embodiment of the multi-chip module to which the present invention is applied. Data is serially communicated between the LSI body and dedicated program chip through a data exchange control circuit in synchronism with a clock. In other words, an identification number generated in the identification number generator circuit of the LSI body is transferred to the dedicated program chip through the data exchange control circuit.

The dedicated program chip holds a plurality of registration numbers (identification numbers) corresponding to one unit and their defect recovery information in one-to-one correspondence as programming data. The dedicated program chip registers identification numbers transferred thereto from the LSI body through the data exchange control circuit into an identified number register through a counter.

A matching circuit compares such an identified number with registered identification numbers in the programming data for matching. This matching operation makes the determination while allowing fluctuations in identification numbers due to a difference in environment and condition between the registration instance and matching instance in accordance with the algorithm illustrated in FIGS. 30 and 31. As a matching candidate number is detected, register data in the programming data is read to a data read circuit. Then, reverse to the identification number, the recovery information is transferred from the dedicated program chip to the LSI body through the data exchange control circuit. This recovery information is serial-to-parallel converted and held in the data register for use in the defect recovery.

Since the dedicated program chip has defect recovery information for a plurality of chips corresponding to one unit, one type of dedicated program chip is formed for a plurality of LSI bodies for one unit, and is commonly combined for use. For this reason, it is not necessary to manufacture, manage and assemble the LSI bodies and dedicated program chips in a one-to-one correspondence.

Figure 35:
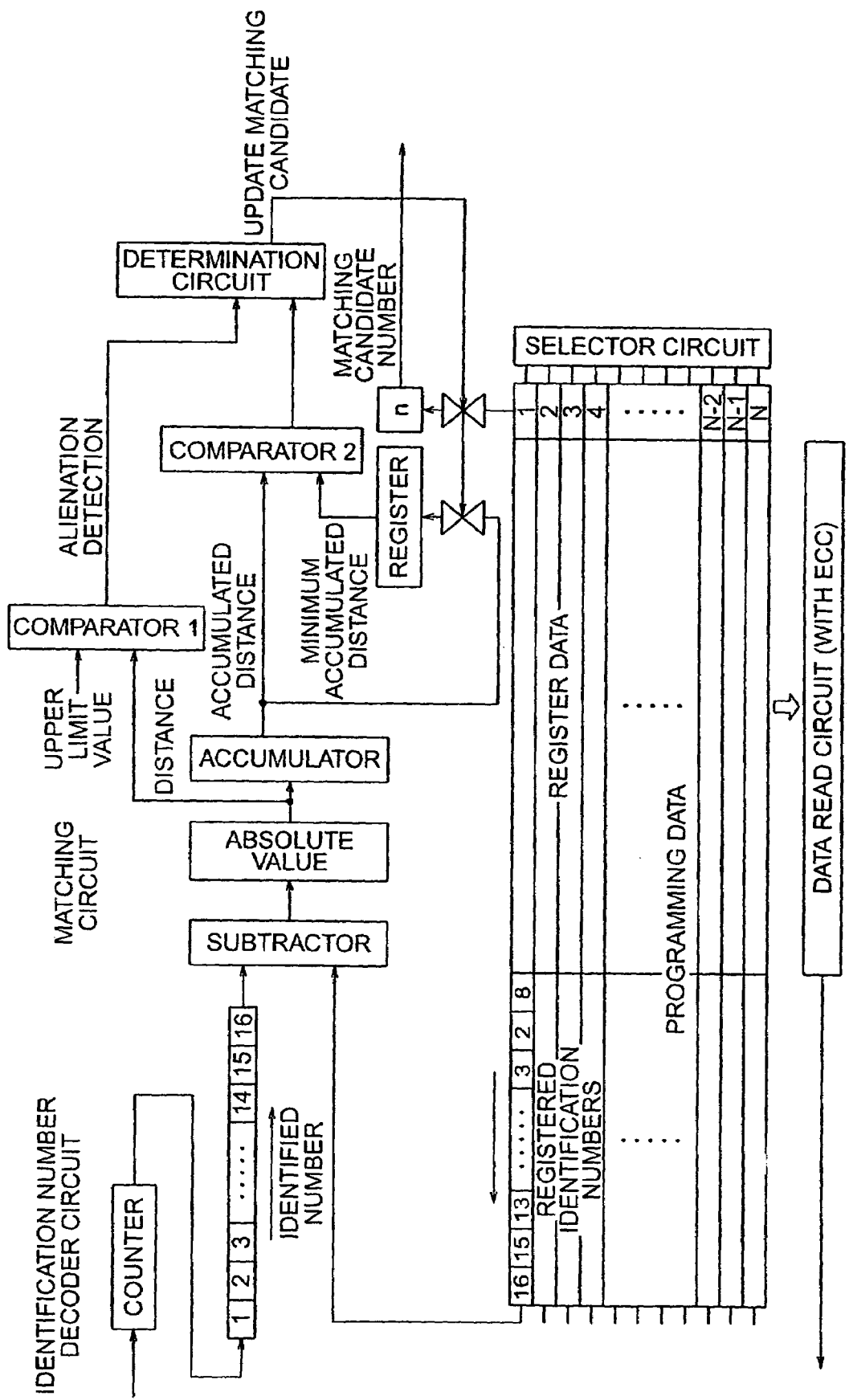
FIG. 35 is a block diagram illustrating one embodiment of a dedicated program chip in the foregoing FIG. 34.

FIG. 35 illustrates a block diagram of one embodiment of the dedicated program chip. Though not particularly limited, the dedicated program chip is composed of an identification number decoder circuit, a matching circuit, a circuit for reading programming data and data, and the like. The registered identification number and resister data are registered by selectively cutting fuses with irradiation of laser.

In the matching circuit, corresponding to the determination algorithm in FIGS. 30 and 31, an absolute value of a subtraction result using a subtractor is compared with an upper limit value in a comparator 1 for detecting an alienation. A comparator 2 compares a cumulative distance outputted from the accumulator with reference to a minimum cumulative distance which is sequentially replaced, and one matching candidate number is outputted from 1 to N by a determination circuit together with the alienation detection signal. Register data is selected by this matching candidate number and transferred to the data read circuit. The data read circuit is designed to have an ECC function (error correcting function). This improves the reliability of data.

Figure 36:
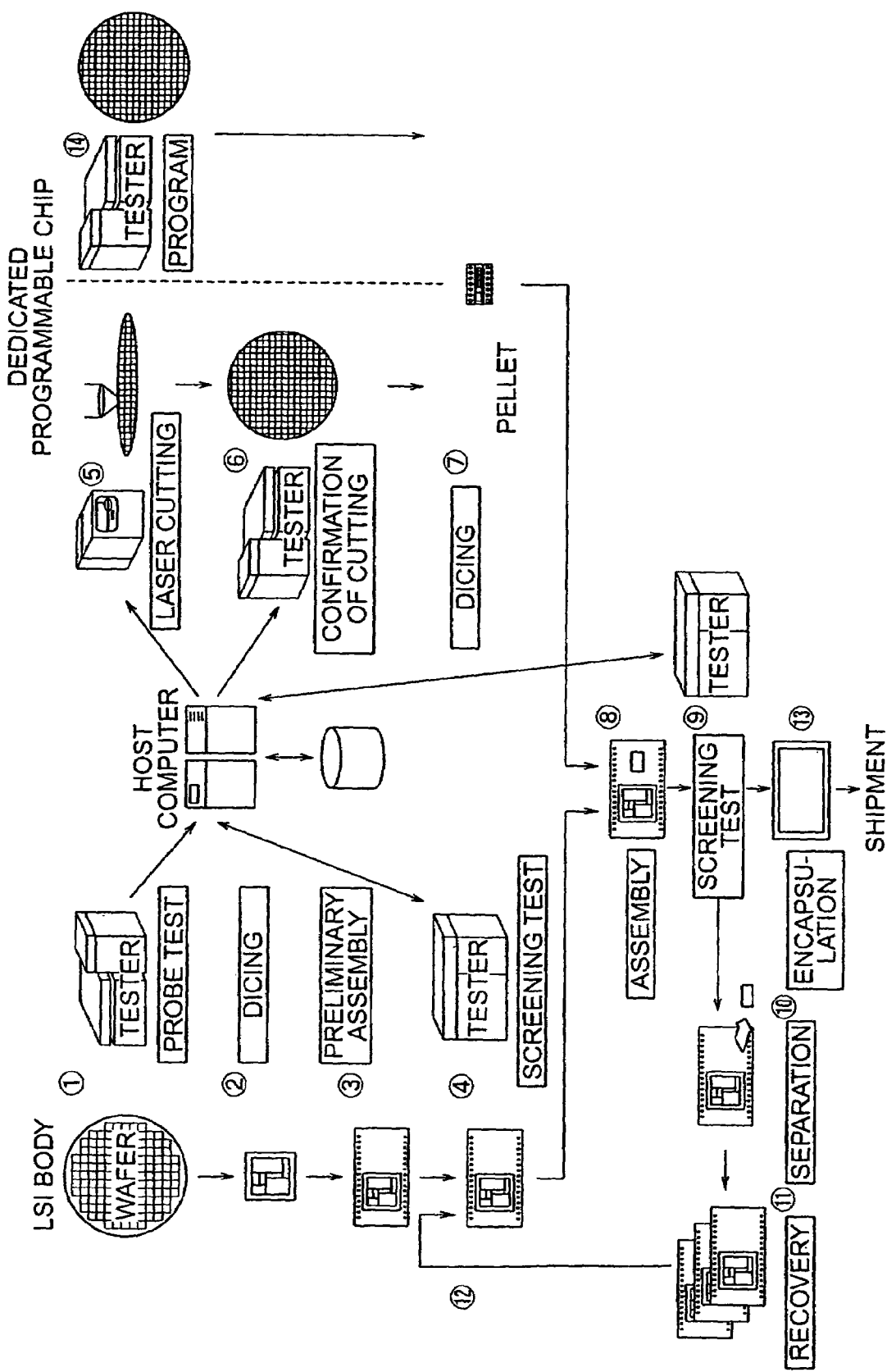
FIG. 36 is a schematic diagram for describing a manufacturing step of one embodiment of a semiconductor integrated circuit device which is mounted with the identification number generator circuit according to this application.

FIG. 36 illustrates a schematic diagram of manufacturing steps (1) to (13) in one embodiment, referred to as a so-called post-process, of a semiconductor integrated circuit device which is mounted with the identification number generator circuit according to this application. In this embodiment, it is assumed that the LSI body is a large scaled system LSI which comprises a mixture of DRAM and SRAM, and the dedicated program chip is implemented by laser cut metal fuses. In the following, the flow of manufacturing steps will be described with reference to FIG. 36.

(1) The LSI body is tested by a probe tester. An identification number in the LSI is transferred to a host computer together with defective memory cell recovery information, an internal power supply circuit trimming setting, a delay circuit setting and the like in the DRAM and SRAM. The host computer stores the information sent thereto in a database in conjunction with other manufacturing management information.

(2) An LSI body wafer is diced.

(3) The LSI body alone is preliminarily mounted on a multi-chip module substrate. While there is one LSI body in FIG. 36, there can be a plurality of LSI bodies.

(4) The identification number is read from the LSI body by a screening tester and sent to the host computer. The host computer recognizes the LSI body from the identification number, and returns information necessary to the individual LSI body to the tester. The necessary information refers to the defective memory cell recovery information, LSI body identification information and the like which are managed by the host computer in the database. This is referred to as the "LSI body register information." The screening tester stores the LSI body register information in a recovery address register of a recovery circuit in the LSI body if it is, for example, defective memory cell recovery information, and stores the LSI body register information in a trimming value setting register in an internal circuit if it is an internal power supply circuit trimming setting.

The screening tester conducts a fast operation test and the like which cannot be covered by the probe test, after setting the LSI body register information. The screening tester also transfers fault information on those which are additionally detected as faulty to the host computer. The host computer analyzes the fault information sent thereto together with collected information to determine whether either a second recovery or an adjustment can be made, and again stores the information in the database.

(5) The register information necessary to the LSI body is programmed into the dedicated program chip. Further, manufacturing management information, customer information, cipher, function information and the like are programmed, if necessary. The dedicated program chip can store therein information on a plurality of LSI bodies. For example, assuming that the dedicated program chip has a capacity of storing information on 100 LSI bodies, a laser cutter receives identification numbers and register information of 100 LSI bodies from the host computer, and programs the same register information of the 100 LSI bodies into all of 100 dedicated program chips based on the received information.

Here, an estimation is made for a fuse cutting time for the dedicated program chip. Assuming for example that the number of bits for programming per LSI body is 1,000 bits, and one dedicated program chip can store (register) information for 100 LSI bodies, one dedicated program chip has 100,000 (1000×100) fuses. Since the recent laser cutter has the ability of 5,000 pulses or more per second, 100,000 fuses can be cut in about 20 seconds, i.e., for one dedicated program chip. 2,000 seconds (33 minutes) are taken for 100 chips. Also, the dedicated program chip has the area of 1.5 square millimeters for the fuses, assuming that one fuse has a size of 15 square microns, and approximately three square millimeters, including peripheral circuits and pads.

(6) A probe test is conducted for removing laser cut defective chips. In some cases, a step may be added before the main process for depositing a protective film for protecting a chip. A test data pattern is received from the host computer. Here, since laser cut defective chips can be produced, more than 100 chips should be programmed in the foregoing step (5). This number is adjusted by results of yield rate. Here, if the dedicated program chips are less than the LSI bodies, surplus LSI bodies are recovered and mixed into another group. Conversely, surplus dedicated program chips, if any, are discarded. Though a damage is caused in any case, this is more economical than discarding expensive LSI bodies.

(7) The dedicated program chips are diced. From diced chips, 100 chips and a margin, which have been programmed with the same information in the step (6), are picked up and collected into a group (lot) which corresponds to the LSI bodies.

(8) A dedicated program chip is mounted in a multi-chip module package. In this event, the groups corresponded in the steps (4) and (6) must be combined. However, since the individual LSI bodies need not be corresponded one-to-one to the dedicated program chips, no significant change in steps is needed as compared with the conventional assembling steps. While in this embodiment, complete encapsulation or capping is not performed in consideration of a subsequent separation step (10) in this assembling steps, the present invention is not necessarily limited to this method.

(9) Completed multi-chip modules are finally tested for screening. The dedicated program chip contains (registers) recovery information for 100 chips. When the LSI body on a board is activated, data is exchanged between the LSI body and dedicated program chip. Specifically, the identification number is sent from the LSI body to the dedicated program chip, and the dedicated program chip compares the sent identification number with identification numbers stored therein to identify the LSI body mounted in the module, and sends necessary register information such as recovery information to the LSI body. The LSI body performs internal initial settings based on the register information sent thereto. Subsequently, a final test is conduced. Those which pass the final test are conveyed to the next encapsulation step, while those which fail the final test are conveyed to a separation step, and simultaneously, fault information is sent to the host computer to analyze whether or not the defective ones can be recycled.

(10) Modules which have passed the final test are encapsulated or capped for shipment.

(11) The dedicated program chips are removed from recyclable products within the failed products.

(12) The recyclable products are recovered and collected in a new quantity unit.

(13) The recovered recyclable products are again subjected to the screening test. In this event, the identification number is read from the LSI body to retrieve past probe test information, screening test information, final screening test information corresponding thereto from the host computer. Also, though not shown, dedicated program chips are created for the new recyclable products, in a manner similar to non-recycled products, to advance similar steps. As the dedicated program chip, it can be replaced with one based on an electrically programmable element. In this event, the number of steps can be reduced.

Figure 37:
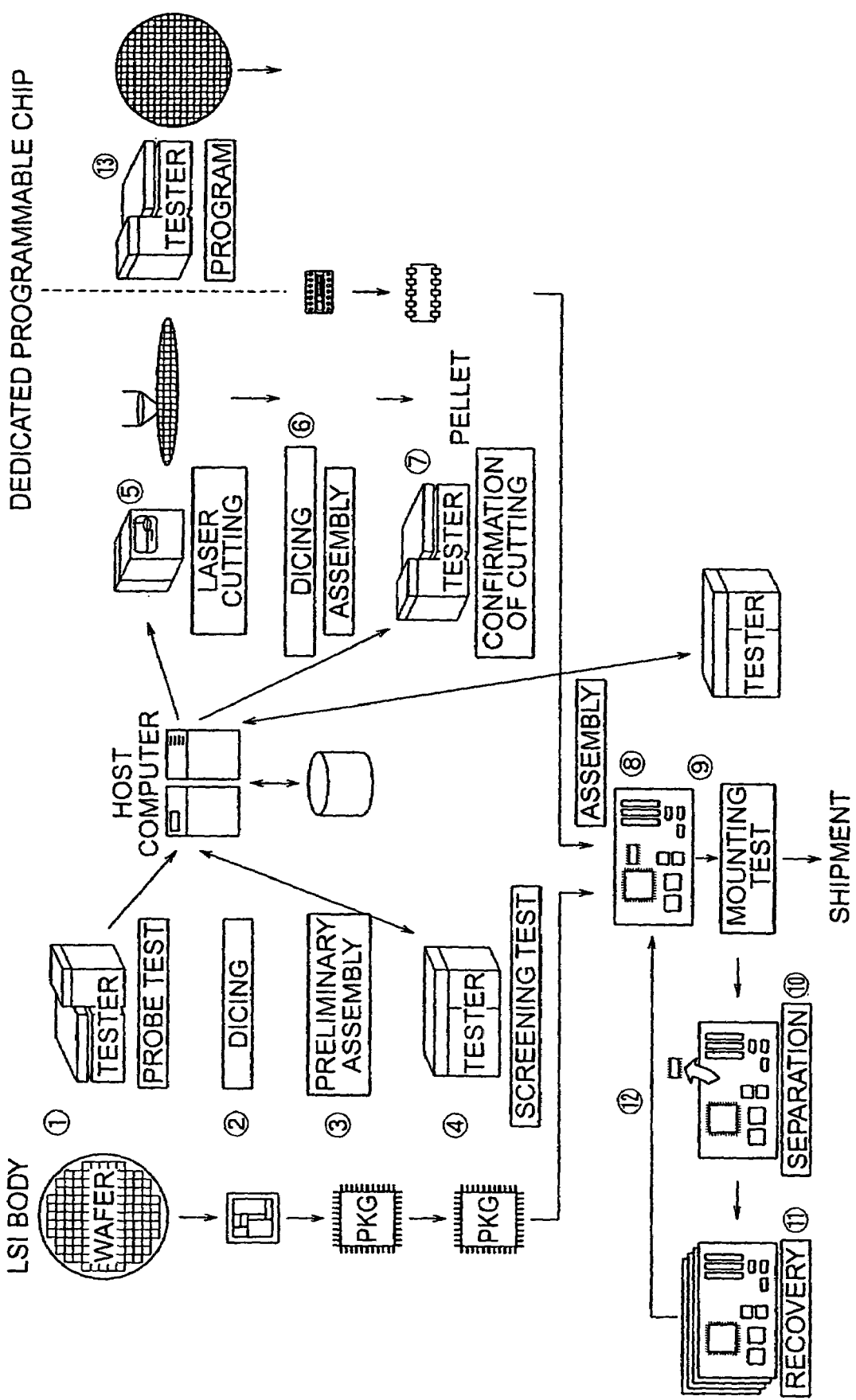
FIG. 37 is a schematic diagram for describing a manufacturing step of one embodiment when a semiconductor integrated circuit device mounted with the identification number generator circuit according to this application is assembled into a circuit mounting board.

FIG. 37 illustrates a schematic diagram of manufacturing steps (1) to (15) in one embodiment when a semiconductor integrated circuit device mounted with the identification number generator circuit according to this application is assembled into a circuit mounting board.

(1) The LSI body is tested by a probe tester. An identification number in the LSI is transferred to a host computer together with defective memory cell recovery information, an internal power supply circuit trimming setting, a delay circuit setting and the like in the DRAM and SRAM. The host computer stores the information sent thereto in a database in conjunction with other manufacturing management information.

(2) An LSI body wafer is diced.

(3) The LSI body is assembled into a package.

(4) The same as step (4) in FIG. 36.

(5) The same as step (5) in FIG. 36.

(6) Dedicated program chips are diced. The diced chips are collected into a group (lot) corresponding to the LSI bodies in a manner similar to the embodiment in FIG. 36.

(7) The same as step (7) in FIG. 36.

(8) An LSI body and a dedicated program chip are mounted on a circuit mounting board. In this event, groups corresponded at steps (4) and (6) must be combined. However, since the individual LSI bodies need not be corresponded one-to-one to the dedicated program chips, no significant change in steps is not needed as compared with the conventional assembling steps.

(9) The chips on the completed board are tested. When the LSI body on the board is activated, data is exchanged between the LSI body and dedicated program chip. If any fault is confirmed in the LSI body or dedicated program chip in course of the mounting on the board, the board is sent to a separation step, and simultaneously, fault information is sent to the host computer to analyze whether it is recyclable.

(10) Boards which pass the test are shipped.

(11) The dedicated program chip are removed from recyclable boards within failed boards.

(12) The recyclable boards are recovered and collected into a new quantity unit.

(13) Dedicated program chips are created for the recovered recyclable boards. The current register information includes a mounting test result in addition to the previous register information.

(14) The recovered boards are again returned to the mounting step, where the LSI body is mounted on a mounting board together with the dedicated program chip created at step (13), and subsequently go through similar steps.

(15) Similar to step (13) in FIG. 36.

It should be understood that the embodiment shown herein is a mere embodiment, and may vary depending on products to which the present invention is applied, and on forms of existing production lines.

Figure 38:
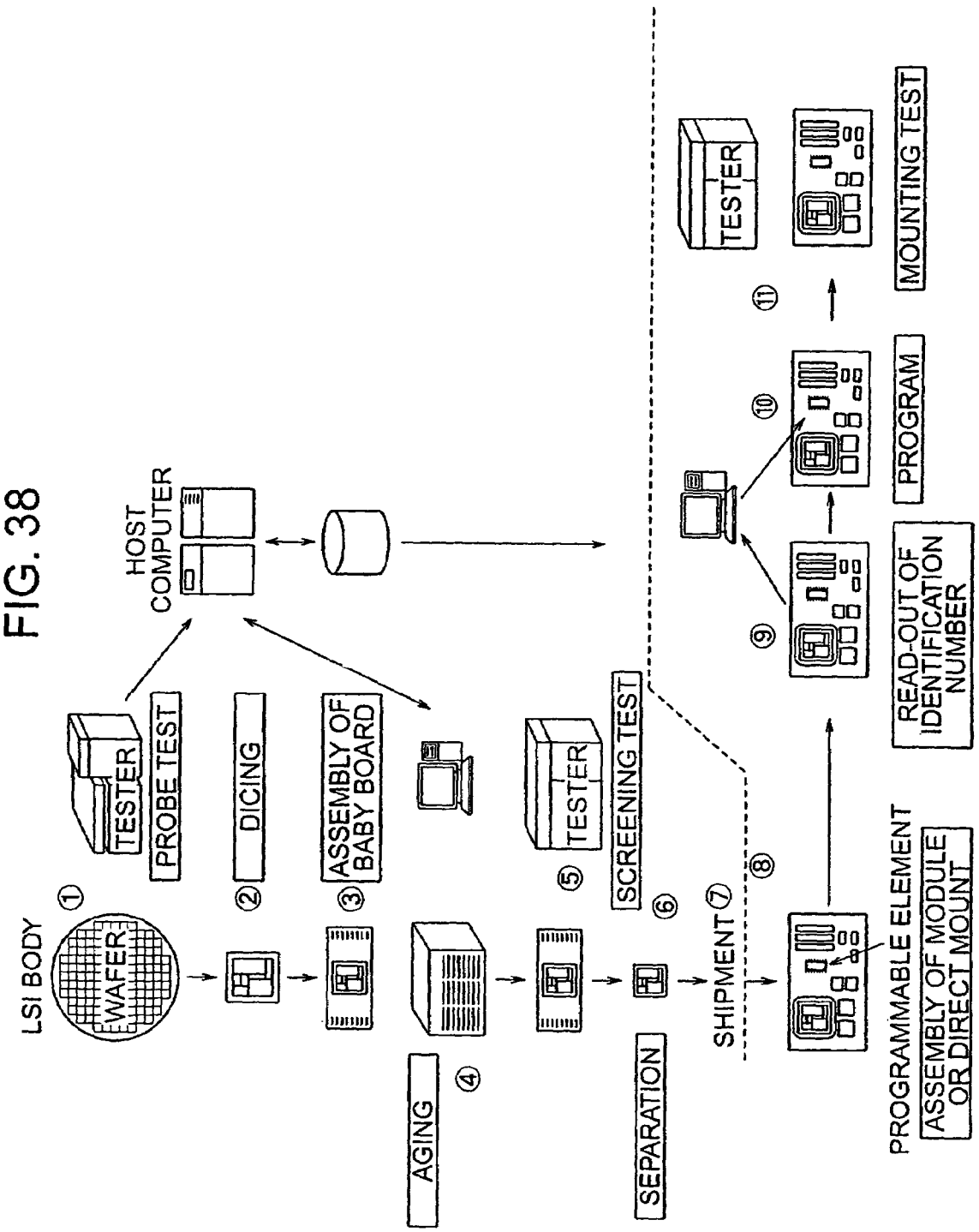
FIG. 38 is a schematic diagram for describing a manufacturing step of another embodiment of the semiconductor integrated circuit device which mounted with the identification number generator circuit according to this application.

FIG. 38 illustrates a schematic diagram of manufacturing steps (1) to (11) for another embodiment of a semiconductor integrated circuit device which is mounted with the identification number generator circuit according to this application.

(1) The LSI body is tested by a probe tester. An identification number in the LSI is transferred to a host computer together with defective memory cell recovery information, an internal power supply circuit trimming setting, a delay circuit setting and the like in the DRAM and SRAM. The host computer stores the information sent thereto in a database in conjunction with other manufacturing management information.

(2) A LSI body wafer is diced, and recoverable chips are picked up.

(3) The LSI body is preliminary assembled into a baby board.

(4) After the baby board is checked for defective assembly and the like, aging is performed. In this event, the identification number is read from the chip on the baby board, and recovery data corresponding to each chip is retrieved from the host computer and stored in the chip on the board.

(5) Screening is performed by a tester.

(6) The LSI body is removed from the baby board.

(7) The LSI bodies are shipped.

(8) A customer mounts a program device on a circuit mounting board simultaneously with the LSI body.

(9) The identification number is retrieved from the LSI body.

(10) A host computer in a maker is accessed through a communication line to receive data corresponding to the mounted LSI body. The data is transferred to the program device for storing the data therein. Rather than using the communication line, electronic media such as CD-ROM, for example, may be used for distribution.

(11) Final boards are screened by a tester.

In the method of manufacturing a semiconductor integrated circuit device in each of the foregoing embodiments, (1) Since the combinations of the LSI bodies and dedicated program chips are equal to the number of LSI bodies registered in the dedicated program chips, one-to-one management is not required, the productivity is improved, and minor modifications are only needed in existing production facilities.

(2) Laser cut fuses can be used for the dedicated program chip. The metal fuse is advantageous over other electrically programmable elements in that it involves few modifications to a standard CMOS process, facilitates modifications to a design in accordance with the specifications of the LSI body, and does not depend on the generation of process. Modifications from the standard process include formation of final wiring layers and a passivation step.

(3) Since the registers in the LSI body can be implemented by latch circuits, it has a smaller area to reduce the chip size of the LSI body.

(4) When a chip identification number generator circuit is mounted in the LSI body, it is not necessary to add a programmable element process to the chip body.

(5) The dedicated program chip can be replaced (repaired). When the LSI body must be modified or experiences a problem after it has been mounted on a module or a board, this can be coped with by replacing the dedicated program chip with a chip which has modified contents of the program.

(6) The exchange of information centered at the host computer can be realized using a network to use a remote manufacturing factory, thereby permitting economical production activities.

Figure 39:
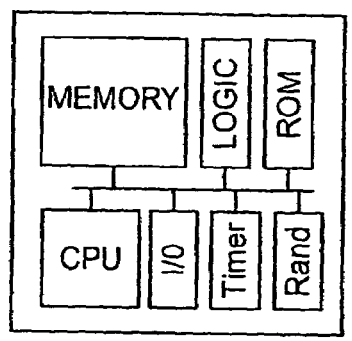
FIG. 39 is a block diagram illustrating an exemplary application specific LSI which is provided with the identification number generator circuit according to the present invention.
Figure 40:
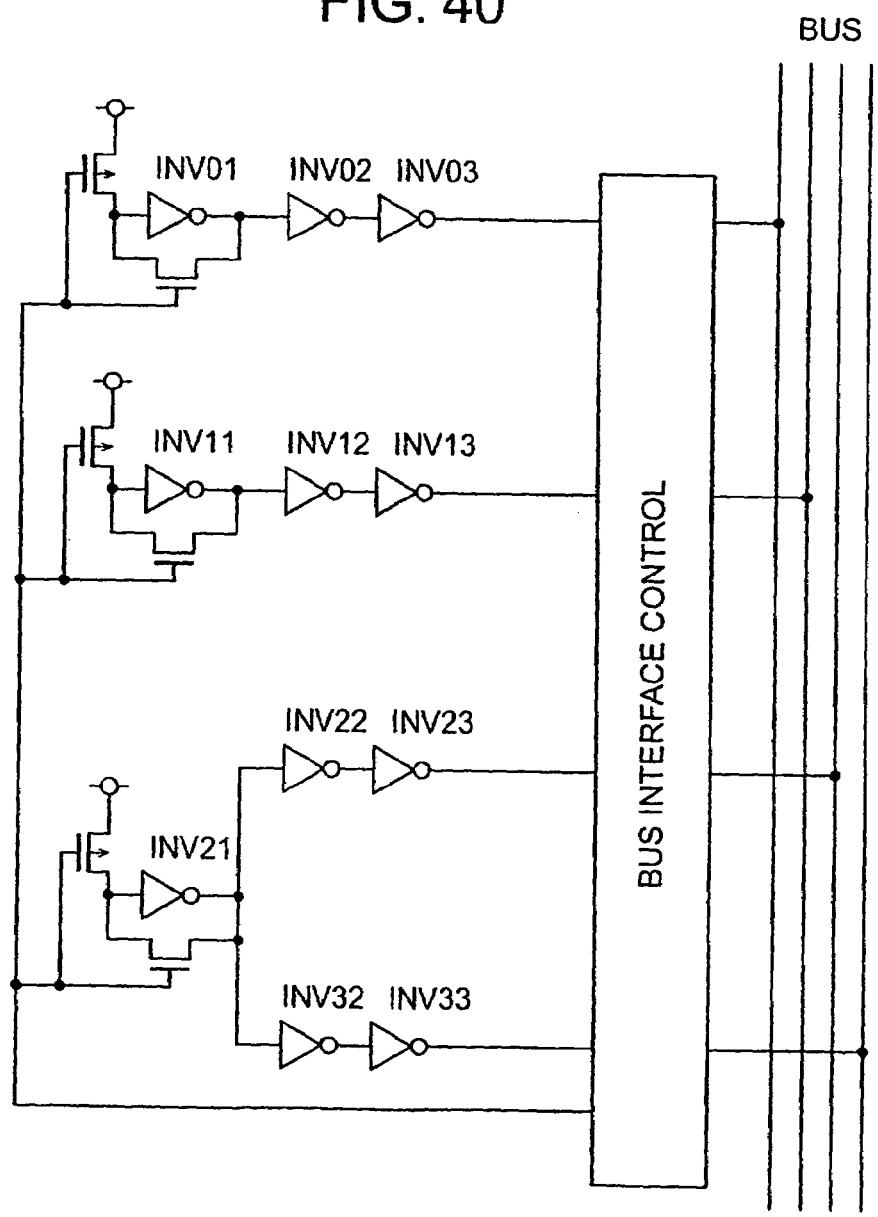
FIG. 40 is a circuit diagram illustrating an embodiment in which variations in logical threshold value of the CMOS inverter according to the present invention is applied to a random number generator.

FIG. 40 shows an embodiment in which variations in logical threshold values of CMOS inverters is applied to a random number generator. An application specific LSI as in FIG. 39 will be used in description as a more specific embodiment. This LSI is for controlling a toy robot. Toy robots currently available on the market, particularly robots raised as pets, have uniform characters upon shipment from the factories. However, for making the robots similar to actual living creatures and animals, they may be provided with inherent or genetic characteristics such as sex, i.e., male or female, tempers, the capacity for locomotion, by way of example, so that purchasers who own the robots are encouraged to conceive a great affection for them as living creatures.

FIG. 40 illustrates the most simple circuit for providing a dedicated LSI with inherent characteristics when LSIs are manufactured without programs. This outputs a 4-bit random number in binary notation, and an output value of each bit is randomly generated from one LSI to another. For example, D0 determines whether the robot is male or female. D1 determines tempers, and D2 and D3 determine the dependency on the owner in four stages. While two types of circuit schemes are shown for D0 and D1, D2 and D3, they are basically identical in that a difference in logical threshold value between two CMOS inverters is extracted.

A robot can be provided with such inherent personality in other methods. For example, this is possible by changing parameters in a control program from one robot to another. However, the owners cannot deny a feeling that the robots are programmed by manufacturing makers, i.e., created by humans. The method shown in this embodiment can improve the value of a product because individual personality cannot control even by the maker who manufactured it, thus making the owner feel something like so-called "Providence of God."

Figure 41:
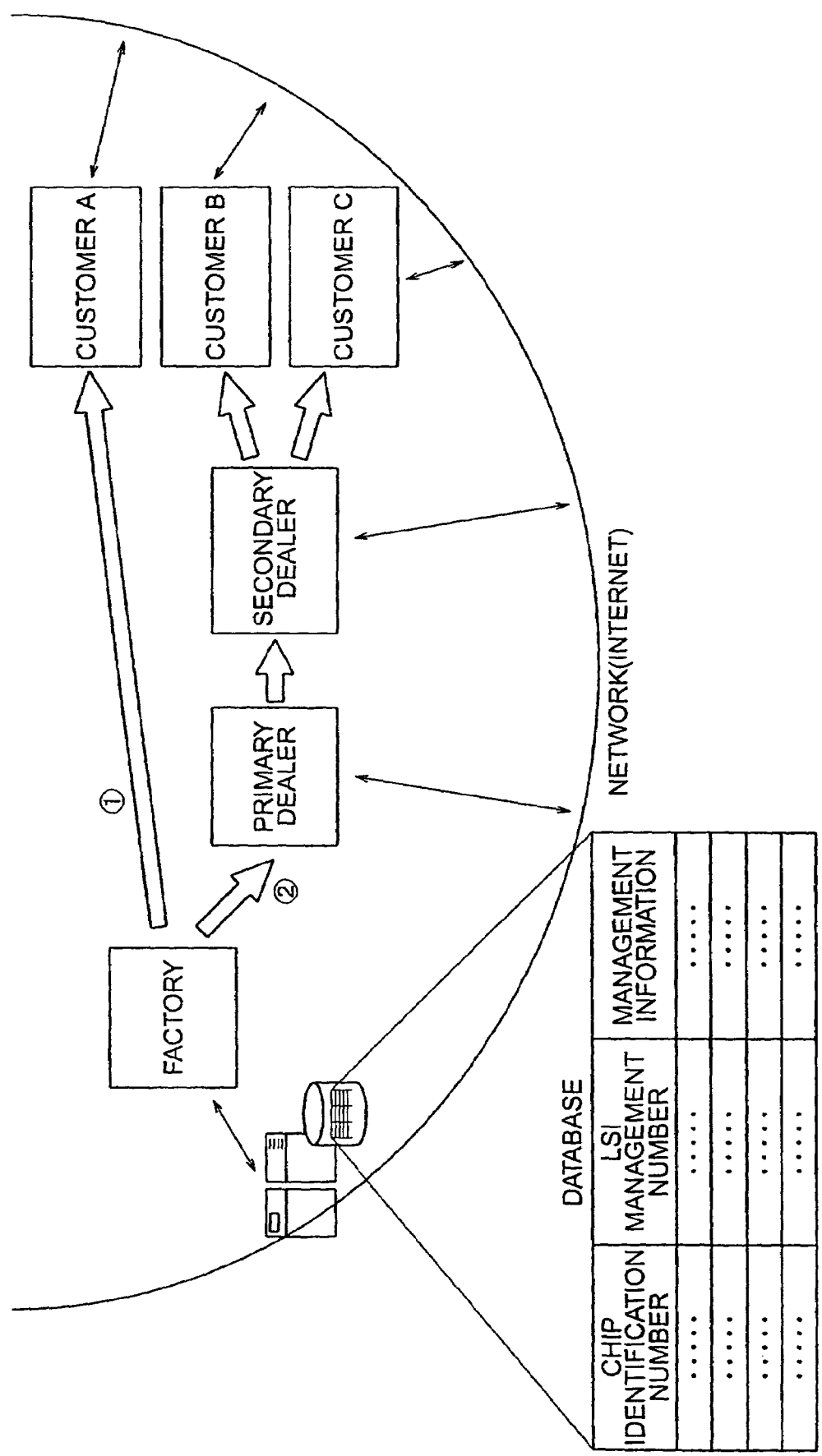
FIG. 41 is a schematic diagram for describing an exemplary use of a chip identification number generator circuit for purposes of reducing fraudulent actions and a variety of troubles in an inter-enterprise electronic part procurement market.

FIG. 41 illustrates a schematic diagram of an exemplary usage of a chip identification number generator circuit for purposes of reducing fraudulent actions and a variety of troubles in an electronic part procurement market over companies.

Semiconductor LSIs shipped from a factory each have the built-in chip identification number generator circuit as described above. The factory or maker collects chip identification numbers of all shipped products. Since the chip identification numbers are random, they are corresponded to LSI management numbers which are convenient for management. The chip identification number is further related to a variety of management information, for example, a production line name, a manufactured date, and the like.

For a direct delivery to a customer A as in (1) of FIG. 41, information such as a number of a unit (box or the like) which pack products, a customer number, ledger data, and the like is added to management information in a database. The customer A who has received products, reads chip identification numbers from all LSIs or sampled LSIs during an acceptance test. Next, the customer A accesses the database of the maker through a network, for example, the Internet or the like. The customer A retrieves the chip identification numbers of LSIs included in the received unit from the database for comparison with the identification numbers read from the received LSIs. If the retrieved identification numbers match the read identification numbers, it can be confirmed that the delivery of the products is correct. While this approach can be applied to general-purpose products and customer-based custom products, it is particularly effective with the custom products.

Assume in FIG. 41 that a broker (dealer) intervenes. The shipment from the factory is the same as the above. Generally, a primary broker who has received a package does not open the package, but references the unit number to a server of the maker, and simultaneously, registers information on the next delivery destination and the like. Further, a secondary and a third-order dealers act in a similar manner. A final customer reads identification numbers of LSIs from the received LSIs in a manner similar to the foregoing (1) for reference to the database in the maker. The following effects are expected by building the foregoing system:

(1) Mix-up of delivered products can be prevented.
(2) Brokers are prevented from fraudulent acts such as replacement with used products, and the like.
(3) Resale of defective products or used products by return can be prevented.
(4) A distribution route can be confirmed.

Figure 42:
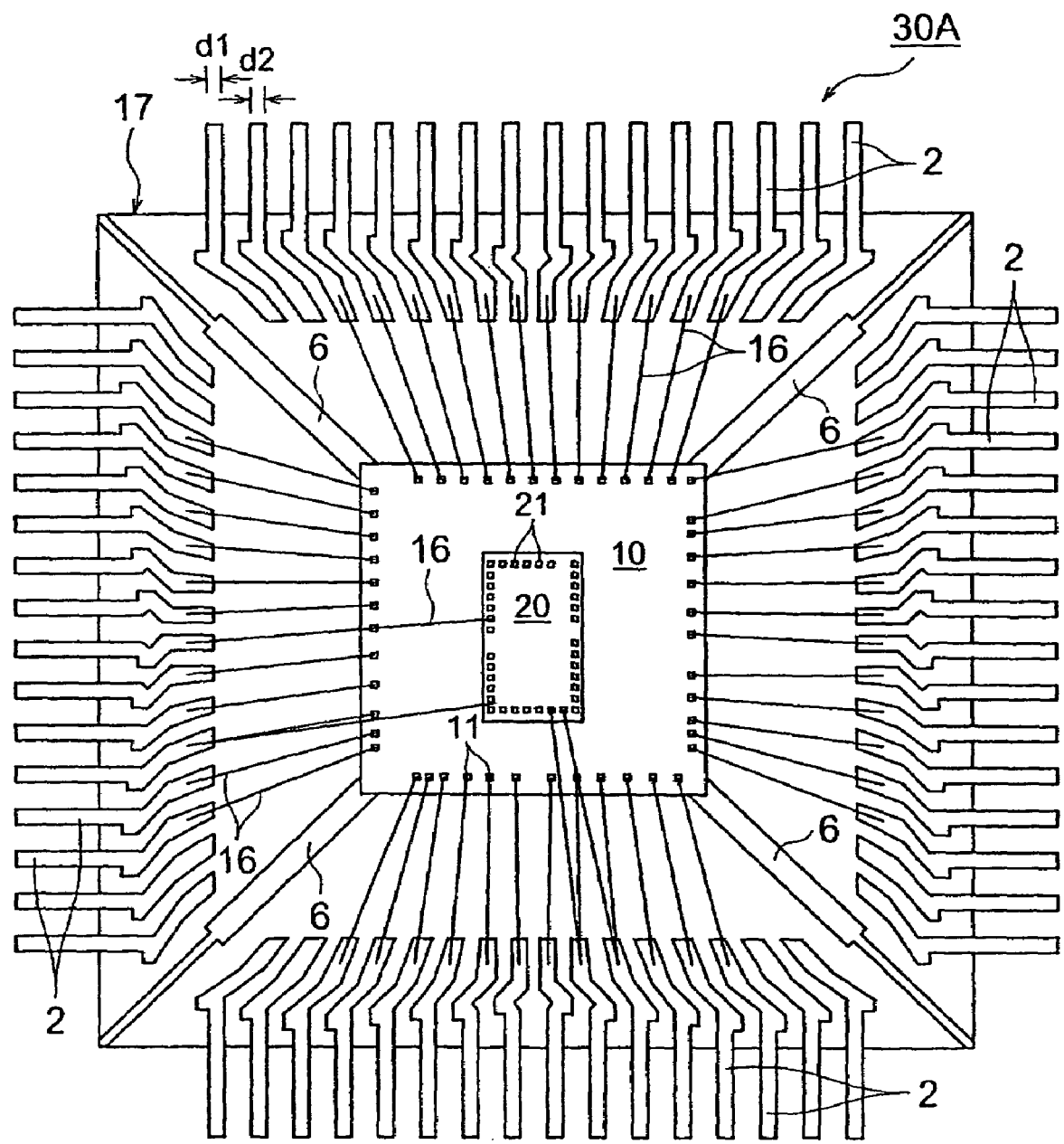
FIG. 42 is a basic circuit diagram illustrating another embodiment of the identification number generator circuit according to the present invention.

FIG. 42 illustrates a diagrammatic plan view of another embodiment of a semiconductor integrated circuit device according to the present invention. FIG. 42 is a diagrammatic plan view of the semiconductor integrated circuit device from which a top portion of a resin encapsulator is removed, which is applied to a semiconductor device referred to as an MCP (Multi Chip Package) type. In the MCP type semiconductor device of this embodiment, two semiconductor chips are stacked and assembled into a single package. Among them, a semiconductor integrated circuit device 10 is used as a base chip which serves as the LSI body in FIGS. 33, 34 and the like. Then, an overlying semiconductor chip 20 is used as the dedicated program chip. A QFP type semiconductor device 30A in this embodiment has two semiconductor chips (LSI body 10, dedicated program chip) stacked one on the other, and the two semiconductor chips are encapsulated by a single resin encapsulator 17.

The LSI body 10 and dedicated program chip 20 are formed in different plane sizes (outer dimensions), and their respective plane shapes are formed in a square shape. In this embodiment, the plane shape of the LSI body 10 is formed, for example, in a rectangle of 4.05 [mm]×4.15 [mm], while the plane shape of the dedicated program chip 20 is formed, for example, in a rectangle of 1.99 [mm]×1.23 [mm].

The LSI body 10 and dedicated program chip 20 each comprise a semiconductor substrate made, for example, of single crystal silicon; a multi-layer wiring layer having insulating layers and wiring layers stacked in a plurality of stages on a circuit formation surface of the semiconductor substrate; and a surface protection film (final protection film) formed to cover the multi-layer wiring layer.

Out of a circuit formation surface (one main surface) 10A and a back surface (the other main surface) of the LSI body 10 opposing each other, a plurality of bonding pads 11 are formed on the circuit formation surface 10A. The plurality of bonding pads 11 are formed on the topmost wiring layer in the multi-layer wiring layer of the LSI body 10. The topmost wiring layer is covered with the surface protection film formed thereon, and the surface protection film is formed with bonding openings for exposing the surface of the bonding pads 11.

Out of a circuit formation surface (one main surface) 20A and a back surface (the other main surface) of the dedicated program chip 20 opposing each other, a plurality of bonding pads 21 are formed on the circuit formation surface 20A. The plurality of bonding pads 21 are formed on the topmost wiring layer in the multi-layer wiring layer of the dedicated program chip 20. The topmost wiring layer is covered with the surface protection film formed thereon, and the surface protection film is formed with bonding openings for exposing the surface of the bonding pads 21.

The bonding pads 11 of the LSI body 10 and the bonding pads 21 of the dedicated program chip have a plane shape formed in a square of 65 [μm]×65 [μm], by way of example.

A plurality of bonding pads 11 of the LSI body 110 are arranged along four sides of the LSI body 10 (two longer sides (10A1, 10A2) opposite to each other, and two shorter sides (10A3, 10A4) opposite to each other). A plurality of bonding pads 21 of the dedicated program chip 20 are arranged along four sides of the EEPROM chip 20 (two shorter sides (20A1, 20A2) opposite to each other, and two longer sides (20A3, 20A4) opposite to each other).

The dedicated program chip 20 is disposed on the circuit formation surface 10A of the LSI body 10 such that the back surface or the other main surface of the dedicated program chip 20 faces the circuit formation surface 10A of the LSI body 10, and is securely adhered to the circuit formation surface 10A of the LSI body 10 through an adhesive layer 15. In this embodiment, a polyimide-based adhesive resin film, for example, is used for the adhesive layer 15.

The LSI body 10 is securely adhered to a die pad through an adhesive layer with its back surface facing the die pad. The die pad is integrated with four hanging leads 6, such that these die pad 5 and four hanging leads 6 make up a supporter.

The resin encapsulator 17 has a plane shape formed in a square. In this embodiment, the resin encapsulator 17 has a plane shape formed in a square of 10 [mm]×10 [mm], by way of example. The resin encapsulator 17 is formed, for example, of an epoxy-based resin added with a phenol hardener, silicone rubber, filler and the like for purposes of reducing stresses. The formation of the resin encapsulator 17 is implemented by a transfer mold method which is suitable for mass production. The transfer mold method employs a mold which comprises a pot, a runner, a inflow gate, a cavity and the like, and injects a resin into the cavity from the pot through the runner and inflow gate for forming the resin encapsulator.

Around the LSI body 10, a plurality of leads 2 are arranged along each side of the resin encapsulator 17. Each of the plurality of leads 2 has an inner lead section (inner lead) and an outer lead section (outer lead) integrally formed with the inner lead section. The inner lead section of each lead 2 is positioned inside the resin encapsulator 17, while the outer lead section is positioned outside the resin encapsulator 17. In other words, the plurality of leads 2 extend internal to and external to the resin encapsulator 17. The outer lead section of each lead 2 is bent, for example, in a gull-wing lead shape which is one of surface mount lead shapes.

In this embodiment, the LSI body 10 comprises an identification number generator circuit generated in the relation of magnitude in logical threshold values of CMOS inverter circuits, as mentioned above. When such CMOS inverter circuits are used, a control signal must be inputted for supplying the LSI body with an operating voltage to operate the identification number generator circuit. For this purpose, a special power supply unit, though simple in configuration, and a signal read unit are required.

When semiconductor integrated circuit devices are on a communication path, it is often the case that someone wants to know their identification numbers, but presumably, the operating voltage cannot be supplied under certain environments. The inventive concept of this application lies in determining the relation of magnitude in a physical amount corresponding to process variations in a plurality of identification elements in the same form in course of a semiconductor integrated circuit device manufacturing process. The semiconductor integrated circuit device has a plurality of leads which are formed by pressing or the like to have a uniform lead width d.

However, widths d1, d2 and the like of a plurality of leads are caused by process variations. Thus, the lead widths d1, d2 and the like of the plurality of leads are measured by an optical device and compared in terms of magnitude for utilization in generating the identification number, making use of the process variations, as is the case with the logical threshold values of the CMOS inverter circuits. In this configuration, the lead widths of a plurality of leads are measured by a measuring device, and their relation of magnitude is determined to determine an identification number unique to a semiconductor integrated circuit device in a manner similar to the foregoing.

Specifically, 16 leads have been previously determined before shipment of semiconductor integrated circuit devices as mentioned above, the lead width, a pitch between the leads or the like is measured for holding the positional information and the relation of magnitude in the form of a database. For measuring the lead width pitch, the measurement is preferably made at a portion of the lead 2 protruding from a package 17. Since this measurement can be made in a short time by an optical device, the determination of identification numbers upon shipment will not take a long time.

This can be utilized for semiconductor integrated circuit devices which are not mounted with CMOS circuits, and in semiconductor integrated circuit devices comprised of CMOS circuits, it may be used in combination with the electric identification numbers of the CMOS inverters. Variations in two such physical amounts can be totally determined to more securely determine the identification number.

Figure 43:
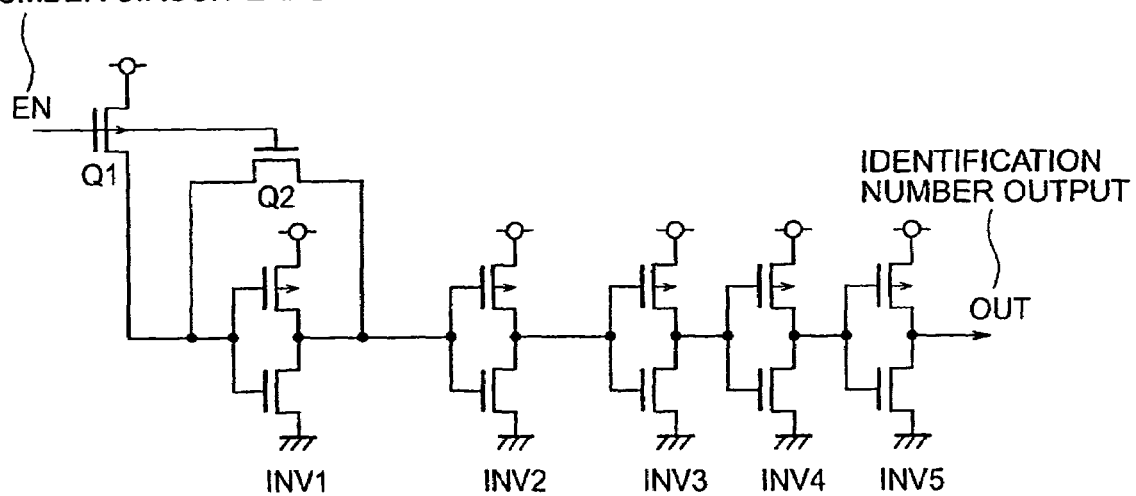
FIG. 43 is a basic circuit diagram illustrating another embodiment of the identification number generator circuit according to the present invention.

FIG. 43 illustrates a basic circuit diagram of another embodiment of the identification number generator circuit according to the present invention. In the foregoing embodiment, the circuit represented in FIG. 7 is used to generate the identification number from the order of logical threshold values of variations of a plurality of CMOS inverter circuits. In contrast, in this embodiment, the result of comparison between logical threshold values of two CMOS inverter circuits INV1 and INV2 is used as one bit. This idea is utilized also in the embodiment of FIG. 40.

In this embodiment, the logical threshold values of the two CMOS inverter circuits INV1 and INV2 are compared in the following manners. An N-channel MOSFET Q2 for short-circuiting is provided between an input terminal and an output terminal of the inverter circuit INV1. Though not particularly limited, a P-channel MOSFET Q1 is provided between the input terminal of the CMOS inverter circuit INV1 and a supply voltage VDD. These MOSFETs Q1 and Q2 are supplied with an identification number circuit enable signal EN at their respective gates.

The output terminal of the inverter circuit INV1 is connected to an input terminal of the inverter circuit INV2. An output signal of the inverter circuit INV2 is binarized by an amplifier circuit comprised of a cascaded circuit of similar CMOS inverter circuits INV3 to INV5, so that an identification number output is formed from an output terminal OUT.

When the identification number enable signal EN is at low level, the circuit is inactive, wherein the MOSFET Q1 is turned on, and the CMOS inverter circuit INV1 is supplied with a high level corresponding to the supply voltage VDD at the input. In this event, the MOSFET Q2 is turned off, the output signal of the inverter circuit INV1 is brought to low level, and subsequently a signal which alternates between the high level and low level is transferred through the inverter circuit sequence INV2 to INV5.

The characteristics of MOSFETs which makes up a CMOS inverter circuit can undesirably vary depending on a gate bias applied to the gate. In comparison of a P-channel MOSFET with an N-channel MOSFET, the P-channel MOSFET is more likely to present relatively large fluctuations in characteristics due in part to the NBTI phenomenon as previously introduced in the description in connection with FIG. 19 and as will be next described with reference to FIG. 44.

The pull-up operating MOSFET Q1, which turns on when the identification number circuit of FIG. 43 is inactive, has an action of preventing a through current of the CMOS inverter circuit at the first stage, and an action of sufficiently suppressing the fluctuations in the characteristics of the P-channel MOSFET by maintaining the gate potential of the P-channel MOSFET in the CMOS inverter circuit at the first stage at its source potential, i.e., a high potential comparable to the power supply potential level.

When the identification number circuit is activated, i.e., when it generates an identification number, the signal EN is brought to high level. Consequently, the input and output of the CMOS inverter circuit INV1 are short-circuited by the MOSFET Q2 to generate a voltage corresponding to the logical threshold value voltage. The voltage corresponding to the logical threshold value of the CMOS inverter circuit INV1 is supplied to the input terminal of the CMOS inverter circuit INV2. The CMOS inverter circuit INV2 compares its own logical threshold value voltage with the voltage corresponding to the logical threshold value of the CMOS inverter circuit INV1.

When the logical threshold value of the inverter circuit INV1 is lower than that of the inverter circuit INV2, its output potential is higher than the logical threshold value voltage of the inverter circuit INV2. The output signal of the inverter circuit INV2 is amplified by the subsequent inverter circuits INV3, INV3, INV4, so that a potential at a node N5 is close to VSS. In contrast to the foregoing, when the logical threshold value of the inverter circuit INV1 is higher than that of the inverter circuit INV2, its output potential is lower than the logical threshold value voltage of the inverter circuit INV2. The output signal of the inverter circuit INV2 is amplified by the subsequent inverter circuits INV3, INV3, INV5, so that the potential at the node N5 is close to VDD.

Figure 44:
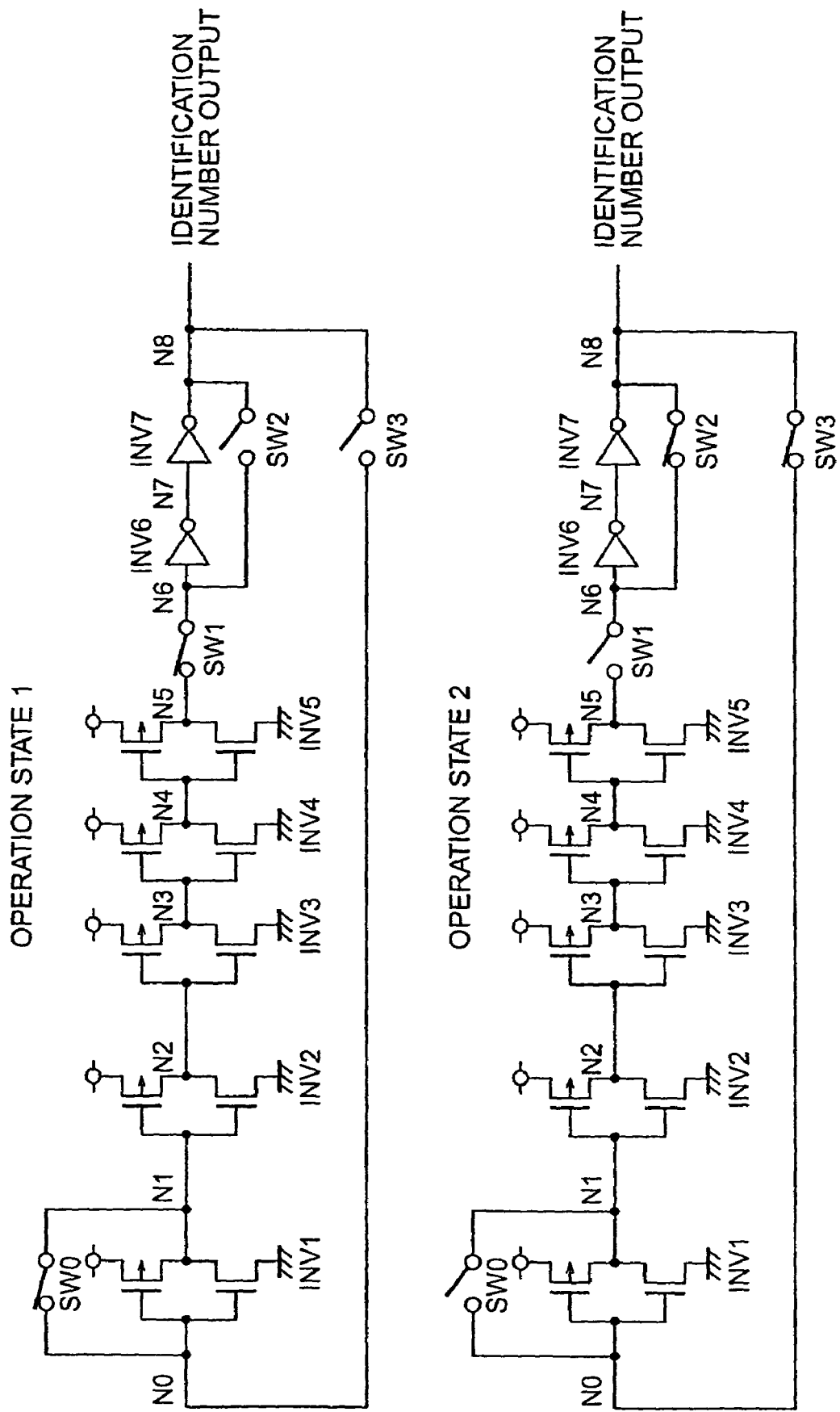
FIG. 44 is a basic circuit diagram illustrating another embodiment of the identification number generator circuit according to the present invention.

FIG. 44 illustrates a circuit diagram of another embodiment of the identification number generator circuit according to the present invention. Since features lie in the operation, FIG. 44 illustrates two circuits together corresponding to an operation state 1 and an operation state 2 for describing the operation.

Like the embodiment described in connection with FIG. 43, for generating identification information from a difference between the logical threshold values of the two CMOS inverter circuits INV1, INV2, it is important to ensure the reproductivity of an output signal even if the difference is small. Particularly, it is necessary to take into consideration fluctuations in the threshold value voltage of the P-channel MOSFET (not the logical threshold value of the CMOS inverter circuit) caused by the phenomenon referred to as NBTI which has become prominent in recent devices. Specifically, the phenomenon referred to as NBTI causes fluctuations in the threshold voltage of the P-channel MOSFET in one of the two CMOS inverter circuits, and the logical threshold value of the CMOS inverter circuit is also affected to reverse the difference between the logical threshold values of the two CMOS inverter circuits, giving rise to a problem of a lower reliability for identification information generated thereby.

In this embodiment, a latch and a feedback path are added for ensuring the reproductivity of the identification number and for improving the immunity to aging changes. Specifically, the output signal of the inverter circuit INV5, which forms part of the amplifier circuit as described above, is transferred to an input of an input-side CMOS inverter circuit INV6, which forms part of the latch circuit, through a switch SW1. An output signal of the inverter circuit INV6 is transferred to an input of an inverter circuit INV7, and an output signal of the inverter circuit INV7 is fed back to the input of the inverter circuit INV6 through a switch SW2. Also, the input signal of the inverter circuit INV7 is fed back to the input of the inverter circuit INV1 through a switch SW3.

The operation state 1 in FIG. 44 shows the operation of generating identification information, wherein a switch SW0 is turned on to short-circuit the input and output of the CMOS inverter circuit INV1 to generate a voltage corresponding to the logical threshold value voltage at an output node N1. As the voltage corresponded to the logical threshold value of the CMOS inverter circuit INV1 is inputted to the CMOS inverter circuit INV2 as mentioned above, a voltage corresponding to the difference between the logical threshold value voltages is generated at an output node N2 of the CMOS inverter circuit INV2, and is amplified by the CMOS inverter circuits INV3 to INV5 which form part of the amplifier circuit.

When the logical threshold value of the inverter circuit INV1 is lower than that of the inverter circuit INV2, the potential at the node N2 is higher than the logical threshold value voltage of INV2. The difference between the potential and logical threshold value of INV2 is amplified by the subsequent inverter circuits INV3, INV4, INV5, so that the potential at the node N5 is close to VSS In this event, the switch 1 of the latch circuit is turned on, while the switch SW2 is turned off, so that the amplified signal is transferred through the switch SW1 in ON state, resulting in the potentials at the input node N6 of the inverter circuit INV6, at an output node N7 of the inverter circuit INV6, and at an output node N8 of the inverter circuit INV7 being equal to VSS, VDD, VSS, respectively.

The operation state 2 in FIG. 44 shows a feedback operation, where the switch SW1 of the latch circuit is turned off, while the switch SW2 is turned off, and the foregoing states are held. The switch SW0 is turned off, and the switch SW3 is turned on to feed a voltage held at the node N8 back to the input of the CMOS inverter circuit INV1.

Consequently, the gate input of the inverter circuit INV1 is equal to the node N8, i.e., the VSS potential. Also, the gate input of INV2 is equal to VDD. In other words, the potential at the gate of the P-channel MOSFET in the inverter circuit INV1 is at VSS. This is a condition for accelerating NBTI for the P-channel MOSFET, and if this state is held long, the threshold value (not the logical threshold value) voltage of the MOSFET tends to gradually increase. Though there is not necessarily a corroboration of increase, this is not at least a condition for reducing. When the threshold value of the P-channel MOSFET in the inverter circuit INV1 fluctuates to be higher, the logical threshold value voltage of the inverter circuit INV1 becomes relatively lower from a relation with the N-channel MOSFET.

On the other hand, when viewed for the P-channel MOSFET in the inverter circuit INV2, the gate potential is at VDD, which is a condition in which the acceleration of NBTI is hard to occur, so that the logical threshold value voltage of the inverter circuit INV2 vary in a relatively small range. Specifically, the continued operation state 2 causes the logical threshold value of the inverter circuit INV1 to fluctuate to be lower for maintaining that of the inverter circuit INV2, resulting in a relatively expanded difference between the original threshold values. In this way, even with a small difference between the logical threshold values, the reproductivity of the identification bit, which has a low reproducibility, is increased, allowing for the realization of an identification number generator circuit which is highly immune to aging changes.

When the logical threshold value of the inverter circuit INV1 is higher than that of the inverter circuit INV2, the potential at the node N2 is lower than the logical threshold value of INV2. Therefore, in the feedback operation, the node N8 is amplified to the VDD potential. On the other hand, the gate input of INV2 is equal to VSS. In other words, the potential at the gate of the P-channel MOSFET in the inverter circuit INV2 is at VSS. This is a condition for accelerating NBTI for the P-channel MOSFET, and if this state is held long, the threshold value (not the logical threshold value) voltage of the MOSFET tends to gradually increase. Though there is not necessarily a corroboration of increase, this is not at least a condition for reducing. When the threshold value of the P-channel MOSFET in the inverter circuit INV2 fluctuates to be higher, the logical threshold value voltage of the inverter circuit INV2 becomes relatively lower from a relation with the N-channel MOSFET.

On the other hand, when viewed for the P-channel MOSFET in the inverter circuit INV1, the gate potential is at VDD, which is a condition in which the acceleration of NBTI is hard to occur, so that the logical threshold value voltage of the inverter circuit INV1 vary in a relatively small range. Specifically, the continued operation state 2 causes the logical threshold value of the inverter circuit INV2 to fluctuate to be lower for maintaining that of the inverter circuit INV1, resulting in a relatively expanded difference between the original threshold values. In this way, even with a small difference between the logical threshold values, the reproductivity of the identification bit, which has a low reproductivity, is increased, allowing for the realization of an identification number generator circuit which is highly immune to aging changes.

In FIG. 44, for preventing the operation state 2 from being brought into an erroneous state, the first operation state is first started by such a circuit as a power supply reset circuit or an initialization circuit in the semiconductor integrated circuit device upon activation of the semiconductor integrated circuit device, such as each time it is powered on, followed by a transition to the second operation state. In this way, an appropriate feedback operation can be performed irrespective of the power-on characteristics of the inverter circuits INV6, INV7 themselves.

Figure 45:
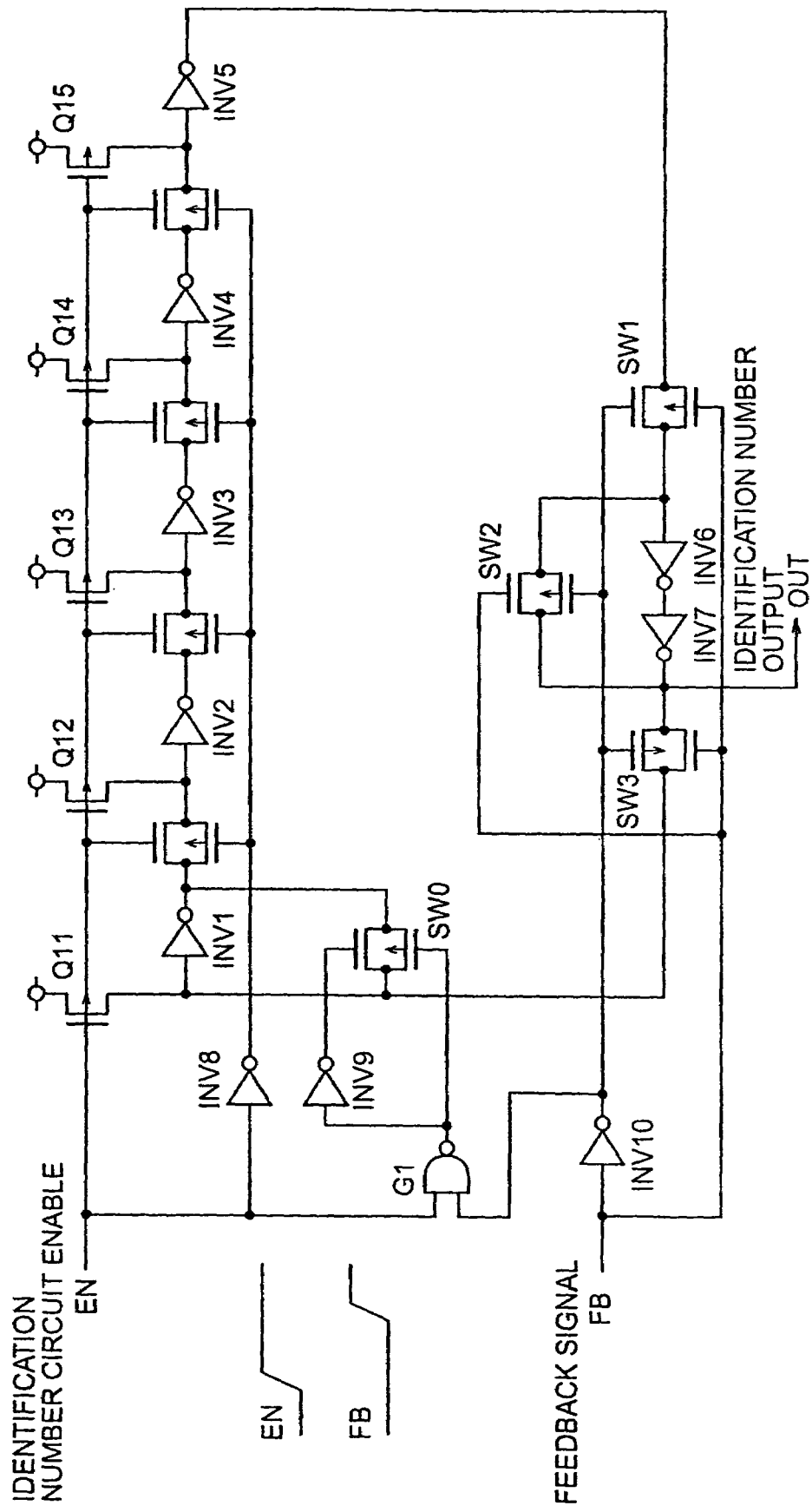
FIG. 45 is a specific circuit diagram illustrating one embodiment of the identification number generator circuit according to the present invention.

FIG. 45 illustrates a specific circuit diagram of one embodiment of the identification number generator circuit according to the present invention. This embodiment employs CMOS switches for the switches SW0 to SW3, each of which comprises an N-channel MOSFET and a P-channel MOSFET connected in parallel. Also, a CMOS switch and a P-channel MOSFET for pulling up to the supply voltage VDD are provided at each input terminal of the inverter circuit INV2 and each of the inverter circuits INV3 to INV5 which form part of an amplifier circuit.

Then, a feedback control signal FB is used to control the switch SW0 for short-circuiting the input and output of the inverter circuit INV1, in addition to controlling the switches SW1 to SW3 of the latch circuit. In other words, an output signal of an inverter circuit INV10 for forming an inverted version of the feedback signal FB is supplied to one input of an AND gate circuit G1, other than for controlling the CMOS switches SW1 to SW3 as mentioned above. The other input of the NAND gate circuit G1 is supplied with the signal EN, so that the switch SW0 is controlled with an output signal of the AND gate G1 and an inverted signal formed by an inverter circuit INV9.

In the circuit of this embodiment, when the signal EN is at low level with the supply voltage being applied to a semiconductor integrated circuit device or a semiconductor chip which is mounted with the identification number circuit, P-channel MOSFET Q11-Q15 are turned on to supply the input terminal of each CMOS inverter circuit with a high level such as the supply voltage VDD. In this event, the switch disposed at the input terminal of each of the CMOS inverter circuits INV2 to INV5 is turned off by the signal EN at low level and the inverted signal at high level by the inverter circuit INV8 to disconnect the cascade connection between the respective inverter circuits, so that the voltage level at the input terminal is brought to high level corresponding to the ON state of the MOSFET Q11 to Q15.

This is advantageous for preventing the threshold value voltage (not the logical threshold value of the CMOS inverter circuit) of the P-channel MOSFET, which forms part of the CMOS inverter circuit, from fluctuating due to the phenomenon referred to as NBTI when no identification number is extracted while the semiconductor integrated circuit device or semiconductor chip is being powered.

As the signal EN is changed from low level to high level, the switches for connecting the inverter circuits INV1 to INV5 in cascade are turned on, and the output signal of the gate circuit G1 transitions to low level, causing the switch SW0 to turn on. In this way, an amplified differential voltage between the logical threshold value voltage of the CMOS inverter circuit INV1 and the logical threshold value voltage of the inverter circuit INV2 is generated from the output of the inverter circuit INV5. When the signal FB is at low level, the switch SW0 is turned on, so that the output signal of the inverter circuit IV5 is taken into the inverter circuits INV6, INV7 which form part of the latch circuit.

When the signal FB is changed from low level to high level in the foregoing state, the switch SW1 is turned off, while the switches SW2 and SW3 are turned on in the latch circuit to hold the identification information taken therein. In addition, a signal corresponding thereto is fed back to the input of the inverter circuit INV1 through the switch SW3 to set the input voltages for the inverter circuits INV1 to INV5, thereby attempting to ensure or stabilize the identification number which conversely utilizes NBTI as described above. In this event, the signal FB at high level causes the output signal of the NAND gate G1 to return to high level, turning off the switch SW0 which has short-circuited the input and output of the inverter circuit INV1.

It is contemplated that since there is a large differential voltage between the input voltage of the inverter circuits INV4, INV5 and the like, which form part of the amplifier circuit, and the logical threshold value voltage, they will not be substantially affected by NBTI as mentioned above. However, when they are designed in the same configuration as the inverter circuits INV2, INV3 and the like, the same circuit cells can be used for forming the circuits on a semiconductor substrate, which is advantageous in utilizing a soft IP technique, later described.

Figure 46:
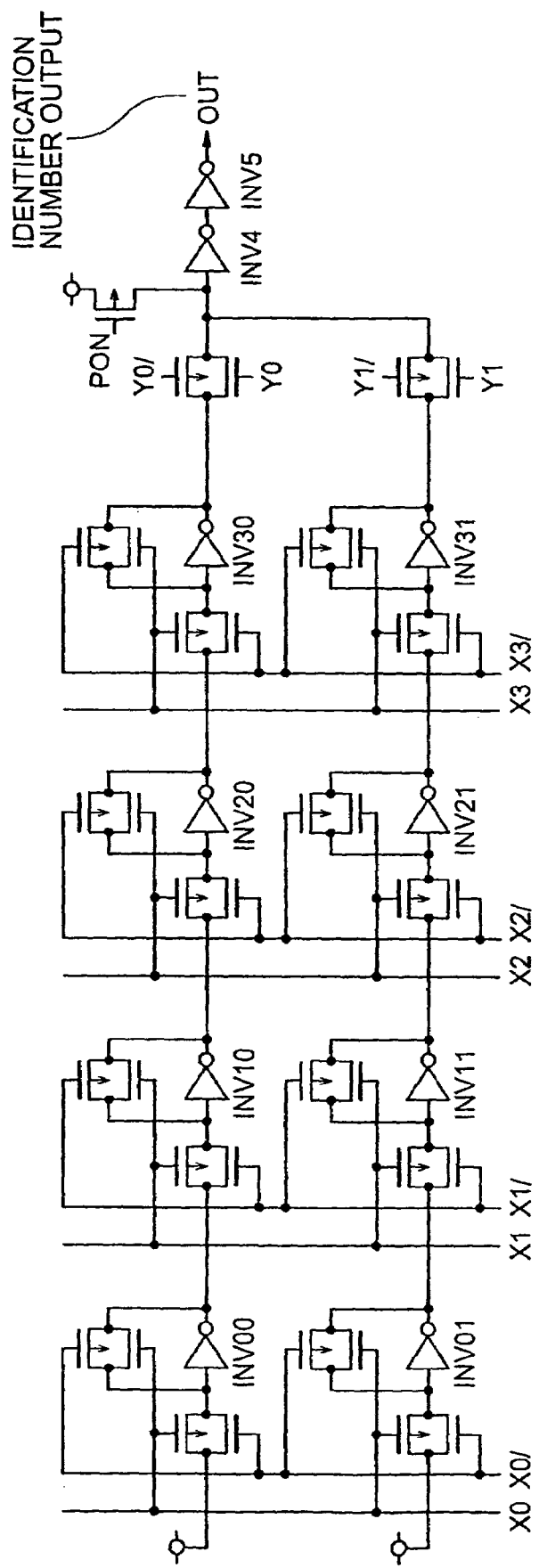
FIG. 46 is a specific circuit diagram illustrating a further embodiment of the identification number generator circuit according to the present invention.

FIG. 46 illustrates a specific circuit diagram of a further embodiment of the identification number generator circuit according to the present invention. This embodiment is an extension of the 1-bit identification number generator circuit as illustrated in FIG. 44 and the like. This embodiment is directed to a circuit which is composed of a less number of circuit elements for generating an 8-bit identification number.

In this embodiments, all CMOS inverter circuits in the circuit diagram are identical in constants and layout. Specifically, a unit circuit (cell) is composed of a CMOS inverter circuit, a CMOS switch provided at its input terminal, and a CMOS switch for short-circuiting its input terminal and output terminal. Respective unit circuits are connected in cascade through the CMOS switches provided at the input terminals. In FIG. 46, four unit circuits are connected in cascade. The first circuit of the four unit circuits is supplied with the supply voltage through the MOS switch.

Two CMOS switches of the CMOS inverter circuits are disposed at corresponding positions in two cascaded circuits, as mentioned above, which are arranged in parallel, and are commonly supplied with selection signals X0 to X3 and their inverted signal X0/ to X3/. In this way, the unit circuits are arranged in matrix extending in a signal transfer direction in which the unit circuits are connected in cascade and in a direction orthogonal thereto.

A switch is provided at an output terminal of the last circuit of the two cascaded circuits, and is supplied with selection signals Y0, Y0/ and Y1, Y1/ for selecting one of the cascaded circuits. Then, inverter circuits INV4 and INV5, which form part of an amplifier circuit as mentioned above, are provided to output an identification number erroneous output from an output terminal OUT. The inverter circuit INV4 is provided with a P-channel MOSFET at the input which is controlled by a signal PON for countermeasures to NBTI as mentioned above to supply the supply voltage to the input terminal of the inverter circuit INV4.

Figure 47:
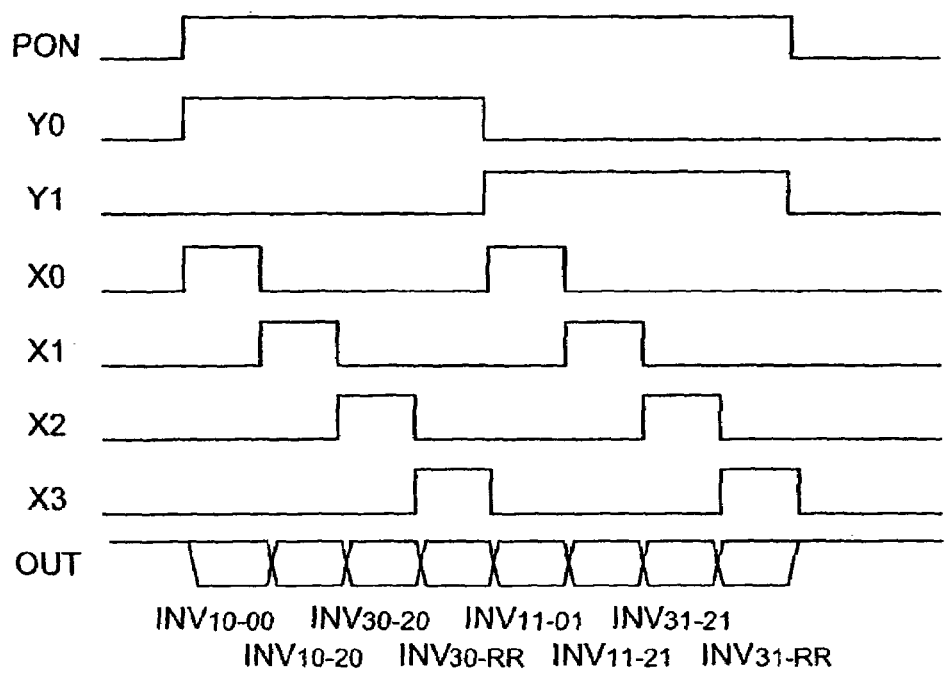
FIG. 47 is a timing diagram for describing the operation of the circuit in the embodiment of FIG. 46.

FIG. 47 illustrates a timing chart for describing the operation of the circuit in the embodiment of FIG. 46.

1) When the power-on signal PON is at low level, the selection signals X0 to X3 are at low level; the inverted signals X0/ to X3/ are at high level; Y0 and Y1 are at low level; and the inverted signals Y0/ and Y1/ are at high level. The outputs of CMOS inverters INV00, 20 and INV01, INV21 and INV4 are at low level, and those of INV10, INV30 and INV11, INV31 and INV5 are at high level.

2) As the power-on signal PON transitions to high level, the selection signal X0 goes to high level; X0/ to low level; Y0 to high level; and Y0/ to low level. The inputs of the inverter circuits INV00 and INV01 are disconnected from the supply voltage VDD, and the inputs and outputs of the respective inverter circuits are short-circuited by the CMOS switches which are turned on by the selection signal X0 at high level and X0/ at low level, causing the output voltages of the inverter circuits INV00 and INV01 to be at voltages corresponding to the logical threshold values.

When the logical threshold value VLT(INV00) of the inverter circuit INV00 and the logical threshold value VLT(INV10) of the next inverter circuit INV10 is in a relationship represented by VLT(INV00)>VLT(INV10), the output voltage of the inverter circuit INV10 largely leans to the VSS potential, i.e., to the low level side by an inverting amplification action possessed by the inverter circuit INV10. Conversely, when VLT(INV00)<VLT(INV10), the output voltage of the inverter circuit INV10 largely leans to the VDD potential, i.e., to the high level side. The output amplitudes of the inverter circuits INV10, INV11 are further amplified by the following inverter circuits INV20 to INV30, INV21 to INV31.

The output of the inverter circuit INV30 passes through a CMOS switch which is selected by the selection signals Y0, Y0/, further passes through the amplifier circuit composed of two CMOS inverter circuits INV4 and INV5, and is outputted at the output terminal OUT. After all, when VLT(INV00)>VLT(INV10), a low level is outputted at the output terminal OUT, whereas when VLT(INV00)<VLT(INV10), a high level is outputted at the output terminal OUT.

3) Next, the selection signals transition: X0 to low level (X0/ to high level) and X1 to high level (X0/ to low level). The inputs of the inverter circuits INV10 and INV11 are disconnected from the outputs of the preceding inverter circuits INV00 and INV01 because the CMOS switches disposed at the input terminals thereof are turned off by the X1 at high level (X0/ at low level), so that the input and output of the respective inverter circuits are short-circuited by the CMOS switch, causing the outputs of the inverter circuits INV10 and INV11 to be equal to the logical threshold values. When the logical threshold value VLT(INV10) of the inverter circuit INV10 and the logical threshold value VLT(INV11) of the next inverter circuit INV11 is in a relationship represented by VLT(INV10)>VLT(INV20), the output of the inverter circuit INV20 largely leans to the VSS potential, i.e., to the low level side by an inverting amplification action possessed by the inverter circuit INV20. Conversely, when VLT(INV10)<VLT(INV20), the output voltage of the inverter circuit INV20 largely leans to the VDD potential, i.e., to the high level side by the inverting amplification action possessed by the inverter circuit INV20.

The output amplitudes of the inverter circuits INV20, INV21 are further amplified by the following inverter circuits INV30, INV31, respectively. The output of the inverter circuit INV30 passes through a CMOS switch which is selected by the selection signals Y0, Y0/, further passes through the two CMOS inverter circuits INV4 and INV5, and is outputted at the output terminal OUT.

After all, when VLT(INV10)>VLT(INV20), a high level is outputted at the output terminal OUT, whereas when VLT(INV10)<VLT(INV20), a low level is outputted at the output terminal OUT. Here, the correspondence of the relation of magnitude in the previous and subsequent logical threshold values of the CMOS inverter circuits to the value of the output terminal OUT are reverse in the cases 2) and 3). This is caused by a different number of inverter circuits connected to the CMOS switch, i.e., a different number of stages of the CMOS inverter circuits for amplifying the logical threshold value voltage difference.

4) Next, the selection signals transition: X1 to low level (X1/ to high level), and X2 to high level (X2/ to low level). The inputs of the inverter circuits INV20 and INV21 are disconnected from the outputs of the preceding inverter circuits INV10 and INV11, and the input and output of the respective inverter circuits are short-circuited by the CMOS switches, causing the outputs of the inverter circuits INV20 and INV21 to be equal to the logical threshold values.

The subsequent operation follows the foregoing 2).

5) Next, the selection signals transition: X to low level (X2/ to high level), and X3 to high level (X3/ to low level). The inputs of the inverter circuits INV30 and INV31 are disconnected from the outputs of the preceding inverter circuits INV20 and INV21, and the input and output of the respective inverter circuits are short-circuited by the CMOS switches, causing the outputs of the inverter circuits INV30 and INV31 to be equal to the logical threshold values. When the logical threshold value VLT(INV30) of the inverter circuit INV30 and the logical threshold value VLT(INV4) of the next inverter circuit INV4 is in a relationship represented by VLT(INV30)>VLT(INV4), the output voltage of the inverter circuit INV4 largely leans to the VSS potential, i.e., to the low level side by an inverting amplification action possessed by the inverter circuit INV5. Conversely, when VLT(INV30)<VLT(INV4), the output voltage of the inverter circuit INV30 largely leans to the VDD potential, i.e., to the high level side.

After all, when VLT(INV30)>VLT(INV4), a high level is outputted at the output terminal OUT, whereas when VLT(INV30)<VLT(INV4), a low level is outputted at the output terminal OUT.

6) In the next transition and onward, the selection signal Y0 goes to low level (Y0/ to high level), and Y1 to high level (Y1/ to low level), resulting in the operation following the foregoing 2) to 5). In this way, an identification number comprised of eight bits (=4×2) is outputted.

This embodiment is characterized in that the inverter circuits for generating the identification number also serve as an amplifier circuit, and that the identification number is serially outputted by a read operation. This permits simplification of the circuit, which is suitable for outputting the identification number serially from a single output.

Figure 48:
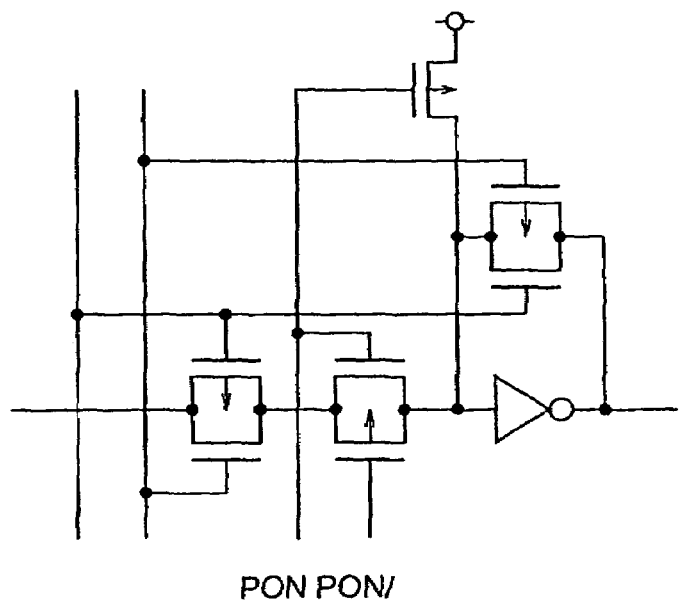
FIG. 48 is a circuit diagram illustrating another embodiment of the unit circuit used in the embodiment of the foregoing FIG. 46.

FIG. 48 illustrates a circuit diagram of another embodiment of the unit circuit for use in the embodiment of FIG. 46. This embodiment takes the following actions for NBTI as mentioned above. Specifically, a CMOS switch is added to the input terminal of each inverter circuit, in addition to the CMOS switch for connecting the inverter circuits as described above in cascade, for disconnecting the input terminal from the preceding circuit when the identification number circuit is inactive. Also, a P-channel MOSFET is provided at the input terminal for supplying the supply voltage to the input terminal.

In the unit circuit of this embodiment, when the power-on signal is at low level, i.e., when the supply voltage is supplied without reading an identification number from the identification number generator circuit, this signal PON is brought to low level to disconnect the input terminal of each inverter circuit from the preceding circuit irrespective of the selection signals X0, X0/ and the like as mentioned above, and the supply voltage VDD is supplied by the P-channel MOSFET.

Figure 49:
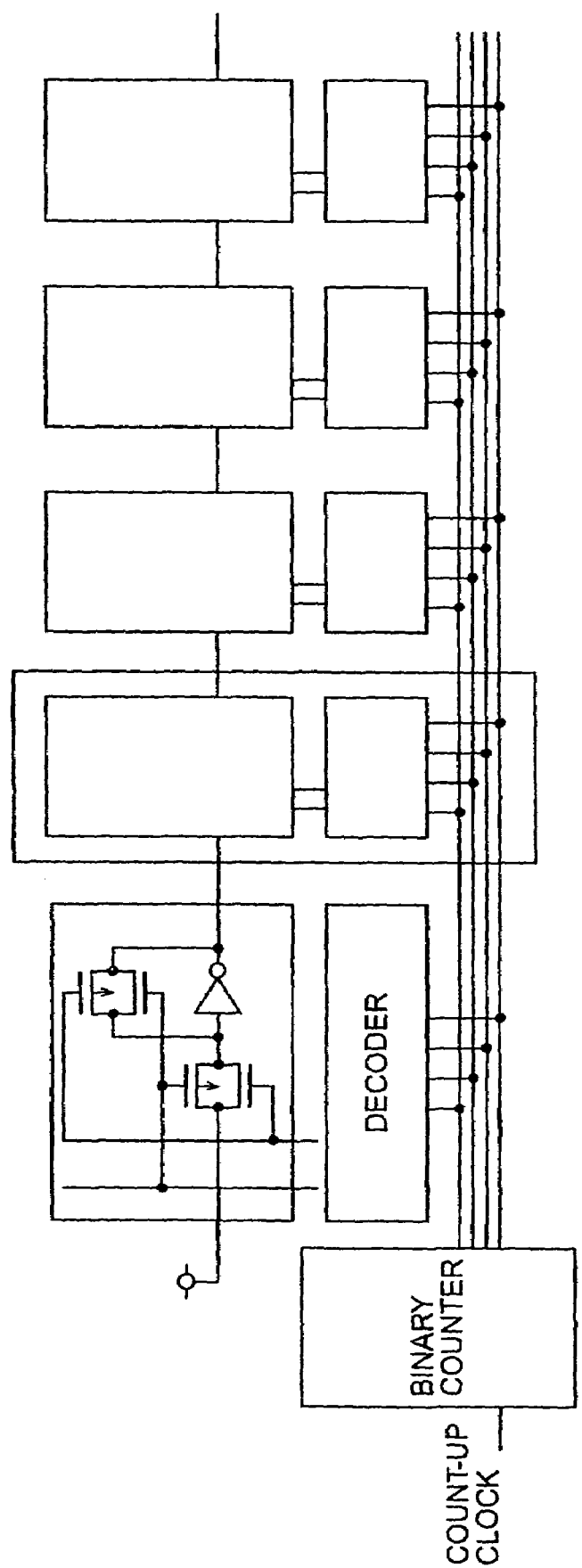
FIG. 49 is a circuit diagram illustrating a further embodiment of the identification number generator circuit according to the present invention.

FIG. 49 illustrates a circuit diagram of a further embodiment of the identification number generator circuit according to the present invention. This embodiment connects the unit circuits illustrated in FIG. 46 in cascade in a line, and forms selection signals using a binary counter and decoders. Specifically, the binary counter counts count-up clocks, and supplies the count output to the decoder provided in correspondence to each unit circuit to generate selection signals X0 (X0/) to Xn (Xn/) in order from the first circuit.

Figure 50:
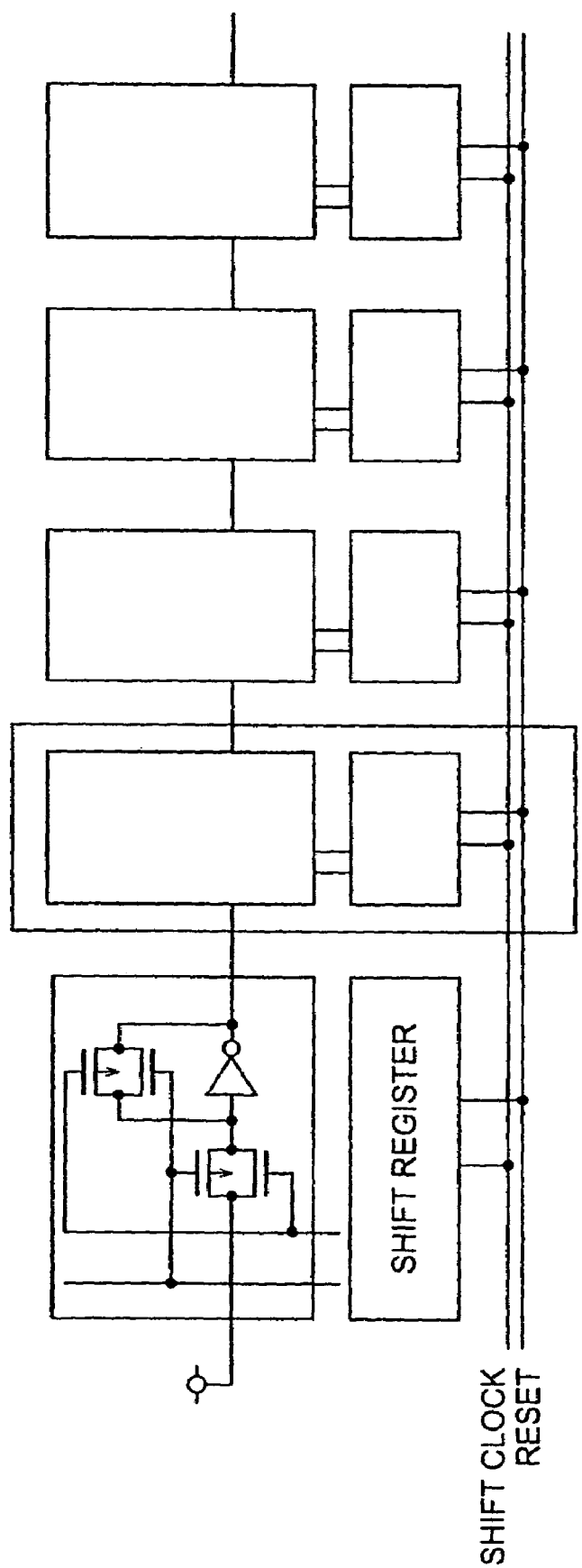
FIG. 50 is a circuit diagram illustrating a further embodiment of the identification number generator circuit according to the present invention.

FIG. 50 illustrates a circuit diagram of a further embodiment of the identification number generator circuit according to the present invention. This embodiment connects the unit circuits illustrated in FIG. 46 in cascade in a line, and forms selection signals using shift registers. Specifically, a shift register (for one stage) is provided corresponding to each unit circuit to sequentially shift the selection signals, thereby forcing the unit circuits to perform the selection operation as described above in order from the first unit circuit.

In either of the embodiments of FIGS. 49 and 50, those surrounded by a broken line may be defined as one unit circuit, which facilitates the design, expansion and mounting. Particularly, in the circuit in the embodiment of FIG. 50, the number of bits of the identification number can be increased only by connecting three types of signal lines consisting of cascade connection lines of the unit circuits, shift clock and reset, providing a high degree of freedom for mounting the chip, which is suitable for soft IP as later described.

Figure 51:
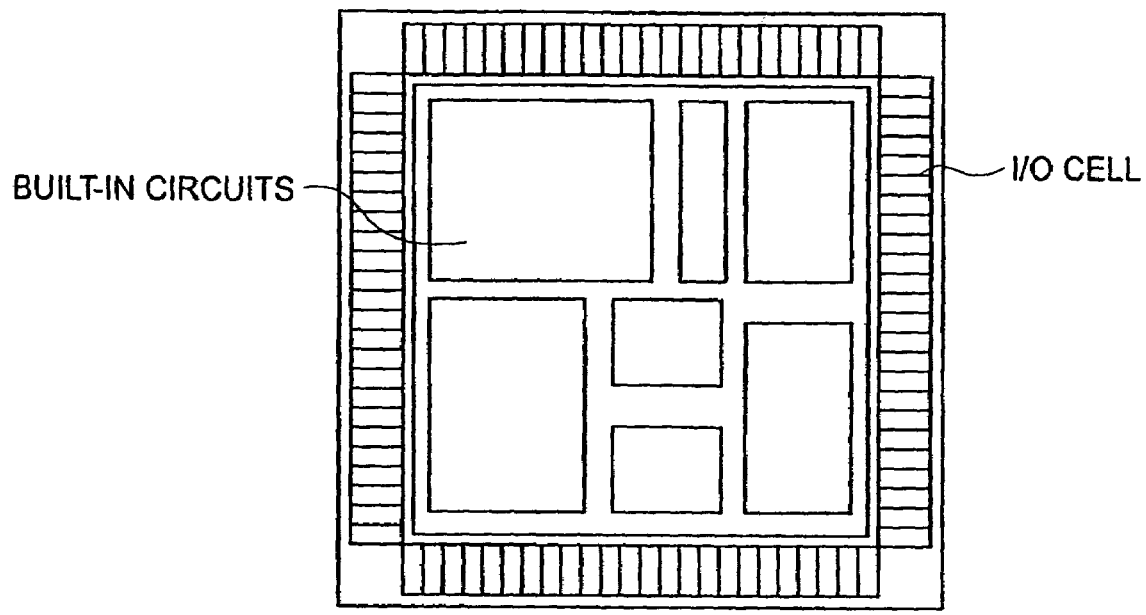
FIG. 51 is a circuit layout diagram illustrating one embodiment of a semiconductor integrated circuit device or a semiconductor chip to which the present invention is applied.

FIG. 51 illustrates a circuit layout diagram of one embodiment of a semiconductor integrated circuit device or a semiconductor chip to which the present invention is applied. FIG. 51 schematically represents a general system LSI chip, where a normal I/O cell (input/output circuit) is provided near the chip, and a plurality of circuits associated with the functions of the system LSI are provided in built-in circuits.

Figure 52:
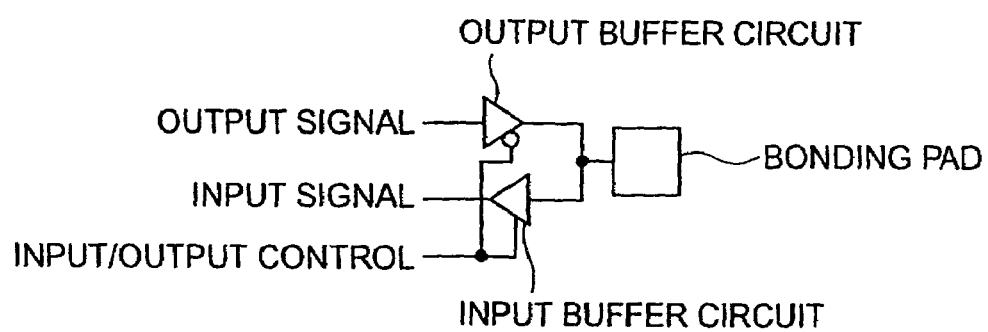
FIG. 52 is a block diagram illustrating a standard embodiment of the I/O cell.

FIG. 52 illustrates a block diagram of a standard embodiment of the I/O cell which is composed of an output buffer circuit, an input buffer circuit, and bonding pads (PAD) provided corresponding to them. The output buffer circuit and input buffer circuit are controlled by input/output control signals for performing an input operation or an output operation.

Figure 53:
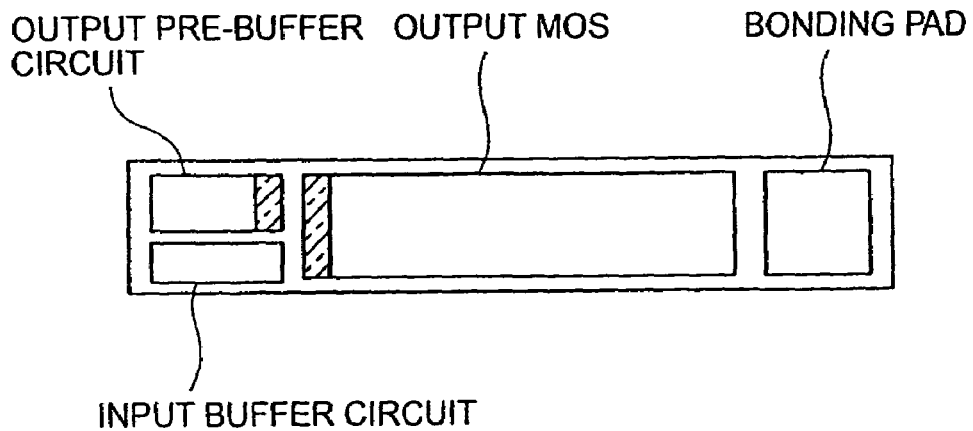
FIG. 53 is a circuit layout diagram illustrating one embodiment of an I/O cell provided in a semiconductor integrated circuit device or a semiconductor chip according to the present invention.

FIG. 53 illustrates circuit layout diagram of one embodiment of the I/O cell provided in a semiconductor integrated circuit device or a semiconductor chip according to the present invention. In this embodiment, an output pre-buffer circuit is provided for driving an output MOSFET. The output buffer circuit in FIG. 52 is composed of the output buffer circuit and output MOSFET.

For wire bonding, the bonding PADs are formed to have a relatively large occupation area. To be compatible with this, the output MOSFET as well as the output pre-buffer circuit and input buffer circuit are laid out. In this way, the I/O cell can be efficiently disposed corresponding to the pitch of the bonding pads.

Since the I/O cell is designed to have a relatively large occupation area as mentioned above, the 1-bit identification number generator circuit as illustrated in the foregoing embodiments can be fitted in a portion of the output pre-buffer circuit or output MOSFET, as indicated by hatchings.

Figure 54:
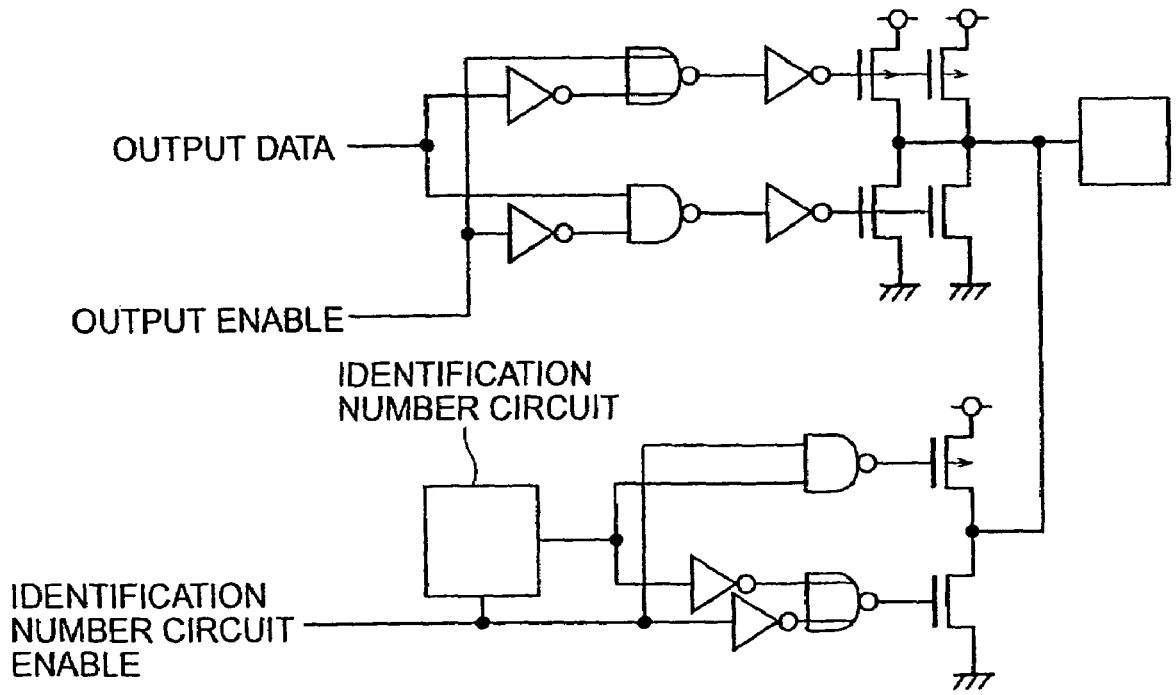
FIG. 54 is a circuit diagram illustrating one embodiment of an output buffer circuit which is provided in a semiconductor integrated circuit device or a semiconductor chip according to the present invention.

FIG. 54 illustrates a circuit diagram of one embodiment of the output buffer circuit which is provided in a semiconductor integrated circuit device or a semiconductor chip according to the present invention. In this embodiment, the 1-bit identification number generator circuit is added to the output buffer circuit.

In this embodiment, when an identification number circuit enable signal is activated (at this time, a regular output enable is inactive), a 1-bit identification number is outputted from a buffer disposed in parallel with a regular output buffer circuit. This buffer can be implemented by a MOSFET which has a smaller size as compared with an output MOSFET of the regular circuit, though its driving capability may be low. In this configuration, a special output terminal is not required for outputting the identification number, and a multi-bit identification number can be extracted making use of a large number of input/output terminals or input/output pads provided for the semiconductor integrated circuit device or semiconductor chip.

Figure 55:
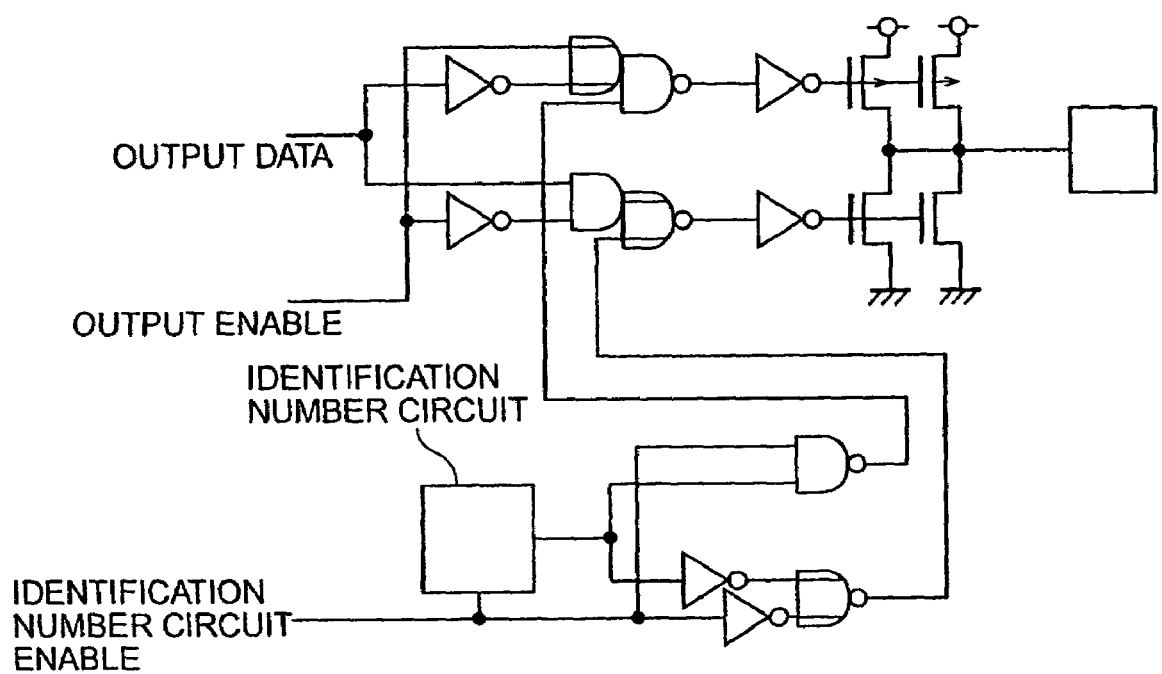
FIG. 55 is a circuit diagram illustrating another embodiment of an output buffer circuit which is provided in a semiconductor integrated circuit device or a semiconductor chip according to the present invention.

FIG. 55 illustrates a circuit diagram of another embodiment of the output buffer circuit which is provided in a semiconductor integrated circuit device or a semiconductor chip according to the present invention. Likewise, in this embodiment, the 1-bit identification number generator circuit is added to the output buffer circuit. In this embodiment, the identification number is outputted by use of a regular output buffer circuit. Specifically, a gate circuit is added to an output pre-buffer circuit to selectively output a regular output and an identification number. An identification circuit enable signal may be generated from a dedicated pin of an LSI, or generated by a special DFT function. The same applies to the embodiment of FIG. 54.

In recent years, JTAG (Joint Test Action Group) has been increasingly employed in logic LSIs. The JTAG standard also has a function referred to as IDCODE for registering and reading an identification number of LSI. However, since this identification number cannot be used for identifying an individual chip because it is allocated a small number of bits, i.e., 32 bits which are meticulously defined in configuration such that each bit identifies a device, a manufacturing maker, and the like.

Figure 56:
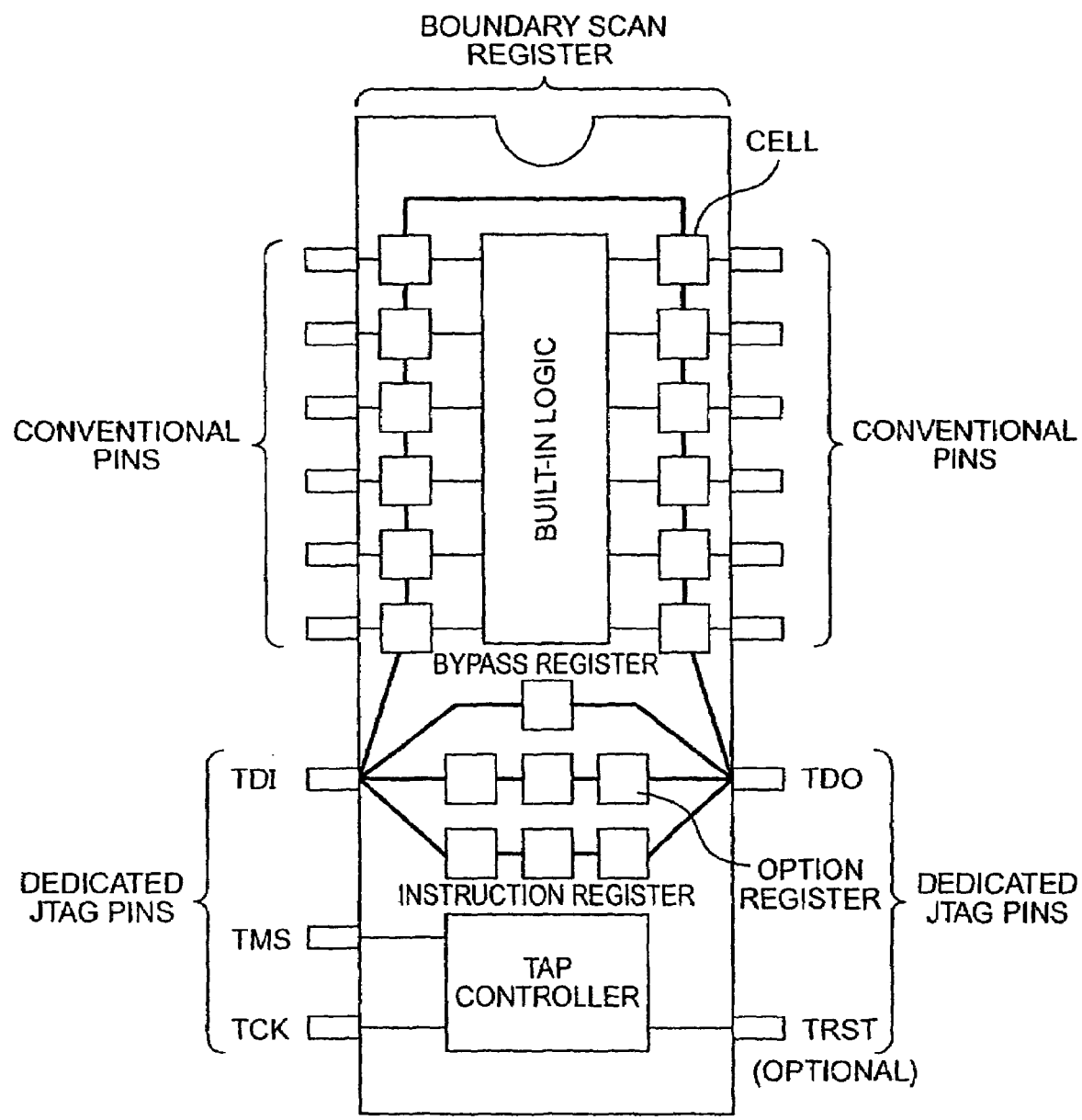
FIG. 56 is a general schematic diagram illustrating one embodiment of a semiconductor integrated circuit device according to the present invention.

FIG. 56 illustrates a general schematic diagram illustrating one embodiment of a semiconductor integrated circuit device according to the present invention. This embodiment is devised to output an identification number making use of an interface of JTAG.

A JTAG supporting device (semiconductor integrated circuit device) contains a boundary scan register, an instruction register, an option register and a bypass register, as well as a test logic comprised of a TAP controller for controlling them, in addition to built-in logics for performing essential functions of the semiconductor integrated circuit device.

A serial interface for inputting and outputting instructions to a test logic, test data, test result data and the like, which is referred to as TAP (Test Access Port), has five signal lines. These signal lines are controlled by an external host computer or the like to conduct a JTAG test.

Figure 57:
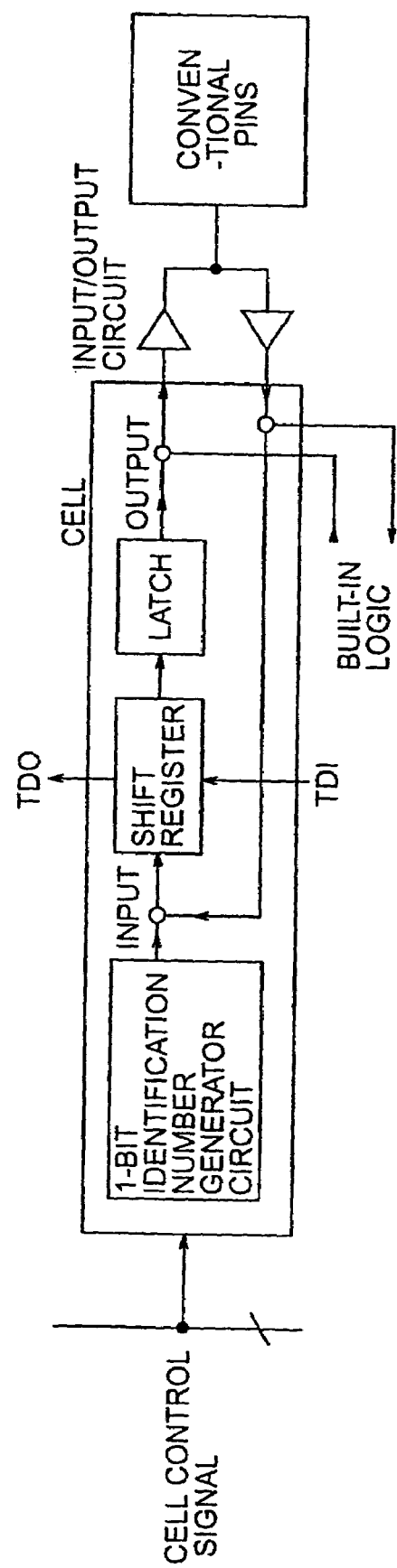
FIG. 57 is a block diagram illustrating one embodiment of a basic JTAG cell for the semiconductor integrated circuit device according to the present invention.

FIG. 57 illustrates a block diagram of one embodiment of a basic JTAG cell for the semiconductor integrated circuit device according to the present invention. In this embodiment, a 1-bit identification number generator circuit is assembled into a cell which constitutes a boundary scan register of JTAG. The JTAG cell may be assembled into the I/O cell such as that in FIG. 51 or assembled into a built-in logic.

A circuit for alternately inputting a signal from the built-in logic and identification information generated by the 1-bit identification number generator circuit is added to the cell of the boundary scan register, thereby enabling a serial output making use of a shift operation of the boundary scan register.

Figure 58:
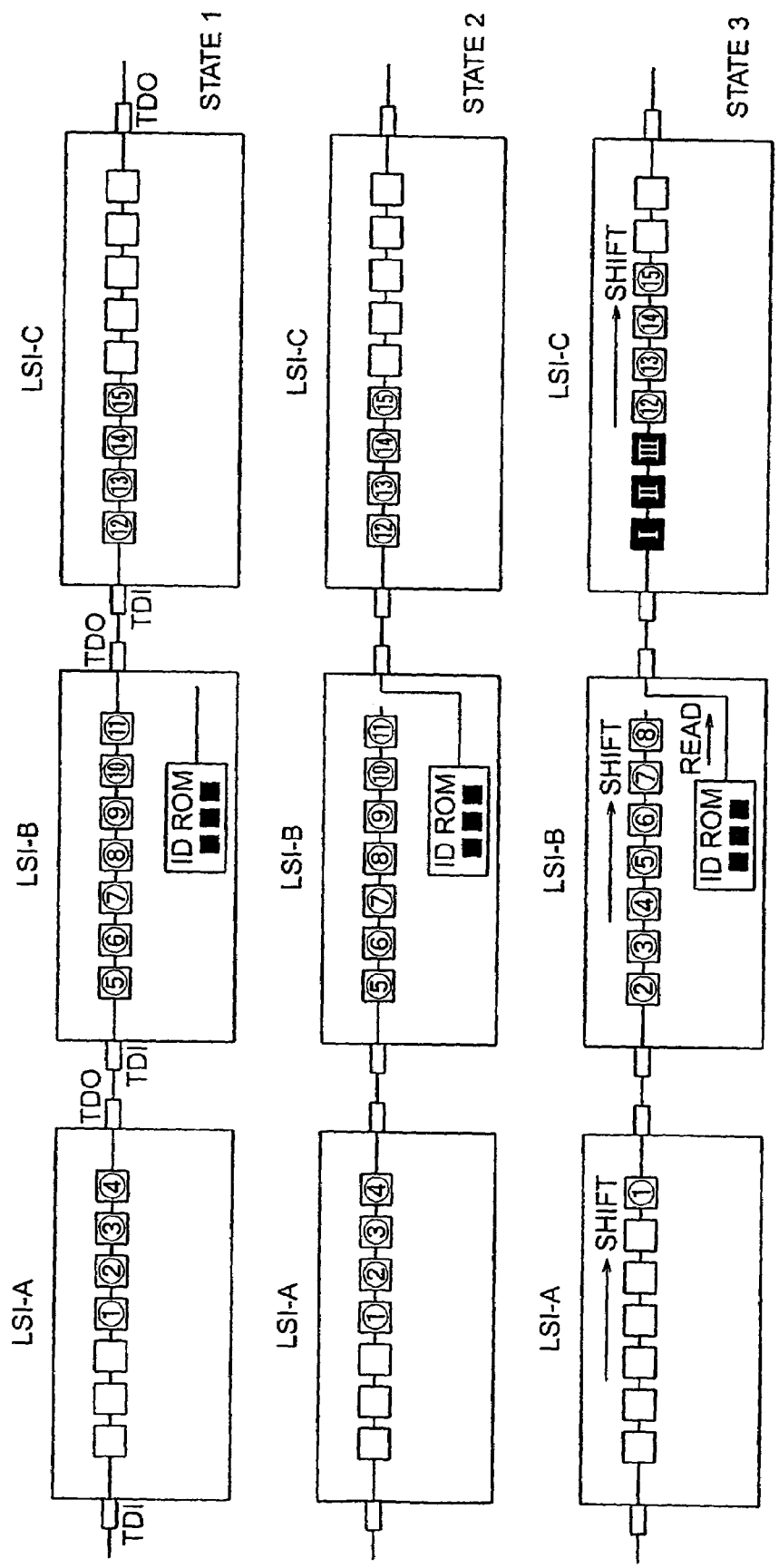
FIG. 58 is a schematic diagram for describing one embodiment of an operation of serially outputting an identification number, making use of a shifting operation of a boundary scan register of the semiconductor integrated circuit device according to the present invention.

FIG. 58 illustrates a schematic diagram for describing one embodiment of an operation of serially outputting an identification number, making use of the shifting operation of the boundary scan register of the semiconductor integrated circuit device according to the present invention.

In this embodiment, there are three LSIs (A to C) and seven, seven and nine JTAG cells (boundary scan registers) in the respective LSIs, wherein numerals indicative of data numbers are written in the respective cells for indicating the flow of data. Then, FIG. 58 illustrates, as a representative, an exemplary operation of reading an identification number from an identification number generator circuit (ID-ROM) mounted in the LSI-B.

A state 1, which is an initial state, indicates an operation state in JTAG.

In a state 2, TDO of LSI-B is disconnected from the JTAG cell, for example, in response to a private instruction of JTAG, and instead connected to the identification number generator circuit ID-ROM.

In state 3, the identification number generator circuit ID-ROM performs a shift operation in response to a shift instruction of JTAG to sequentially output an identification number from TDO. In the state shown in FIG. 58, 3-bit identification number information (I, II, III) is delivered. The JTAG cells in each LSI shift to the right as usual to output the identification number of LSI-B through LSI-C.

After the identification number is extracted, the JTAG returns from a private instruction mode to a normal automatic mode, though not shown, and TDO is connected to the JTAG cell. In the foregoing operation, JTAG cell information (9), (10), (11) of LSI-B are missing, however, if necessary, the cell information (9), (10), (11) can be set later by repeating the shifts in the normal mode.

Figure 59:
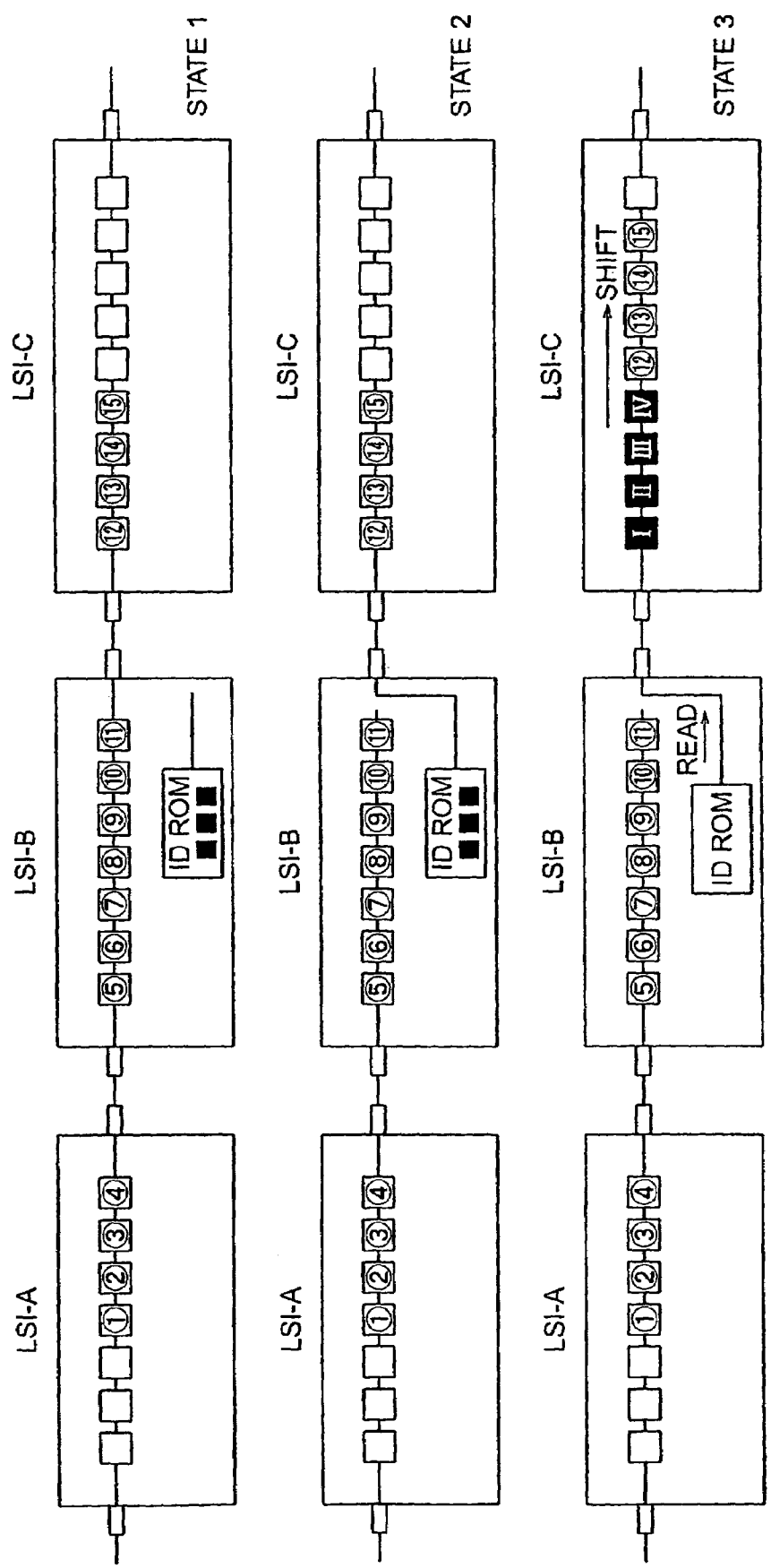
FIG. 59 is a schematic diagram for describing another embodiment of the operation of serially outputting an identification number, making use of the shift operation of the boundary scan register of the semiconductor integrated circuit device according to the present invention.
Figure 60:
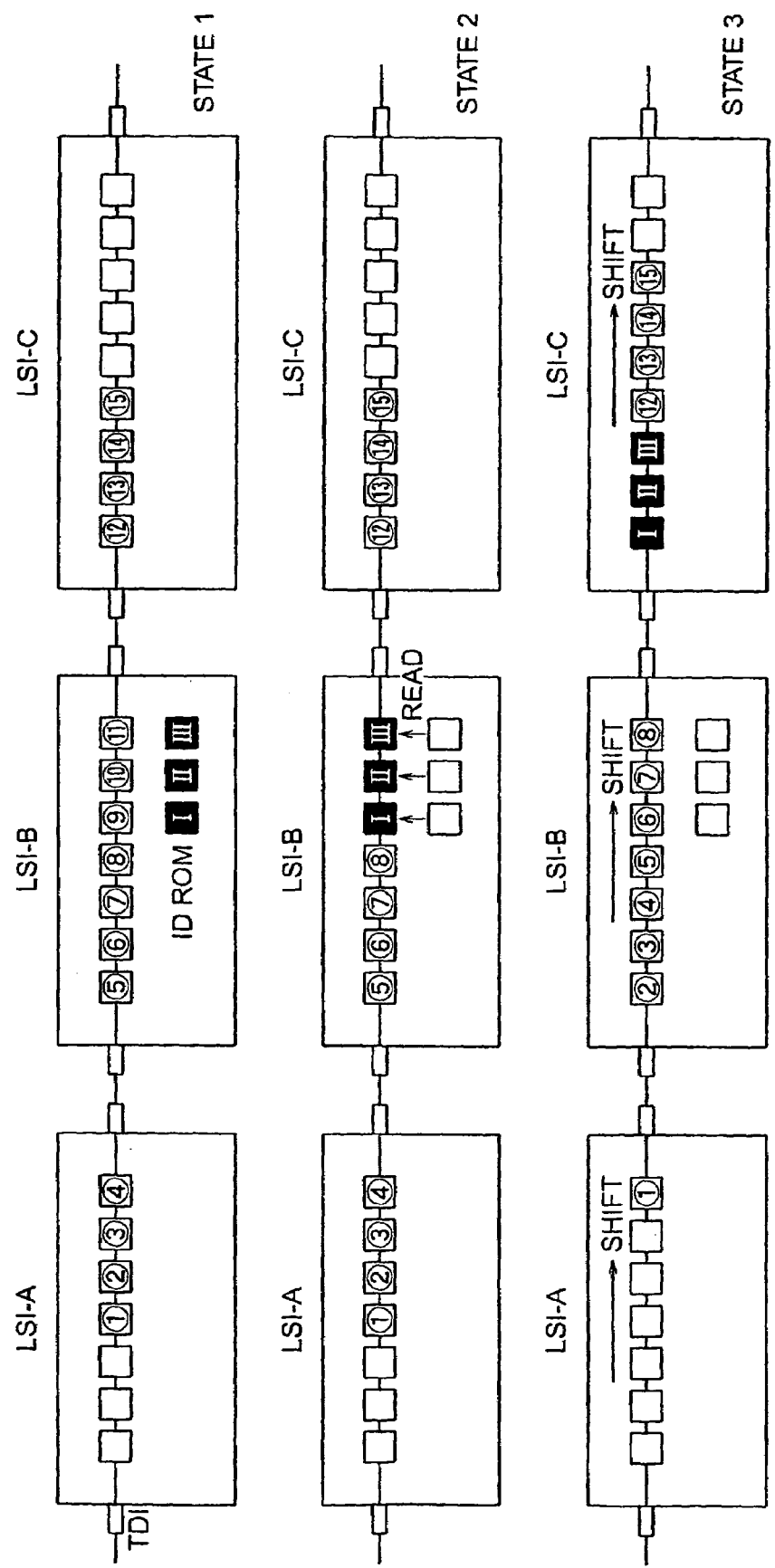
FIG. 60 is a schematic diagram for describing another embodiment of the operation of serially outputting an identification number, making use of a shifting operation of a boundary scan register of the semiconductor integrated circuit device according to the present invention.

FIG. 59 illustrates a schematic diagram for describing another embodiment of the operation of serially outputting an identification number, making use of the shift operation of the boundary scan register of the semiconductor integrated circuit device according to the present invention. This embodiment differs from the embodiment of FIG. 58 in that only the JTAG cells in LSI-C are shifted in the state 3. This eliminates the missing JTAG cell information (9), (10), (11) which is experienced in the embodiment of FIG. 59, resulting in ID-ROM information just inserted between JTAG cell information of LSI-B and LSO-C.

FIG. 59 illustrates a schematic diagram for describing another embodiment of the operation of serially outputting an identification number, making use of the shift operation of the boundary scan register of the semiconductor integrated circuit device according to the present invention. An identification number generator circuit (ID-ROM) in this embodiment corresponds to the identification number generator circuit illustrated in FIG. 57.

A state 1 is an initial state.

In a state 2, information of the 1-bit identification number generator circuit is transferred to JTAG cells of LSI-B. In this event, JTAG cell information (9), (10), (11) of LSI-B are destroyed because they are replaced by an operation of transferring the identification information.

In a state 3, an identification number of ID-ROM is sequentially outputted from TDO of LSI-B in response to a shift instruction of JTAG.

Figure 61:
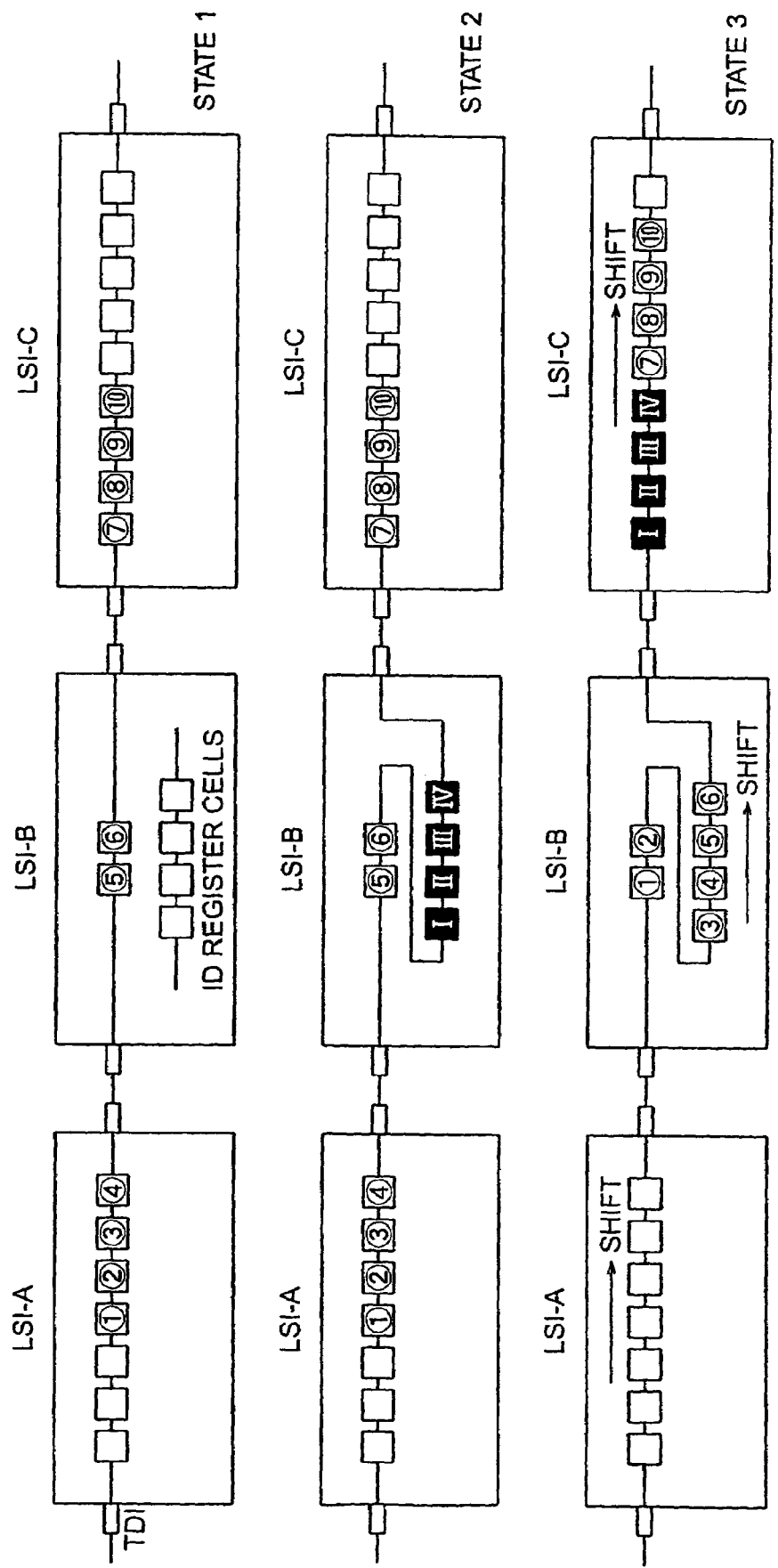
FIG. 61 is a schematic diagram for describing another embodiment of the operation of serially outputting an identification number, making use of the shift operation of the boundary scan register of the semiconductor integrated circuit device according to the present invention.

FIG. 61 illustrates a schematic diagram for describing another embodiment of the operation of serially outputting an identification number, making use of the shift operation of the boundary scan register of the semiconductor integrated circuit device according to the present invention. In this embodiment, shift registers (ID register cells) are built in exclusively for the identification number.

A state 1 is an initial state.

In a state 2, TDO of LSI-B is disconnected from JTAG cells, for example, in response to a private instruction of JTAG, and is connected to the head of the shift registers exclusive for a different number. Also, the top JTAG cell of LSI-B is connected to the last one of the shift registers exclusive for identification number. In this event, an identification number is simultaneously set in the shift registers exclusive for identification number.

In a state 3, the identification number of ID-ROM is sequentially outputted from TDO of LSI-B in response to a shift instruction of JTAG. Simultaneously, JTAG cell information of LSI-A is shifted into the shift registers for the JTAG cell information of LSI-B and those exclusive for the identification number.

Though not shown, the shift is further continued to shift out all effective JTAG cell information of LSI-B, followed by returning to the initial state.

Figure 62:
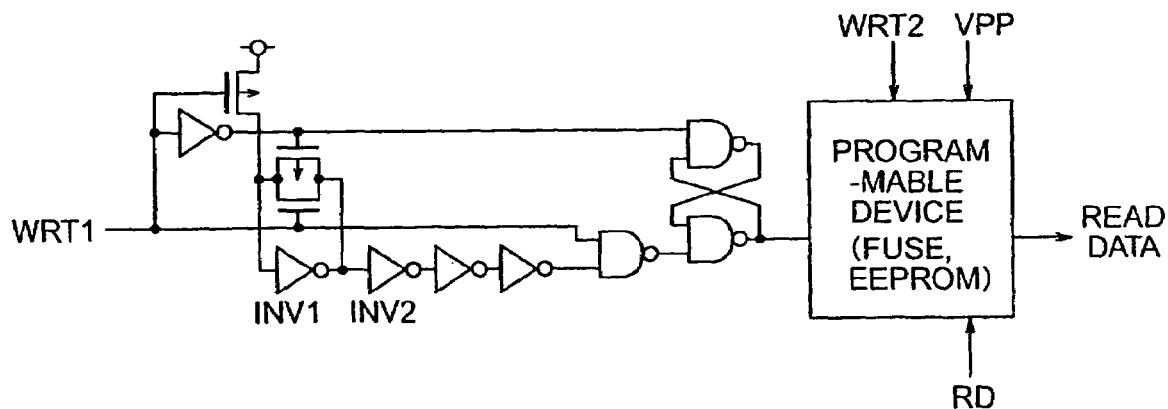
FIG. 62 is a circuit diagram illustrating a further embodiment of the identification number generator circuit according to the present invention.

FIG. 62 illustrates a circuit diagram of a further embodiment of the identification number generator circuit according to the present invention. In this embodiment, the difference between the logical threshold value voltages of the CMOS inverter circuits INV1 and INV2 as mentioned above is amplified by an amplifier circuit to generate identification information which is held in a latch circuit comprised of a NAND gate circuit. Specifically, in response to a first write signal WRITE1 at high level, binary identification information corresponding to the difference between the logical threshold value voltages of the inverter circuits INV1 and INV2 is inputted to the latch.

Next, the first write signal WRITE1 is brought to low level, forcing the latch circuit to hold the binary identification information, and an inverter circuit sequence composed of the inverter circuits INV1, INV2 and amplifier circuit is supplied with a high level which is formed by a pull-up MOSFET at the input of the inverter circuit INV1 at the input stage.

Next, the information held in the latch circuit is written into a non-volatile programmable device, for example, fuses (comprised of FUSE, EEPROM or the like) using a second write signal WRITE2 and the high voltage VPP. Then, when the identification number is required, the programmable device is accessed with a signal RD to output the identification number written therein as read data.

In this configuration, since the identification information corresponding to the difference between the logical threshold value voltages of the inverter circuits INV1 and INV2 is written into another non-volatile circuit in response to the first write signal WRITE1, the resulting identification number generator circuit can hold the reproductivity of identification bits without being affected by NBTI as mentioned above, and is highly immune to aging changes.

In the identification number generator circuit which uses variations in logical threshold values of CMOS inverter circuits as in the foregoing embodiments, the order of the magnitude of the threshold values of the respective elements is used as the source of identification information.

Figure 63:
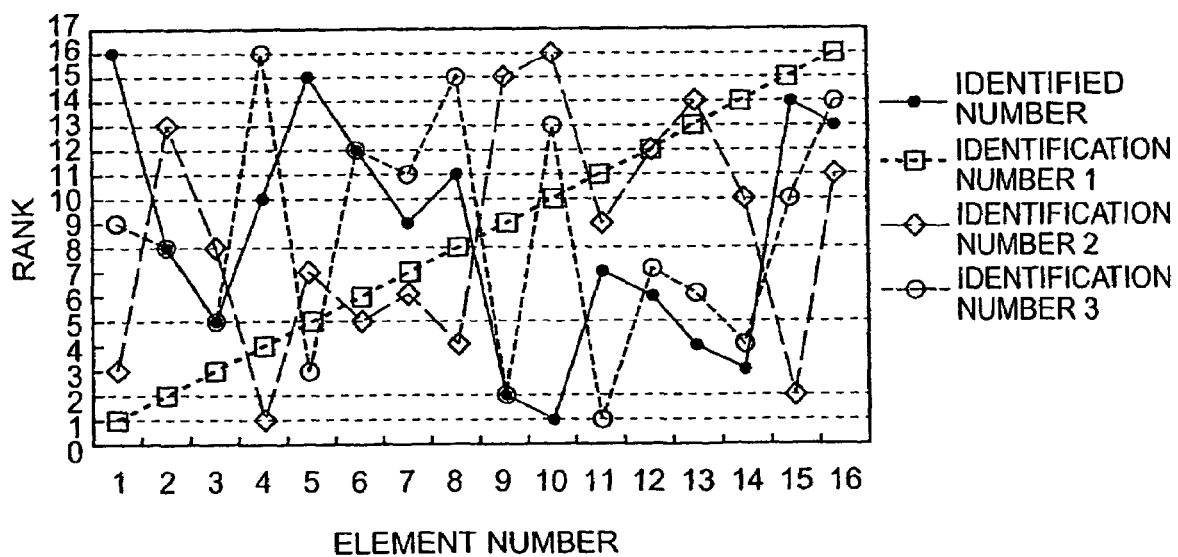
FIG. 63 is an explanatory diagram of an identification number according to the present invention.

FIGS. 63 and 64 show four exemplary identification numbers. FIG. 63 shows the order of their threshold values in graphic representation. In FIG. 64, an element of an identified number (CMOS inverter circuit) has the highest rank of 16 elements, while an element 10 has the lowest rank. This means that the element 1 has the highest logical threshold value, and the element 10 has the lowest logical threshold value. Now, paying attention to the element 1 and element 10, The element having the order closest to the element 1 is an element 5, and one having the order closest to the element 10 is an element 9.

Since the identification number generator circuit according to the invention of this application sequences variations in logical threshold values of CMOS inverter circuits, it is unknown how large difference exists, for example, between the logical threshold value voltages of the element 1 and element 5. Similarly, it is unknown the difference between the element 10 and element 9. When there is an extremely small difference between them, the element 1 may change place with the element 5 depending on a test condition or the like. However, it is contemplated that the element 1 changes place with the element 10 with an extremely low possibility. This can be readily understood also from the graph of FIG. 63.

The identified number acquired upon matching should have been acquired at least once or more in the past, stored in the database, and exists in a form quite similar to the identified number. "Similar" is used to take into consideration the case where an identification number is not completely reproduced due to the influence of aging changes or the like in the identification number generator circuit of the invention of this application. Even if variations partially change place in the order between the CMOS inverter circuits as described above, it can be readily estimated that in regard to the order of at least the element 1 and element 10 in the example of FIG. 64, either an identification number acquired in the past or the most recent identified number does not change in their relation of magnitude.

Figure 65:
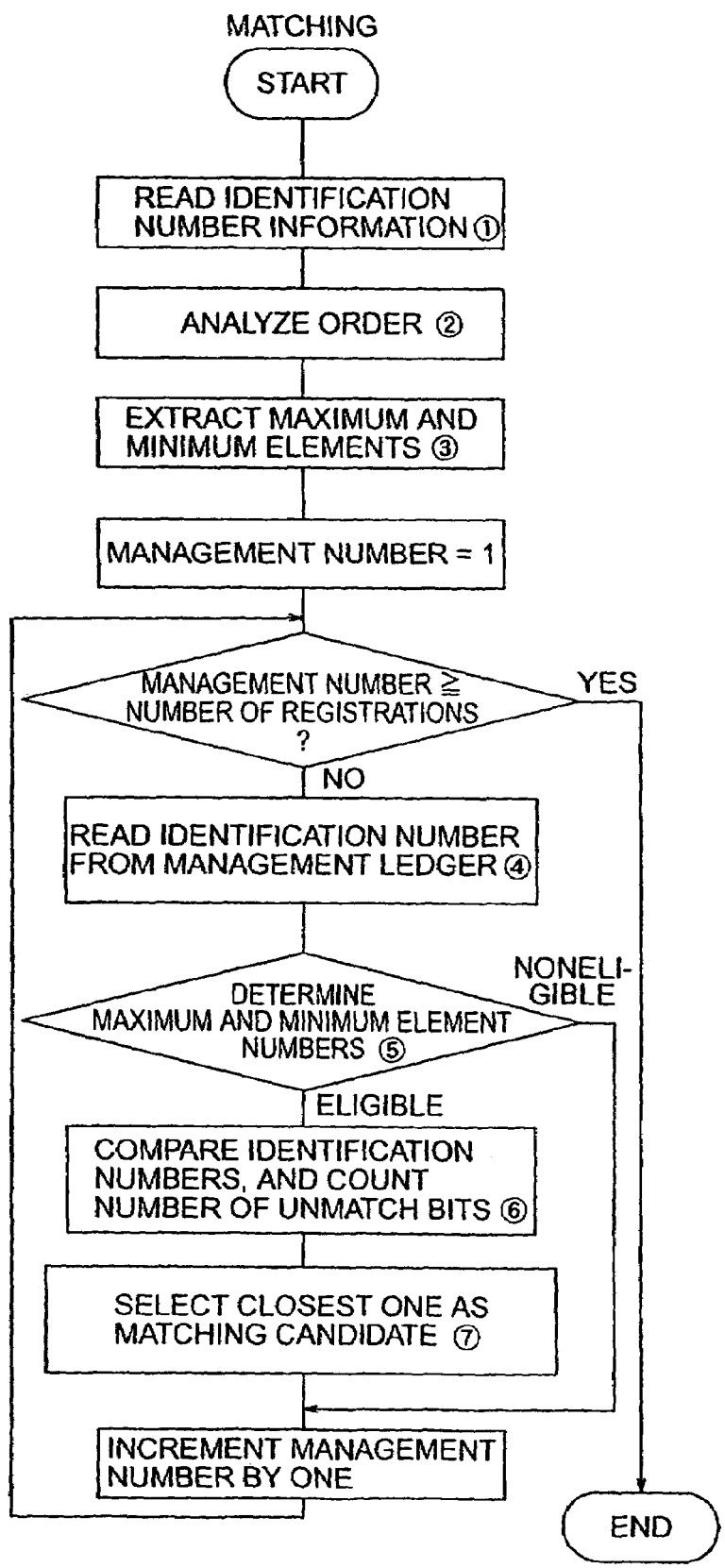
FIG. 65 is a flow chart for describing one embodiment of a fast identification number matching (searching) algorithm for an identification number generated by the identification number generator circuit according to the present invention.
Figure 66:
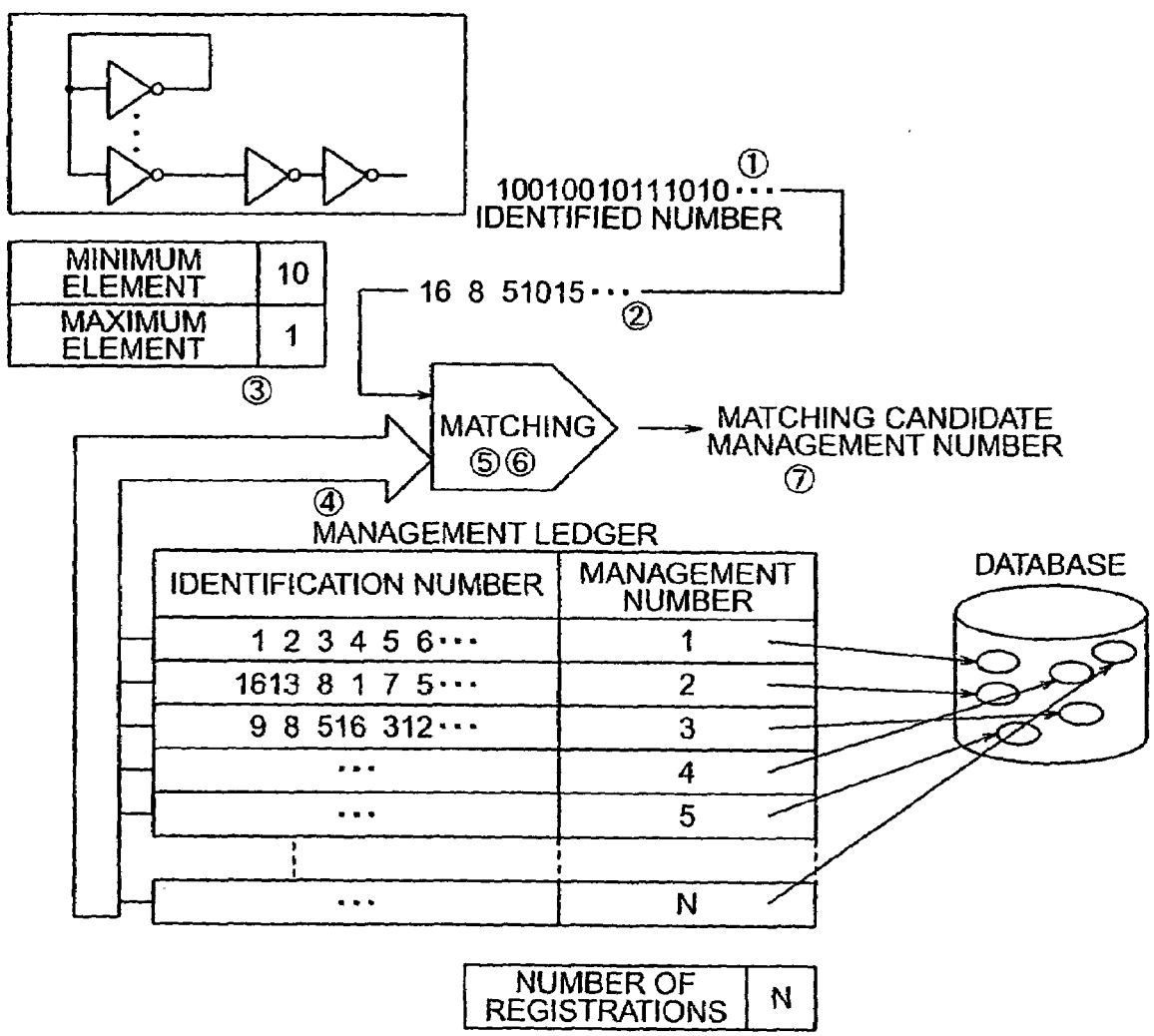
FIG. 66 is a schematic diagram corresponding to the embodiment of FIG. 65.

FIG. 65 illustrates a flow chart for describing one embodiment of a fast identification number matching (searching) algorithm for an identification number generated by the identification number generator circuit according to the present invention. FIG. 66 illustrates a schematic diagram corresponding to this.

(1) At an identified number reading step, sequential data composed of "0" and "1" is generated in the 1-bit identification number generator circuit.

(2) In an order analysis step, the data is converted to a numeral indicative of the order. In other words, the order of the 1-bit identification number generator circuit as in FIG. 64 is converted to a numeral.

(3) In a maximum/minimum element extraction step, the orders are analyzed to extract and record numbers of the element having the largest order and the element having the smallest order.

In (4), one of registered identification numbers is retrieved from a management ledger.

In (5), the orders of element numbers corresponding to the largest and smallest element numbers recorded above are extracted from the registered identification number. For example, in the example of FIG. 64, in the identification number 1, "1" is the largest, and "10" is the smallest, which shows a reversed relation of magnitude, when comparing numerals 1 and 10. This can be readily estimated that the order is a phenomenon far beyond fluctuations due to variations, so that the identification number 1 has picked up the identified number from a different chip. Consequently, the identification number 1 is determined to be incompatible, and a subsequent detailed matching test is omitted therefor.

Those determined to be compatible in the foregoing undergo a detail test in (6) and (7). Since this is basically similar to the aforementioned embodiment, description thereon is omitted. In (5), since the proportion of resulting compatible and incompatible in the comparison of magnitude between orders is stochastically 50% for either of them, the effect of omitting the detail test is also 50%.

Thus, in this embodiment, though there is one set of magnitude comparison, two sets are compared in expectation of further doubling the effect. However, when this is increased, the processing itself involved in the magnitude comparison is increased to possibly reduce the effect, so that a selection is desirably made in view of a trade-off between the number of digits of the identification number, and a total population parameters of the identification number.

Figure 67:
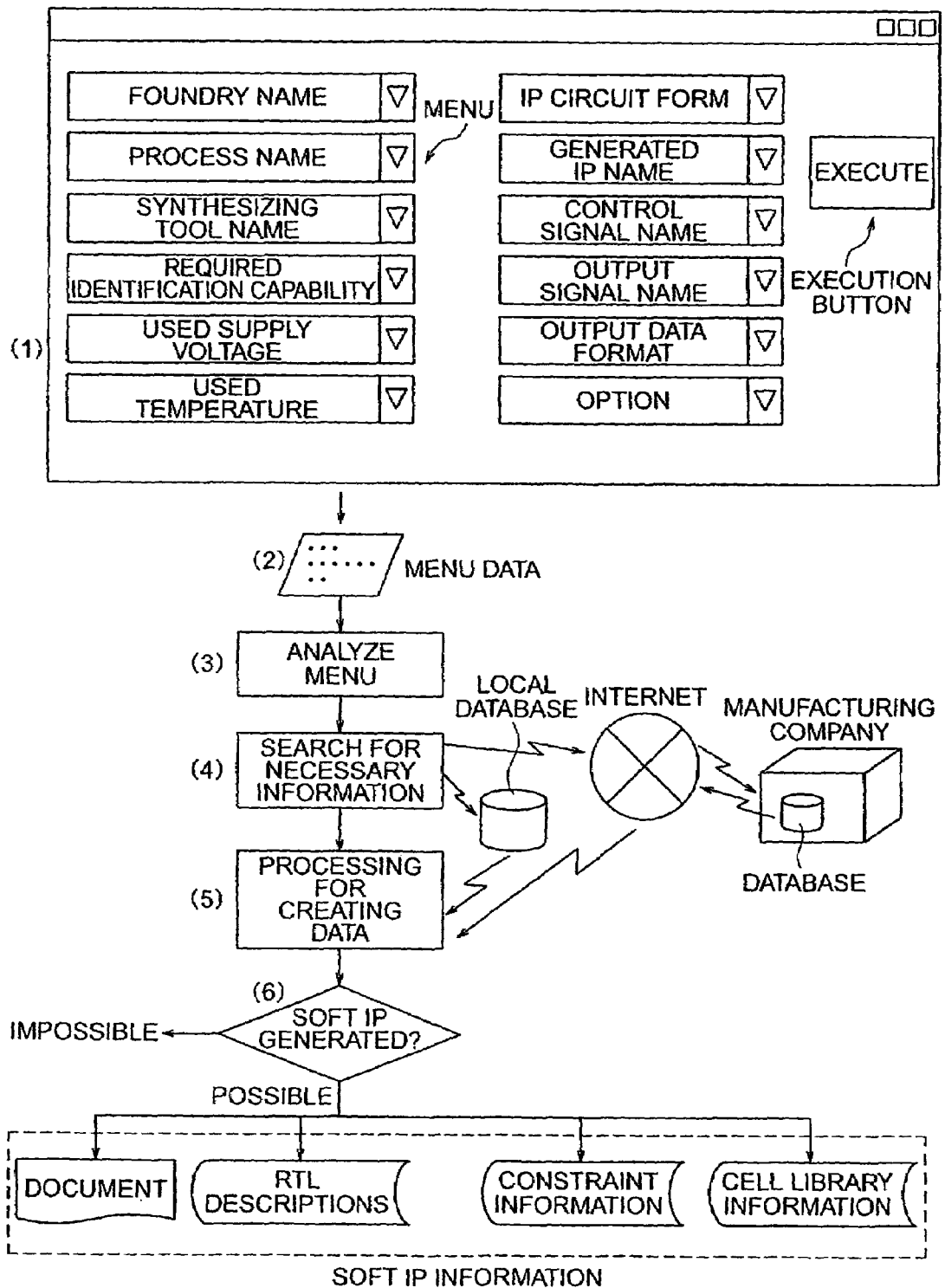
FIG. 67 is a flow chart illustrating one embodiment of a method for designing circuits for a semiconductor chip which incorporates the identification number generator circuit according to the present invention.

FIG. 67 illustrates a flow chart of one embodiment of a method for designing circuits for a semiconductor chip which incorporates the identification number generator circuit according to the present invention. Circuit design software as this embodiment is provided for designing companies and dedicated manufacturing companies. Alternatively, the same functions are incorporated into a tool of an EDA vendor.

(1) A menu is pulled down for selection.

(2) Menu data is generated. At the second time onward, desired IP can be selected only by specifying this menu data.

(3) The menu data is analyzed to detect violations and the like.

(4) Necessary information is retrieved from a local database in accordance with the menu data. Recent information not stored in the local database is acquired from databases of dedicated manufacturing companies and the like through a network such as the Internet.

(5) Data required for soft IF is generated based on the information collected from the database.

(6) It is determined whether or not the soft IP can be generated. If not, a hard IP design is selected.

Figure 68:
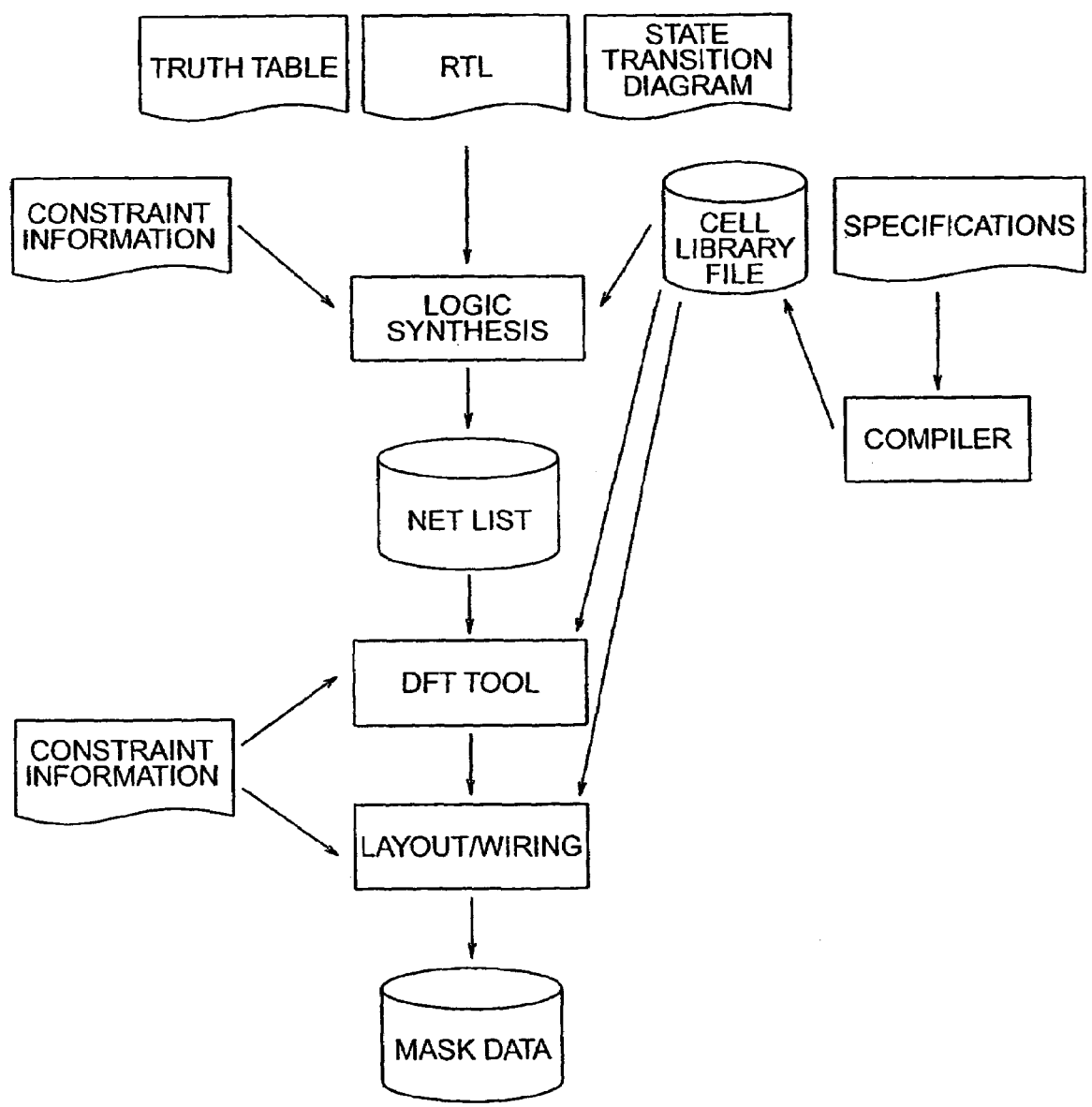
FIG. 68 is a flow chart illustrating one embodiment of a method for designing an LSI which has the built-in identification number generator circuit according to the present invention.

FIG. 68 illustrates a flow chart of one embodiment of a method for designing an LSI which has the built-in identification number generator circuit according to the present invention. Though not particularly limited, this embodiment is directed to a design flow for application specific LSI (ASIC).

A logical combination tool generates logic circuits (net list) at a gate level from truth tables, RTL descriptions, state transition diagrams and the like in accordance with the result of the determination as to the generation of the soft IP in the design flow illustrated in FIG. 67. Though not shown, in many cases, RTL and the like are generated based on a function describing language such as VHDL, Verilog HDL and the like. Required for logical combination is cell library information which includes connection information at transistor level, delay information, layout information and the like. Also, generally, information added to RTL includes a timing error tolerance value referred to as constraint information, a layout spacing, a maximum signal wiring length and the like. A DFT tool adds diagnosis logics effective for a test of LSI to logic circuits at gate level to create final layout data through an automatic layout wiring tool.

Types of cells registered in a cell library are mainly the most basic circuit components such as an inverter, NAND, flip-flop and the like. Generally, data in the cell library, for example, layout information is manually created. However, an automatic cell generation tool, a RAM compiler and the like are used for a large scaled one, or those which differ slightly in configuration from one another though basic functions are the same, for example, such as memories.

Here, brief description will be made on the hard IP and soft IP as referred to in the invention of this application. At present, in the semiconductor industries, the design and manufacturing of application specific LSI in particular is classified into a total company form in which a single company is responsible for designing through manufacturing, and a work division form in which the work is divided by a so-called LSI design company which is dedicated to designing and a so-called foundry company which is dedicated to manufacturing.

Also, recently, companies which supply IP (IP vendors), a distribution market for them, standardization supporting groups and the like have been established in step with the tendency for the division of work. The IP has become an important existence for improving the LSI design efficiency, and is not negligible for total companies.

The IP is roughly classified into those referred to as hard IP and soft IP. Differences between the two will be compared with respect to the division of work implemented by an LSI design company and a foundry company. The LSI design company (fabless company) creates data using a function describing language such as VHDL in FIG. 68, Verilog HLD or the like, data such as truth tables, RTL descriptions, state transition diagrams and the like, constraint information, and the like based on specifications provided by a customer. However, the customer himself may create these data which is passed to the LSI design company.

Next, the LSI design company creates a net list using the logical combination tool which has been described at the beginning. Circuit elements used in logical combination are limited to those registered in a cell library. They have been certified by dedicated manufacturing companies which manufacture the products. Generally, manufacturing companies themselves provide basic components such as the aforementioned inverter circuit and NAND gate circuit.

Actually, however, the dedicated manufacturing companies also provide more complicated components for enhancing the competitive strength thereof. However, since it is difficult to provide complicated high functional circuits, for example, PLL, SRAM, processing circuit and the like only with dedicated manufacturing companies, a lot of IP vendors participate for designing and supplying them. In the IP, among others, PLL or the like has a complicated circuit configuration, and its characteristics largely depend on a process in which it is used, so that IP vendors generally supply it in the form of hard IP. Simply speaking, the hard IP has cell layouts designed by IP vendors registered in a cell library. Therefore, for supplying the hard IP, a hard IP vendor must change the IP for each generation of process, not to mention for each dedicated manufacturing company, receive certificates of manufacturing companies, and further must be registered in a cell library possessed by each LSI design company.

On the other hand, in the case of soft IP, IP vendors simply supply LSI design companies, foundry companies or customers at a higher rank with the foregoing data using a function describing language such as VHDL, Verilog HDL or the like, data such as truth tables, RTL descriptions and state transition diagrams, constraint information, and the like. At present, therefore, it can be thought that in the market of application specific LSIs, the soft IP is more pervasive, and its prepotency will not even change in the future. Also, the RAM compiler is strictly for automating the creation of parts for the cell library, and belongs to the category of hard IP.

As described above, the hard IP-based supply framework is inferior in distribution and popularization of IP, and the hard IP supplier side is disadvantageously burdened with a design change for each process, and the like. On the contrary, the identification number generator circuit of this embodiment, particularly, the circuit as illustrated in FIG. 49 or 50, only comprises inverters and pass transistors even in its core, and otherwise comprises standard logic elements, so that the soft IP can be readily applied thereto. For example, if CMOS inverter circuits (of course) and CMOS switches (pass transistors) have been registered in the cell library, the IP can be supplied to design companies only with the RTL descriptions. Even if pass transistors are not registered as standard in the cell library, the pass transistors alone must be registered in extra, but its scale is extremely small.

Though automatic layout/wiring processing is disadvantageous in that the result of layout and wiring is irregular, two inverters for identifications, for example, can be disposed at extremely distanced positions. Consequently, a long wire is routed from a signal P to a signal PP on a circuit diagram, and is susceptible to noise from the surroundings. To reduce this, it is effective to limit the layout and signal line lengths in the layout/wiring processing. It is also effective to combine only this portion with a standard cell registered in the cell library for registration as a new cell. Rather, a counter, a decoder and the like is efficiently created by the automatic layout/wiring or the like.

In recent years, application examples have been increased in which an ID number, a variety of unique information (hereinafter this is referred to as the "general information") are programmed into LSI. For example, they may be a manufacturing line number of a product, a manufacturing week number, the grade of a product, and manufacturing management information. Generally, the ID number is programmed using laser fuses, EPROM or the like. In this program, a laser program should not include any errors. Moreover, while a laser fuse scheme is processed substantially in a wafer state, no change should be accepted in steps after a laser processing step. The information is even more important if its contents are concerned with the life and fortune.

However, with individual chips which have been diced after programming, an important problem arises in that even if the general information written thereinto in the laser program can be read therefrom, it is quite difficult to confirm whether it is correct. The following can be contemplated as countermeasures thereto. One is to add parity bits to detect changes in data. A function for parity check may be built in the chip, or a measuring device may be used for determination.

However, in the strict sense, data written in the chip is not confirmed.

Another one is a method of creating a mechanism for recording the read general information in some method to confirm duplication of information in order to ensure the reliability of the read information. This method can prevent troubles of products by treating chips with the same general information as defective in the worst case. However, actually, if information read from a plurality of chips is the same, it is difficult to confirm which one is correct, resulting in complicated management and settlement of the chips.

In other words, it is contemplated that an essential method of solving the problem mentioned above should involve identifying once diced chips, acquiring correct information on the chips, and comparing with it.

As such, though it is contemplated to add a unique identification number to a chip for retrieving a correct number from a database or the like based on the information, even if itself is written with the same laser fuses, that will simply form a vicious circle.

On the other hand, according to the information theory (for example, "Information Theory" written by Yasuo Taki, published by Iwanami Shinsho), it is known that if there is a large distance between codes (for example, Humming distance), a change in original information can be detected and repaired even if noise introduces into them (for example, "Error Correcting Code and Its Application" edited by the Institute of Image Information and Television Engineers and published by Ohm Co.). Here, the codes refer to information written with laser fuses, and noise corresponds to a partial change therein.

In other words, when a unique identification number having a large inter-code distance is added to the unique information, it can be sufficiently distinguished from other identification numbers, i.e., chips even if part of the overall information slightly changes. Thus, the utilization of the identification number generator circuit according to the invention of this application is effective.

Figure 69:
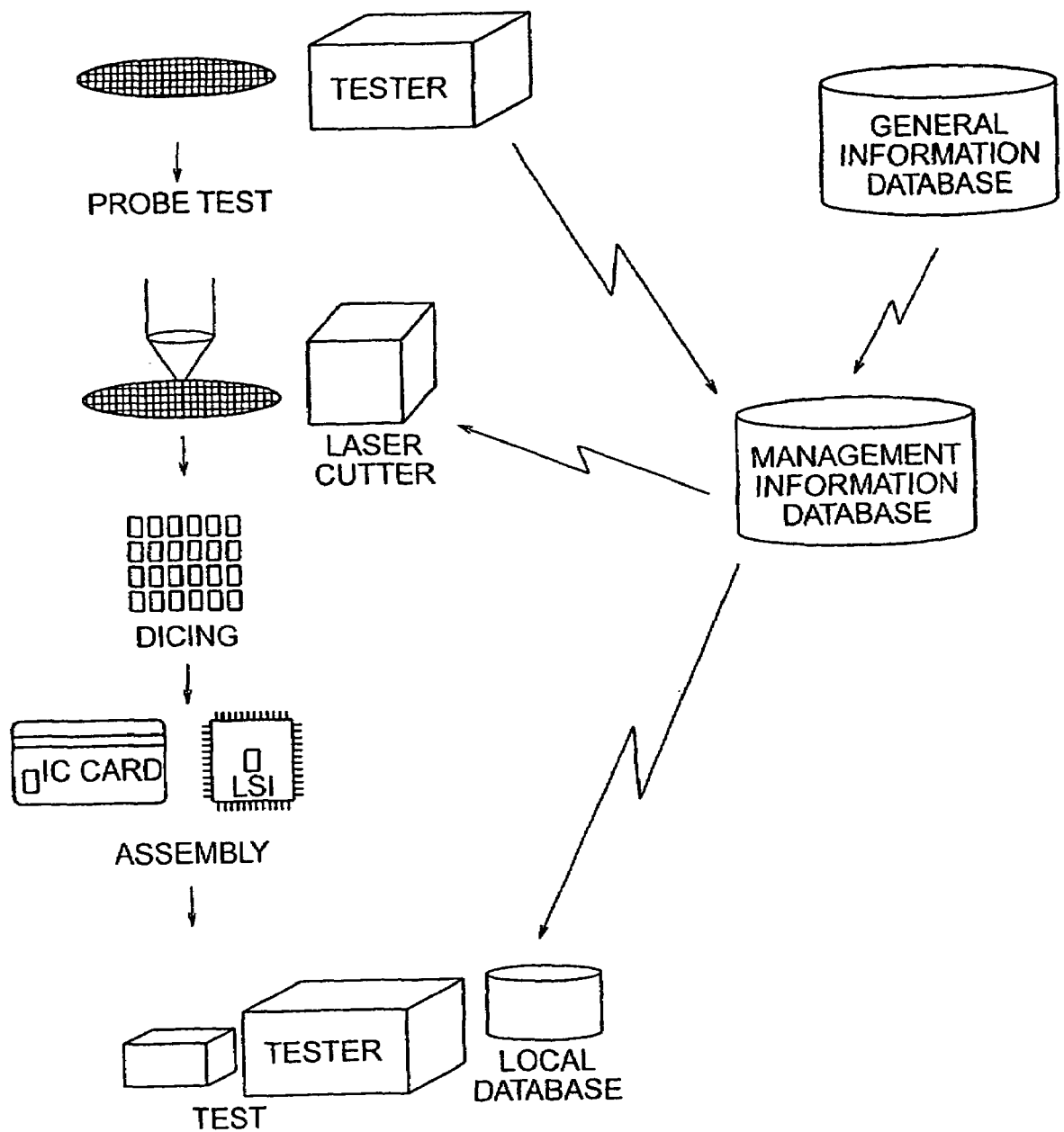
FIG. 69 illustrates a flow chart of one embodiment of a method for manufacturing a semiconductor integrated circuit device which uses a semiconductor chip with a built-in identification number generator circuit according to the present invention.

FIG. 69 illustrates a flow chart of one embodiment of a method for manufacturing a semiconductor integrated circuit device which uses a semiconductor chip that has a built-in identification number generator circuit according to the present invention.

Information which is a combination of the general information and a unique identification number having a large inter-code distance for a chip (hereinafter, this is referred to as the "management information") is programmed into laser fuses on a specified wafer. The unique identification number used in this event is generated by the built-in identification number generator circuit.

The general information and unique identification number are saved and managed on a databases as management information. The management information is comprised, for example, of the general information and a chip identification number.

In a test step after assembly of a semiconductor integrated circuit device or an IC card, the management information is read to reference the database for confirming whether or not there is the same management information. If the same management information exists in the database, the laser-based program is determined as correct. Next, the general information in the read information is compared with the general information in the retrieved management information.

For this reading, the general information part is read in a plurality of conditions, for example, by changing a supply voltage condition, while the unique identification number is read only once, thereby making it possible to confirm whether or not a data write is sufficiently stabilized in a short time. During a test, it is necessary to match with the management information on the database at a high speed. For example, data of management information to be referenced may have been previously stored in a work station or the like associated with a testing apparatus.

The foregoing method permits a rapid and correct confirmation of program information. Moreover, if the unique identification information is written one by one with laser fuses or the like, the processing time and chip area can be increased, whereas the unique identification number can be simply and automatically acquired by using the chip identification number generator circuit which relies on variations in logical threshold values of CMOS inverter circuits according to the invention of this application.

Specifically, the chip identification number, and information on a lot, a wafer and the like, acquired in a probe test or the like prior to the laser program are registered in the management information database. The management information corresponding to a chip on the specified wafer is written into laser fuses.

Figure 70:
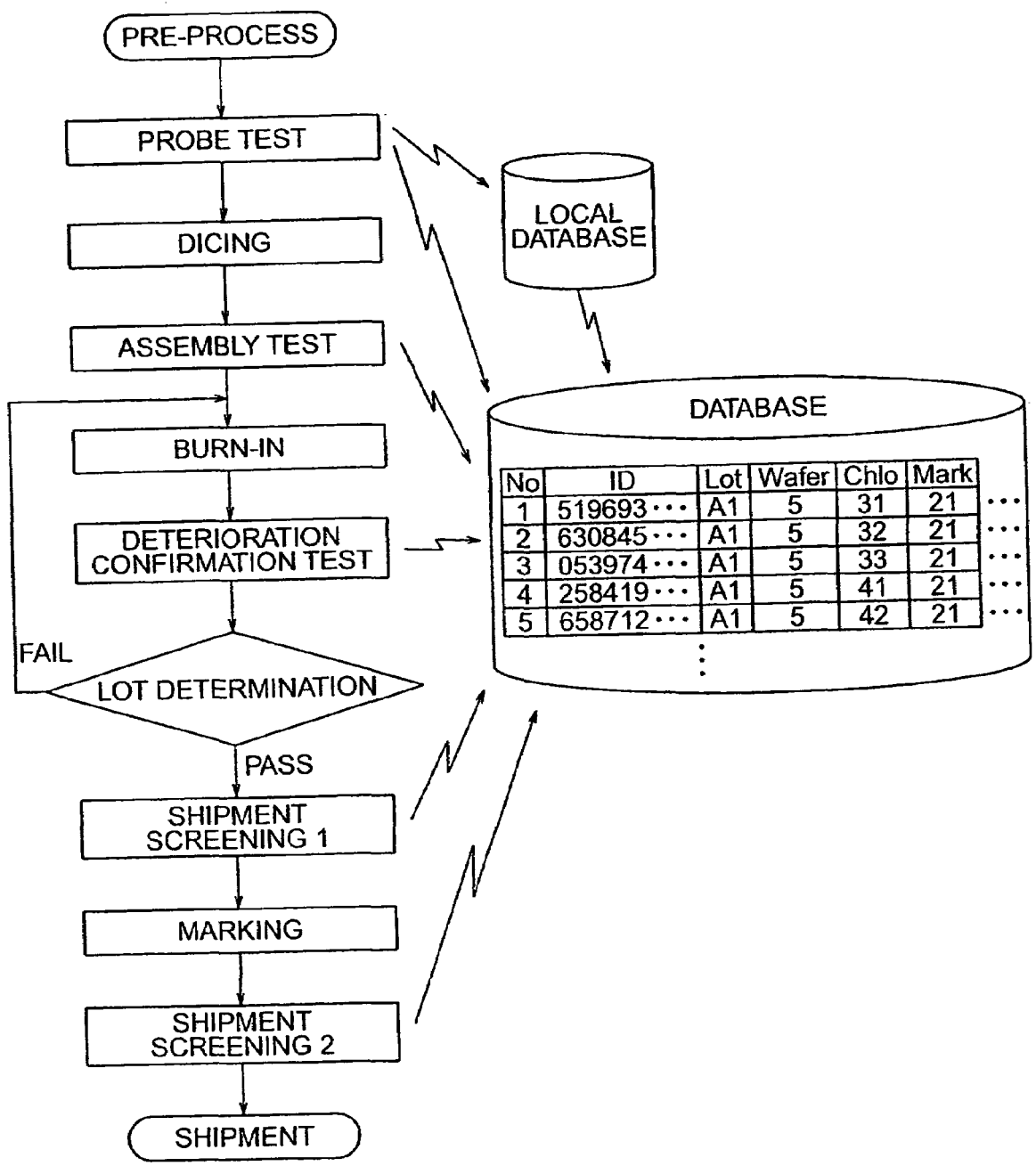
FIG. 70 is a flow chart illustrating one embodiment of a process of assembling a semiconductor integrated circuit device which uses a semiconductor chip mounted with the identification number generator circuit according to the present invention.

FIG. 70 illustrates a flow chart of one embodiment of a process of assembling a semiconductor integrated circuit device (a so-called post-process) which uses a semiconductor chip that is mounted with the identification number generator circuit according to the present invention.

(1) In the probe test, an ID number generated by the identification number generator circuit, a lot name, a wafer number, a chip number and the like are registered in a database.

(2) When a newly generated ID number is similar to an ID number which has been previously registered upon registration, some alarm is generated and the chip is disposed.

(3) In steps after the assembly test, chips have been separated one by one in a dicing step, so that ID numbers generated by the identification number generator circuit, step numbers, and the step lot name are registered in the database.

(4) Since the ID number which can be acquired by the identification number generator circuit according to this application can fluctuate due to mechanical and thermal stresses in the assembling process, electrical stresses in a burn-in step, and the like, the most recent ID number acquired in the test step is stored in the database.

(5) If chips need not be tracked in the post-process, the ID numbers generated by the identification number generator circuit are acquired only in the final shipment screening step for registration in the database.

(6) The previously acquired ID number information of chips determined as defective in each test step is deleted or marked to reduce a subsequent search processing time.

(7) In a marking step, a symbol or a number indicative of a line on which a product is manufactured, a year number and a week number indicative of the manufacturing term may be impressed. These impressions serve as information for a search in identifying individual samples. Thus, in shipment screening 2, the ID number generated by the identification number generator circuit and the information on these impressions are registered in the database. Though chips having common impression information must have the ID numbers generated by the identification number generator circuit completely independent of one another, chips having different impression information may have the same or similar ID numbers generated by the identification number generator circuit. In other words, it is possible to restrict the ability to identify the ID numbers generated by the identification number generator circuit mounted in each chip, resulting in a reduction in the scale of the identification number generator circuit and the number of bits of the identification number.

(8) Upon registration of the ID number generated by the identification number generator circuit in each step, introduction/mixture of lots is detected based on the ID numbers to generate some alarm.

In this embodiment, all the steps are directly coupled on-line to the database. Actually, however, a connection through a communication line may be difficult depending on geographical conditions, or some situations may lack the real time performance for such reasons as a slow communication rate, intervention of batch processing, and the like.

In such cases, the information is once saved in a local database. Further, when the immediacy is not needed, the information is saved in a storing medium which is transported to the database, or carried to the next step together with actual articles.

Due to constraints and the like of a testing apparatus in each step, a processing computer and the like, data in different formats may be collected into the database. In this event, processing for converting the data format may be inserted immediately before the registration in the database.

Figure 71:
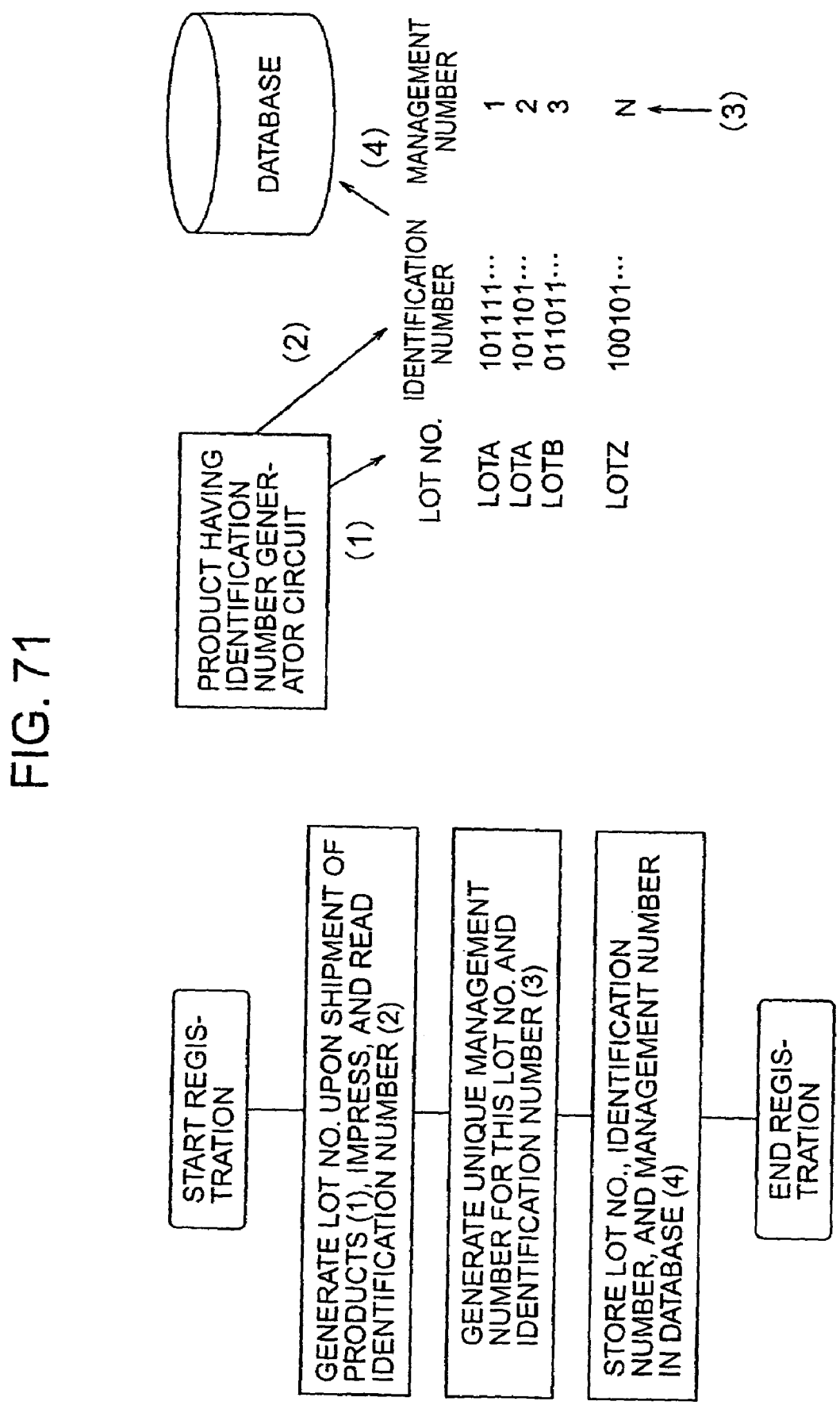
FIG. 71 is a schematic diagram illustrating one embodiment of a method of reducing the number of bits of the identification number generator circuit according to the present invention.
Figure 72:
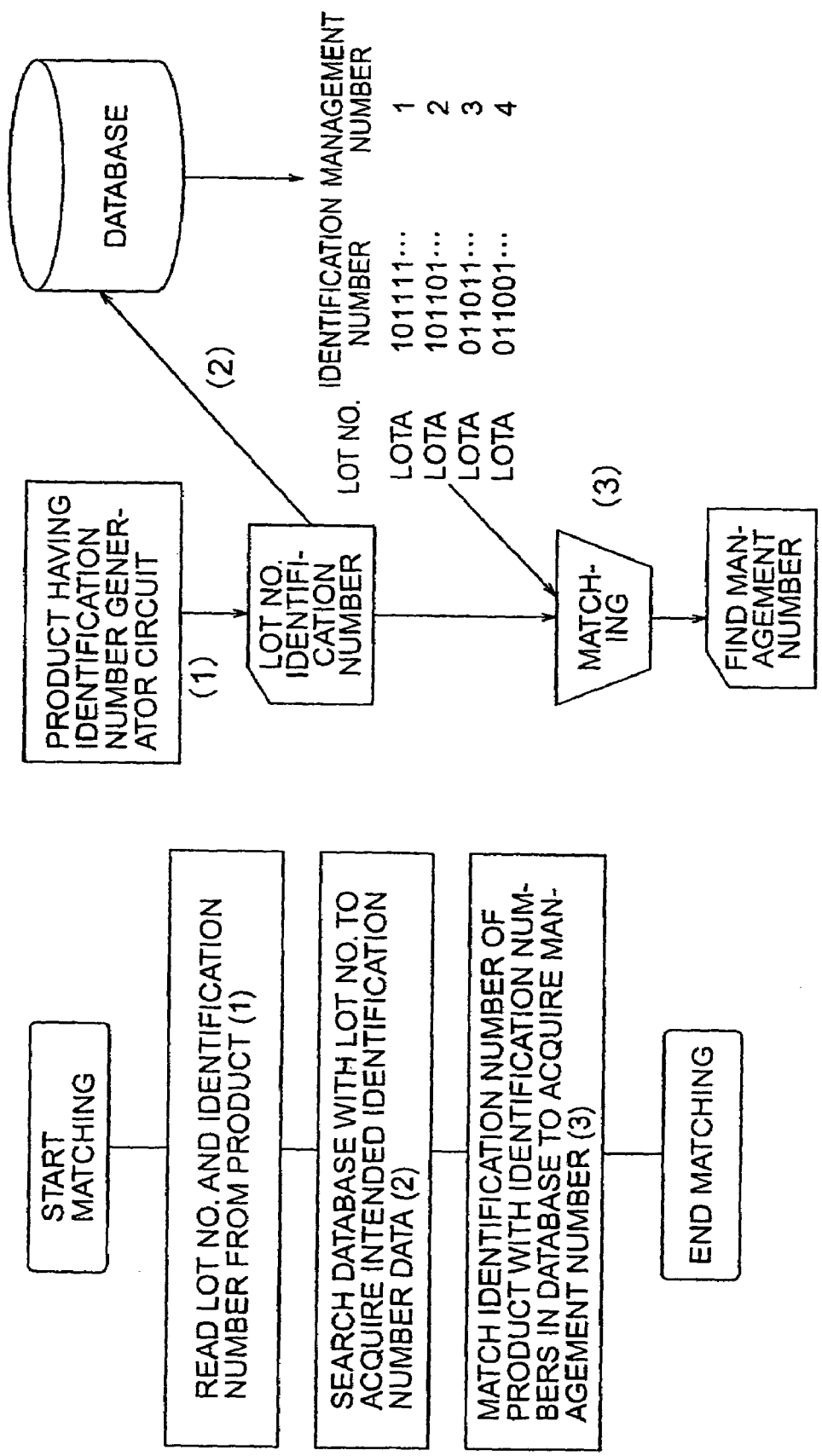
FIG. 72 is a schematic diagram illustrating one embodiment of a method of reducing the number of bits of the identification number generator circuit according to the present invention.

FIGS. 71 and 72 illustrate schematic diagrams of one embodiment of a method for reducing the number of bits of the identification number generator circuit according to the present invention. FIG. 71 illustrates a registration method for reducing the number of bits of the identification number generator circuit, and FIG. 72 illustrates a matching method therefor.

When a product such as a semiconductor integrated circuit device distributed on the market fails while it is used by the user, the identification number generator circuit according to the invention of this application effectively functions for investigating the cause of the fault in the returned product. In this event, the identification number is registered in a database for management upon shipment, and data on the manufacturing process is investigated when the product is returned as failed. In this event, it is necessary to match which management number of product the failed product has. When there are a lot of shipped products, the following situation may occur.

The number of identifiable identification numbers depends on the number of bits of the identification number generator circuit, so that the exactness of identification is improved as the number of bits is larger, but a correspondingly increased number of data must be identified. In identifying a product, as the number of objects to be identified is increased, it is necessary to read more data on the database for comparison and matching and to execute matching processing. Thus, for reducing the comparison/matching time and mitigating the load on the system, information indicative of an identification number group is separately defined as in FIG. 71. In this way, a range of the number of data to be matched can be reduced as in FIG. 72.

For the identification number group for reducing the number of bits of the identification number as mentioned above, information generally referred to as a lot or a mark is used. A combination of this information with the identification number permits products to be uniquely managed. Also, in the database only for managing products after shipment, information on failed chips is deleted to reduce a management cost. The identification group can reduce those which must be matched from among immense data on the database to reduce the processing time and system load.

Figure 73:
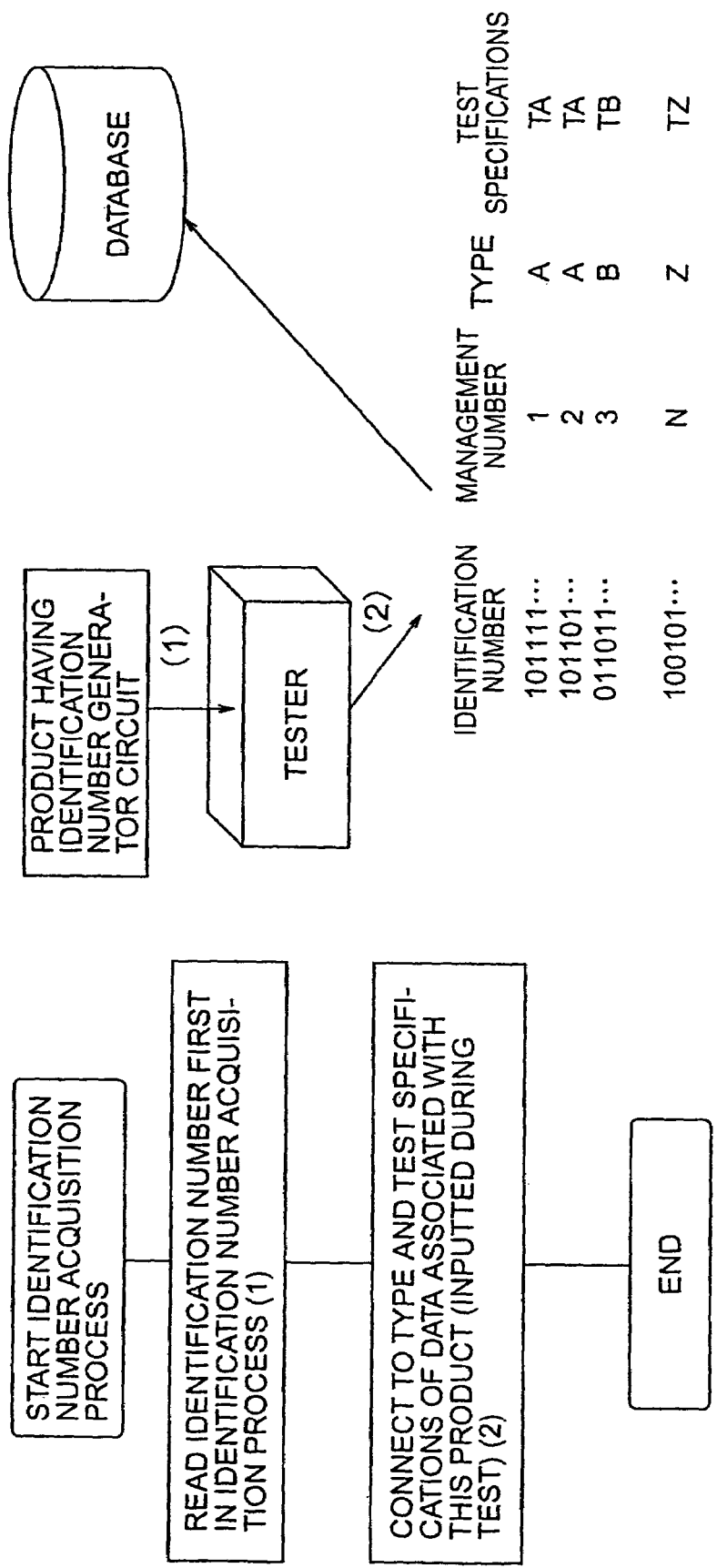
FIG. 73 is a schematic diagram for describing a testing method which utilizes the identification number generator circuit mounted in the semiconductor integrated circuit device according to the present invention.
Figure 74:
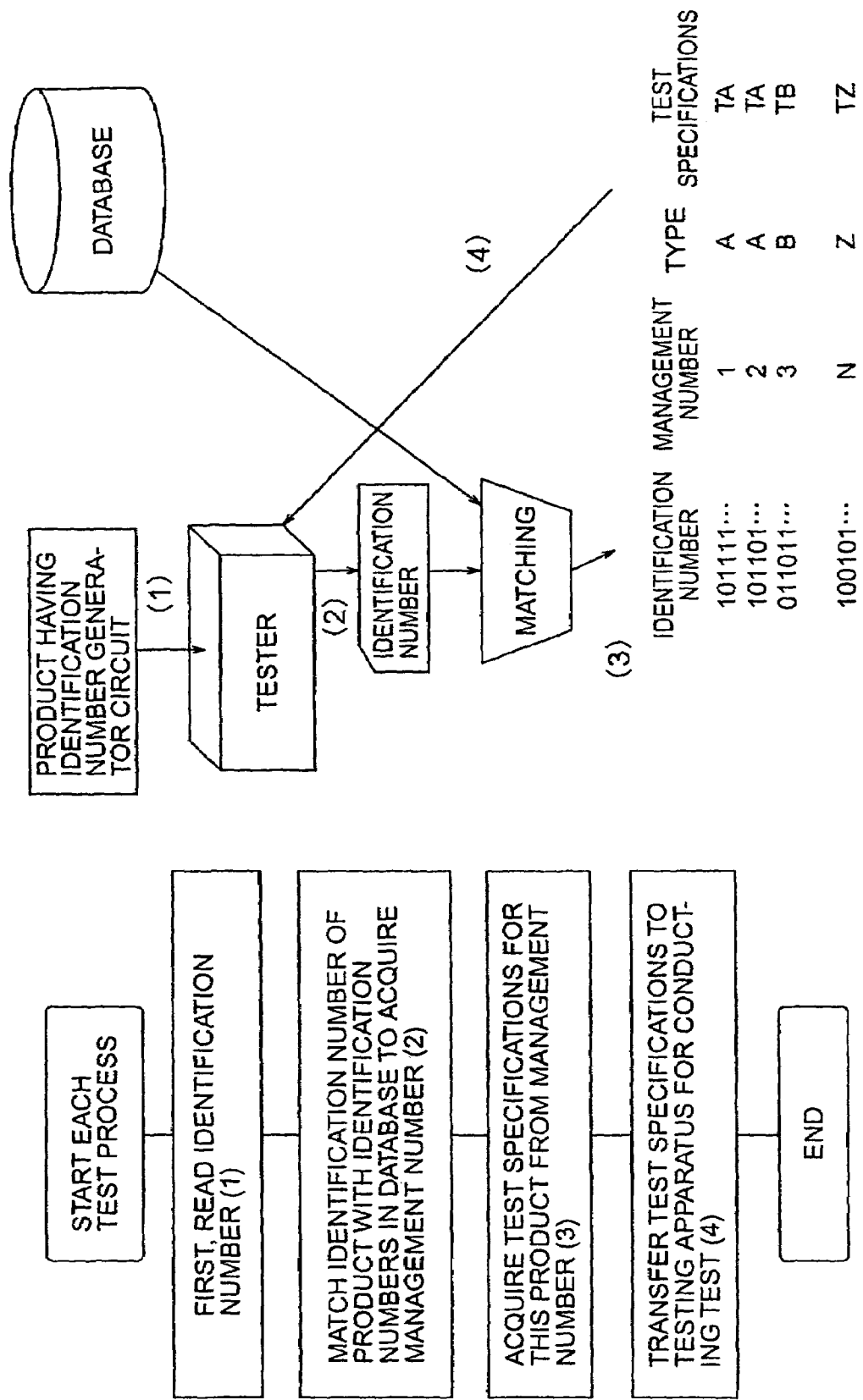
FIG. 74 is a schematic diagram for describing the testing method which utilizes the identification number generator circuit mounted in the semiconductor integrated circuit device according to the present invention.

FIGS. 73 and 74 illustrate schematic diagrams for describing a testing method which utilizes the identification number generator circuit mounted in the semiconductor integrated circuit device according to the present invention. FIG. 73 illustrates an identification number acquisition process, while FIG. 74 illustrates a test process.

At a stage close to the end of the manufacturing process illustrated in FIG. 73, the identification number generator circuit can utilize its functions, so that an identification number acquisition process is provided before several test processes. First, data such as an identification number and data such as a management number, a product type and the like required in subsequent processes are registered in the database. However, this is limited to a device which is capable of performing minimally required operation related to the generation of the identification number.

In each of subsequent test processes illustrated in FIG. 74, the identification number of a product is first read and matched with identification numbers on the database to acquire a management number. Data on the product type and test specifications is uniquely determined from the management number and transferred to a testing apparatus. The testing apparatus can conduct a test in accordance with test specifications given to each of products. The advantage of this configuration lies in that if the product type and test specifications or other associated data are given to the database only in the first identification number acquisition step, such data need not be given again in each of subsequent test processes or manufacturing process, so that the production efficiency can be increased.

Figure 75:
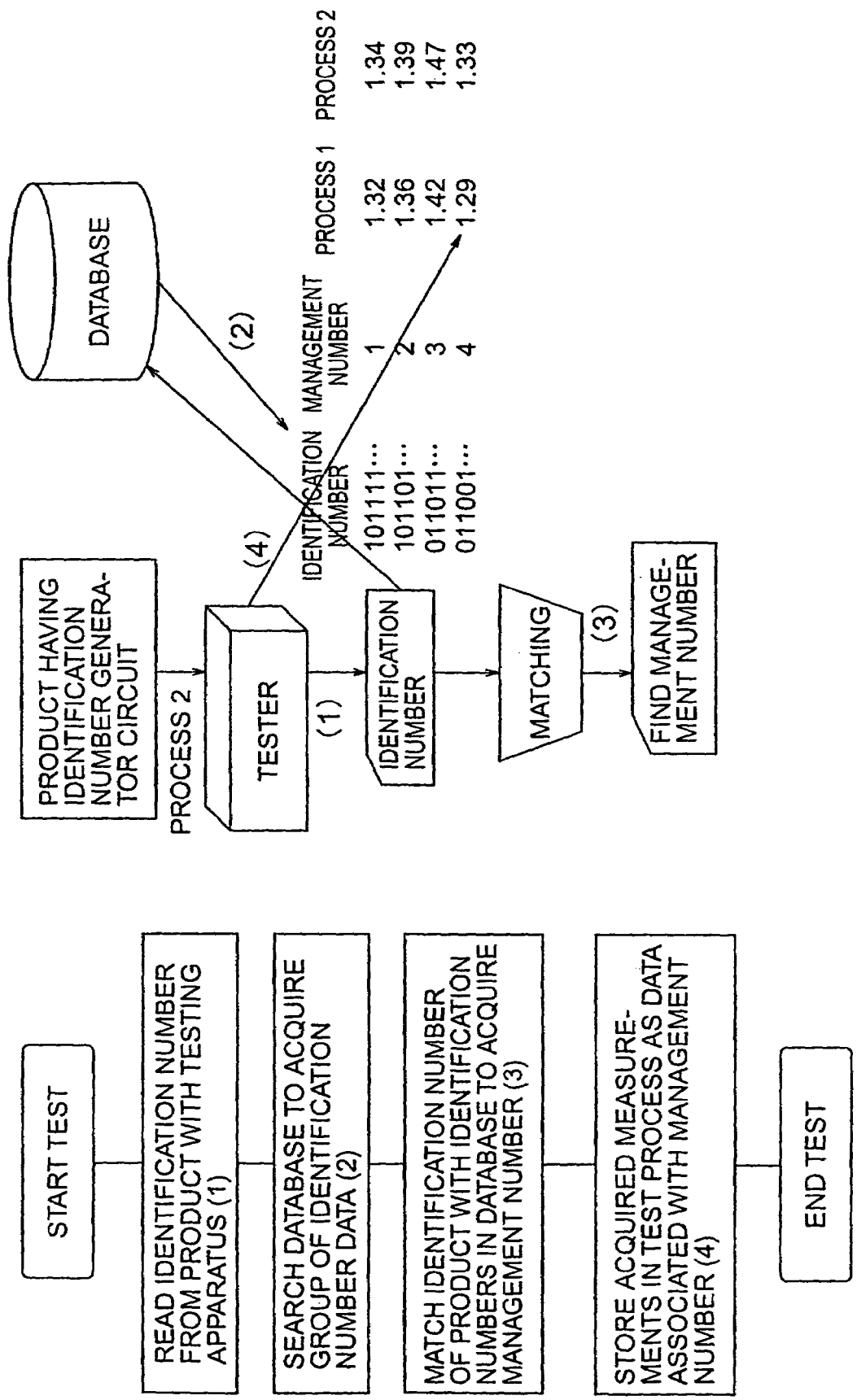
FIG. 75 is a schematic diagram for describing a method for managing correlation of characteristic data for each semiconductor chip in each test step, making use of the identification number generator circuit mounted in the semiconductor integrated circuit device according to the present invention.

FIG. 75 illustrates a schematic diagram for describing a method for managing correlation of characteristic data for each semiconductor chip in each test step, making use of the identification number generator circuit mounted in the semiconductor integrated circuit device according to the present invention.

Characteristic data (measurements) found in each test step in the semiconductor manufacturing is found in each step, and a change in the characteristic data may be analyzed. The identification number is used for managing these characteristic data to store the characteristic data of each chip in each step in the database. In this event, the identification numbers in the database are also updated by identification numbers read in the most recent step to take a change in the identification numbers due to a change in the operation of the circuit into the database.

Conventionally, the correlation of a probe test to a finished product test has been taken in lot units in which a plurality of chips were collected in a group. At this time, since the correlation can be taken for a change in the characteristic data between the respective processes for each chip, the accuracy of the analysis can be increased.

Figure 76:
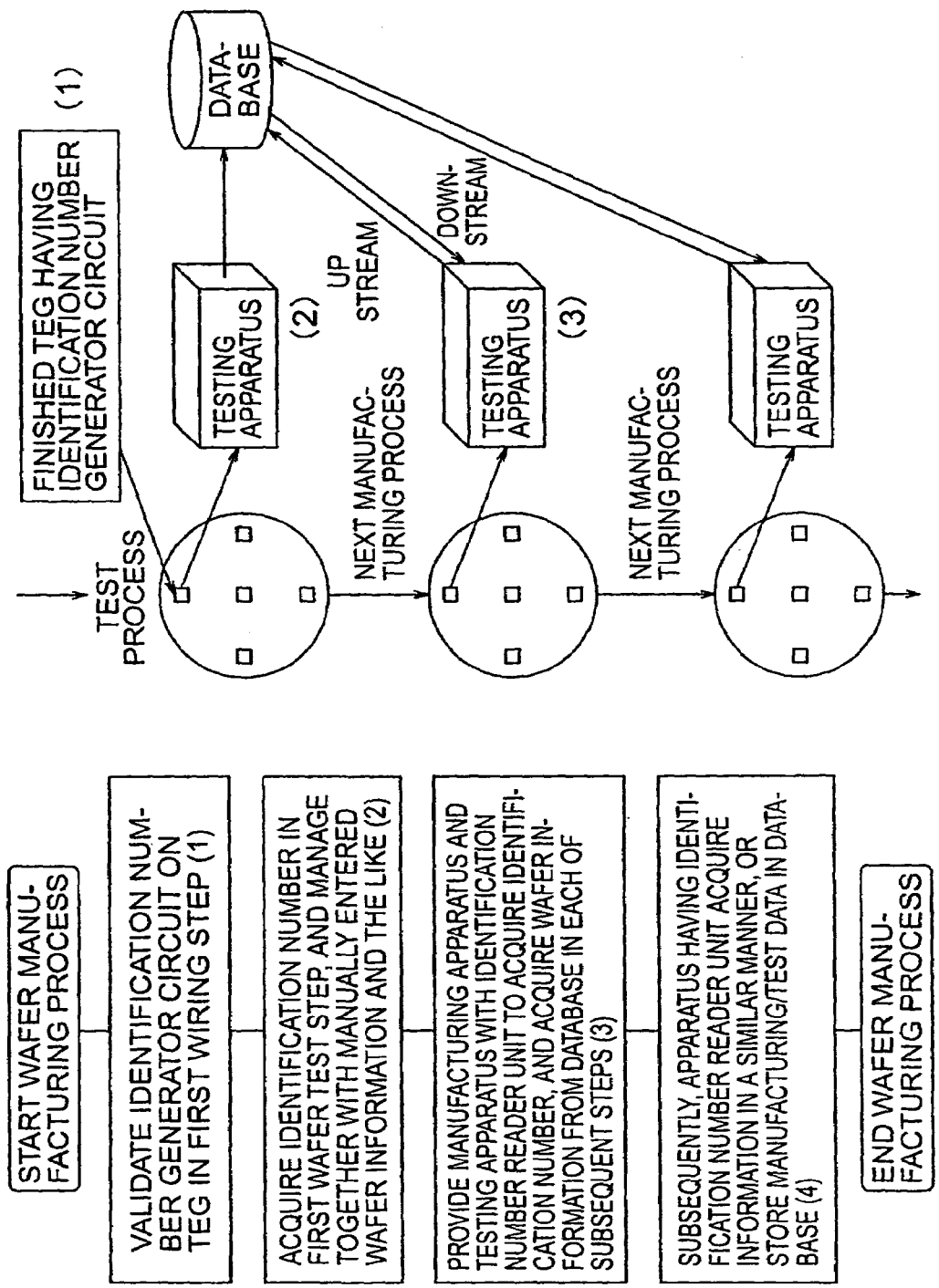
FIG. 76 is a schematic diagram for describing a method for automatically managing wafers in a pre-process, making use of the identification number generator circuit mounted in the semiconductor integrated circuit device according to the present invention.

FIG. 76 illustrates a schematic diagram for describing a method for automatically managing wafers in a pre-process, making use of the identification number generator circuit mounted in the semiconductor integrated circuit device according to the present invention.

The identification number generator circuit is provided on TEG for identifying a wafer, such that each wafer can be managed with its identification number when its function is completed in the first wiring step. This eliminates the need for attaching a tag to the wafer for management and the need for inputting information to a system for managing the wafer manufacturing process.

When the function of the identification number generator circuit is validated, and when an identification number reading mechanism is attached to manufacturing apparatuses and testing apparatuses for processing the wafer in respective steps subsequent thereto, the database can be accessed with a read identification number to automatically set information on the wafers in the apparatuses. In addition, the manufacturing conditions in which the wafer is processed, and test data can also be automatically stored in the database.

The identification number reading mechanism can be comprised of a power supply which can be controlled from a personal computer, a board which can generate a signal for functioning the identification number generator circuit and reading its output (identification number), and software. A probe is also required for inputting and outputting data to and from TEG.

Figure 77:
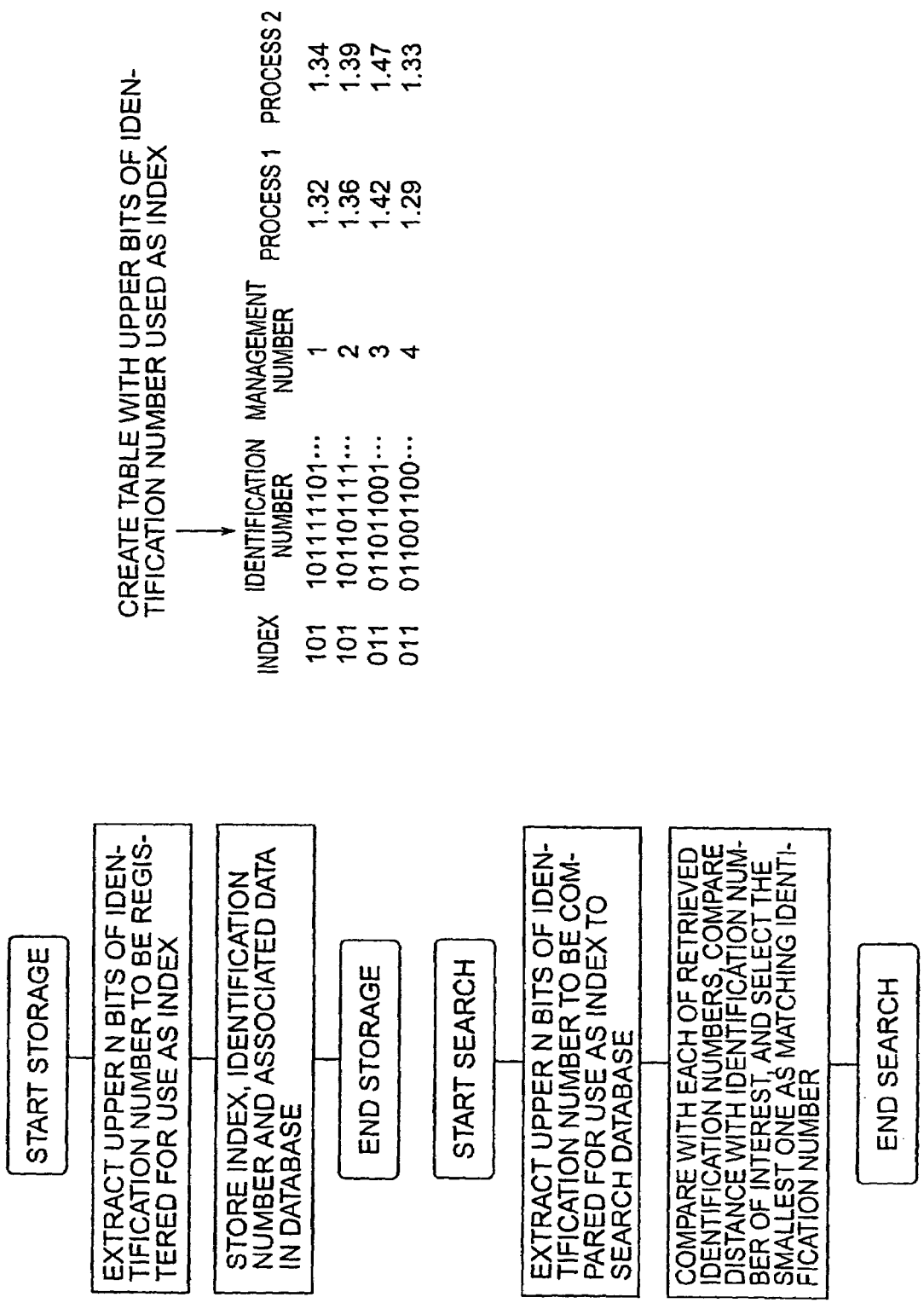
FIG. 77 is a schematic diagram for describing a method of storing and searching an identification number of the identification number generator circuit mounted in the semiconductor integrated circuit device according to the present invention.

FIG. 77 illustrates a schematic diagram for describing a method of storing and searching an identification number of the identification number generator circuit mounted in the semiconductor integrated circuit device according to the present invention.

This embodiment employs a scheme for extracting upper N bits of the identification number which is stored in a table field on the database as an index for management, thereby improving a search speed and reducing a load on the system. With a method of comparing an identification number to be compared with a group of identification numbers in the database, upper bits of the identification number to be compared are first extracted, and a table is searched on condition that this value matches an index value on the database. Next, an identification number distance is found for each of the identification numbers retrieved here, and the one having the shortest identification number distance is determined as a matching identification number. In this way, the pertinent data can be found without comparing identification numbers of all items on the table.

Figure 78:
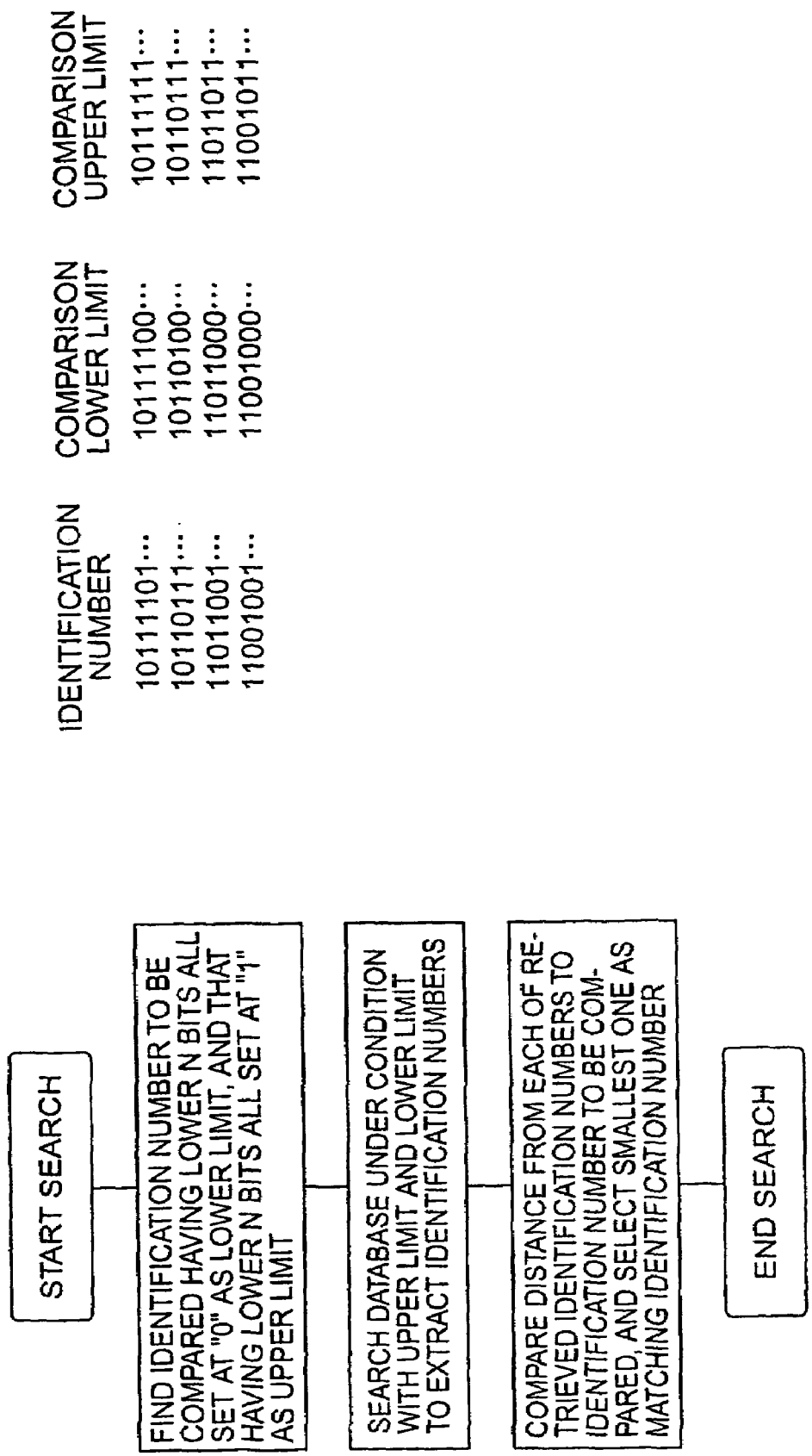
FIG. 78 is a schematic diagram for describing another example of the method of storing and searching an identification number of the identification number generator circuit mounted in the semiconductor integrated circuit device according to the present invention.

FIG. 78 illustrates schematic diagram for describing another example of the method of storing and searching an identification number of the identification number generator circuit mounted in the semiconductor integrated circuit device according to the present invention.

A scheme for comparing an identification number with a group of identification numbers in the database within a limited search range of identification numbers is employed to improve a search speed and reduce a load on the system. With a method of comparing an identification number to be compared with a group of identification numbers in the database, the table is searched with database search conditions which include an upper limit and a lower limit of an allowable range by fluctuations for an identification number to be compared. Next, an identification number distance is found for each of the identification numbers retrieved here, and the one having the shortest identification number distance is determined as a matching identification number. If no data falls within the upper limit and lower limit of the allowable range at the first time so that no data can be retrieved, the upper and lower limits are relaxed to gain perform the search processing.

Figure 79:
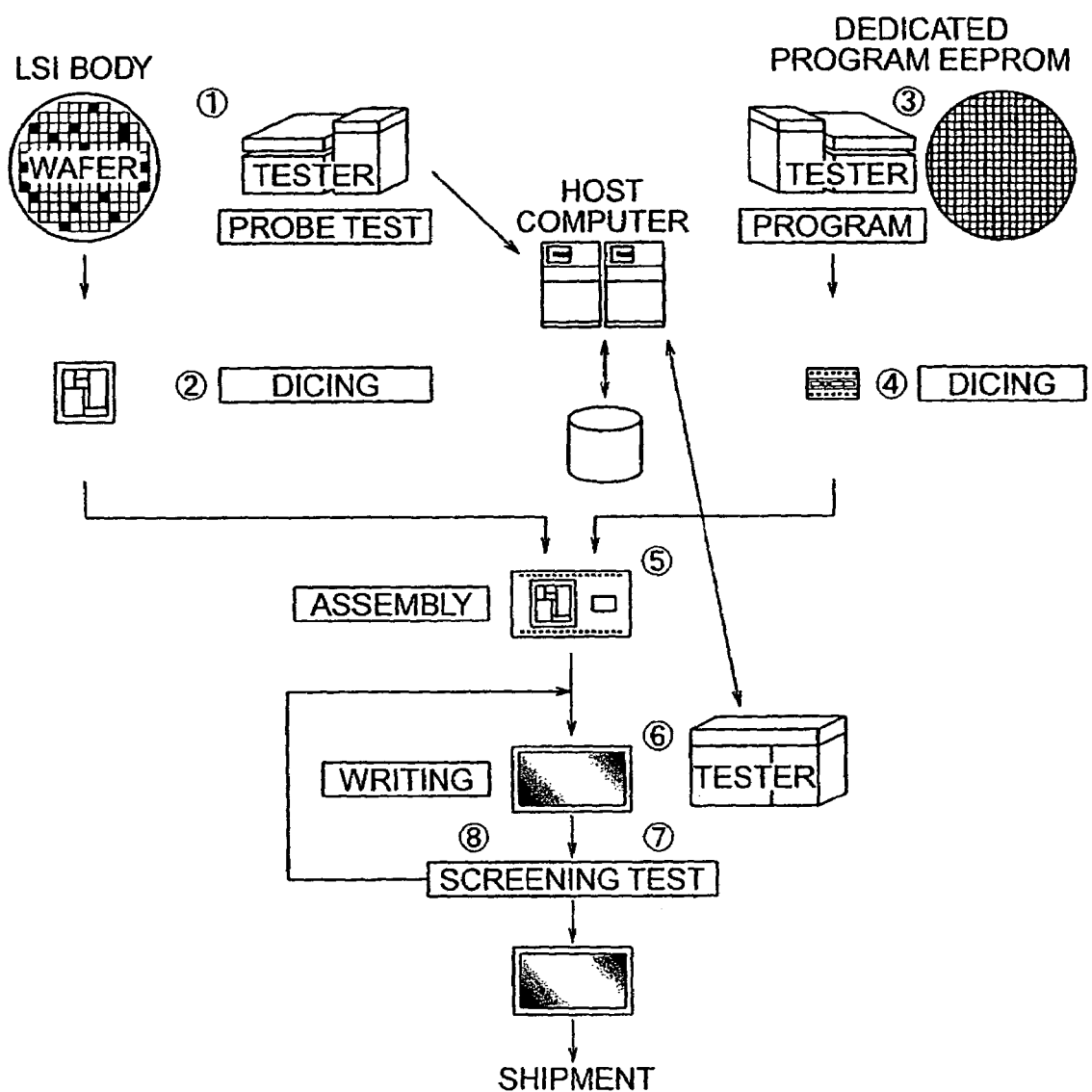
FIG. 79 is a schematic diagram illustrating one embodiment of a method for recovering a semiconductor integrated circuit device, making use of the identification number generator circuit according to the present invention.

FIG. 79 illustrates a schematic diagram illustrating one embodiment of a method for recovering a semiconductor integrated circuit device, making use of the identification number generator circuit according to the present invention.

(1) A probe test is conducted for a chip body. With this test, recovery data of DRAM or the like is sent to a host computer together with an identification number extracted from the identification number generator circuit.

(2) Dicing is performed to pick out only completely operable products and recoverable products.

(3) A probe test is conducted for EEPROM dedicated to recovery data.

(4) Normally operable products are diced for stock.

(5) An LSI body and the EEPROM dedicated to recovery data are mounted in the same module.

(6) The identification number is read from the LSI body mounted in the module, and corresponding recovery data is written into the EEPROM dedicated to recovery data.

(7) A screening test is conducted.

(8) Good LSIs are shipped, while recoverable ones of defective LSIs are returned to the step (6), where corresponding recovery data is written into the EEPROM dedicated to recovery data.

In this way, semiconductor integrated circuit devices can be readily and rationally recovered.

Other than the recovery of semiconductor integrated circuit device, a test cost can be reduced, making use of the identification number. In a probe test which is conducted at the time a semiconductor chip is formed on a half wafer, for example, semiconductor chips such as a flash memory which have the same circuit functions operating at different voltages such as 3.0 V, 2.5 V and 1.8V may be manufactured as different product types.

In this event, a test is conducted with a voltage which is set corresponding to 1.8 V to determine whether or not the memory correctly operates. A semiconductor chip determined as good in this determination is recorded with voltage information indicative of the operation confirmed at 1.8 V. The operation confirmation information is written into and held in the semiconductor chip itself in a non-volatile manner. Therefore, in the semiconductor chip, a management memory comprised of a flash memory is set.

For a chip which fails at 1.8 V in the foregoing, the voltage is set at 2.5V, and determination is made whether or not the memory operates. A semiconductor chip determined as good in this determination is recorded with voltage information indicative of the operation confirmed at 2.5 V. Then, for a chip which fails at 2.5 V, the voltage is set at 2.5V, and determination is made whether or not the memory operates. A semiconductor chip determined as good in this determination is recorded with voltage information indicative of the operation confirmed at 3.0 V. A chip which fails at 3.0 V is discarded as a defective chip.

In this embodiment, a semiconductor chip determined to be operable at 1.8 V, for example, is handled as being operable at 2.5 V and 3.0 V without undergoing the operation tests at 2.5V and 3.0 V. Similarly, a semiconductor chip determined to be operable at 2.5 V is handled as being operable at 3.0 V without undergoing the operation test at 3.0 V. Thus, although the semiconductor chip determined to be operable at 1.8 V may fail if it is operated at 2.5 V or 3.0 V, this probability is deemed to be low, so that the manufacturing cost can be reduced as a whole by omitting the operations performed one by one at the respective voltages to reduce the test time, rather than performing such operations.

Then, when assembled into a single flash memory or combined with a microprocessor or the like to build a complete semiconductor integrated circuit device, the operation voltage information stored in the host computer is retrieved from the identification number to combine compatible ones. In this event, a semiconductor integrated circuit device operable at 2.5 V can use a chip which is confirmed to be operable at 1.8 V, while a semiconductor integrated circuit device operable at 3.0 V can also use chips which are operable at 1.8 V and 2.5 V.

Figure 80:
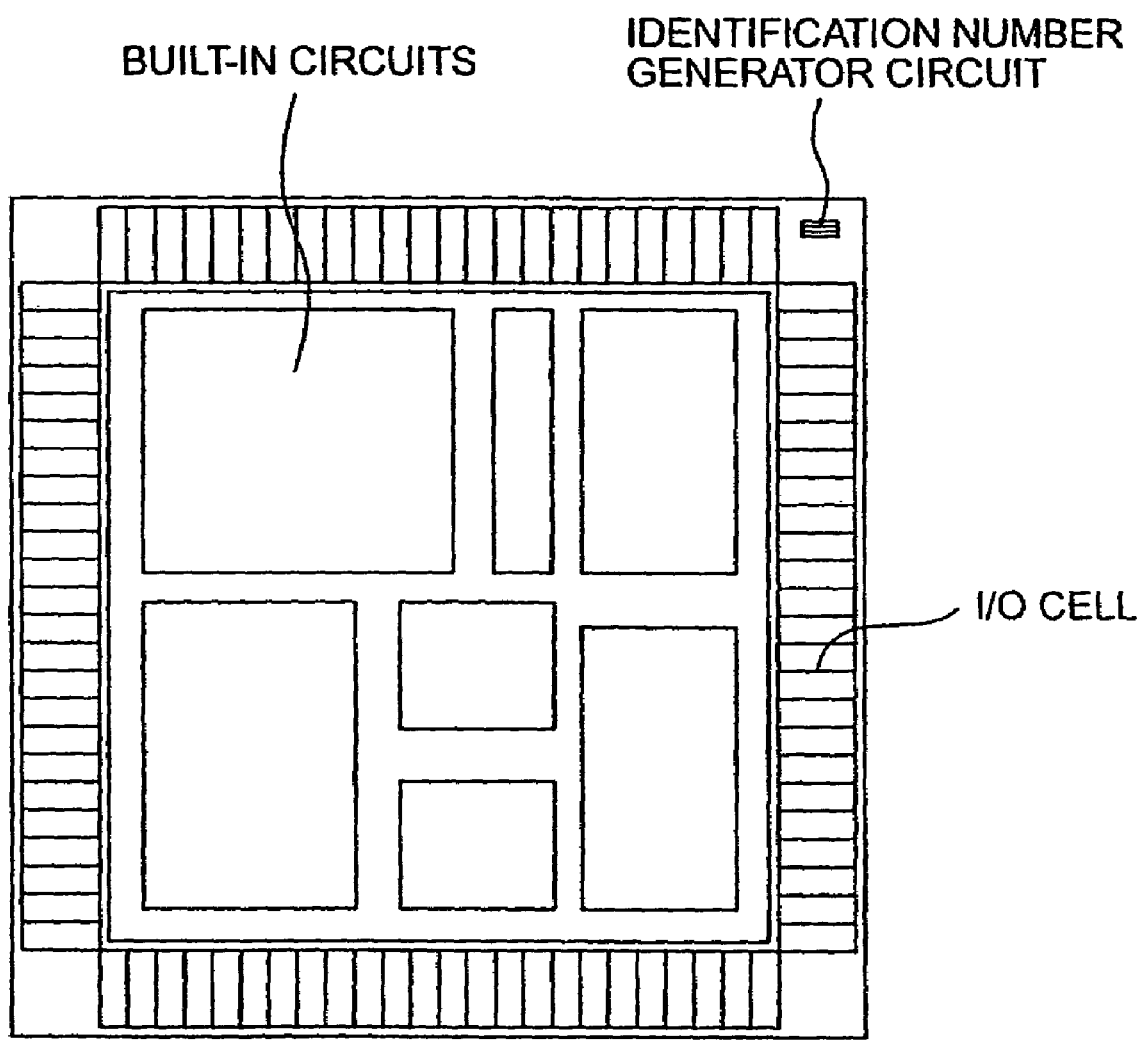
FIG. 80 is a layout diagram illustrating one embodiment of a semiconductor integrated circuit device which is mounted with the identification number generator circuit according to the present invention.
Figure 81:
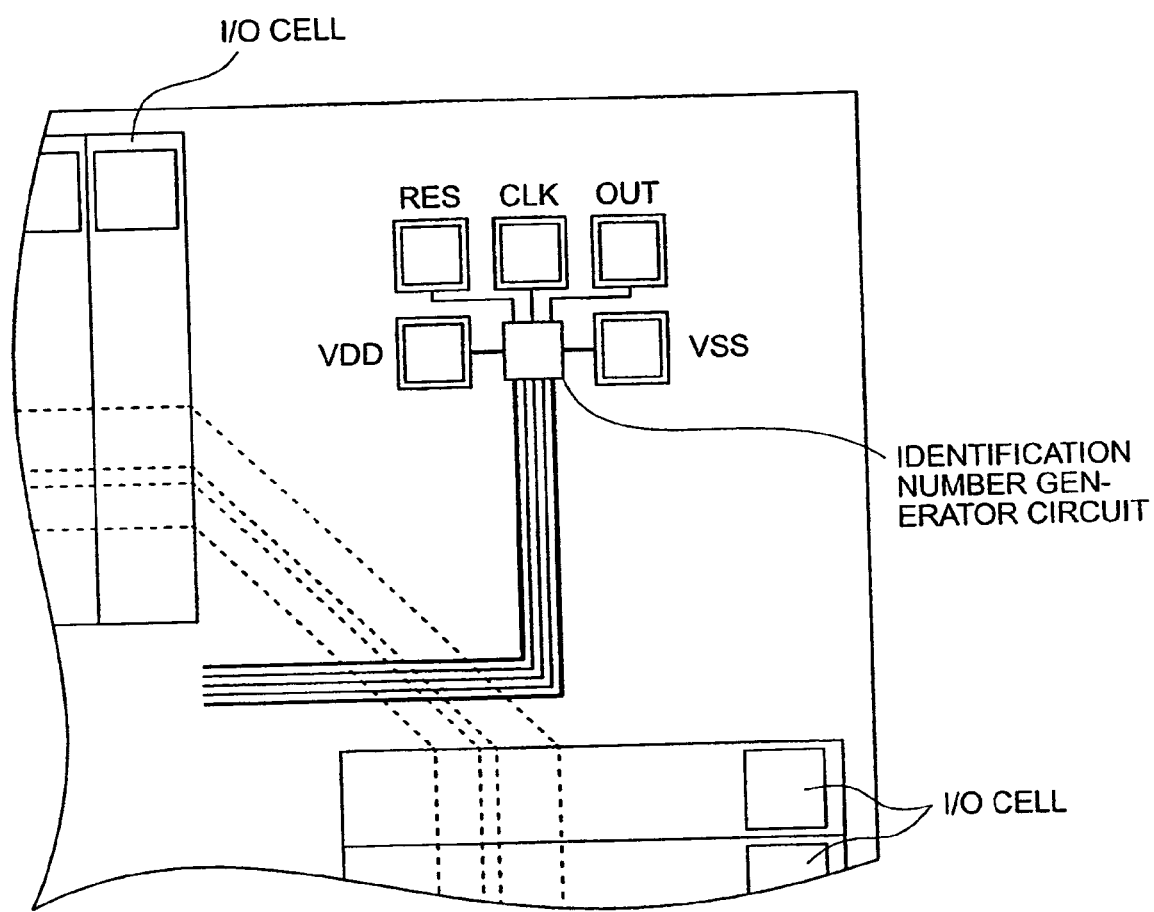
FIG. 81 is a partially enlarged layout diagram of the layout diagram in FIG. 80.

FIG. 80 is a layout diagram of a further embodiment of a semiconductor integrated circuit device which comprises the identification number generator circuit according to the present invention, and FIG. 81 is a partially enlarged layout diagram of FIG. 80. Like many general semiconductor integrated circuit devices, the semiconductor integrated circuit device in FIG. 80 has built-in circuits and internal circuits disposed substantially at the center of a semiconductor chip which forms part of it, and a plurality of input/output cells (I/O cells) disposed around the built-in circuits and internal circuits for communicating signals to the outside.

Similar to general semiconductor integrated circuit devices, four corners of the peripheral portion of the semiconductor chip are empty regions in which no I/O cell is disposed. This embodiment makes use of such empty regions, and provides an identification number generator circuit CRNC in one of them.

The identification number generator circuit CRNC is coupled to the built-in circuits through a signal and power supply wiring layer extending over the semiconductor chip.

As will be later described, the signal and power supply wires can be disconnected. For convenience of such disconnection, such signal and power supply wiring layers are preferably small in quantity. Thus, in the embodiment, wires for interfacing the identification number generator circuit with the built-in circuits are comprised of a small number of wires such as power supply wires (VDD, VSS) for the identification number generator circuit and three signal wires for a reset signal (RES), a clock signal (CLK), and an identification number output signal (OUT). In the partially enlarged view of FIG. 81, the power supply wires VDD, VSS are represented by relatively fat lines, while the signal wires for the reset signal, clock signal and identification number output signal are represented by relatively thin lines. As is apparent from the figure, the signal wires extend while they are substantially surrounded by the power supply wires VDD, VSS. The identification number generator circuit CRNC is configured to be able to generate identification number in accordance with the round-robin scheme as in the aforementioned embodiment under the reset signal and clock signal. On an empty region around the identification number generator circuit CRNC, electrode pads RES, CLK, OUT, VDD, VSS are provided to extend to the reset signal (RES), clock signal (CLK) identification number output signal (OUT), and power supply terminals VDD, VSS, as illustrated in FIG. 81. These electrode pads are provided on the semiconductor chip to be compatible with contactors referred to as probe needles, instead of provided as external terminals of the semiconductor integrated circuit device which is constructed by packaging the semiconductor chip with a packaging member such as a mold resin or the like.

Identification number information from the illustrated identification number generator circuit CRNC can be read to the outside through a normal path by way of the I/O cell if the power supply lines, built-in circuits, I/O cell and the like on the path of the semiconductor integrated circuit device are operable.

Here, the identification number information can preferably meet a number of needs including a product historical investigation. In some cases, it is desired that the identification number information can be extracted from an inoperative semiconductor integrated circuit device.

Inconveniently, if a semiconductor integrated circuit device fails to normally operate due to an abnormal increase in the supply current, or a variety of other factors, the package member such as mold resin is removed to expose the semiconductor chip, and the power supply and signal wire layers between the identification number generator circuit CRNC and the built-in circuits are cut by a laser cutter for removal. As a result, the identification number generator circuit CRNC is connected only to the electrode pads. Stated another way, the circuit CRNC is free from internal wire short-circuit, destruction of internal elements, and the line of the semiconductor integrated circuit device, and can be independently operated per se. Thus, in this state, contactors are brought into contact with the electrode pads, such that the identification number information can be acquired through the contactors.

When the semiconductor integrated circuit device takes a package form referred to as a chip size package or a chip scale package which comprises a plurality of external terminals comprised of bump electrodes through an insulating layer intended for mitigating a stress and a wiring layer such as a relocation wire on the semiconductor chip, the identification number information can be extracted in a similar manner. In this event, if it is difficult to extract the identification number information through normal external terminals, the bump electrodes and insulating layer are removed to expose the electrode pads and a portion of wires to be cut, in the same manner as the foregoing, and the identification number information is read through the electrode pads after cutting and removing the wires.

Figure 82:
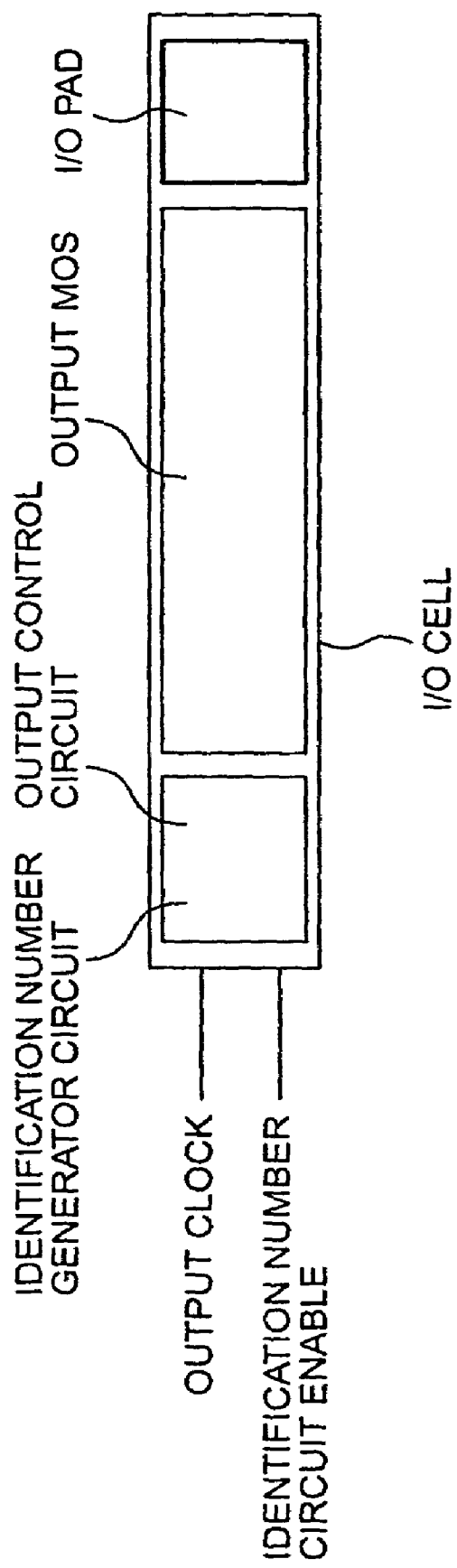
FIG. 82 is a layout diagram illustrating another embodiment of the semiconductor integrated circuit device which is mounted with the identification number generator circuit according to the present invention.
Figure 83:
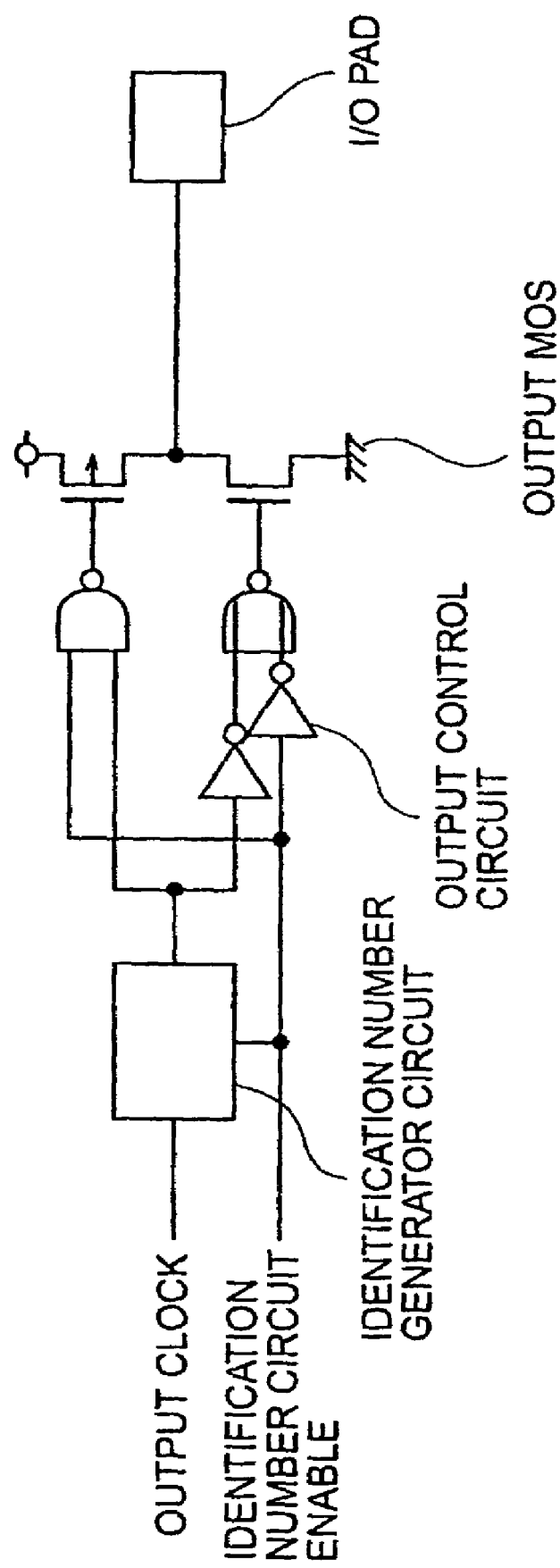
FIG. 83 is a circuit diagram corresponding to the layout in FIG. 81.

FIG. 82 is a layout diagram of another embodiment of the semiconductor integrated circuit device which comprises the identification number generator circuit according to the present invention, and FIG. 83 is its circuit diagram.

The semiconductor integrated circuit device in this embodiment is of a so-called master slice scheme in which a semiconductor region for forming MOSFETs and the like is configured in a fixed pattern, and desired functional circuits are provided through wires. Within I/O cells set on a semiconductor chip which comprises the semiconductor integrated circuit device, an unused I/O cell, i.e., an I/O cell which is not used for functions of the semiconductor integrated circuit device, is used to provide the identification number generator circuit.

As illustrated, one I/O cell comprises a region for an output control circuit having a relatively small area; a region for an output MOSFET having a relatively large area (output MOS), and a region for disposing input/output pad electrodes (I/O PAD), and is as a whole in a rectangular plane pattern, as illustrated.

While the region for the output control circuit has a relatively small area, it has a relatively large number of sub-elements such as gate circuits, inverter circuits and MOSFETs such that a desired output control circuit and input circuit can be implemented therein. The region for the output MOSFET has a relatively small number of MOSFETs comprised of one or two p-channel MOSFETs and one or two N-channel mosfets, but has a relatively large area in regard to a high external load driving capability.

The identification number generator circuit is comprised of the sub-elements in the region for the output control circuit in the unused I/O cell. The identification number generator circuit can be provided in such a region by a relatively large number of sub-elements in the region for the output control circuit.

The P-channel MOSFET and N-channel MOSFET, inverter circuits, NAND circuit and NOR circuit illustrated in FIG. 83 make up, as a whole, a tri-state output buffer circuit for outputting the output of the identification number generator circuit to the outside. In this output buffer circuit, the inverter circuits, NAND circuit and NOR circuit are comprised of the sub-elements in the region for the output control circuit, while the output MOSFET is comprised of MOSFETs in the region for the output MOSFET.

The output of the tri-state output buffer circuit in the unused I/O cell is coupled to an input/output pad electrode (I/O PAD) disposed in the cell. The illustrated input/output pad electrode is an output electrode dedicated to identification number information.

The input/output pad electrode is coupled to an empty pin or an empty terminal as normally referred to as an NC (Non Connection) pin in the semiconductor integrated circuit device.

According to this embodiment, an enable signal, labeled as identification number circuit enable in the figure, is brought to a significant level such as a high level, causing the identification number generator circuit and tri-state output buffer circuit to be operative. For the operation of the identification number generator circuit, a continuous clock signal, labeled as output clock in the figure, is supplied. In response to this continuous clock signal, identification number information is sequentially supplied to the input/output pad electrode.

Figure 84:
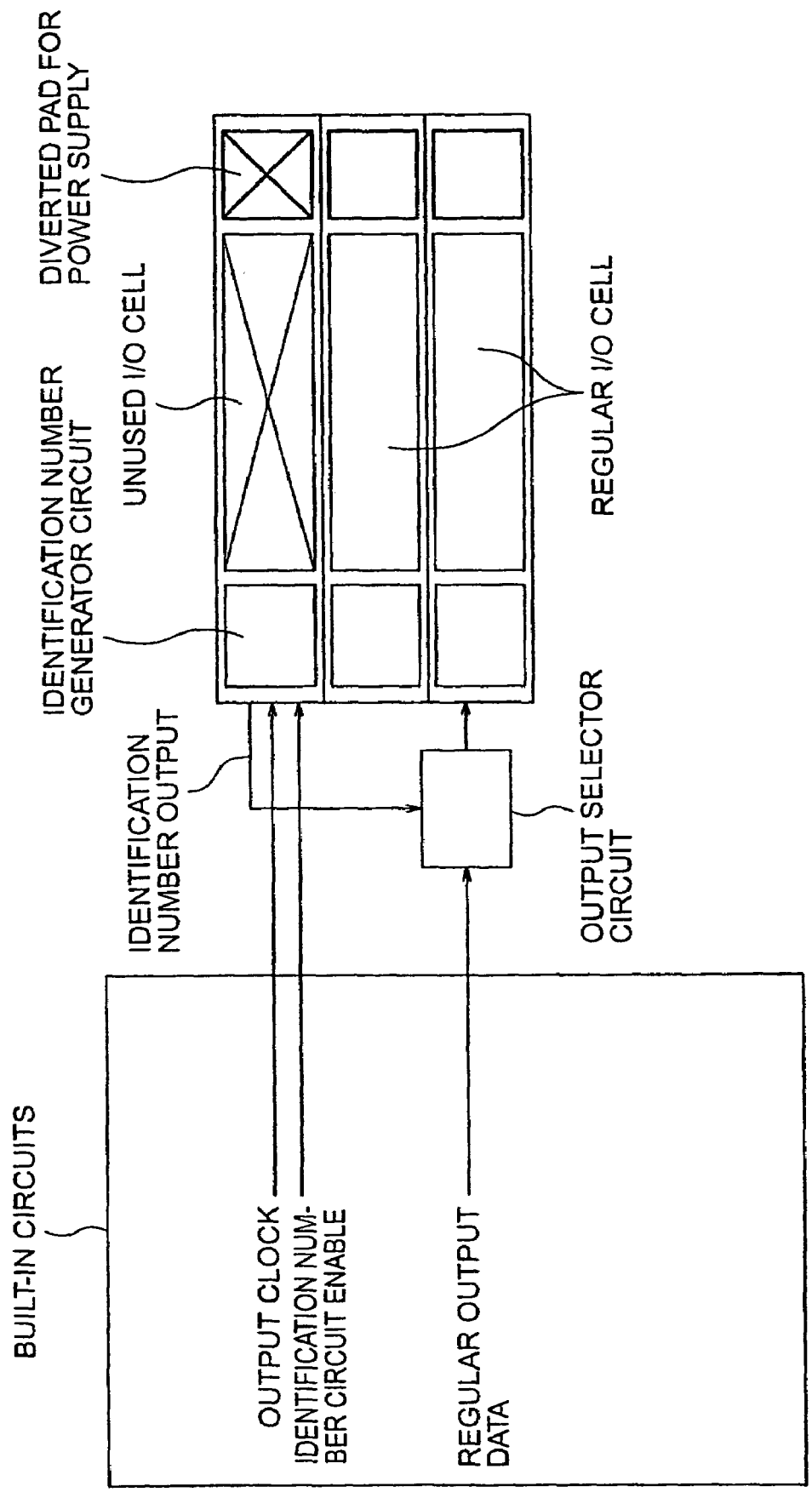
FIG. 84 is a schematic diagram illustrating a further embodiment of the semiconductor integrated circuit device which comprises the identification number generator circuit according to the present invention.

FIG. 84 is a schematic diagram illustrating a further embodiment of the semiconductor integrated circuit device which comprises the identification number generator circuit according to the present invention. This embodiment is made in consideration of diversion of a cell region of an unused I/O cell, if any, for enhancing the power supply, from a view point of enhancement of power supply for supporting increased current consumption and faster operation speed in large scaled semiconductor integrated circuit devices in recent years.

The layout diagram of FIG. 84 illustrates three I/O cells. In the three I/O cells, the upper I/O cell in the figure is assumed to be an unused I/O cell, while another I/O cell in a lower region of the drawing is assumed to be a regular I/O cell for use in the operation of the semiconductor integrated circuit device.

In the unused I/O cell, a power supply pad electrode, i.e., a pad electrode diverted for the power supply or the like is provided in a region for input/output pad electrodes. The power supply pad electrode is coupled to a plurality of I/O cells, and a power supply wiring layer, not shown, for built-in circuits. It should be understood that the power supply wire layer on the unused I/O cell is generally comprised of an upper wiring layer made of a metal in wiring layers which employ a multi-layer wiring structure.

In the unused I/O cell, in a portion corresponding to the region for the output control circuit in FIG. 81, the identification number generator circuit is disposed in a manner similar to the example in FIG. 81, where the identification number generator circuit receives an output clock signal and an identification number circuit enable signal through wires implemented by a lower wiring layer in the multi-layer wiring layers to form an identification number output.

The wiring layer for the output clock signal, identification number enable signal and identification number output between the identification number generator circuit and built-in circuits use relatively upper wiring layers in their respective parts in order to facilitate disconnection of wires and formation of terminals, as later described.

An output signal of the identification number generator circuit is supplied to an output selector circuit which is disposed on the input side of the regular I/O cell which is set as an output cell.

In this way, the regular I/O cell which is set as the output cell outputs regular output data supplied thereto from the built-in circuits through the output selector circuit to its input/output pad electrode in a normal operation of the semiconductor integrated circuit device.

When the identification number information should be outputted, the regular I/O cell outputs the identification number information supplied thereto from the identification number generator circuit through the output selector circuit to its input/output pad electrode.

Figure 85:
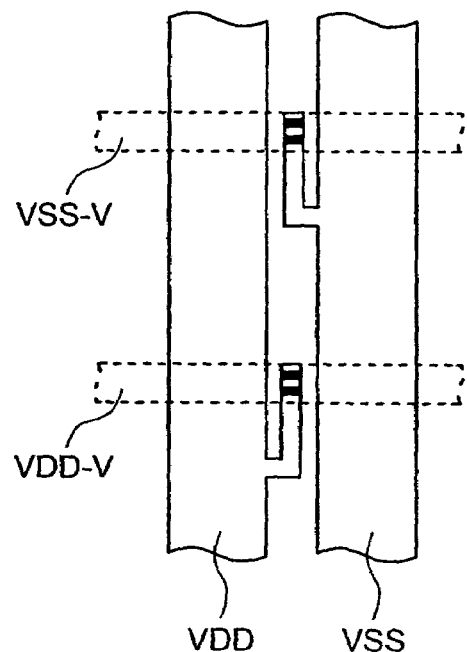
FIG. 85 is a partially plan pattern diagram of a semiconductor integrated circuit device which forms part of the embodiment in FIG. 84.

FIG. 85 illustrates a coupling pattern of the power supply terminal VDD and the reference potential terminal VSS as referred to as a ground terminal of the identification number generator circuit with the power supply wiring layer and reference potential wiring layer which may extend over a plurality of I/O cells. The power supply wiring layer VDD and reference potential wiring layer VSS extending over the I/O cells are designed to have relatively large widths with the intention of enhancing the power supply system. In this embodiment, as illustrated in FIG. 85, a branch wiring layer having a small width is provided for the power supply wiring layer having a relatively large width, and this narrow branching wiring layer is coupled to a power supply wire VDD-V for the identification number generator circuit. The coupling of the reference potential wiring layer with a reference potential wire VSS-V of the identification number generator circuit is also in a similar configuration. This configuration provides a separation between the identification number generator circuit and the power supply wiring layer and reference potential wiring layer, as described below.

Figure 86:
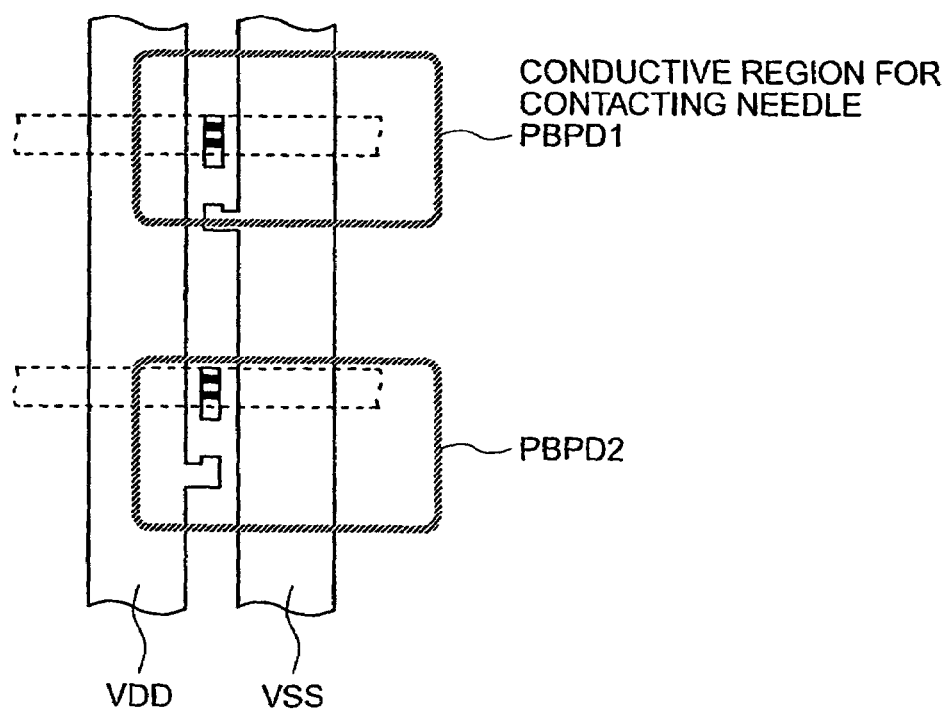
FIG. 86 is another partially plan pattern diagram of the semiconductor integrated circuit device which forms part of the embodiment in FIG. 84.

Irrespective of a fault such as short-circuiting between the power supply wiring layer and reference potential wiring layer and the like, when identification number information must be generated from the identification number generator circuit, a narrow branch wiring layer connected to the power supply terminal VDD and reference potential terminal VSS of the circuit is cut by a technique such as a laser cutting technique or a focused ion beam (FIB) technique, as in FIG. 86. Together with this, signal lines as mentioned above are also cut in a similar manner between the identification number generator circuit and built-in circuits.

Next, the formation of an insulating film, formation of openings through the insulating film, and selective formation of a conductive layer are performed by a known technique such as the FIB technique. In this way, conductive regions made of the new conductive layer as in FIG. 86 are set for the power supply terminal VDD and reference potential terminal VSS of the identification number generator circuit. Simultaneously, new conductive layers are also set for the aforementioned signal lines.

A contactor referred to as a probe needle is brought into contact with these conductive layers to operate the identification number generator circuit to generate identification number information.

Figure 87:
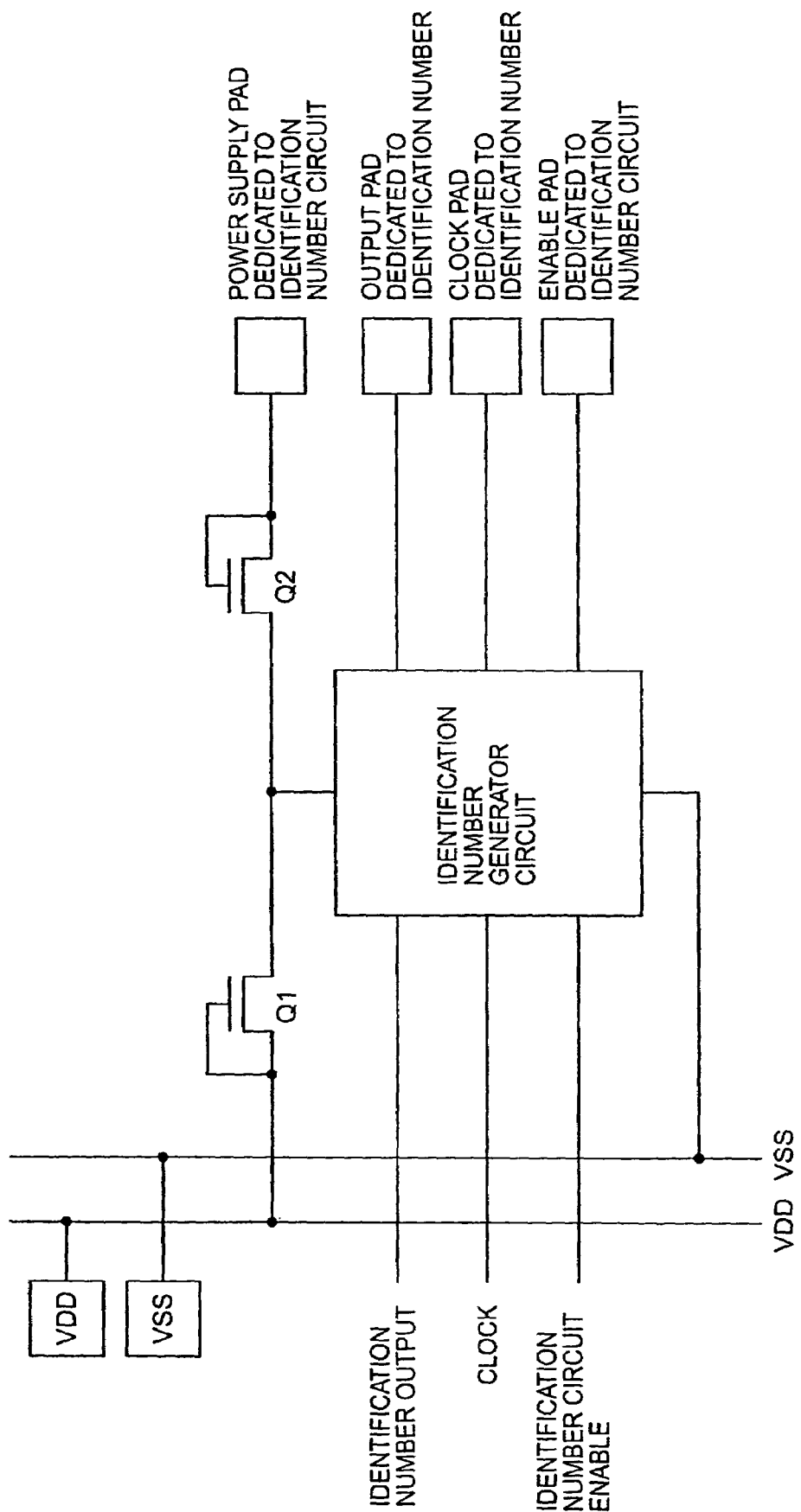
FIG. 87 is a circuit diagram illustrating one embodiment of the semiconductor integrated circuit device which comprises the identification number generator circuit according to the present invention.

FIG. 87 is a circuit diagram illustrating one embodiment of the semiconductor integrated circuit device which comprises the identification number generator circuit according to the present invention.

In this embodiment, the identification number generator circuit fabricated in a semiconductor integrated circuit device is provided with two diode-connected MOSFETs Q1, Q2; a power supply pad for the identification number circuit; an output pad dedicated to an identification number, a clock pad dedicated to the identification number, and an enable pad dedicated to the identification number, as illustrated.

When the semiconductor integrated circuit device can normally operate, the identification number generator circuit is applied with an operating voltage through a regular power supply terminal VDD, a regular power supply wire, and the diode-connected MOSFET Q1, and outputs identification number information to built-in circuits in response to a clock signal and an identification number enable signal from the built-in circuits, not shown.

If the identification number generator circuit cannot be powered through the regular terminals VDD, VSS due to a fault such as short-circuiting between the regular power supply terminal VDD and the power supply wire connected thereto, and the regular reference potential terminal VSS and the reference potential wire connected hereto, or the like, necessary voltages and signals are applied to such circuits through a variety of illustrated pads to operate the circuits. The diode-connected MOSFET Q1 performs a switching operation to automatically turn off in response to the power supply voltage applied to the circuit through the power supply pad for the identification number circuit and MOSFET Q2. In this way, the identification number generator circuit can be powered irrespective of a fault in the regular power supply system.

Advantageous effects are provided by the respective embodiments described above as follows.

(1) A plurality of identification elements in the same form are fabricated in course of a semiconductor integrated circuit device manufacturing process, and the relation of magnitude is determined for physical amounts of the plurality of identification elements with respect to one another, corresponding to variations in the process, and used as unique identification information for semiconductor integrated circuit devices, thereby making it possible to effectively identify respective semiconductor integrated circuit devices in simple configuration.

(2) In addition to the above, first identification information assigned to identification elements during the manufacturing, and ordering information on the relation of magnitude in the physical amounts of the plurality of identification elements, found from the determination, are used for the unique identification information, so that the amount of information can be reduced for identifying respective semiconductor integrated circuits, thereby making it possible to effectively simplify a storage circuit for storing the identification information and reduce a determination time therefor.

(3) In addition to the above, an input terminal and an output terminal of a CMOS inverter circuit composed of an N-channel MOSFET and P-channel MOSFET are connected, and its logical threshold value is chosen to be the physical amount which is compared in terms of magnitude, wherein the identification element can be composed of basic digital circuits such as a CMOS circuit and the like, thereby making it possible to effectively expand an applicable range of the semiconductor integrate circuit device without adding extra manufacturing processes.

(4) In addition to the above, when the CMOS inverter circuit is applied with an operating voltage only when the logical threshold value, as the physical amount, is determined, the influence of degraded element characteristics can be reduced, thereby making it possible to effectively provide a stable and reliable identification result.

(5) A plurality of identification elements in the same form are fabricated in course of a semiconductor integrated circuit device manufacturing process, physical amounts corresponding to variations in the process are determined, and unique identification information is generated based on the relation of magnitude in physical amounts of the plurality of identification elements with respect to one another corresponding to the variations in the process, and stored in association with a manufacturing log. When such a semiconductor integrated circuit device fails, the stored manufacturing log is read based on the unique identification information to analyze the fault, and is fed back to the manufacturing process as required, thereby making it possible to effectively build a rational manufacturing system.

(6) A plurality of identification elements in the same form are fabricated in course of a process for manufacturing a semiconductor integrated circuit device which comprises a first chip, and unique identification information is generated for the first chip based on the relation of magnitude in physical amounts corresponding to variations in the process with respect to one another. For a plurality of the semiconductor integrated circuit devices, which comprise the first-chip, a plurality of operation modification information are formed in accordance with respective electric characteristics, and written into a second chip in correspondence to the identification information of the respective first chip. The first chip and second chip are assembled into one, and the operation modification information is outputted to the first chip based on the identification information of the first chip, thereby making it possible to effectively manufacture a semiconductor integrated circuit devices in a multi-chip configuration in an efficient manner without performing a laborious chip management.

(7) In addition the above, a memory having redundant circuits is composed of the first chip, and the second chip is provided for storing defective addresses, thereby making it possible to effectively provide a memory device which presents a high manufacturing yield rate in a simple configuration.

(8) In addition to the above, when a fault occurs in a test conducted for the first chip and second chip which have been assembled, the second chip is dismounted and returned to a step which collects a plurality of other semiconductor integrated circuit devices of the semiconductor integrated circuit devices which comprise the first chip, thereby making it possible to effectively improve the manufacturing yield rate.

(9) In addition to the above, after screening, the assembled first chip and second chip are integrally encapsulated, thereby making it possible to effectively carry out a reduction in size of the semiconductor integrated circuit device while improving the manufacturing yield rate.

(10) In addition to the above, when the first chip and second chip are assembled on a common mounting substrate, the second chip can be readily removed, thereby making it possible to effectively perform an effective reuse when the fault occurs.

(11) Unique identification information is provided based on the relation of magnitude in mutual physical amounts corresponding to variations in process of a plurality of identification elements formed as the same form in course of manufacturing a semiconductor integrated circuit device, thereby making it possible to effectively incorporate identification information of each semiconductor integrated circuit device in a simple configuration.

(12) In addition to the above, when the unique identification information is comprised of first identification information assigned to the identification element during the manufacturing, and ordering information on the relation of magnitude in the physical amounts of the plurality of identification elements, the amount of information can be reduced for identifying each semiconductor integrated circuit device, thus making it possible to effectively simplify a storage circuit for storing the unique identification information and speed up the operation for determination.

(13) In addition to the above, an input terminal and an output terminal of a CMOS inverter circuit composed of an N-channel MOSFET and P-channel MOSFET are connected, and its logical threshold value is chosen to be the physical amount which is compared in terms of magnitude, wherein the identification element can be composed of basic digital circuits such as a CMOS circuit and the like, thereby making it possible to effectively expand an applicable range of the semiconductor integrate circuit device without adding extra manufacturing processes.

(14) In addition to the above, the input terminal and output terminal of the CMOS inverter circuit are connected, and a switch is provided for each of a plurality of CMOS inverter circuits as a circuit for determining the magnitude of the logical threshold value. A common voltage comparator circuit is supplied with the logical threshold value voltage for determination with a combination of two each in round robin, thereby making it possible to effectively implement a high identification capability in a simple configuration.

(15) In addition to the above, corresponding to each of a plurality of CMOS inverter circuits, a first switch for connecting an input terminal and an output terminal thereof, a second switch for connecting a common first circuit node with the input terminal, and a third switch for connecting the output terminal with a common second circuit node are provided. In combination of these first to third switches, among a plurality of inverter circuits, two CMOS inverter circuits are grouped into a set in round robin, an input terminal and an output terminal of one CMOS inverter circuit is connected to supply a voltage generated at the first circuit node to an input terminal of the other CMOS inverter circuit, and an output signal of voltage comparison is generated at the second circuit node using the logical threshold value voltage of the other CMOS inverter circuit as a reference voltage, thereby making it possible to effectively generate an identification number in a simple configuration.

(16) In addition to the above, The CMOS inverter circuits and the first to third switches are composed of elements which comprise a CMOS gate array, thereby making it possible to effectively provide the identification number generator circuit only through a wiring design.

(17) In addition to the above, when the CMOS inverter circuit is supplied with an operating voltage upon determination of a voltage as the physical amount, the influence of degraded element characteristics can be reduced, thus making it possible to effectively generate a stable and reliable identification number.

(18) A first switch for selectively short-circuiting an input terminal and an output terminal of a first inverter circuit, and a second inverter circuit having an input terminal connected to the output terminal of the first inverter circuit are provided, a plurality of identification elements are provided for receiving the output signal which is amplified by an amplifier circuit, and an identification number circuit is built in for generating an identification number from an output signal from each identification element when the first switch is on, thereby making it possible to effectively identify each semiconductor chip in a simple configuration.

(19) In addition to the above, the inverter circuit is comprised of a CMOS inverter circuit, and a latch circuit is further provided for receiving an output signal of the amplifier circuit to form a low level when an output signal of the second inverter is on the high level side with respect to its logical threshold value; for receiving the output signal of the amplifier circuit to from a high level when the output signal of the second inverter is on the low level side with respect to its logical threshold value; and for feeding the output signal back to the input terminal of the first inverter circuit in a feedback operation in which the first switch is turned off, thereby making it possible to effectively enhance the reproductivity of the identification number and the immunity to aging changes.

(20) In addition to the above, the amplifier circuit is comprised of a plurality of CMOS inverter circuits connected in cascade, a third switch is provided for applying a voltage on the high level side to the respective input terminals of the respective CMOS inverter circuits which form part of the first inverter circuit, second inverter circuit and amplifier circuit, a third switch is provided at a mutual connection point of the respective inverter circuit sequences which form part of the first inverter circuit and the amplifier circuit, wherein the second switch is turned on, and the third switch is turned off when the identification number circuit is inoperative, and the second switch is turned off, and the third switch is turned on when the identification information is amplified with the first switch being turned on and in the feedback operation, thereby making it possible to effectively improve even more the reproductivity of the identification number and the immunity to aging changes.

(21) A first switch is provided for short-circuiting the input terminal and the output terminal of each of the first inverter circuit and second inverter circuit, a second switch is provided for connecting the output terminal of the first inverter circuit to the input terminal of the second inverter circuit, and a plurality of identification elements including an amplifier circuit including a third inverter circuit having an output terminal connected to the output terminal of the second inverter circuit is used, wherein the identification number circuit is incorporated for generating an identification number such that first identification information is generated from the output signal of the amplifier circuit including the third inverter circuit when the first switch of the first inverter circuit is turned on, the first switch of the second inverter circuit is turned off, and the second switch is turned on, and second identification number is generated from the output signal of the amplifier circuit including the third inverter circuit when the first switch of the second inverter circuit is turned off and the second switch is turned off, thereby making it possible to effectively identify respective semiconductor chips while simplifying the circuit.

(22) In addition to the above, a plurality of circuit sequences each comprised of the first inverter circuit and second inverter circuit are provided such that the first inverter circuit and second inverter circuit are arranged in correspondence. First switches corresponding to the plurality of circuit sequences are commonly supplied with the same switch control signal, and one of output signals of the second inverter circuits in the plurality of circuit sequences is selected by a third switch and connected to an input terminal of a third inverter circuit which comprises the first circuit in the amplifier circuit, thereby making it possible to effectively provide a large number of identification information in an efficient manner.

(23) In addition to the above, a fourth switch for disconnecting the input signal, and a fifth switch for supplying a voltage on the high level side are provided at the input terminals of the first inverter circuit and second inverter circuit, wherein the fourth switch is turned off and the fifth switch is turned on when the identification number circuit is inoperative, thereby making it possible to effectively improve even more the reproductivity of the identification number and the immunity to aging changes.

(24) A plurality of unit elements each comprising a first inverter having an input terminal and an output terminal short-circuited by a first switch, and a second switch disposed at the input terminal of the first inverter circuit, are connected in cascade through the second switch to form an identification element sequence, the output terminal of the first inverter circuit corresponded to the last stage of the identification element sequence is connected to an input terminal of an amplifier circuit which includes a second inverter circuit, a decoder for decoding a count output of a binary counter for counting a clock is provided corresponding to the first switch and second switch of each first inverter circuit, and an identification number circuit is built in for generating an identification number by generating a plurality of identification information corresponding to the respective first inverter circuits of the identification element sequences with the output signal of the amplifier circuit including the third inverter circuit by sequentially turning on the first switches and turning off the second switches complementarily to the first switches corresponding to the count output of the binary counter in order from the first circuit of the identification element sequences corresponding to the count output of the binary counter, thereby making it possible to effectively identify each semiconductor integrated circuit device while simplifying the circuit.

(25) A plurality of unit elements each comprising a first inverter having an input terminal and an output terminal short-circuited by a first switch, and a second switch disposed at the input terminal of the first inverter circuit, are connected in cascade through the second switch to form an identification element sequence, the output terminal of the first inverter circuit corresponded to the final stage of the identification element sequence is connected to an input terminal of an amplifier circuit including a second inverter circuit, a shift register having shift bits corresponding to the first switch and second switch of each first inverter circuit in the identification element sequence is provided, and an identification number circuit is built in for generating an identification number by generating a plurality of identification information corresponding to the respective first inverter circuits of the identification element sequence with the output signal of the amplifier circuit including the third inverter circuit by sequentially turning on the first switches and turning off the second switches complementarily to the first switches corresponding to a shift operation of the shift register in order from the first circuit of the identification element sequences corresponding to the count output of the binary counter, thereby making it possible to effectively identify each semiconductor integrated circuit device while simplifying the circuit.

(26) A first switch is provided for selectively short-circuiting an input terminal and an output terminal of a first inverter circuit, a second inverter circuit having an input terminal connected to the output terminal of the first inverter circuit is provided, a plurality of identification elements are provided for receiving an output signal of the second inverter and amplifying the output signal with an amplifier circuit, and an identification number circuit is built in for generating an identification number from an output signal of each identification element when the first switch is turned on, thereby making it possible to effectively identify each semiconductor integrated circuit device in a simple configuration.

(27) A plurality of unit elements each comprising a first inverter having an input terminal and an output terminal short-circuited by a first switch, and a second switch disposed at the input terminal of the first inverter circuit, are connected in cascade through the second switch to form an identification element sequence, the output terminal of the first inverter circuit corresponded to the last stage of the identification element sequence is connected to an input terminal of an amplifier circuit which includes a second inverter circuit, a decoder for decoding a count output of a binary counter for counting a clock is provided corresponding to the first switch and second switch of each first inverter circuit, and an identification number circuit is built in for generating an identification number by generating a plurality of identification information corresponding to the respective first inverter circuits of the identification element sequence with the output signal of the amplifier circuit including the third inverter circuit by sequentially turning on the first switches and turning off the second switches complementarily to the first switches corresponding to the count output of the binary counter in order from the first circuit of the identification element sequences corresponding to the count output of the binary counter, thereby making it possible to effectively identify each semiconductor integrated circuit device while simplifying the circuit.

(28) A plurality of unit elements each comprising a first inverter having an input terminal and an output terminal short-circuited by a first switch, and a second switch disposed at the input terminal of the first inverter circuit, are connected in cascade through the second switch to form an identification element sequence, the output terminal of the first inverter circuit corresponded to the final stage of the identification element sequence is connected to an input terminal of an amplifier circuit including a second inverter circuit, a shift register having shift bits corresponding to the first switch and second switch of each first inverter circuit in the identification element sequence is provided, and an identification number circuit is built in for generating an identification number by generating a plurality of identification information corresponding to the respective first inverter circuits of the identification element sequence with the output signal of the amplifier circuit including the third inverter circuit by sequentially turning on the first switches and turning off the second switches complementarily to the first switches corresponding to a shift operation of the shift register in order from the first circuit of the identification element sequences corresponding to the count output of the binary counter, thereby making it possible to effectively identify each semiconductor integrated circuit device while simplifying the circuit.

(29) In addition to the above, a test circuit compatible with a JTAG standard is further provided, wherein an identification number generated by the identification number circuit is outputted through an interface compatible with the JTAG standard, thereby making it possible to effectively simplify the circuit by diverting the test circuit.

(30) In addition to the above, the identification number circuit which includes the unit elements, first switches and second switches can effectively reduce a design cost by using a soft IP technique for performing a circuit design and a circuit layout.

(31) A plurality of unit elements each comprising a first inverter having an input terminal and an output terminal short-circuited by a first switch, and a second switch disposed at the input terminal of the first inverter circuit, are connected in cascade through the second switch to form an identification element sequence, the output terminal of the first inverter circuit corresponded to the final stage of the identification element sequence is connected to an input terminal of an amplifier circuit including a second inverter circuit, a shift register having shift bits corresponding to the first switch and second switch of each first inverter circuit in the identification element sequence is provided, and a soft IP technique is used to design and lay out an identification number circuit is built in for generating an identification number by generating a plurality of identification information corresponding to the respective first inverter circuits of the identification element sequence with the output signal of the amplifier circuit including the third inverter circuit by sequentially turning on the first switches and turning off the second switches complementarily to the first switches corresponding to a shift operation of the shift register in order from the first circuit of the identification element sequences corresponding to the count output of the binary counter, thereby making it possible to effectively reduce the manufacturing cost of the semiconductor integrated circuit device.

While the inventions made by the inventors have been described with reference to embodiments in a specific manner, the inventions of this application are not limited to the foregoing embodiments, but it goes without saying that a variety of modifications can be made without departing from the gist thereof. For example, a plurality of identification elements formed in the same form in course of a semiconductor integrated circuit device manufacturing process may be such that a plurality of resistive elements having the same resistance or a plurality of capacitors having the same capacitance may be formed in the semiconductor integrated circuit device for electrically reading signals, wherein variations in the resistance or capacitance due to the process may be drawn out in the form of a current or a voltage for use as an identification number.

Also, other than the lead width or pitch width of the semiconductor integrated circuit device, a plurality of straight lines having the same length or width may be printed or impressed on the surface of the semiconductor package or the like to make use of variations in the width or pitch width. Otherwise, a variety of embodiments can be employed.

The resistive element illustrated above can be implemented without the need for a relatively complicated manufacturing process such as the CMOS configuration in the embodiment. The resistive element can be considered to be a polysilicon resistor made by a semiconductor integrated circuit technology, a semiconductor resistor such as a so-called diffusion resistor which is made by introducing a conduction type determinant impurity into a single crystal silicon by a method such as a known ion implantation method, or a metal resistor made of a metal layer which is homogeneous to a metal wiring layer. Among these resistors, the diffusion resistor is preferred for providing particular information in accordance with variations in characteristics because an appropriate resistance can be set thereto and aging changes in its resistance are relatively small.

The particular information corresponding to variations in resistance can be formed, for example, by resistance-to-voltage conversion and comparison determination techniques which involve applying a predetermined bias current to two resistive elements which should be compared at a particular time, and determining a difference between voltages generated across the respective resistors, or by a technique which involves constructing a resistor bridge of a plurality of resistive elements and determining the output of the resistor bridge. Characteristic information corresponding to the resistive element can also be formed by a technique which involves utilizing a resistive element as a resistance-to-current conversion element, and comparing converted currents for determination, other than the foregoing techniques. Further, it is also possible to make use of variations in the characteristics of resistive elements as frequency information and delay time information by incorporating a resistive element in some of oscillation frequency determinant elements in an oscillator circuit or delay time determinant elements in a delay circuit.

When a resistive element is used as a load element for a signal input MOSFET which forms part of an inverter, information associated with variations in characteristics reflects both variations in characteristics of the resistive element and variations in characteristics of the signal input MOSFET.

The particular information corresponding to variations in resistance need not be always formed within a semiconductor integrated circuit device. If necessary, a semiconductor integrated circuit device may be configured to be able to transition to a particular information forming mode as appropriate, wherein in this mode, a plurality of resistive elements in the semiconductor integrated circuit device can be coupled to existing external terminals such as signal input/output terminals which have been set in the semiconductor integrated circuit device in a switch manner. In this event, the particular information corresponding to variations in characteristics of the resistive element is formed by a circuit device outside a semiconductor integrated circuit device which is coupled to the external terminals. In this event, it is possible to limit an increase in the number of circuit elements in the semiconductor integrated circuit device, and also limit the number of external terminals by making use of existing terminals of the semiconductor integrated circuit device.

A leak current in a plurality of circuit in the same configuration or circuit elements such as MOSFET is also detected empirically as permanently maintaining variations in characteristics. A leak current level can be detected through a current-to-voltage conversion and a voltage comparison, as is the case with the variations in characteristics of resistive elements. What forms a leak current may be circuits which are identical in configuration to one another, or MOSFET which has the gate connected to the source.

A leak current source suitable for particular information may be a signal output buffer circuit which is connected to a signal output external terminal or a signal input/output external terminal of a semiconductor integrated circuit device. This is because this type of signal output buffer has constituent circuit elements of relatively large sizes such as MOSFET, often forms a relatively large leak current which can be relatively readily measured, and can make use of existing external terminals as they are.

The breakdown characteristic of an element such as an input protection diode in a semiconductor integrated circuit device connected to an external signal input terminal of the semiconductor integrated circuit device can also be used as a source of particular information corresponding to microscopic variations as mentioned above. Even if a plurality of external terminals of a semiconductor integrated circuit device comprise a bus line composed of a relatively small number of bits in an electronic system, appropriately identifiable information can be formed for an extremely large number of items by a round-robin comparison approach as in the aforementioned embodiment.

The capacitance such as a drain junction capacitance of a MOS transistor in a semiconductor integrated circuit device coupled to an external terminal of the semiconductor integrated circuit device has microscopic variations. Therefore, this can also be used as a source of particular information as mentioned above corresponding to variations.

An information holding time in a dynamic memory also presents microscopic variations. In this event, even if no special configuration is added to the dynamic memory, i.e., even if no configuration is set for forming unique identification information, information holding times in a plurality of memory cells at a plurality of particular memory addresses within a plurality of memory addresses can be measured to generate particular information based on the result of the measurements.

When a plurality of semiconductor chips are mounted on a common substrate as a multi-chip module, a unique identification circuit may be set for each semiconductor chip, such that unique identification information from each semiconductor chip can be taken out through the common substrate. If there is a limitation in the number of terminals required on the common substrate for reading the unique identification information of each semiconductor chip, a parallel-to-serial converter circuit for the unique identification information may be set for each semiconductor chip together with a chip selection control circuit. In this event, the unique identification information in each semiconductor chip is serialized by the parallel-to-serial converter circuit in a selected state of the chip, outputted from each semiconductor chip, and read out through the common substrate. When a dedicated program chip is provided in the meaning as in FIG. 33, the dedicated program chip may be configured to support a plurality of different types of semiconductor chips on the common substrate.

INDUSTRIAL APPLICABILITY

The present invention can be widely utilized in a method for identifying a semiconductor integrated circuit device or a semiconductor chip, which assigns unique identification information to each semiconductor integrated circuit device or semiconductor chip to identify individual semiconductor integrated circuit devices or semiconductor chips, a method for manufacturing a semiconductor integrated circuit device, a semiconductor integrated circuit device, and a semiconductor chip.

The invention claimed is:

1. A method for identifying a semiconductor integrated circuit device, the method comprising the steps of:
   (a) providing a semiconductor integrated circuit device with a plurality of identification elements formed within a same semiconductor chip area, each said identification element having the same form and being formed using the same manufacturing process;
   (b) detecting information which reflects variations in electric parameters of said plurality of identification elements caused during said manufacturing process within the same semiconductor chip area, and
   (c) setting the information obtained in step (b) as unique identification information with respect to the semiconductor integrated circuit device.

2. A method according to claim 1, wherein in step (a), said plurality of identification elements is formed within said semiconductor integrated circuit device.

3. A method according to claim 1 wherein said unique identification information comprises information indicative of the order of magnitude of the variations of the electric parameters detected in said plurality of identification elements.

4. A method according to claim 1 wherein each said identification element comprises a logic circuit, and said electric parameters are associated with said logic circuit.

5. A method according to claim 4, wherein at least one of said plurality of logic circuits is configured to have an output electrically connected with an input to output, to a next stage of the logic circuit, a voltage equal to a threshold voltage as a corresponding electric parameter.

6. A method according to claim 5, wherein each said logic circuit comprises at least one inverter circuit.

7. A method for according to claim 6, wherein each said identification element comprises a CMOS inverter circuit having an N-channel MOSFET and a P-channel MOSFET.

8. A method according to claim 4, wherein each said logic circuit operates with a limited operating voltage when steps (b) and (c) are not in operation.

9. A method for identifying a semiconductor integrated circuit device, comprising the steps of:
   (a) providing a semiconductor integrated circuit device with an identification information generator containing a plurality of identification elements, each said identification element including a logic circuit, said plurality of identification elements being formed within a same semiconductor chip area and each said identification element having the same form and constructed using the same manufacturing process, and
   (b) detecting information which reflects variations in electric parameters of the logic circuits caused during said manufacturing process within the same semiconductor chip area when said identification information generator is activated,
   wherein the information obtained by step (b) is related as unique identification information with respect to the semiconductor integrated circuit device.

10. A method according to claim 9, wherein the logic circuit of each said identification element is configured to have an output electrically connected with an input to output a voltage equal to a threshold voltage as a corresponding electric parameter.

11. A method according to claim 9, wherein step (b) further comprises the step of comparing an output of one of said identification elements with an output of another of said identification elements, each said output including information relating to electric parameters of the corresponding logic circuit.

12. A method according to claim 9, wherein step (b) further comprises the step of arranging outputs of said plurality of identification elements according to magnitudes either of the larger to the lesser or of the lesser to the larger so that said unique identification information comprises information indicative of an order of the magnitudes of the electric parameters of said logic circuits.

13. A method according to claim 9,
   wherein step (a) further comprises the step of performing, at one time of manufacturing the semiconductor integrated circuit device, a measurement with respect to said semiconductor integrated circuit device to provide information including particulars relating to the semiconductor integrated circuit device,
   wherein the method further comprises the step of (c) storing in a storage means the information including said particulars relating to the semiconductor integrated circuit device by relating it to said unique identification information as a reference.

14. A method according to claim 13, further comprising the step of:
   (d) retrieving at another time later than said one time, said information including said particulars relating to the semiconductor integrated circuit device from said storing means using the unique identification information as the reference.

15. A method for identifying a semiconductor integrated circuit device, comprising the steps of:
   (a) providing a semiconductor integrated circuit device with an identification information generator containing a plurality of identification elements, each said identification element including a logic circuit formed on a same semiconductor chip area and each said identification element having the same form and constructed using the same manufacturing process; and
   (b) comparing, when said identification information generator is activated, an output of one of said plurality of identification elements with an output of another of said plurality of identification elements, to provide information which reflects variations in electrical characteristics of said plurality of logic circuits caused during said manufacturing process,
   wherein the information obtained at step (b) is related as unique identification information with respect to the semiconductor integrated circuit device when said identification information generator is activated.

16. A method according to claim 15, wherein step (a) further comprises the step of performing, at one time of manufacturing the semiconductor integrated circuit device, a measurement with respect to said semiconductor integrated circuit device to provide information including particulars relating to the semiconductor integrated circuit device, and wherein the method further comprises the step of:
(c) storing in a storage means the information including said particulars relating to the semiconductor integrated circuit device by relating it to said unique identification information provided by step (b) as a reference.

17. A method according to claim 16, further comprising the steps of:
(d) performing, at another time later than said time, step (b) to find the unique identification information; and
(e) retrieving said information including said particulars relating to the semiconductor integrated circuit device from said storing means using the unique identification information found in step (d)as the reference.

18. A method for identifying a semiconductor integrated circuit device, comprising the steps of:
(a) preparing a semiconductor integrated circuit device provided with an identification generator containing a plurality of identification elements, each said identification element including a logic circuit, said plurality of identification elements being formed within a same semiconductor chip area and each said identification element having the same form and constructed using the same manufacturing process, the logic circuit in each said identification element being configured to have an output of the logic circuit electrically connected with an input of the logic circuit to output a voltage equal to a threshold voltage of the logic circuit as its electric parameter,
(b) performing detection of information which reflects variations in said electric parameters of said logic circuits caused during said manufacturing process when said identification generator is activated; and
(c) relating the information obtained by step (b) to the semiconductor integrated circuit device as unique identification information thereof.

19. A method according to claim 18, wherein said detection of step (b) comprises the step of comparing said output voltage of one of said identification elements with said output voltage of another said identification element.

20. A method for identifying particulars of a semiconductor integrated circuit device measured at one time of manufacturing thereof, comprising the steps of:
(a) preparing a semiconductor integrated circuit device provided with an identification information generator containing a plurality of identification elements each including a logic circuit, said identification elements being formed on the same semiconductor chip area, and each of said plurality of identification elements configured to have the same form by treating each said identification element through the same manufacturing process;
(b) at said one time of the process of manufacturing the semiconductor integrated circuit device, performing the steps of:
(b1) performing a measurement with respect to said semiconductor integrated circuit device to provide information including particulars relating to the semiconductor integrated circuit device;
(b2) performing detection of information which reflects variations in electrical characteristics of said logic circuits caused during said manufacturing process; and
(b3) storing in a storing means said information including particulars relating to the semiconductor integrated circuit device by relating it to the information obtained at step (b2) as a reference, and
(c) at another time later than said one time, performing the steps of:
(c1) performing step (b2) to find said unique identification information; and
(c2) retrieving said information including particulars relating to the semiconductor integrated circuit device from said storing means using the information found in step (c1) as the reference.

21. A method according to claim 20, wherein the logic circuit in each of said identification elements is configured to have an output of the logic circuit electrically connected with an input of the logic circuit to output a voltage equal to a threshold voltage of the logic circuit as information indicative of its electrical characteristics.

* * * * *